US011845768B2

(12) United States Patent
Hong et al.

(10) Patent No.: US 11,845,768 B2
(45) Date of Patent: Dec. 19, 2023

(54) POLYCYCLIC COMPOUND AND ORGANIC LIGHT-EMITTING DEVICE INCLUDING SAME

(71) Applicant: LG CHEM, LTD., Seoul (KR)

(72) Inventors: Wanpyo Hong, Daejeon (KR); Sujeong Geum, Daejeon (KR); Kyunghee Kim, Daejeon (KR); Dong Hoon Lee, Daejeon (KR); Yongbum Cha, Daejeon (KR)

(73) Assignee: LG CHEM, LTD., Seoul (KR)

( * ) Notice: Subject to any disclaimer, the term of this patent is extended or adjusted under 35 U.S.C. 154(b) by 348 days.

(21) Appl. No.: 17/265,468

(22) PCT Filed: Sep. 4, 2019

(86) PCT No.: PCT/KR2019/011391
§ 371 (c)(1),
(2) Date: Feb. 2, 2021

(87) PCT Pub. No.: WO2020/050619
PCT Pub. Date: Mar. 12, 2020

(65) Prior Publication Data

US 2021/0317147 A1 Oct. 14, 2021

(30) Foreign Application Priority Data

Sep. 4, 2018 (KR) ........................ 10-2018-0105459

(51) Int. Cl.
*C07F 7/00* (2006.01)
*C07F 7/08* (2006.01)
(Continued)

(52) U.S. Cl.
CPC ........... *C07F 7/0816* (2013.01); *H10K 85/40* (2023.02); *H10K 85/636* (2023.02); *H10K 50/11* (2023.02);
(Continued)

(58) Field of Classification Search
None
See application file for complete search history.

(56) References Cited

U.S. PATENT DOCUMENTS

2009/0295275 A1 12/2009 Parham et al.
2016/0285006 A1 9/2016 Itoi
(Continued)

FOREIGN PATENT DOCUMENTS

CN 106467553 A 3/2017
CN 111684615 A 9/2020
(Continued)

*Primary Examiner* — Robert S Loewe
(74) *Attorney, Agent, or Firm* — BRYAN CAVE LEIGHTON PAISNER LLP

(57) ABSTRACT

A compound of Chemical Formula 1, and an organic light emitting device including the same Chemical Formula 1

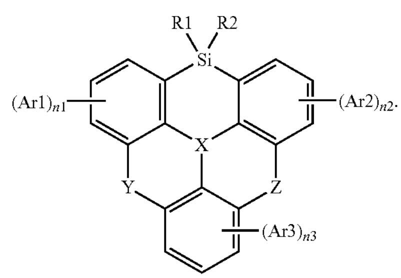

11 Claims, 3 Drawing Sheets

(51) Int. Cl.

| | |
|---|---|
| ***H10K 85/40*** | (2023.01) |
| ***H10K 85/60*** | (2023.01) |
| *H10K 50/11* | (2023.01) |
| *H10K 50/15* | (2023.01) |
| *H10K 50/16* | (2023.01) |
| *H10K 50/17* | (2023.01) |

(52) U.S. Cl.

CPC ............ *H10K 50/15* (2023.02); *H10K 50/16* (2023.02); *H10K 50/171* (2023.02)

(56) References Cited

U.S. PATENT DOCUMENTS

| | | | | |
|---|---|---|---|---|
| 2017/0309828 | A1 | 10/2017 | Tanabe et al. | |
| 2018/0069182 | A1 | 3/2018 | Hatakeyama et al. | |
| 2018/0148462 | A1 | 5/2018 | Fuchiwaki | |
| 2019/0115537 | A1 | 4/2019 | Makishima et al. | |
| 2019/0378982 | A1* | 12/2019 | He | C09K 11/00 |
| 2020/0274075 | A1* | 8/2020 | Park | C09K 11/06 |
| 2020/0411771 | A1 | 12/2020 | Kim et al. | |
| 2021/0050547 | A1* | 2/2021 | Li | H10K 85/6572 |
| 2021/0403490 | A1* | 12/2021 | Lee | C07F 7/0816 |
| 2022/0384733 | A1* | 12/2022 | Choi | H10K 85/622 |

FOREIGN PATENT DOCUMENTS

| | | | | |
|---|---|---|---|---|
| JP | 11-80225 A | 3/1999 | | |
| JP | 2017-126606 A | 7/2017 | | |
| JP | 2018-43984 A | 3/2018 | | |
| KR | 10-2006-0051622 A | 5/2006 | | |
| KR | 10-2016-0116287 A | 10/2016 | | |
| KR | 10-2018-0062561 A | 6/2018 | | |
| WO | 2016/046350 A1 | 3/2016 | | |
| WO | 2017/195669 A1 | 11/2017 | | |
| WO | WO-2018095394 A1 * | 5/2018 | | C07D 209/86 |

* cited by examiner

【FIG. 1】
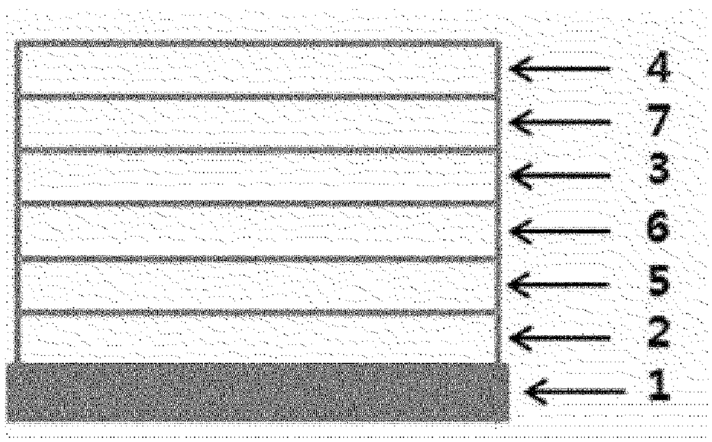
【FIG. 2】
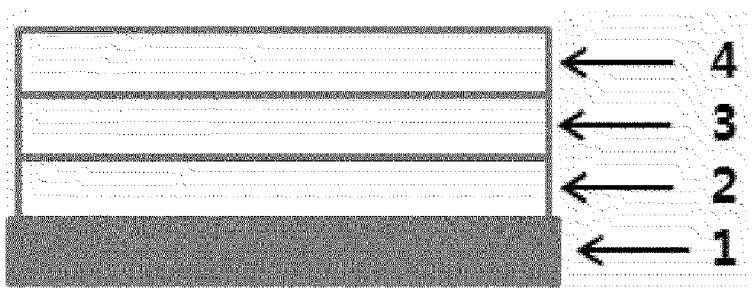

[FIG. 3]
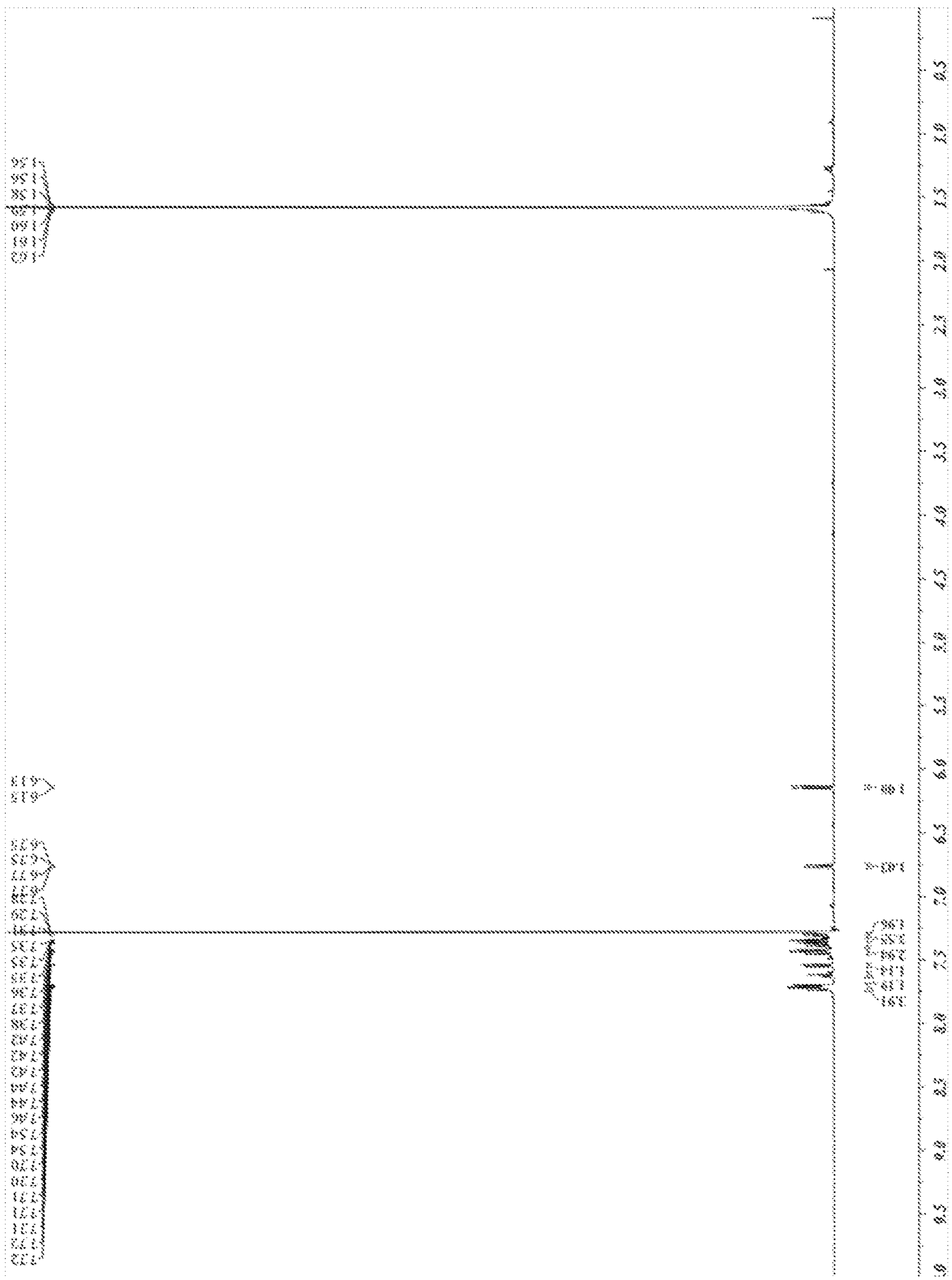

[FIG. 4]
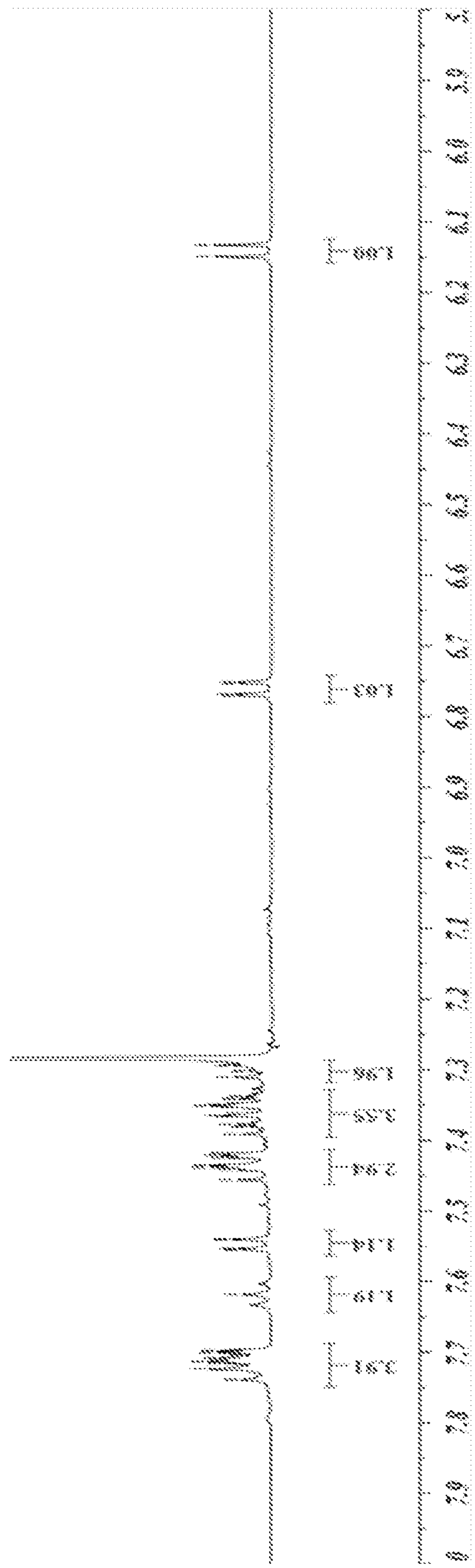

POLYCYCLIC COMPOUND AND ORGANIC LIGHT-EMITTING DEVICE INCLUDING SAME

This application is a National Stage Application of International Application No. PCT/KR2019/011391, filed Sep. 4, 2019, which claims priority to and the benefits of Korean Patent Application No. 10-2018-0105459, filed with the Korean Intellectual Property Office on Sep. 4, 2018, the entire contents of which are incorporated herein by reference.

TECHNICAL FIELD

The present specification relates to a polycyclic compound and an organic light emitting device including the same.

BACKGROUND

An organic light emitting device in the present specification is a light emitting device using an organic semiconductor material, and requires an exchange of holes and/or electrons between an electrode and the organic semiconductor material. An organic light emitting device may be largely divided into two types as follows depending on the operation principle. The first is a light emitting device type in which excitons are formed in an organic material layer by photons introduced to a device from an external light source, these excitons are separated into electrons and holes, and these electrons and holes are each transferred to different electrodes and used as a current source (voltage source). The second is a light emitting device type in which, by applying a voltage or current to two or more electrodes, holes and/or electrons are injected into an organic semiconductor material layer forming an interface with the electrodes, and the light emitting device is operated by the injected electrons and holes.

An organic light emission phenomenon generally refers to a phenomenon converting electrical energy to light energy using an organic material. An organic light emitting device using an organic light emission phenomenon normally has a structure including an anode, a cathode, and an organic material layer therebetween. Herein, the organic material layer is often formed in a multilayer structure formed with different materials in order to increase efficiency and stability of the organic light emitting device, and for example, may be formed with a hole injection layer, a hole transfer layer, a light emitting layer, an electron blocking layer, an electron transfer layer, an electron injection layer and the like. When a voltage is applied between the two electrodes in such an organic light emitting device structure, holes and electrons are injected to the organic material layer from the anode and the cathode, respectively, and when the injected holes and electrons meet, excitons are formed, and light emits when these excitons fall back to the ground state. Such an organic light emitting device is known to have properties such as self-emission, high luminance, high efficiency, low driving voltage, wide viewing angle and high contrast.

Materials used as an organic material layer in an organic light emitting device may be divided into a light emitting material and a charge transfer material, for example, a hole injection material, a hole transfer material, an electron blocking material, an electron transfer material, an electron injection material and the like depending on the function. The light emitting material includes, depending on light emitting color, blue, green and red light emitting materials, and yellow and orange light emitting materials required for obtaining better natural colors.

In addition, in order to increase color purity and light emission efficiency through energy transition, a host/dopant-based may be used as the light emitting material. The principle is that light with high efficiency is produced when mixing a small amount of dopant having a smaller energy band gap and superior light emission efficiency compared to a host mainly consisting a light emitting layer into the light emitting layer by the transferring of excitons produced in the host to the dopant. Herein, the wavelength of the host is shifted to the wavelength band of the dopant, and therefore, light with a target wavelength may be obtained depending on the types of the dopant used.

In order to sufficiently exhibit excellent properties that the above-described organic light emitting device has, materials forming an organic material layer in the device, for example, a hole injection material, a hole transfer material, a light emitting material, an electron blocking material, an electron transfer material, an electron injection material and the like are supported by stable and efficient materials, and therefore, development of new materials has been continuously required.

SUMMARY

The present specification describes a compound of Chemical Formula 1, and an organic light emitting device including the same.

Technical Solution

One embodiment of the present specification provides a compound of the following Chemical Formula 1.

[Chemical Formula 1]

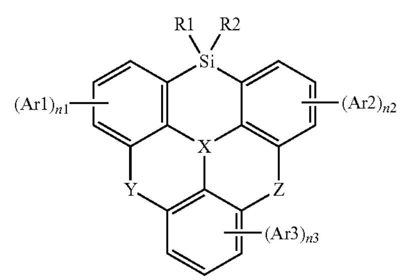

In Chemical Formula 1,

X is B or N,

Y and Z are each 0, S or NR,

R1 and R2 are the same as or different from each other, and each independently a substituted or unsubstituted alkyl group; or a substituted or unsubstituted aryl group, R is hydrogen; deuterium; a halogen group; a cyano group; a substituted or unsubstituted alkyl group; a substituted or unsubstituted cycloalkyl group; a substituted or unsubstituted aryl group; or a substituted or unsubstituted heterocyclic group, Ar1 to Ar3 are the same as or different from each other, and each independently hydrogen; deuterium; a halogen group; a cyano group; a substituted or unsubstituted silyl group; a substituted or unsubstituted boron group; a substituted or unsubstituted alkyl group; a substituted or unsubstituted cycloalkyl group; a substituted or unsubstituted amine group; a substituted or unsubstituted aryl group; or a substituted or unsubstituted heterocyclic group, and n1 to n3 are each an integer of 0 to 3, and when n1 to n3 are each 2 or greater, substituents in the two or more parentheses are the same as or different from each other.

Another embodiment of the present disclosure provides an organic light emitting device including a first electrode; a second electrode provided opposite to the first electrode; and one or more organic material layers provided between the first electrode and the second electrode, wherein one or more layers of the organic material layers include the compound described above.

Advantages

A compound of Chemical Formula 1 of the present disclosure can be used as a material of an organic material layer of an organic light emitting device. By the compound of Chemical Formula 1 of the present disclosure including a silicon atom (Si) in a core structure of the compound, molecular rigidity increases and, as a result, excellent morphological stability is obtained. An organic light emitting device having high efficiency, low voltage and long lifetime properties can be obtained, and when including the compound of the present disclosure in a light emitting layer of an organic light emitting device, an organic light emitting device having high color gamut can be manufactured.

BRIEF DESCRIPTION OF THE DRAWINGS

FIG. 1 illustrates an example of an organic light emitting device formed with a substrate (1), an anode (2), a hole injection layer (5), a hole transfer layer (6), a light emitting layer (3), an electron transfer layer (7) and a cathode (4).

FIG. 2 illustrates an example of an organic light emitting device formed with a substrate (1), an anode (2), a light emitting layer (3) and a cathode (4).

FIG. 3 shows an NMR measurement result of Compound 1.

FIG. 4 is a diagram enlarging a 5 ppm to 8 ppm part of FIG. 3.

REFERENCE NUMERAL

1: Substrate
2: Anode
3: Light emitting Layer
4: Cathode
5: Hole Injection Layer
6: Hole Transfer Layer
7: Electron Transfer Layer

DETAILED DESCRIPTION

Hereinafter, the present specification will be described in more detail.

In the present specification, a description of a certain part "including" certain constituents means capable of further including other constituents, and does not exclude other constituents unless particularly stated on the contrary.

In the present specification, a description of one member being placed "on" another member includes not only a case of the one member adjoining the another member but a case of still another member being present between the two members.

Examples of substituents in the present specification are described below, however, the substituents are not limited thereto.

The term "substitution" means a hydrogen atom bonding to a carbon atom of a compound is changed to another substituent, and the position of substitution is not limited as long as it is a position at which a hydrogen atom is substituted, that is, a position at which a substituent may substitute, and when two or more substituents substitute, the two or more substituents may be the same as or different from each other.

In the present specification, the term "substituted or unsubstituted" means being substituted with one, two or more substituents selected from the group consisting of deuterium; a halogen group; a cyano group (—CN); a silyl group; a boron group; an alkyl group; a cycloalkyl group; an amine group; an aryl group; and a heterocyclic group, or being substituted with a substituent linking two or more substituents among the substituents illustrated above, or having no substituents. For example, "a substituent linking two or more substituents" may include a biphenyl group. In other words, a biphenyl group may be an aryl group, or interpreted as a substituent linking two phenyl groups.

Examples of the substituents are described below, however, the substituents are not limited thereto.

In the present specification, examples of the halogen group may include fluorine (F), chlorine (Cl), bromine (Br) or iodine (I).

In the present specification, the silyl group may be a chemical formula of —SiYaYbYc, and Ya, Yb and Yc may each be hydrogen; a substituted or unsubstituted alkyl group; or a substituted or unsubstituted aryl group. Specific examples of the silyl group may include a trimethylsilyl group, a triethylsilyl group, a tert-butyldimethylsilyl group, a vinyldimethylsilyl group, a propyldimethylsilyl group, a triphenylsilyl group, a diphenylsilyl group, a phenylsilyl group and the like, but are not limited thereto.

In the present specification, the boron group may be a chemical formula of —BYdYe, and Yd and Ye may each be hydrogen; a substituted or unsubstituted alkyl group; or a substituted or unsubstituted aryl group. Specific examples of the boron group may include a trimethylboron group, a triethylboron group, a tert-butyldimethylboron group, a triphenylboron group, a phenylboron group and the like, but are not limited thereto.

In the present specification, the alkyl group may be linear or branched, and although not particularly limited thereto, the number of carbon atoms is preferably from 1 to 60. According to one embodiment, the number of carbon atoms of the alkyl group is from 1 to 30. According to another embodiment, the number of carbon atoms of the alkyl group is from 1 to 20. According to another embodiment, the number of carbon atoms of the alkyl group is from 1 to 10. Specific examples of the alkyl group may include a methyl group, an ethyl group, a propyl group, an isopropyl group, a butyl group, an isobutyl group, a tert-butyl group, a pentyl group, a hexyl group, a heptyl group, an octyl group and the like, but are not limited thereto.

In the present specification, the cycloalkyl group is not particularly limited, but preferably has 3 to 60 carbon atoms, and according to one embodiment, the number of carbon atoms of the cycloalkyl group is from 3 to 30. According to another embodiment, the number of carbon atoms of the cycloalkyl group is from 3 to 20. According to another embodiment, the number of carbon atoms of the cycloalkyl group is from 3 to 6. Specific examples thereof may include a cyclopropyl group, a cyclobutyl group, a cyclopentyl group, a cyclohexyl group, a cycloheptyl group, a cyclooctyl group, an adamantly group and the like, but are not limited thereto.

In the present specification, the amine group may be a chemical formula of —NYfYg, and Yf and Yg may each be hydrogen; deuterium; a substituted or unsubstituted alkyl group; a substituted or unsubstituted cycloalkyl group; a substituted or unsubstituted aryl group; or a substituted or unsubstituted heterocyclic group. The amine group may be selected from the group consisting of an alkylamine group; an arylalkylamine group; an arylamine group; an arylheteroarylamine group; an alkylheteroarylamine group; and a heteroarylamine group, and may more specifically be a dimethylamine group; a diphenylamine group; and the like, but is not limited thereto.

In the present specification, the aryl group is not particularly limited, but preferably has 6 to 60 carbon atoms, and may be a monocyclic aryl group or a polycyclic aryl group. According to one embodiment, the number of carbon atoms of the aryl group is from 6 to 30. According to one embodiment, the number of carbon atoms of the aryl group is from 6 to 20. When the aryl group is a monocyclic aryl group, examples thereof may include a phenyl group, a biphenyl group, a terphenyl group and the like, but are not limited thereto. Examples of the polycyclic aryl group may include a naphthyl group, an anthracenyl group, a phenanthrenyl group, a pyrenyl group, a perylenyl group, a triphenyl group, a chrysenyl group, a fluorenyl group and the like, but are not limited thereto.

In the present specification, the fluorenyl group may be substituted, and two substituents may bond to each other to form a spiro structure.

In the present specification, the heterocyclic group is a cyclic group including one or more of N, O, P, S, Si and Se as a heteroatom, and although not particularly limited thereto, the number of carbon atoms is preferably from 2 to 60. According to one embodiment, the number of carbon atoms of the heterocyclic group is from 2 to 30. Examples of the heterocyclic group may include a pyridine group, a pyrrole group, a pyrimidine group, a pyridazinyl group, a furan group, a thiophene group, an imidazole group, a pyrazole group, dibenzofuran group, dibenzothiophene group, a carbazole group and the like, but are not limited thereto.

In the present specification, the descriptions on the aryl group may be applied to the arylene group except that the arylene group is divalent.

In the present specification, the descriptions on the heterocyclic group may be applied to the heteroarylene group except that the heteroarylene group is divalent.

According to one embodiment of the present specification, Ar1 to Ar3 are the same as or different from each other, and each independently hydrogen; deuterium; a halogen group; a cyano group; a substituted or unsubstituted silyl group; a substituted or unsubstituted boron group; a substituted or unsubstituted alkyl group having 1 to 40 carbon atoms; a substituted or unsubstituted cycloalkyl group having 3 to 60 carbon atoms; a substituted or unsubstituted amine group; a substituted or unsubstituted aryl group having 6 to 60 carbon atoms; or a substituted or unsubstituted heterocyclic group having 2 to 60 carbon atoms.

In another embodiment, Ar1 to Ar3 are the same as or different from each other, and each independently hydrogen; deuterium; a substituted or unsubstituted alkyl group having 1 to 40 carbon atoms; or a substituted or unsubstituted arylamine group having 6 to 60 carbon atoms.

According to another embodiment, Ar1 to Ar3 are the same as or different from each other, and each independently hydrogen; deuterium; a substituted or unsubstituted alkyl group having 1 to 20 carbon atoms; or a substituted or unsubstituted arylamine group having 6 to 30 carbon atoms.

In another embodiment, Ar1 to Ar3 are the same as or different from each other, and each independently hydrogen; deuterium; an alkyl group having 1 to 20 carbon atoms; or an arylamine group having 6 to 30 carbon atoms unsubstituted or substituted with deuterium.

In another embodiment, Ar1 to Ar3 are the same as or different from each other, and each independently hydrogen; deuterium; a methyl group; a butyl group; or a diphenylamine group unsubstituted or substituted with deuterium.

According to one embodiment of the present specification, n1 to n3 are each 0 or 1.

According to one embodiment of the present specification, Y and Z are the same as or different from each other, and each independently O, S or NR.

In another embodiment, any one of Y and Z is NR, and the other one is O, S or NR.

According to another embodiment, Y and Z are NR.

In another embodiment, Z is NR, and Y is O or S.

According to one embodiment of the present specification, R is hydrogen; deuterium; a halogen group; a cyano group; a substituted or unsubstituted alkyl group having 1 to 40 carbon atoms; a substituted or unsubstituted cycloalkyl group having 3 to 60 carbon atoms; a substituted or unsubstituted aryl group having 6 to 60 carbon atoms; or a substituted or unsubstituted heterocyclic group having 2 to 60 carbon atoms.

According to another embodiment, R is hydrogen; deuterium; a substituted or unsubstituted cycloalkyl group having 3 to 60 carbon atoms; a substituted or unsubstituted aryl group having 6 to 60 carbon atoms; or a substituted or unsubstituted heterocyclic group having 2 to 60 carbon atoms.

In another embodiment, R is hydrogen; deuterium; a cycloalkyl group having 3 to 60 carbon atoms; an aryl group having 6 to 60 carbon atoms unsubstituted or substituted with one or more substituents selected from the group consisting of deuterium, a halogen group, a trialkylsilyl group having 1 to 20 carbon atoms, a haloalkyl group having 1 to 20 carbon atoms, an alkyl group having 1 to 20 carbon atoms, a cycloalkyl group having 3 to 30 carbon atoms and a substituted or unsubstituted heteroaryl group having 2 to 30 carbon atoms; or a heterocyclic group having 2 to 60 carbon atoms unsubstituted or substituted with an alkyl group having 1 to 20 carbon atoms.

According to another embodiment, R is hydrogen; deuterium; an adamantyl group; a phenyl group unsubstituted or substituted with one or more substituents selected from the group consisting of deuterium, a halogen group, a trialkylsilyl group having 1 to 20 carbon atoms, a haloalkyl group having 1 to 20 carbon atoms, an alkyl group having 1 to 20 carbon atoms, a cycloalkyl group having 3 to 30 carbon atoms, and a heteroaryl group having 2 to 30 carbon atoms unsubstituted or substituted with an alkyl group having 1 to 20 carbon atoms unsubstituted or substituted with deuterium; a biphenyl group unsubstituted or substituted with one or more substituents selected from the group consisting of deuterium, a halogen group, a trialkylsilyl group having 1 to 20 carbon atoms, a haloalkyl group having 1 to 20 carbon atoms, an alkyl group having 1 to 20 carbon atoms, a cycloalkyl group having 3 to 30 carbon atoms, and a heteroaryl group having 2 to 30 carbon atoms unsubstituted or substituted with an alkyl group having 1 to 20 carbon atoms unsubstituted or substituted with deuterium; a terphenyl group unsubstituted or substituted with one or more substituents selected from the group consisting of deuterium, a halogen group, a trialkylsilyl group having 1 to 20 carbon atoms, a haloalkyl group having 1 to 20 carbon atoms, an alkyl group having 1 to 20 carbon atoms, a cycloalkyl group having 3 to 30 carbon atoms, and a heteroaryl group having 2 to 30 carbon atoms unsubstituted or substituted with an alkyl group having 1 to 20 carbon atoms unsubstituted or substituted with deuterium; a naphthyl group unsubstituted or substituted with one or more substituents selected from the group consisting of deuterium, a halogen group, a trialkylsilyl group having 1 to 20 carbon atoms, a haloalkyl group having 1 to 20 carbon atoms, an alkyl group having 1 to 20 carbon atoms, a cycloalkyl group having 3 to 30 carbon atoms, and a heteroaryl group having 2 to carbon atoms unsubstituted or substituted with an alkyl group having 1 to 20 carbon atoms unsubstituted or substituted with deuterium; a fluorenyl group unsubstituted or substituted with one or more substituents selected from the group consisting of deuterium, a halogen group, a trialkylsilyl group having 1 to 20 carbon atoms, a haloalkyl group having 1 to 20 carbon atoms, an alkyl group having 1 to 20 carbon atoms, a cycloalkyl group having 3 to 30 carbon atoms, and a heteroaryl group having 2 to 30 carbon atoms unsubstituted or substituted with an alkyl group having 1 to 20 carbon atoms unsubstituted or substituted with deuterium; a dibenzofuran group unsubstituted or substituted with an alkyl group having 1 to 20 carbon atoms; or a dibenzothiophene group unsubstituted or substituted with an alkyl group having 1 to 20 carbon atoms.

In another embodiment, R is hydrogen; deuterium; a cycloalkyl group having 3 to 60 carbon atoms; an aryl group having 6 to 60 carbon atoms unsubstituted or substituted with one or more substituents selected from the group consisting of deuterium, fluorine (—F), a trimethylsilyl group, a trifluoromethyl group, a methyl group, a butyl group, an adamantyl group, a pyridyl group unsubstituted or substituted with a methyl group, and a pyridyl group substituted with a methyl group substituted with deuterium; or a heterocyclic group having 2 to 60 carbon atoms unsubstituted or substituted with a butyl group.

According to another embodiment, R is hydrogen; deuterium; an adamantyl group; a phenyl group unsubstituted or substituted with one or more substituents selected from the group consisting of fluorine (—F), a trimethylsilyl group, a trifluoromethyl group, a methyl group, a butyl group, an adamantyl group, a pyridyl group unsubstituted or substituted with a methyl group, and a pyridyl group substituted with a methyl group substituted with deuterium; a biphenyl group unsubstituted or substituted with one or more substituents selected from the group consisting of fluorine (—F), a trimethylsilyl group, a trifluoromethyl group, a methyl group, a butyl group, an adamantyl group, a pyridyl group unsubstituted or substituted with a methyl group, and a pyridyl group substituted with a methyl group substituted with deuterium; a terphenyl group unsubstituted or substituted with one or more substituents selected from the group consisting of fluorine (—F), a trimethylsilyl group, a trifluoromethyl group, a methyl group, a butyl group, an adamantyl group, a pyridyl group unsubstituted or substituted with a methyl group, and a pyridyl group substituted with a methyl group substituted with deuterium; a naphthyl group unsubstituted or substituted with one or more substituents selected from the group consisting of fluorine (—F), a trimethylsilyl group, a trifluoromethyl group, a methyl group, a butyl group, an adamantyl group, a pyridyl group unsubstituted or substituted with a methyl group, and a pyridyl group substituted with a methyl group substituted with deuterium; a fluorenyl group unsubstituted or substituted with one or more substituents selected from the group consisting of fluorine (—F), a trimethylsilyl group, a trifluoromethyl group, a methyl group, a butyl group, an adamantyl group, a pyridyl group unsubstituted or substituted with a methyl group, and a pyridyl group substituted with a methyl group substituted with deuterium; a dibenzofuran group unsubstituted or substituted with a butyl group; or a dibenzothiophene group unsubstituted or substituted with a butyl group.

According to one embodiment of the present specification, Chemical Formula 1 is of the following Chemical Formula 3 or 4.

[Chemical Formula 3]

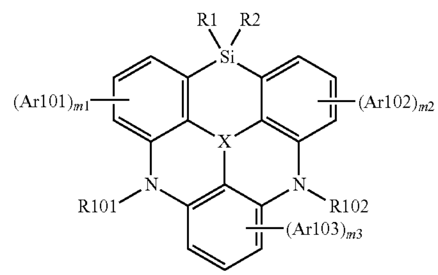

[Chemical Formula 4]

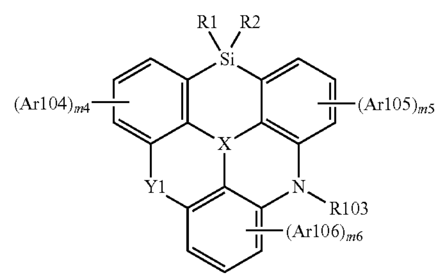

In Chemical Formulae 3 and 4,

R1, R2 and X have the same definitions as in Chemical Formula 1,

Y1 is O or S,

R101 to R103 are the same as or different from each other, and each independently hydrogen; deuterium; a halogen group; a cyano group; a substituted or unsubstituted alkyl group; a substituted or unsubstituted cycloalkyl group; a substituted or unsubstituted aryl group; or a substituted or unsubstituted heterocyclic group, Ar101 to Ar106 are the same as or different from each other, and each independently hydrogen; deuterium; a halogen group; a cyano group; a substituted or unsubstituted silyl group; a substituted or unsubstituted boron group; a substituted or unsubstituted alkyl group; a substituted or unsubstituted cycloalkyl group; a substituted or unsubstituted amine group; a substituted or unsubstituted aryl group; or a substituted or unsubstituted heterocyclic group, and m1 to m6 are each an integer of 0 to 3, and when m1 to m6 are each 2 or greater, substituents in the two or more parentheses are the same as or different from each other.

According to one embodiment of the present specification, R101 to R103 are the same as or different from each other, and each independently hydrogen; deuterium; a halogen group; a cyano group; a substituted or unsubstituted alkyl group having 1 to 40 carbon atoms; a substituted or unsubstituted cycloalkyl group having 3 to 60 carbon atoms; a substituted or unsubstituted aryl group having 6 to 60 carbon atoms; or a substituted or unsubstituted heterocyclic group having 2 to 60 carbon atoms.

According to another embodiment, R101 to R103 are the same as or different from each other, and each independently hydrogen; deuterium; a substituted or unsubstituted cycloalkyl group having 3 to 60 carbon atoms; a substituted or unsubstituted aryl group having 6 to 60 carbon atoms; or a substituted or unsubstituted heterocyclic group having 2 to 60 carbon atoms.

In another embodiment, R101 to R103 are the same as or different from each other, and each independently hydrogen; deuterium; a cycloalkyl group having 3 to 60 carbon atoms; an aryl group having 6 to 60 carbon atoms unsubstituted or substituted with one or more substituents selected from the group consisting of deuterium, a halogen group, a trialkylsilyl group having 1 to 20 carbon atoms, a haloalkyl group having 1 to 20 carbon atoms, an alkyl group having 1 to 20 carbon atoms, a cycloalkyl group having 3 to 30 carbon atoms and a substituted or unsubstituted heteroaryl group having 2 to 30 carbon atoms; or a heterocyclic group having 2 to 60 carbon atoms unsubstituted or substituted with an alkyl group having 1 to 20 carbon atoms.

According to another embodiment, R101 to R103 are the same as or different from each other, and each independently hydrogen; deuterium; an adamantyl group; a phenyl group unsubstituted or substituted with one or more substituents selected from the group consisting of deuterium, a halogen group, a trialkylsilyl group having 1 to 20 carbon atoms, a haloalkyl group having 1 to 20 carbon atoms, an alkyl group having 1 to 20 carbon atoms, a cycloalkyl group having 3 to 30 carbon atoms, and a heteroaryl group having 2 to 30 carbon atoms unsubstituted or substituted with an alkyl group having 1 to 20 carbon atoms unsubstituted or substituted with deuterium; a biphenyl group unsubstituted or substituted with one or more substituents selected from the group consisting of deuterium, a halogen group, a trialkylsilyl group having 1 to 20 carbon atoms, a haloalkyl group having 1 to 20 carbon atoms, an alkyl group having 1 to 20 carbon atoms, a cycloalkyl group having 3 to 30 carbon atoms, and a heteroaryl group having 2 to 30 carbon atoms unsubstituted or substituted with an alkyl group having 1 to 20 carbon atoms unsubstituted or substituted with deuterium; a terphenyl group unsubstituted or substituted with one or more substituents selected from the group consisting of deuterium, a halogen group, a trialkylsilyl group having 1 to 20 carbon atoms, a haloalkyl group having 1 to 20 carbon atoms, an alkyl group having 1 to 20 carbon atoms, a cycloalkyl group having 3 to 30 carbon atoms, and a heteroaryl group having 2 to carbon atoms unsubstituted or substituted with an alkyl group having 1 to 20 carbon atoms unsubstituted or substituted with deuterium; a naphthyl group unsubstituted or substituted with one or more substituents selected from the group consisting of deuterium, a halogen group, a trialkylsilyl group having 1 to 20 carbon atoms, a haloalkyl group having 1 to 20 carbon atoms, an alkyl group having 1 to 20 carbon atoms, a cycloalkyl group having 3 to 30 carbon atoms, and a heteroaryl group having 2 to 30 carbon atoms unsubstituted or substituted with an alkyl group having 1 to 20 carbon atoms unsubstituted or substituted with deuterium; a fluorenyl group unsubstituted or substituted with one or more substituents selected from the group consisting of deuterium, a halogen group, a trialkylsilyl group having 1 to 20 carbon atoms, a haloalkyl group having 1 to 20 carbon atoms, an alkyl group having 1 to 20 carbon atoms, a cycloalkyl group having 3 to 30 carbon atoms, and a heteroaryl group having 2 to 30 carbon atoms unsubstituted or substituted with an alkyl group having 1 to 20 carbon atoms unsubstituted or substituted with deuterium; a dibenzofuran group unsubstituted or substituted with an alkyl group having 1 to 20 carbon atoms; or a dibenzothiophene group unsubstituted or substituted with an alkyl group having 1 to 20 carbon atoms.

In another embodiment, R101 to R103 are the same as or different from each other, and each independently hydrogen; deuterium; a cycloalkyl group having 3 to 60 carbon atoms; an aryl group having 6 to 60 carbon atoms unsubstituted or substituted with one or more substituents selected from the group consisting of deuterium, fluorine (—F), a trimethylsilyl group, a trifluoromethyl group, a methyl group, a butyl group, an adamantyl group, a pyridyl group unsubstituted or substituted with a methyl group, and a pyridyl group substituted with a methyl group substituted with deuterium; or a heterocyclic group having 2 to 60 carbon atoms unsubstituted or substituted with a butyl group.

According to another embodiment, R101 to R103 are the same as or different from each other, and each independently hydrogen; deuterium; an adamantyl group; a phenyl group unsubstituted or substituted with one or more substituents selected from the group consisting of fluorine (—F), a trimethylsilyl group, a trifluoromethyl group, a methyl group, a butyl group, an adamantyl group, a pyridyl group unsubstituted or substituted with a methyl group, and a pyridyl group substituted with a methyl group substituted with deuterium; a biphenyl group unsubstituted or substituted with one or more substituents selected from the group consisting of fluorine (—F), a trimethylsilyl group, a trifluoromethyl group, a methyl group, a butyl group, an adamantyl group, a pyridyl group unsubstituted or substituted with a methyl group, and a pyridyl group substituted with a methyl group substituted with deuterium; a terphenyl group unsubstituted or substituted with one or more substituents selected from the group consisting of fluorine (—F), a trimethylsilyl group, a trifluoromethyl group, a methyl group, a butyl group, an adamantyl group, a pyridyl group unsubstituted or substituted with a methyl group, and a pyridyl group substituted with a methyl group substituted with deuterium; a naphthyl group unsubstituted or substituted with one or more substituents selected from the group consisting of fluorine (—F), a trimethylsilyl group, a trifluoromethyl group, a methyl group, a butyl group, an adamantyl group, a pyridyl group unsubstituted or substituted with a methyl group, and a pyridyl group substituted with a methyl group substituted with deuterium; a fluorenyl group unsubstituted or substituted with one or more substituents selected from the group consisting of fluorine (—F), a trimethylsilyl group, a trifluoromethyl group, a methyl group, a butyl group, an adamantyl group, a pyridyl group unsubstituted or substituted with a methyl group, and a pyridyl group substituted with a methyl group substituted with deuterium; a dibenzofuran group unsubstituted or substituted with a butyl group; or a dibenzothiophene group unsubstituted or substituted with a butyl group.

According to one embodiment of the present specification, Ar101 to Ar106 are the same as or different from each other, and each independently hydrogen; deuterium; a halogen group; a cyano group; a substituted or unsubstituted silyl group; a substituted or unsubstituted boron group; a substituted or unsubstituted alkyl group having 1 to 40 carbon atoms; a substituted or unsubstituted cycloalkyl group having 3 to 60 carbon atoms; a substituted or unsubstituted amine group; a substituted or unsubstituted aryl group having 6 to 60 carbon atoms; or a substituted or unsubstituted heterocyclic group having 2 to 60 carbon atoms.

In another embodiment, Ar101 to Ar106 are the same as or different from each other, and each independently hydrogen; deuterium; a substituted or unsubstituted alkyl group having 1 to 40 carbon atoms; or a substituted or unsubstituted arylamine group having 6 to 60 carbon atoms.

According to another embodiment, Ar101 to Ar106 are the same as or different from each other, and each independently hydrogen; deuterium; a substituted or unsubstituted alkyl group having 1 to 20 carbon atoms; or a substituted or unsubstituted arylamine group having 6 to 30 carbon atoms.

In another embodiment, Ar101 to Ar106 are the same as or different from each other, and each independently hydrogen; deuterium; an alkyl group having 1 to 20 carbon atoms; or an arylamine group having 6 to 30 carbon atoms unsubstituted or substituted with deuterium.

In another embodiment, Ar101 to Ar106 are the same as or different from each other, and each independently hydrogen; deuterium; a methyl group; a butyl group; or a diphenylamine group unsubstituted or substituted with deuterium.

According to one embodiment of the present specification, m1 to m6 are each 0 or 1.

In one embodiment of the present specification, R1 and R2 are the same as or different from each other, and each independently a substituted or unsubstituted alkyl group having 1 to 20 carbon atoms; or a substituted or unsubstituted aryl group having 6 to 30 carbon atoms.

In another embodiment, R1 and R2 are the same as or different from each other, and each independently an alkyl group having 1 to 20 carbon atoms; or an aryl group having 6 to 30 carbon atoms.

According to another embodiment, R1 and R2 are the same as or different from each other, and each independently a methyl group; or a phenyl group.

In another embodiment, R1 and R2 are each a phenyl group.

In another embodiment, R1 and R2 are each a methyl group.

In another embodiment, any one of R1 and R2 is a methyl group, and the other one is a phenyl group.

In one embodiment of the present specification, the compound of Chemical Formula 1 may be any one of the following structures.

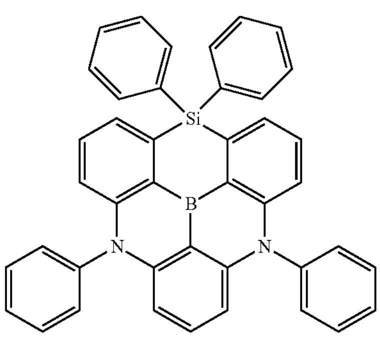

-continued

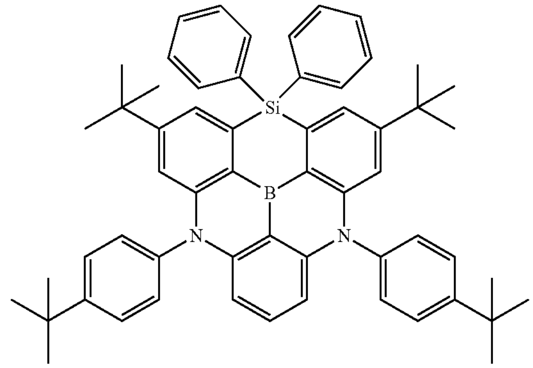

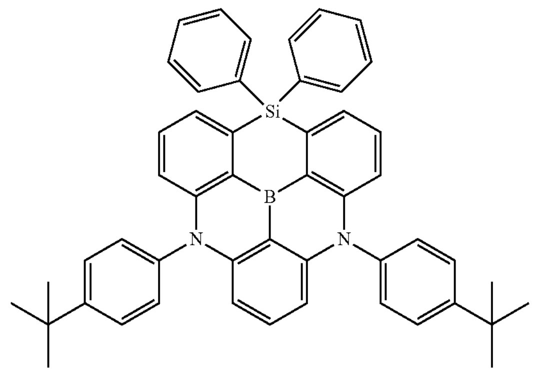

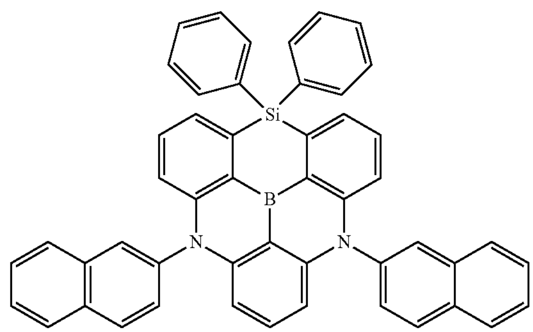

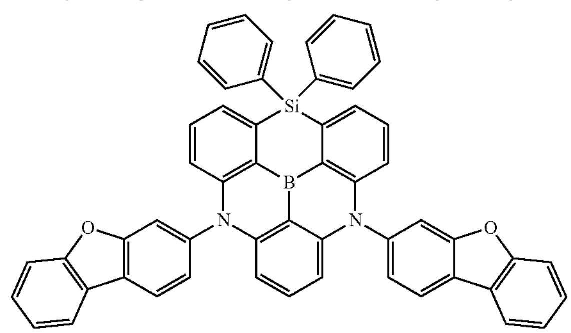

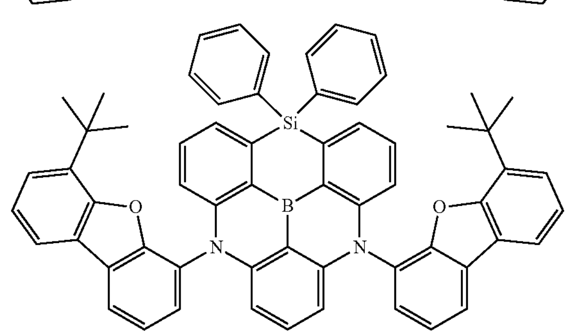

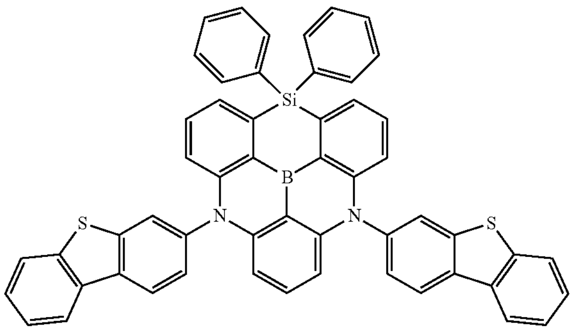
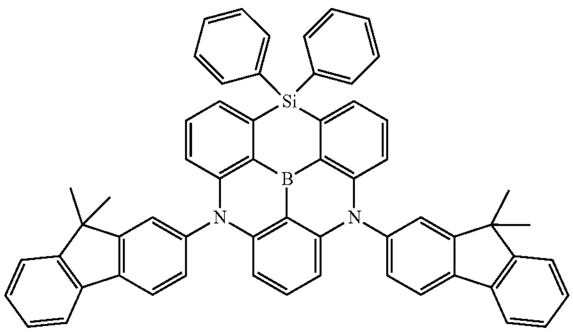
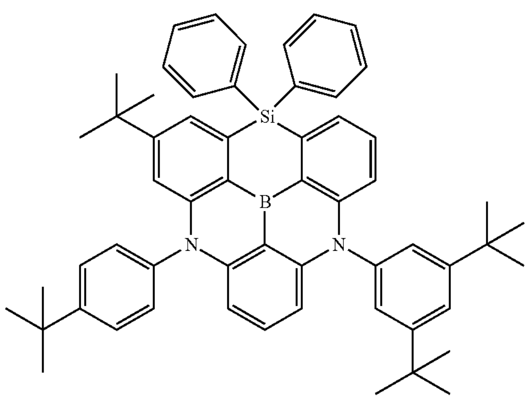
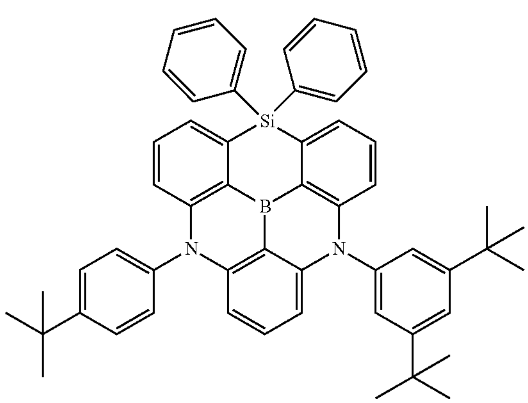
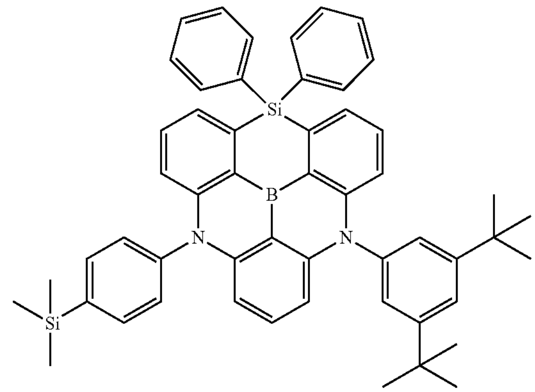
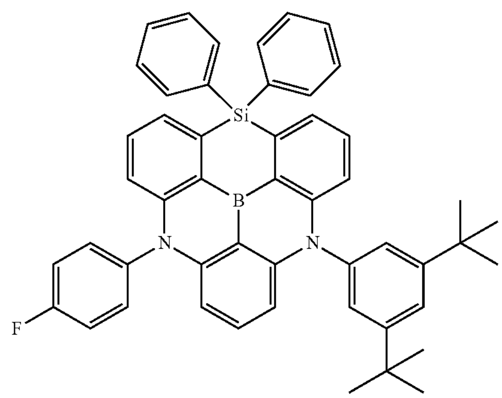
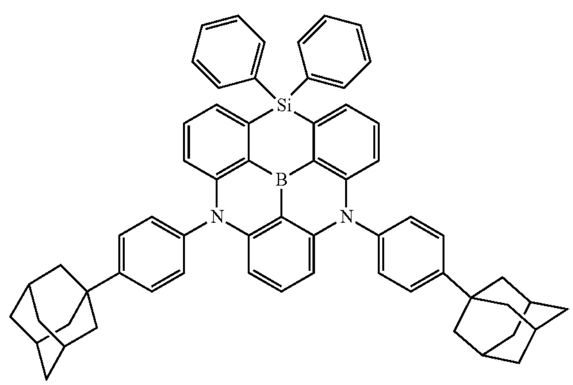
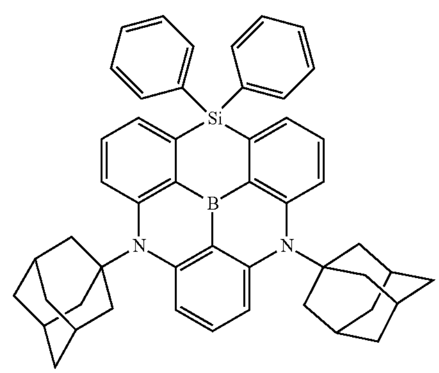

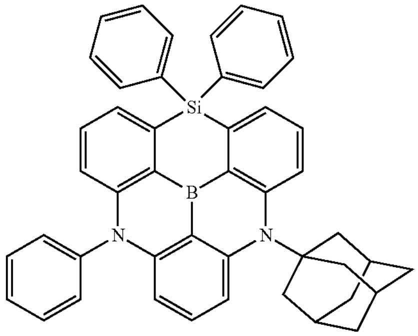
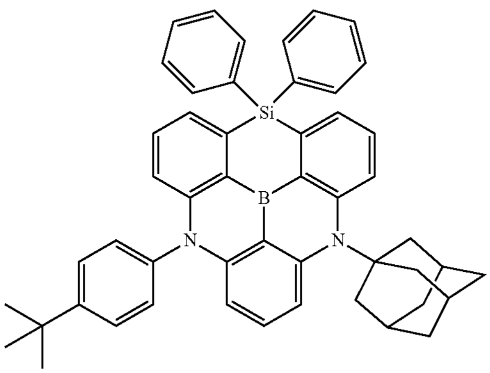
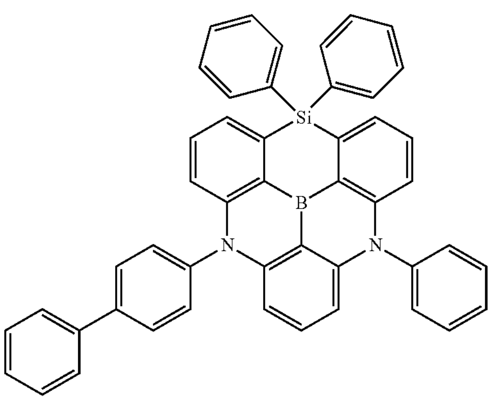
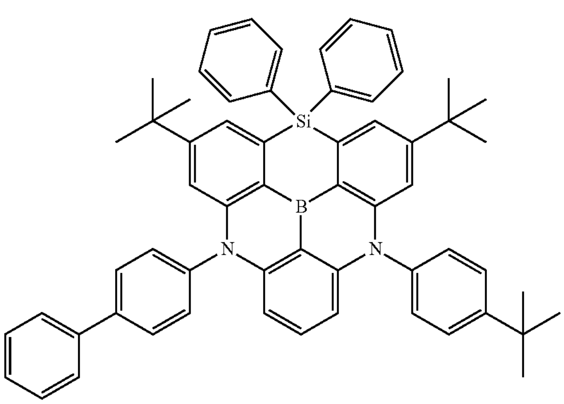
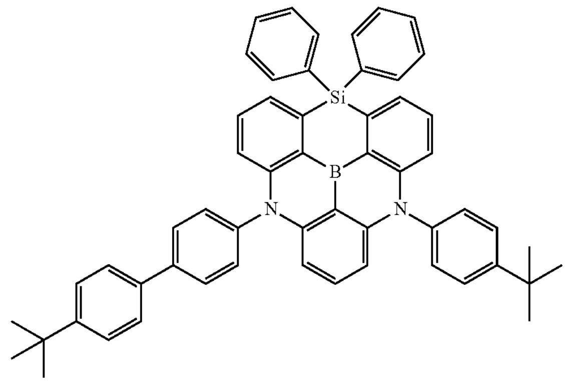
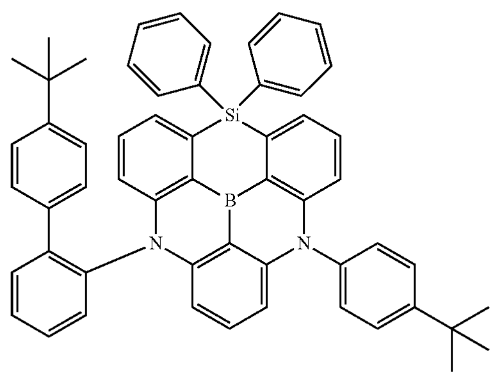
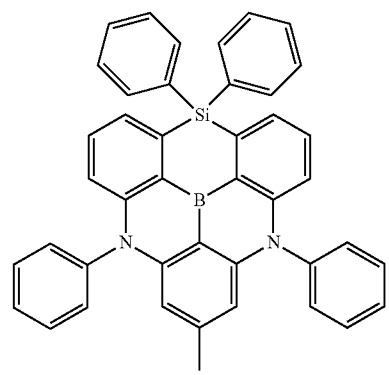
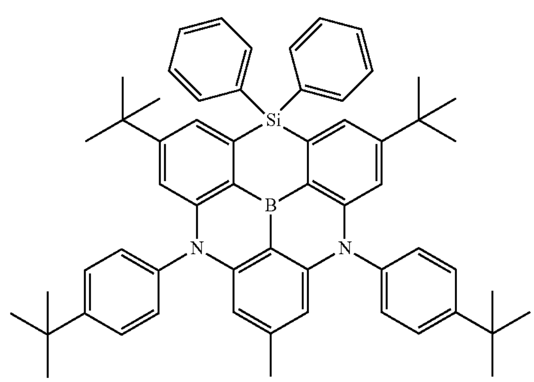

-continued
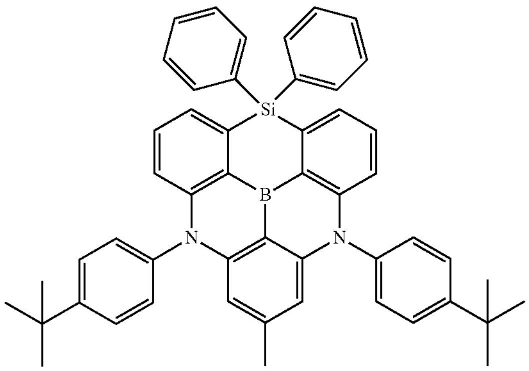
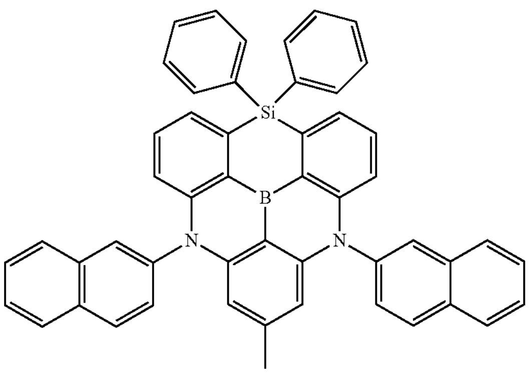
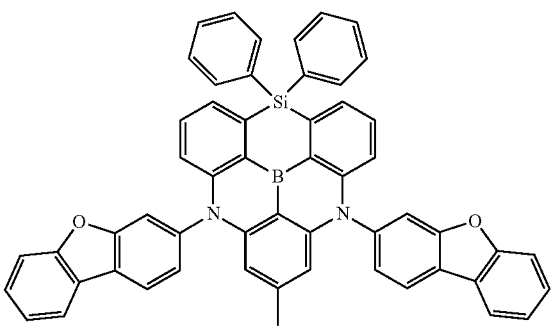
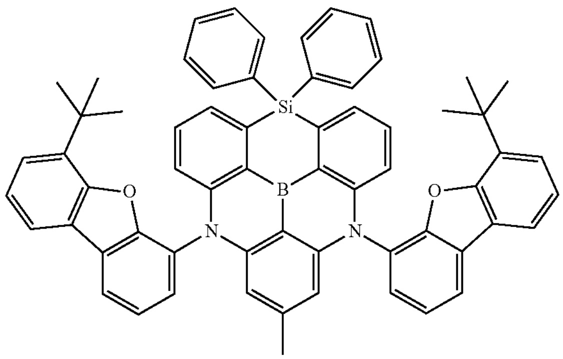
-continued
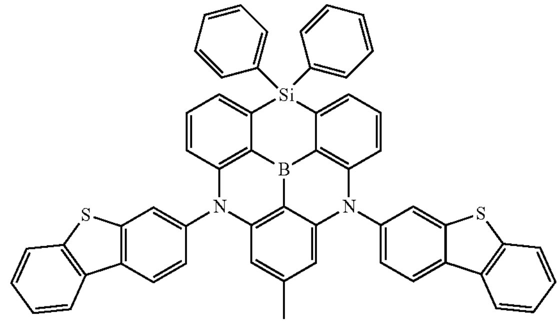
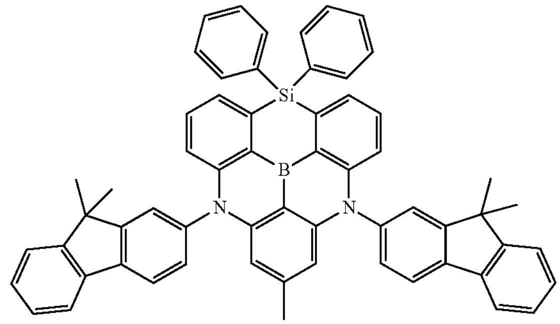
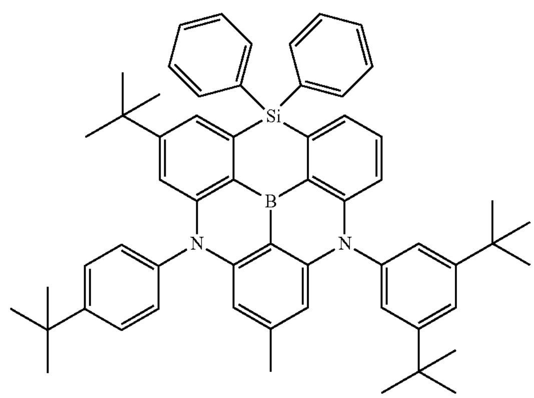
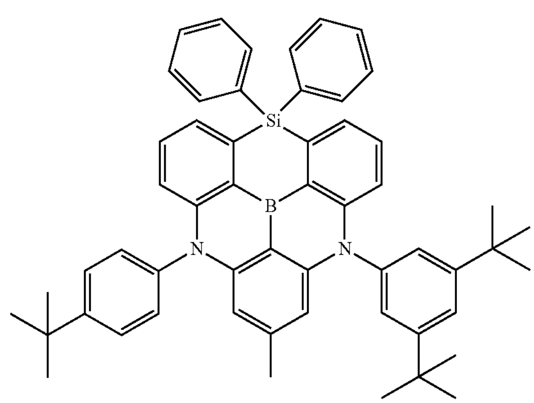

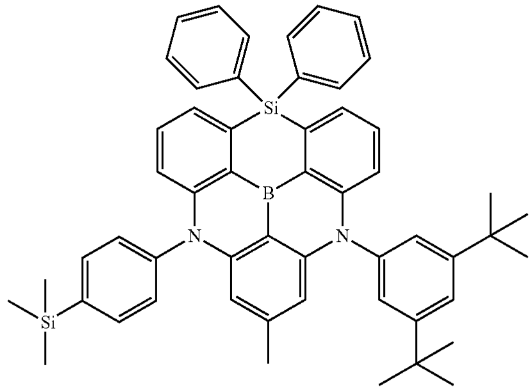
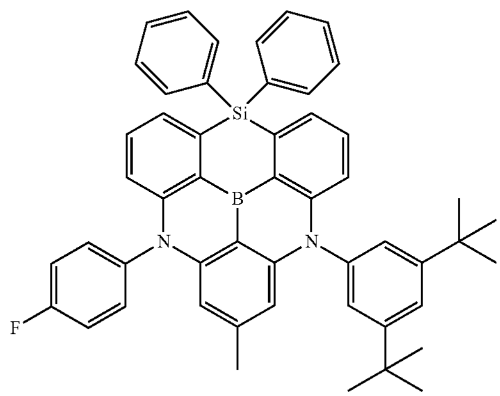
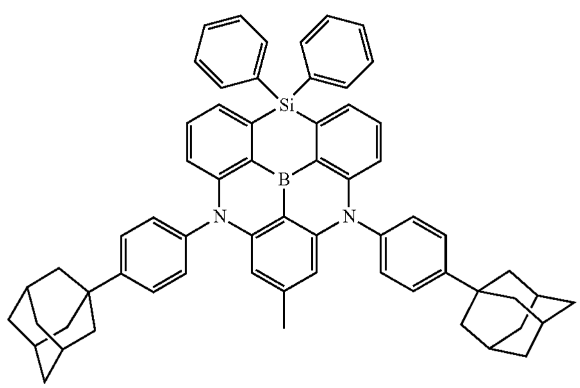
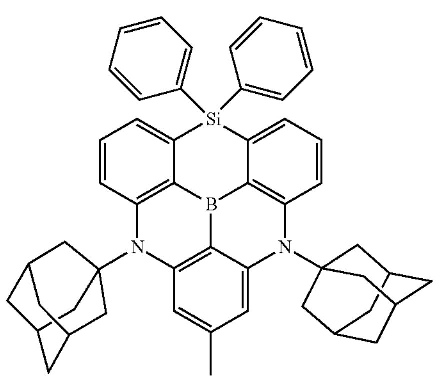
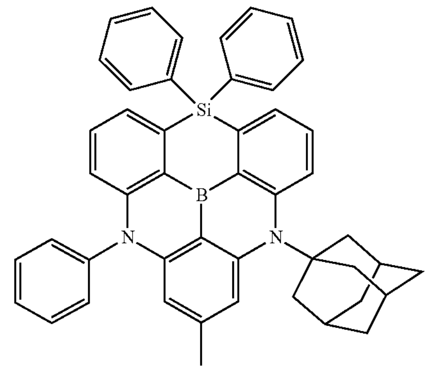
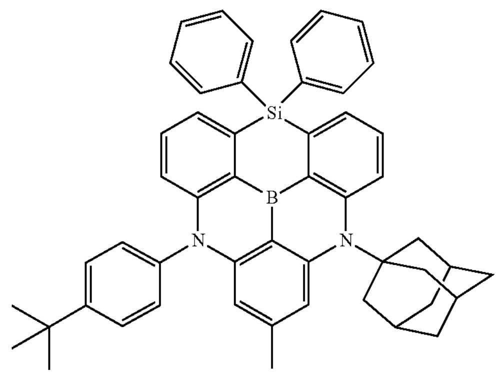
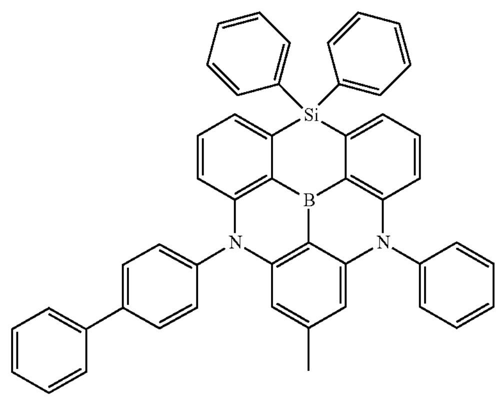
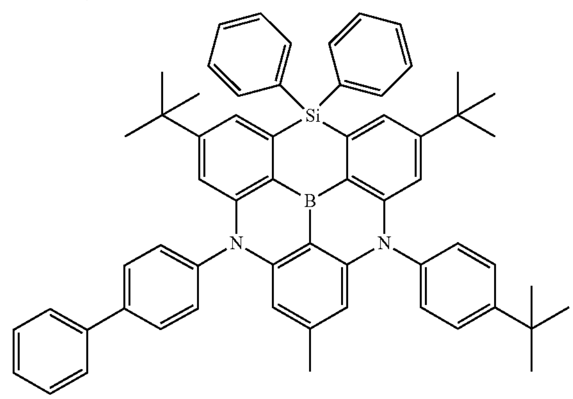

-continued
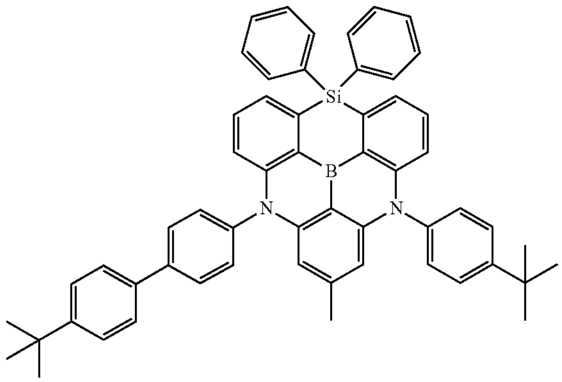
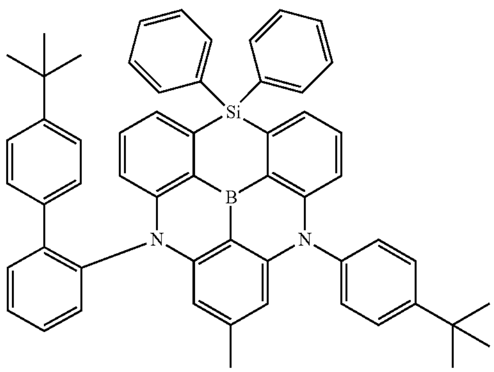
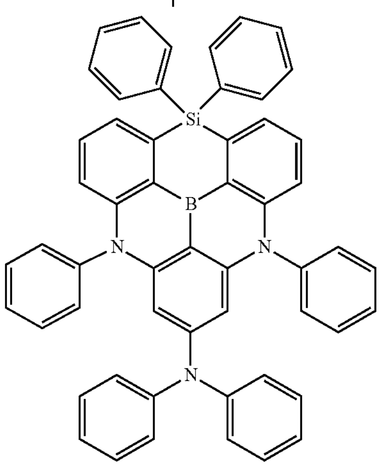
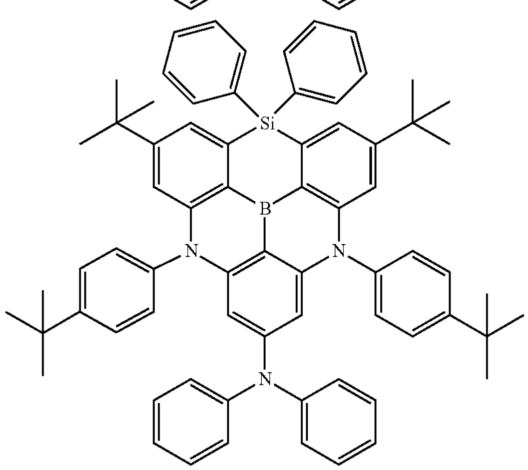
-continued
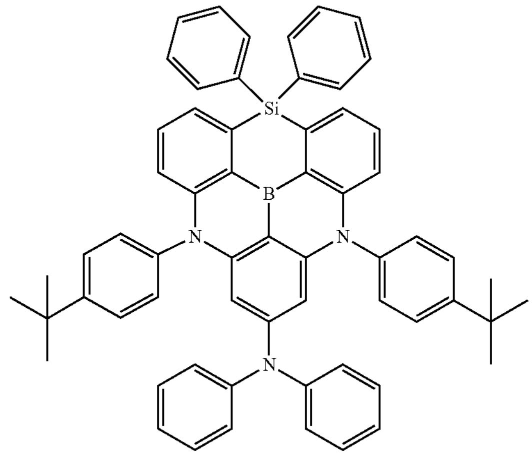
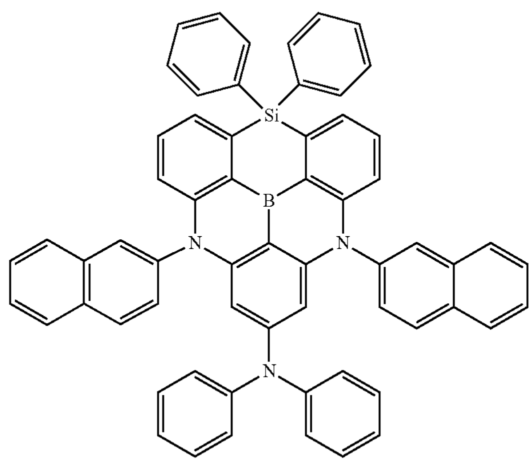
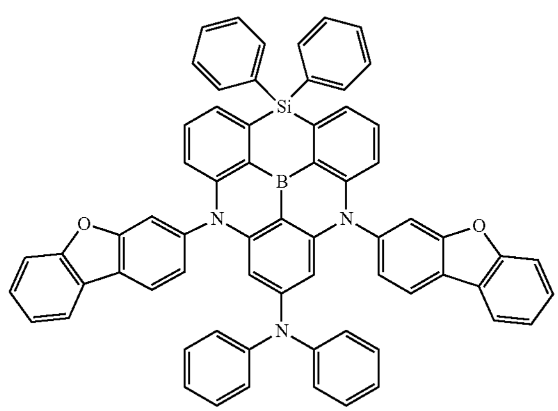

-continued
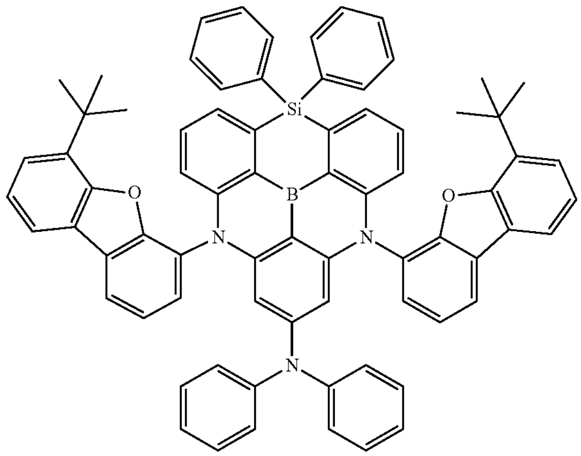
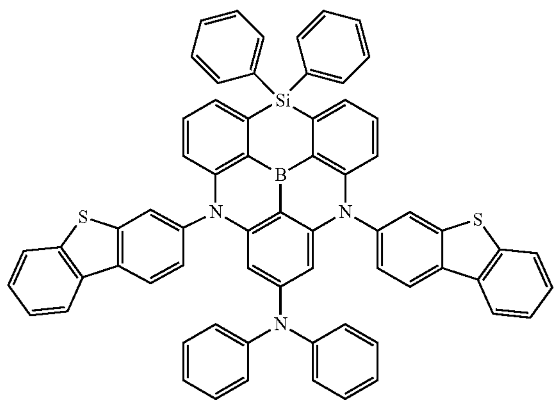
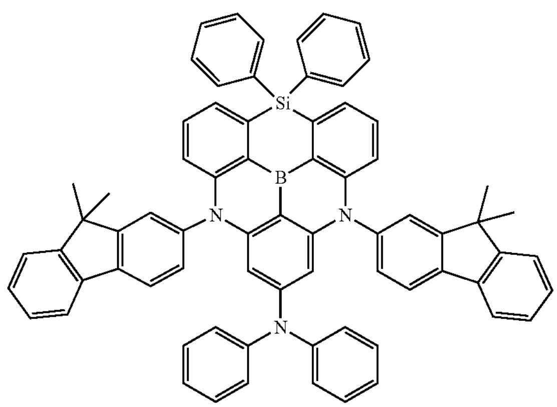
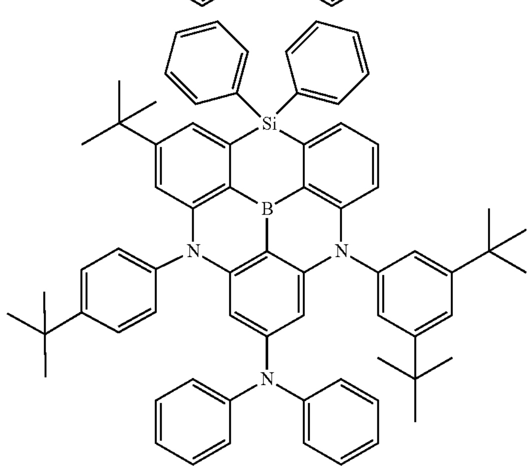
-continued
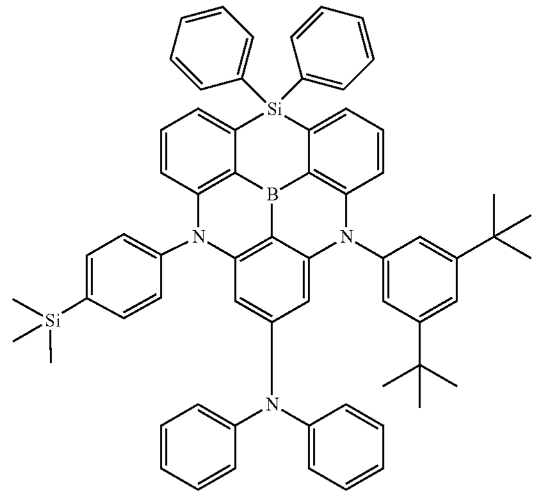
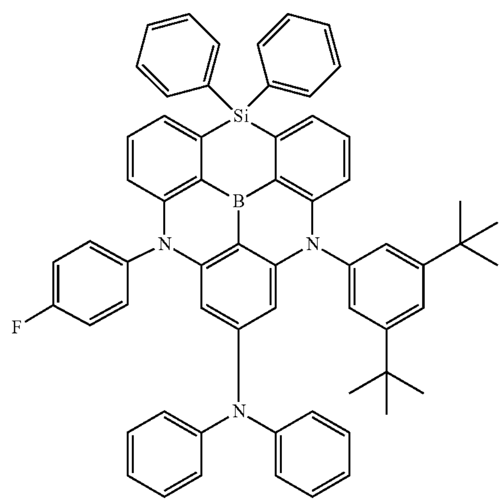
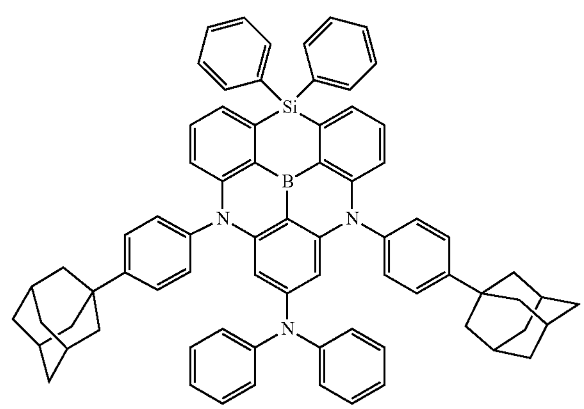

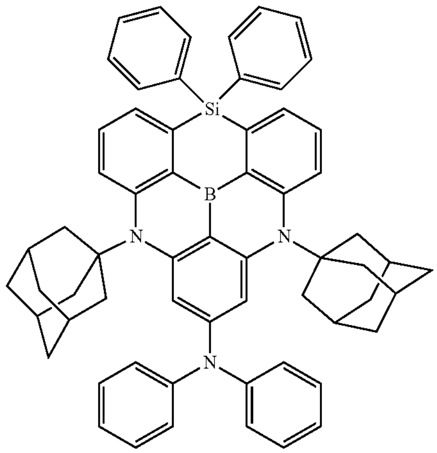
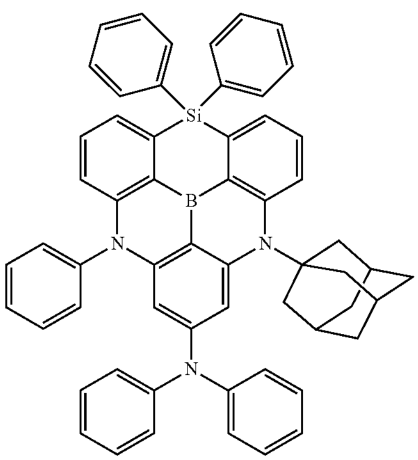
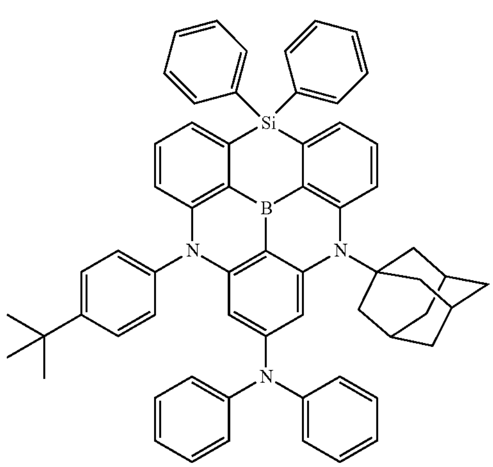
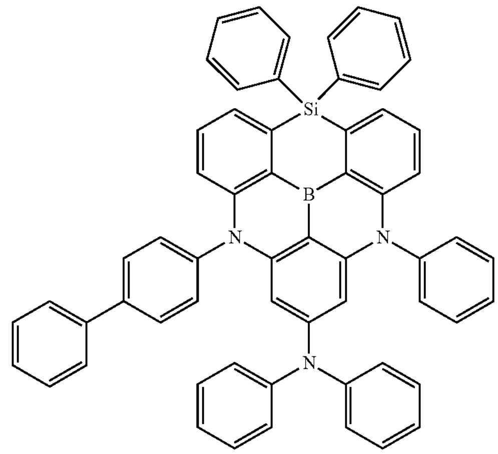
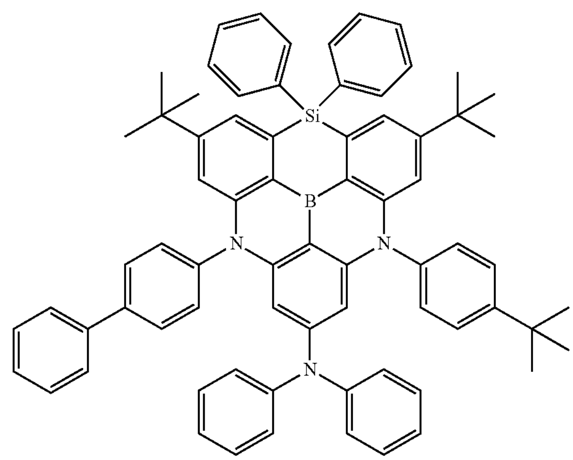
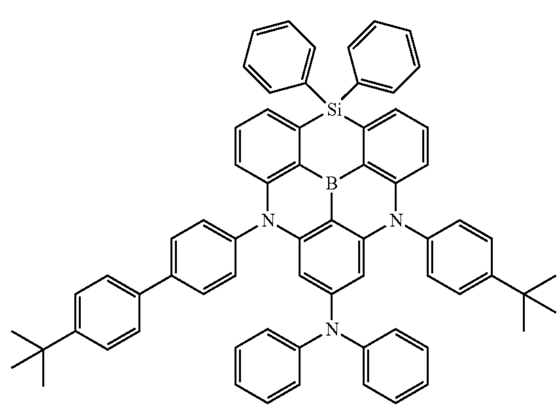

-continued
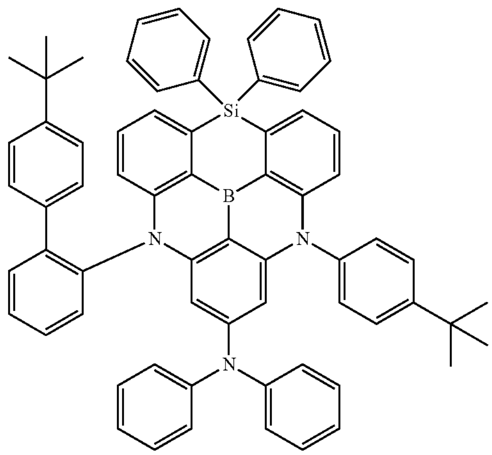
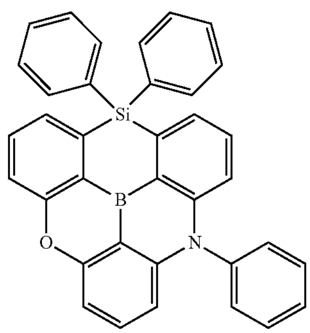
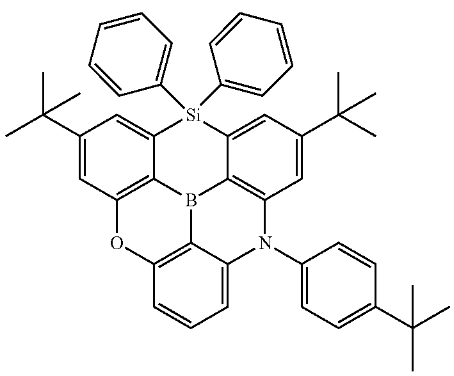
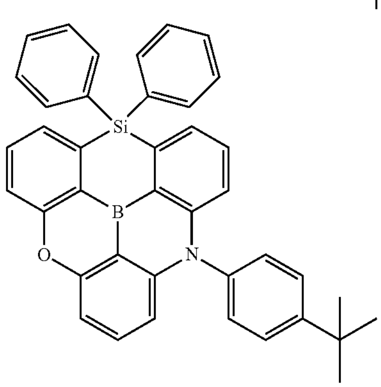
-continued
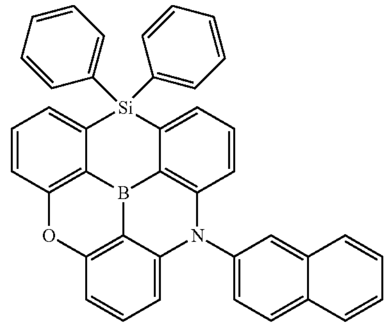
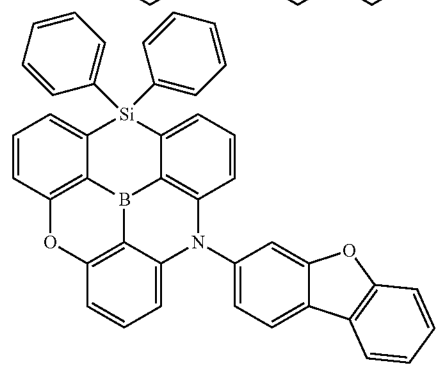
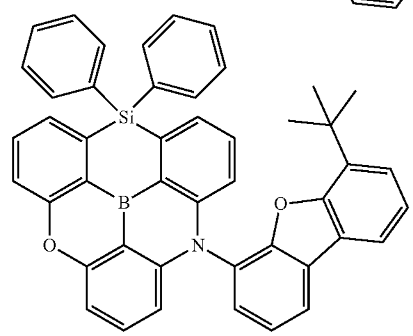
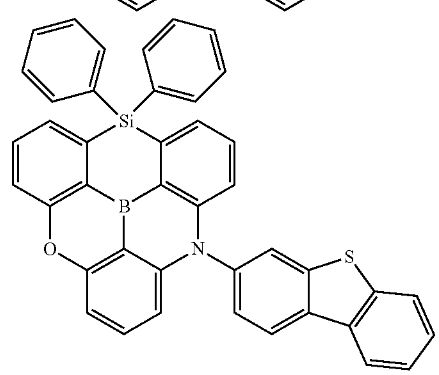
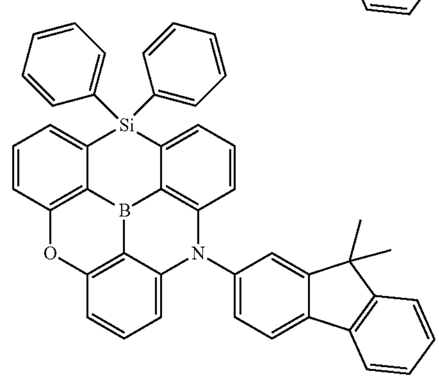

-continued
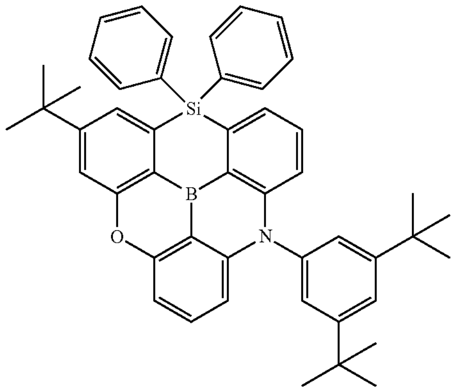
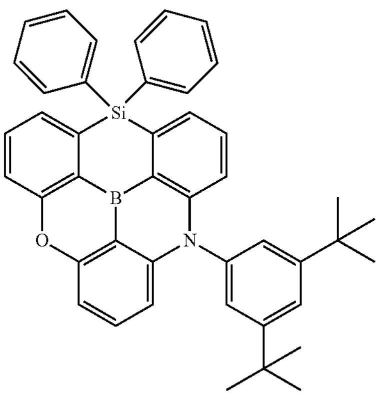
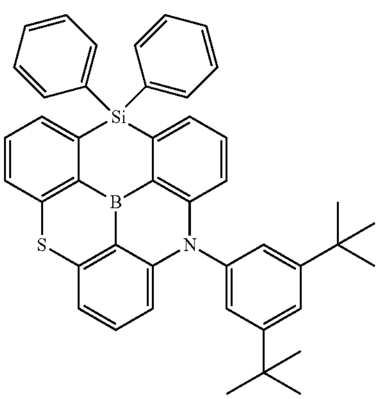
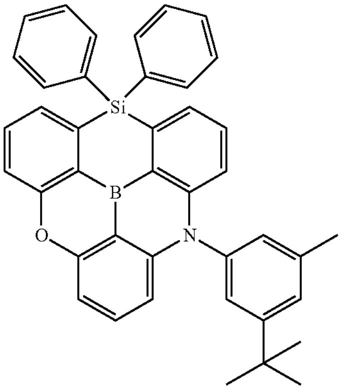
-continued
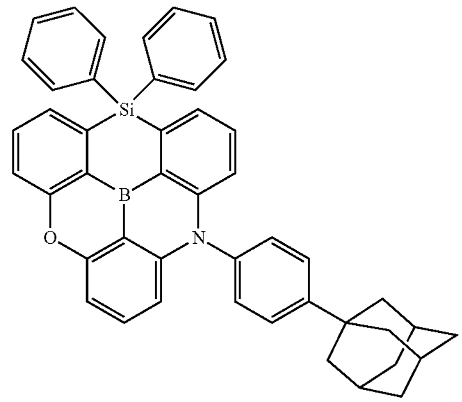
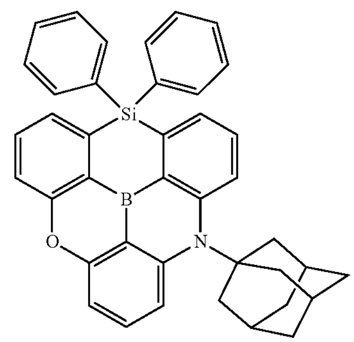
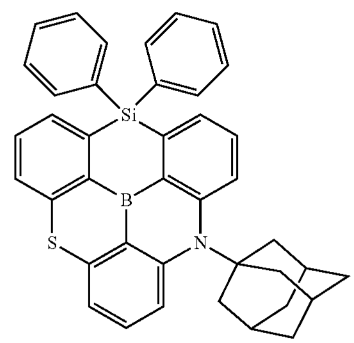
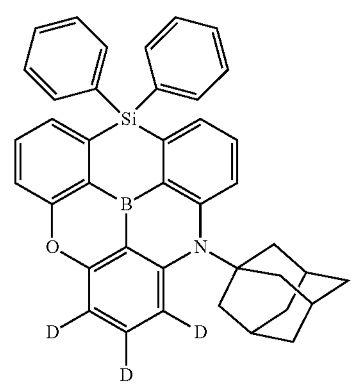

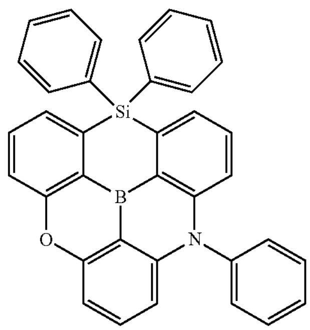
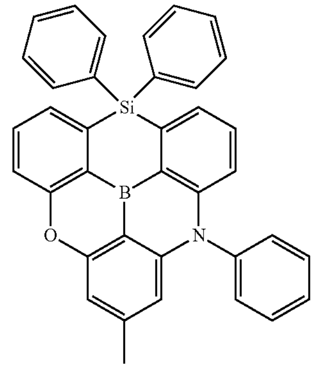
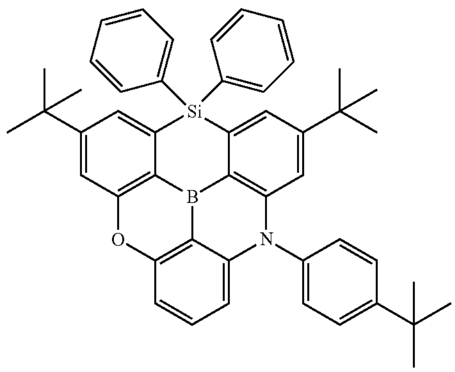
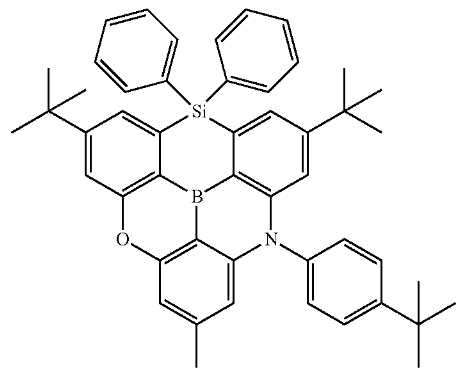
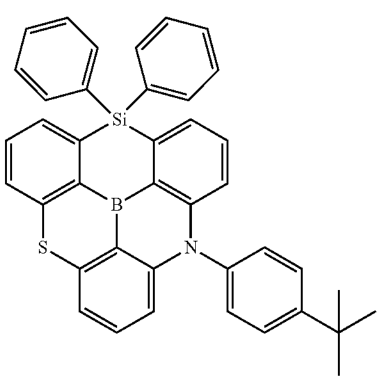
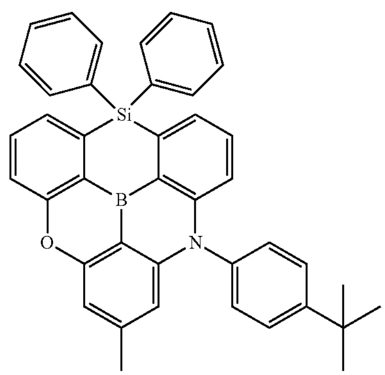
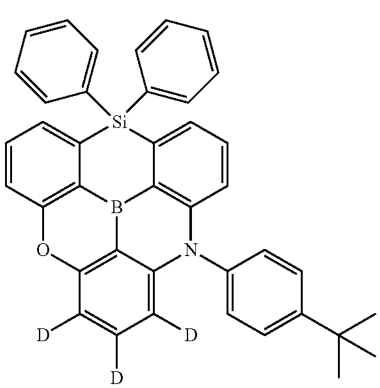
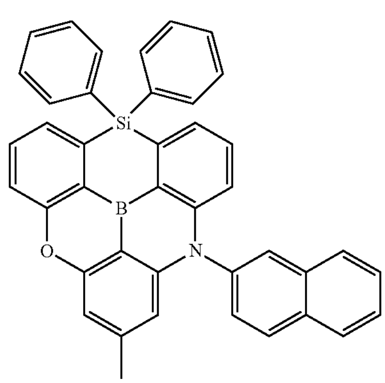
D
D
D

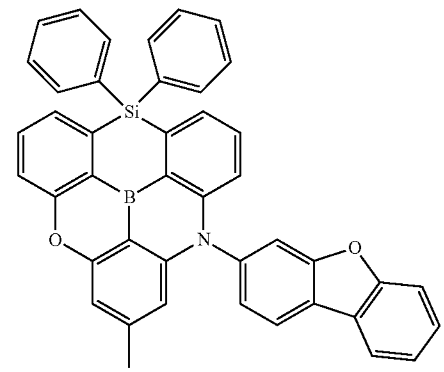
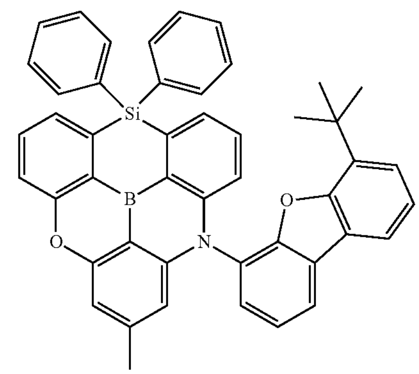
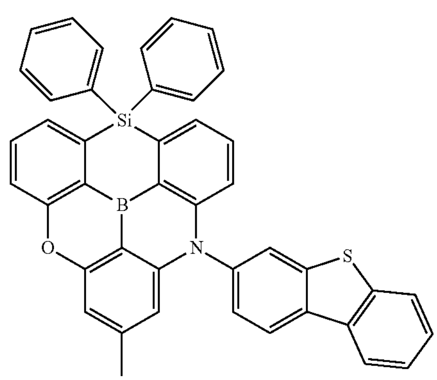
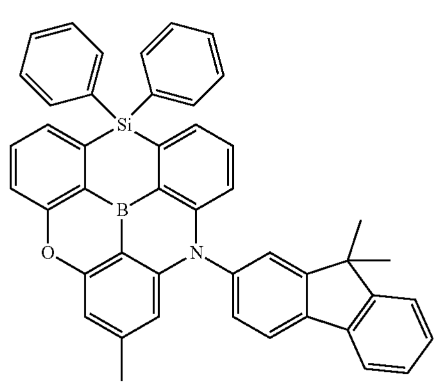
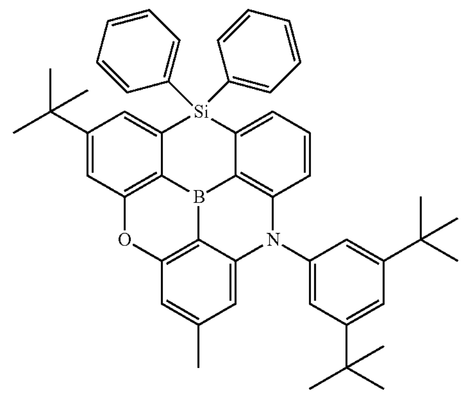
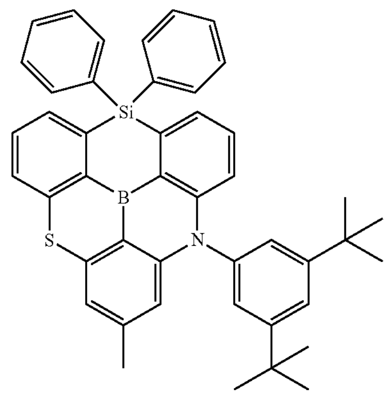
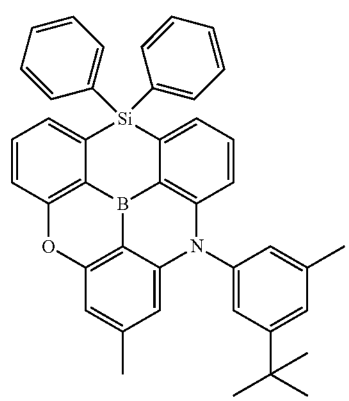
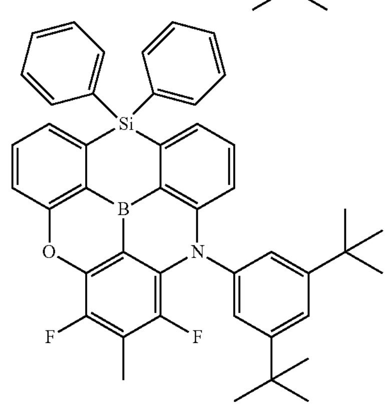

-continued
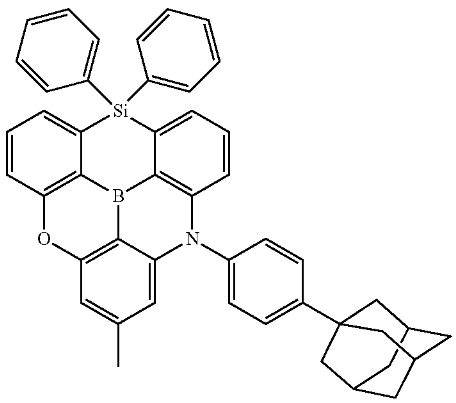
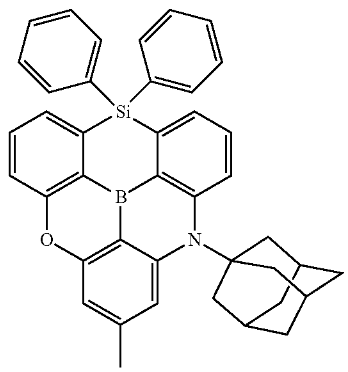
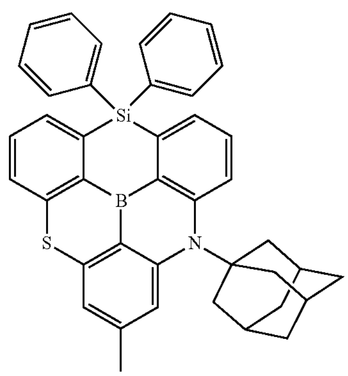
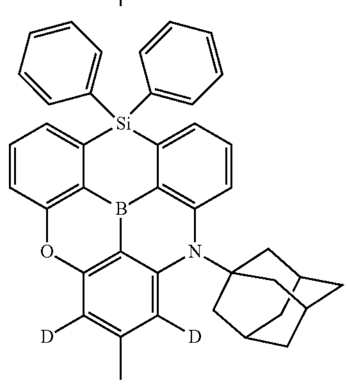
-continued
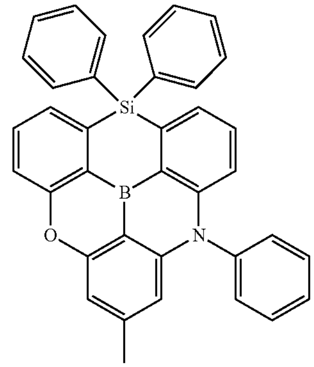
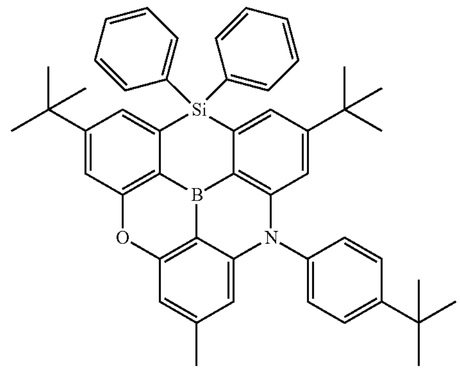
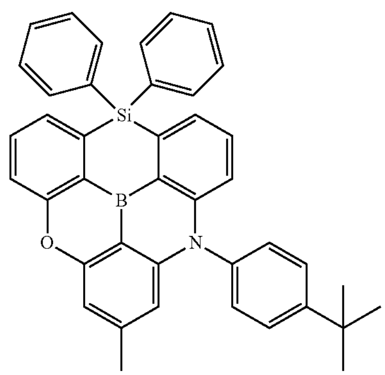
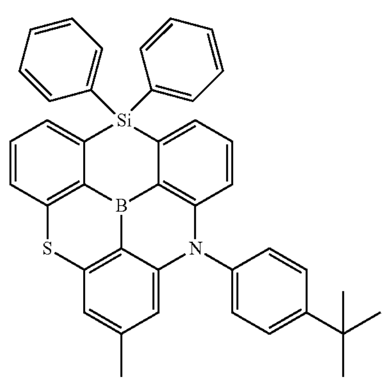

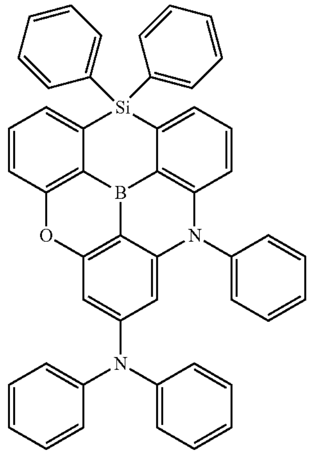
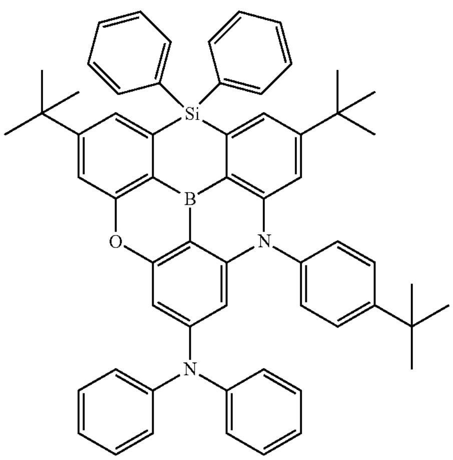
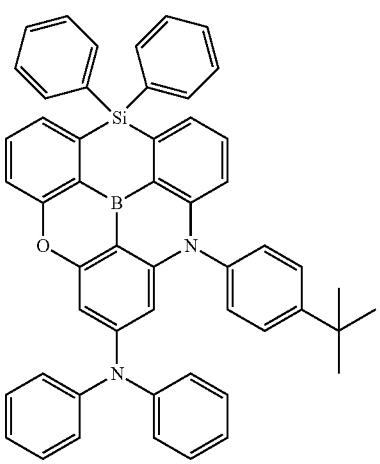
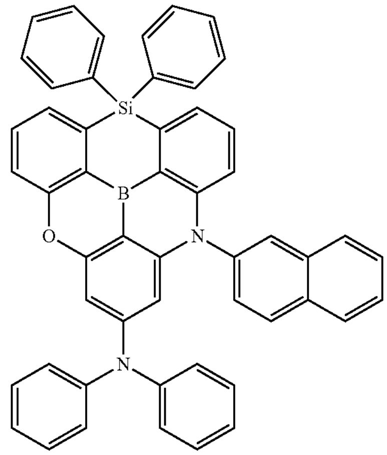
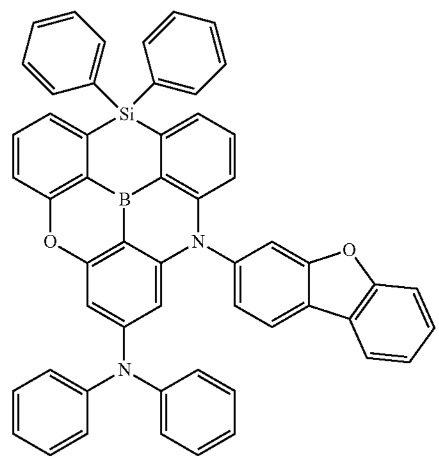
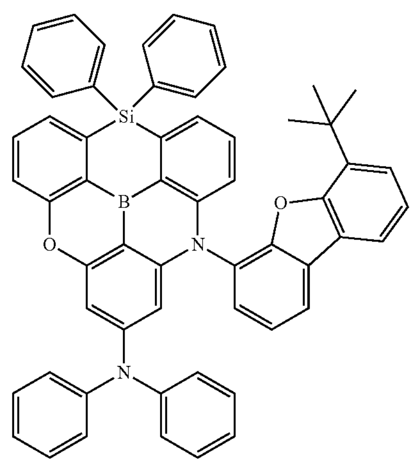

-continued
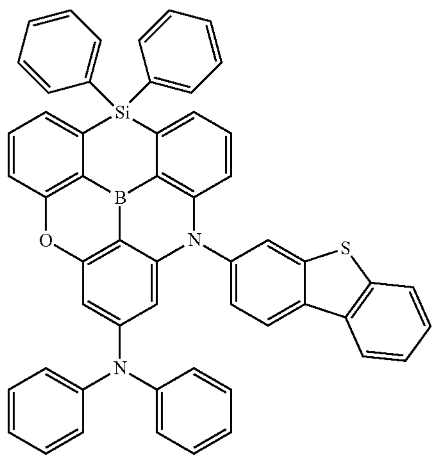
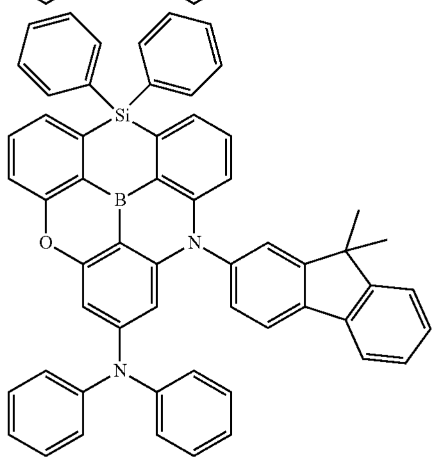
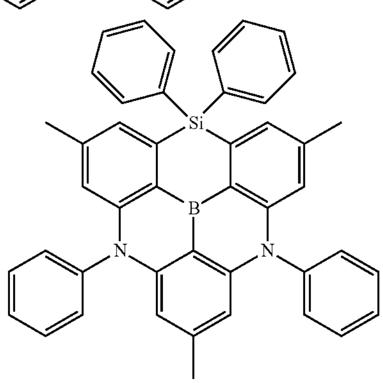
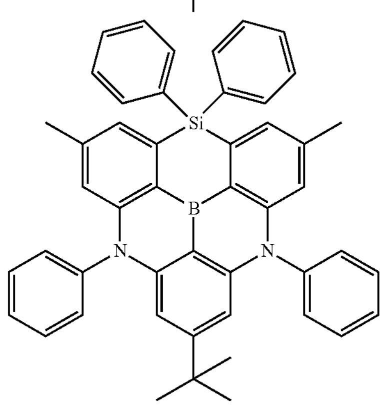
-continued
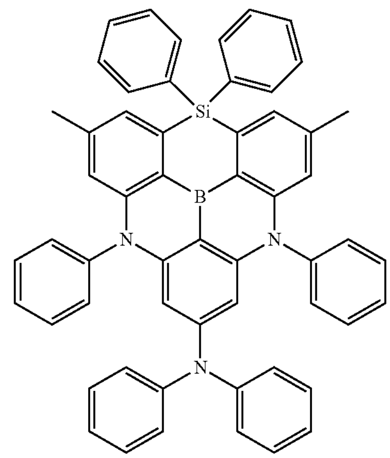
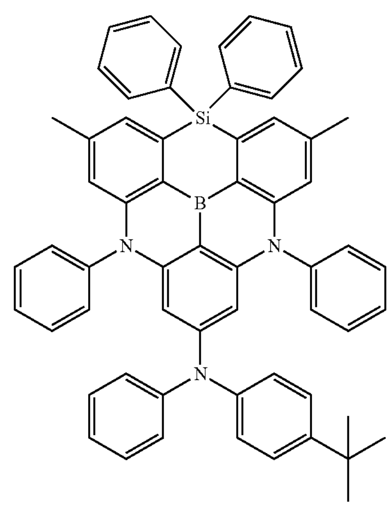
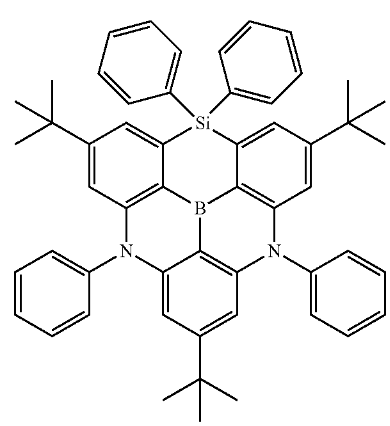

-continued
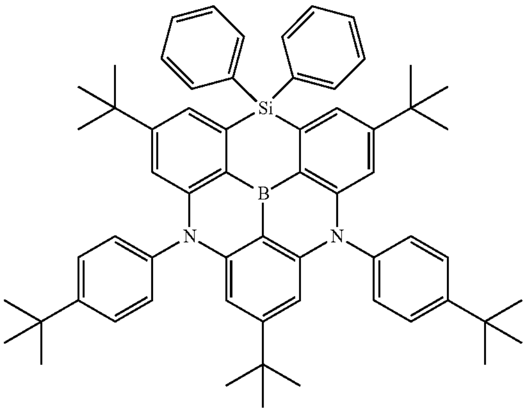
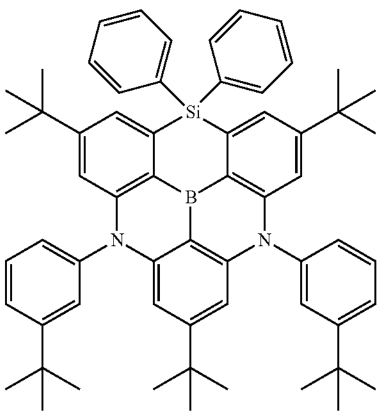
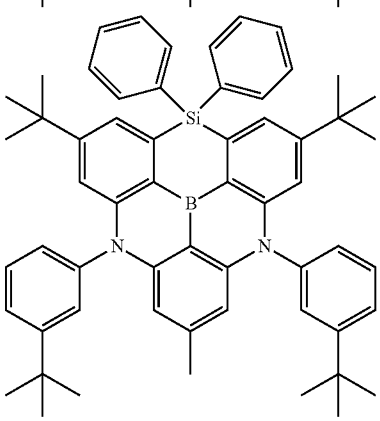
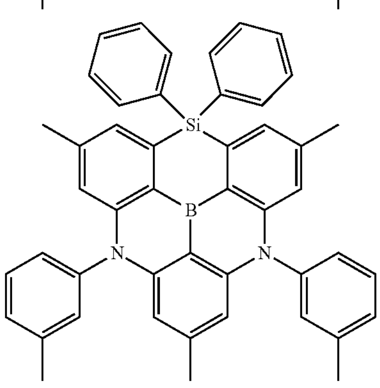
-continued
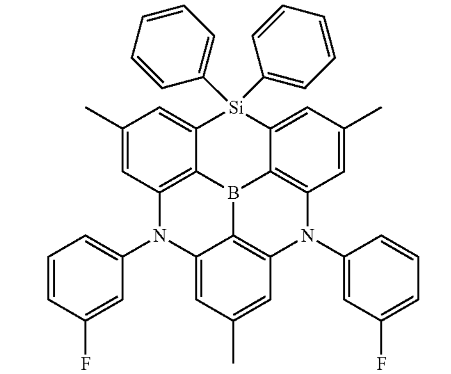
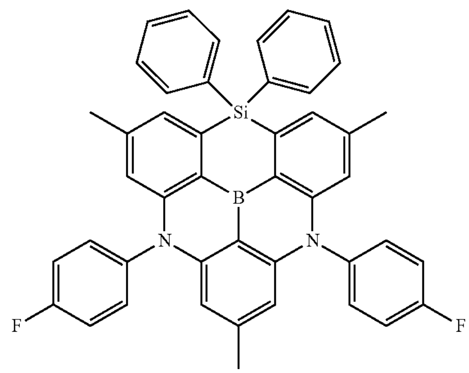
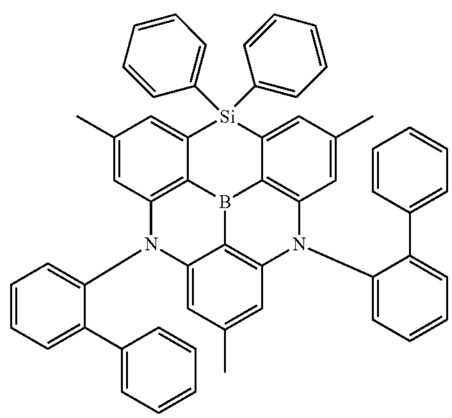
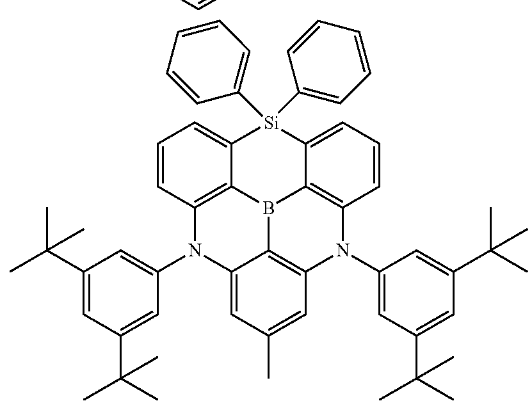

-continued
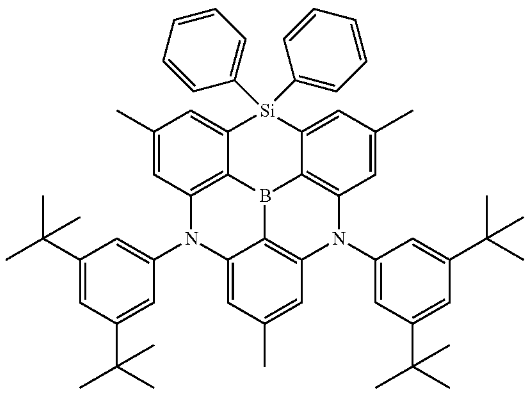
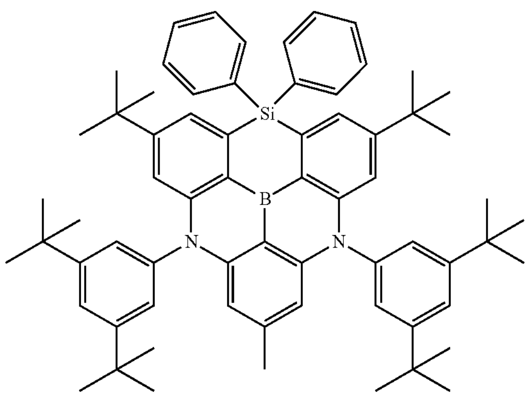
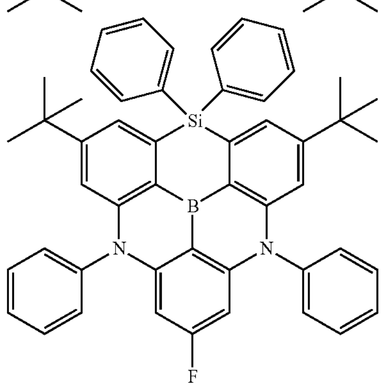
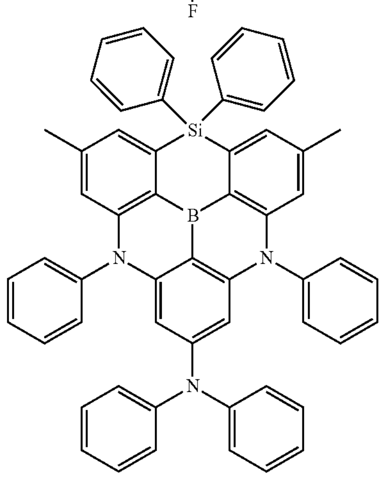
-continued
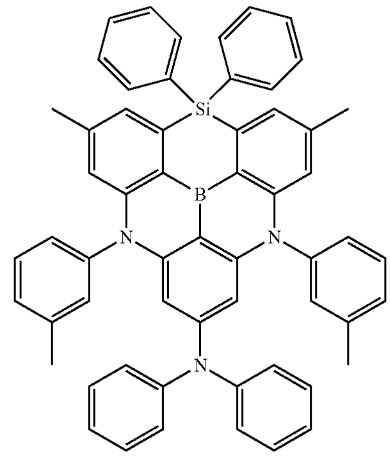
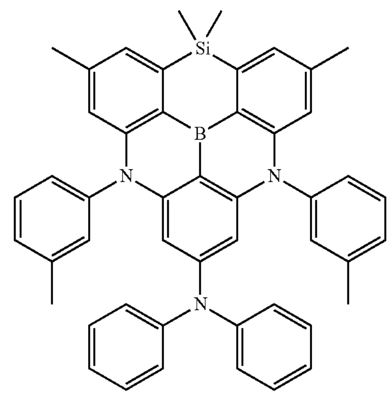
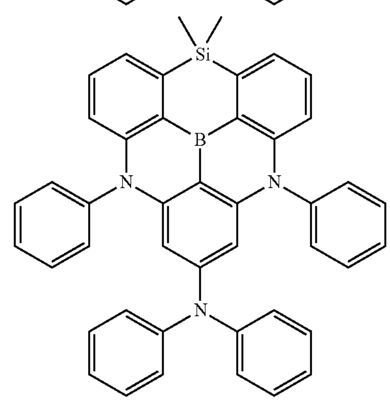
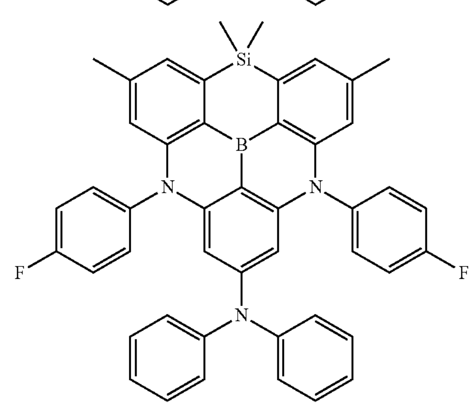

-continued
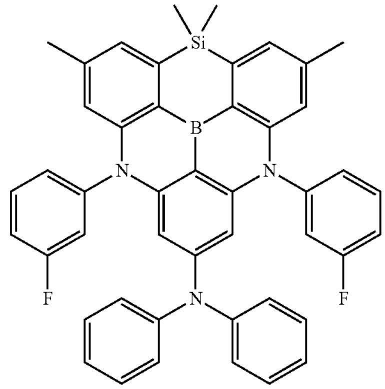
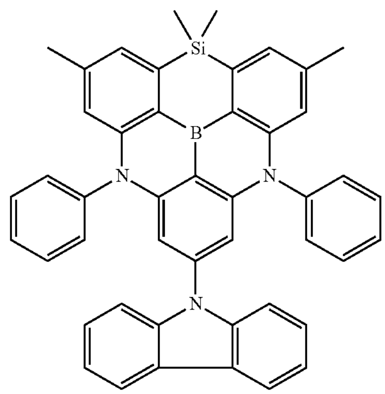
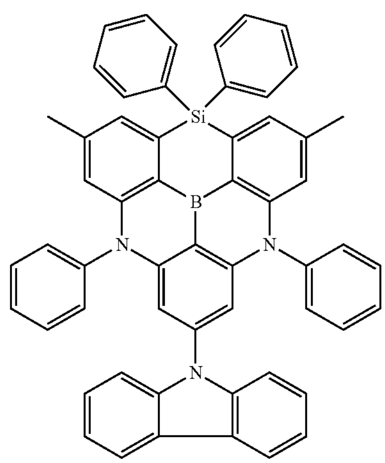
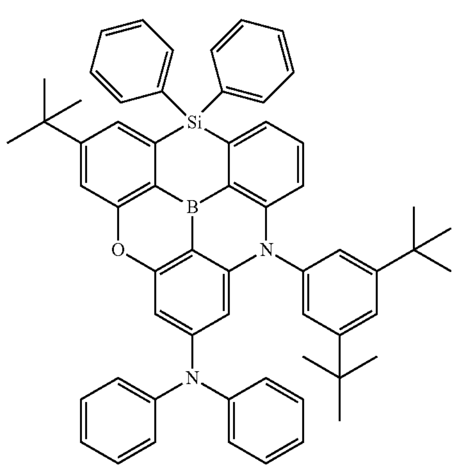
-continued
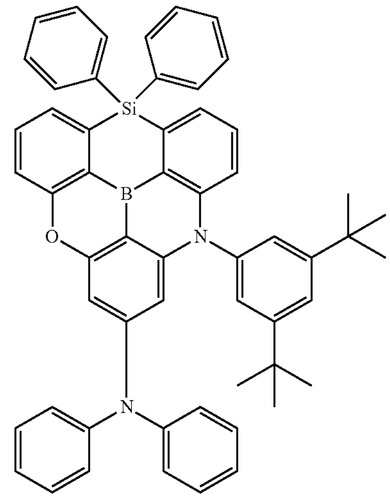
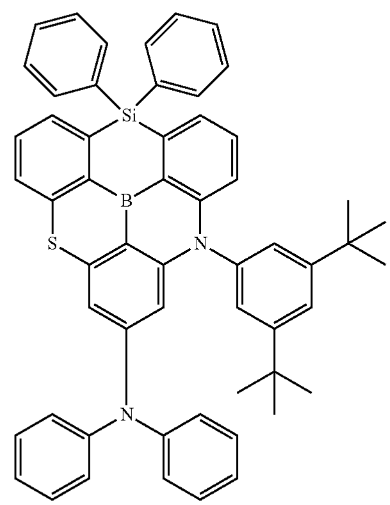
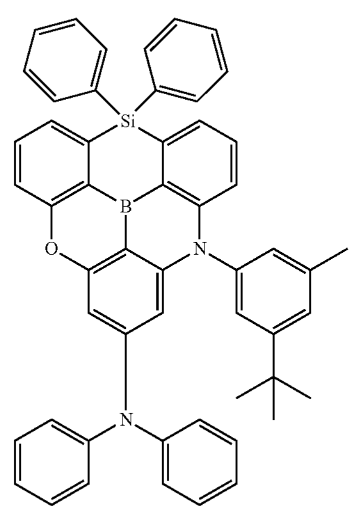

-continued
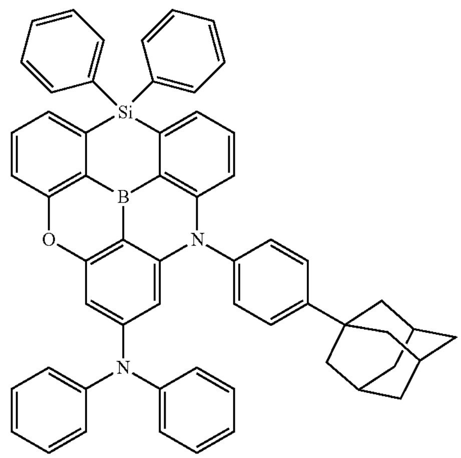
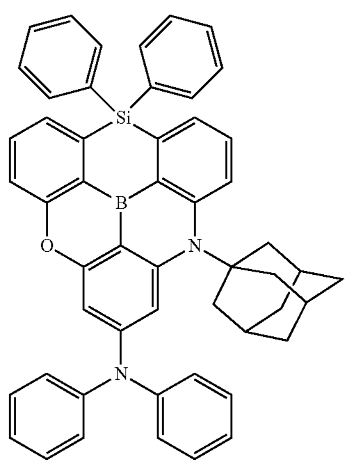
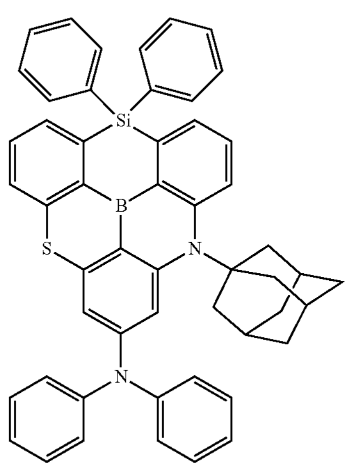
-continued
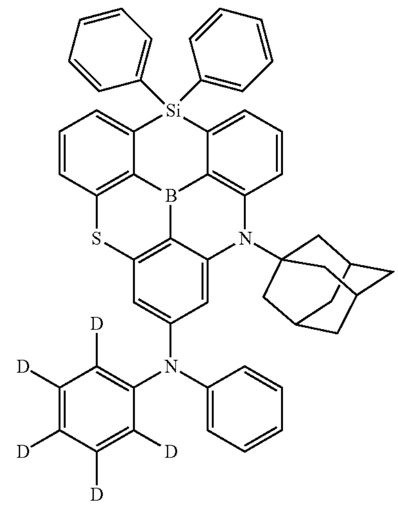
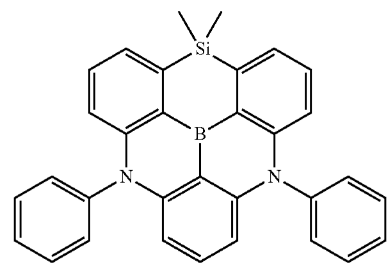
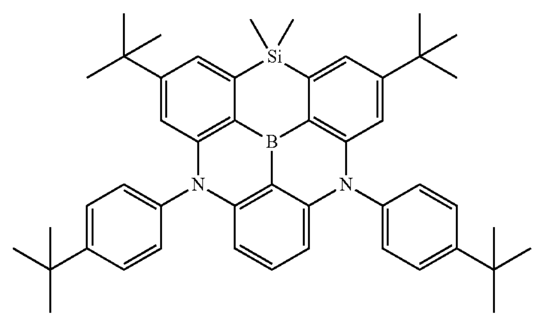
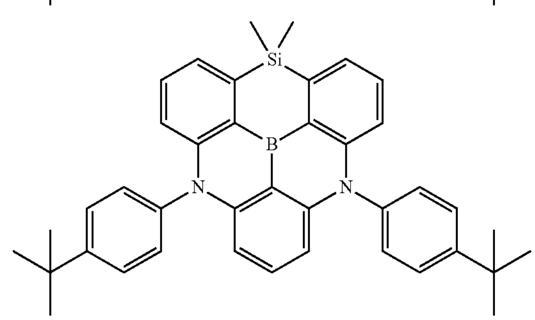
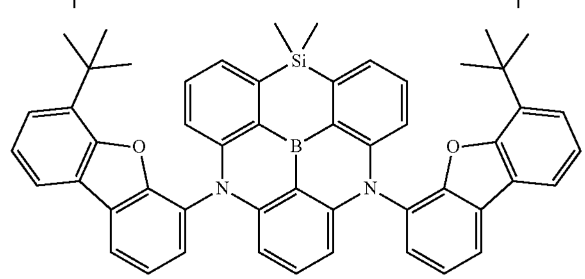

-continued
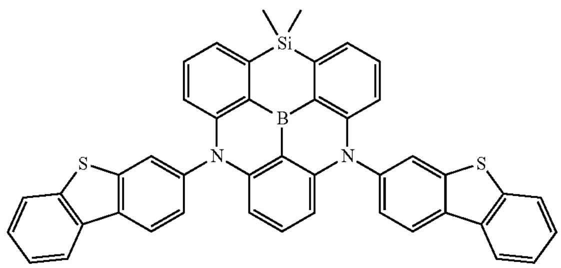
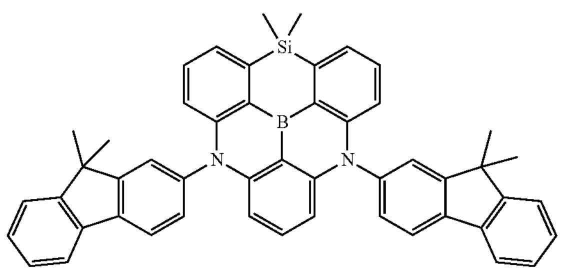
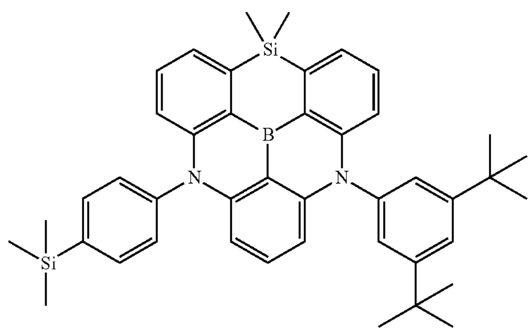
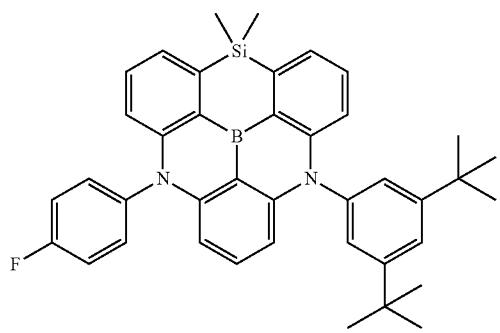
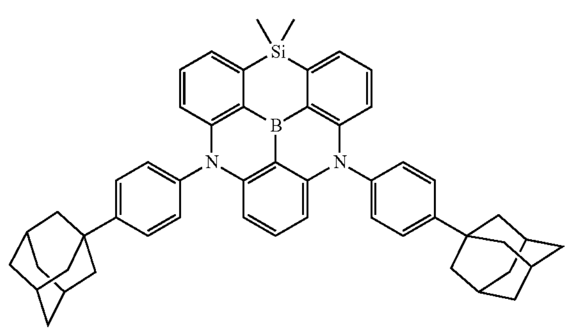
-continued
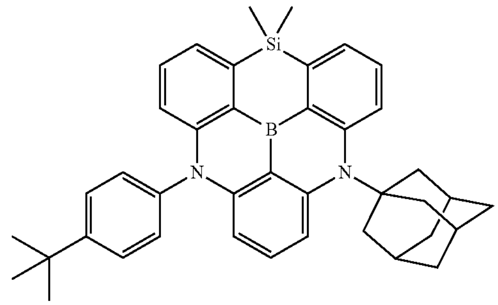
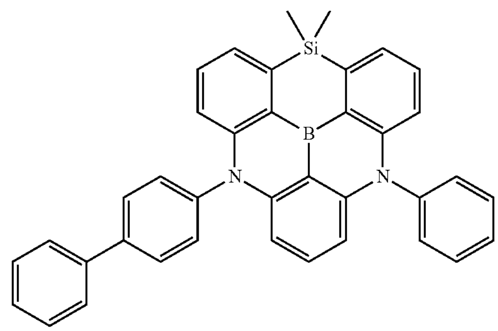
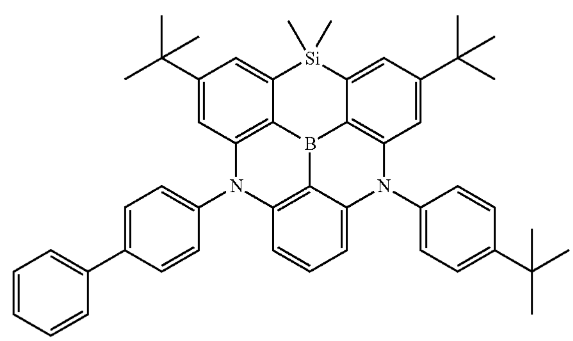
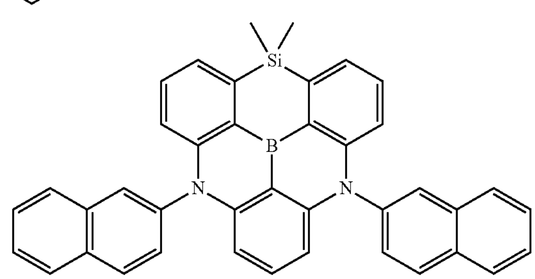
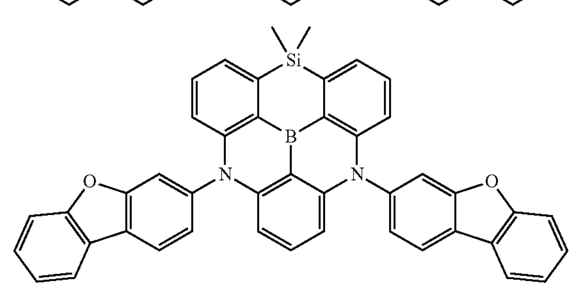

-continued
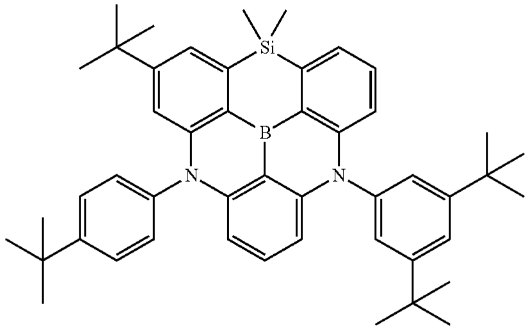
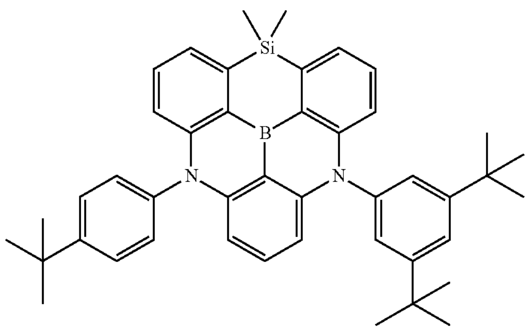
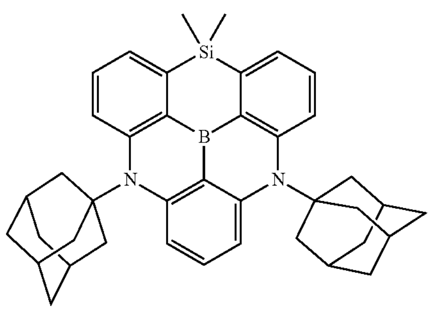
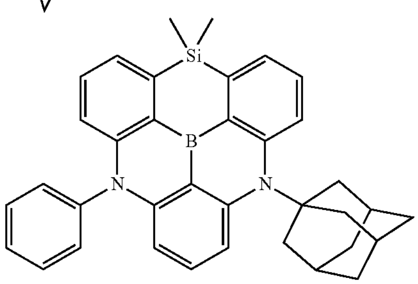
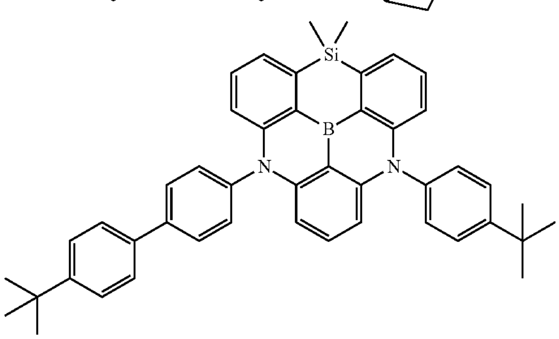
-continued
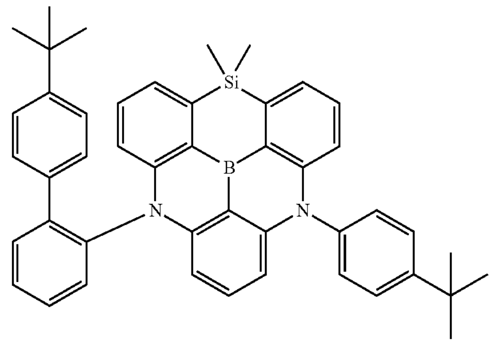
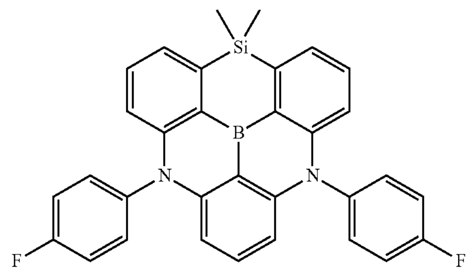
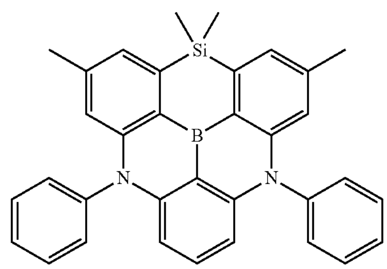
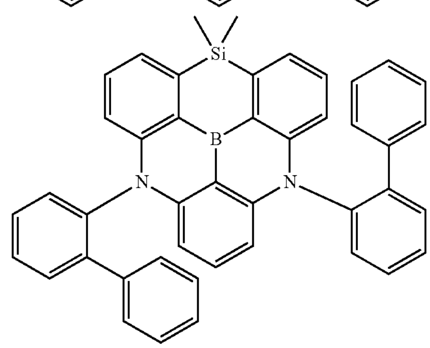
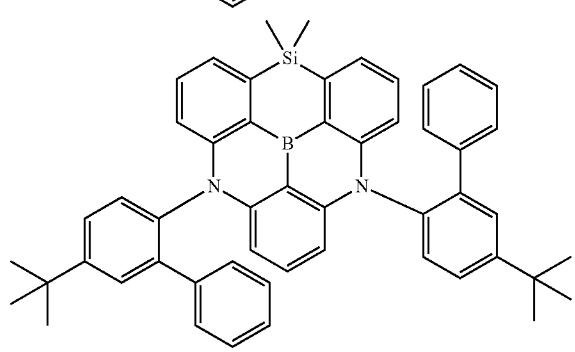

-continued
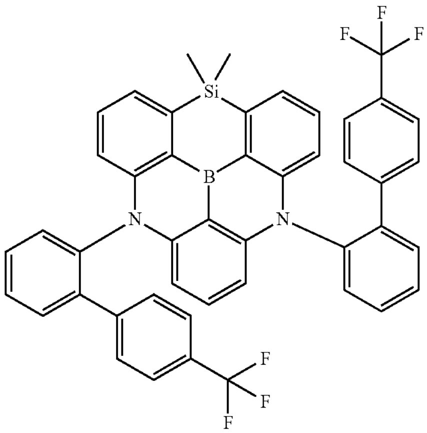
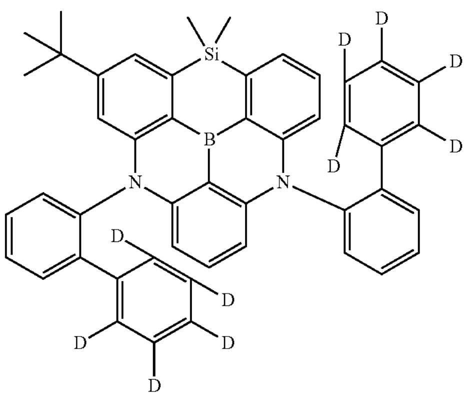
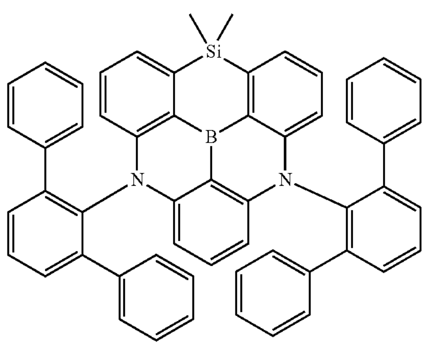
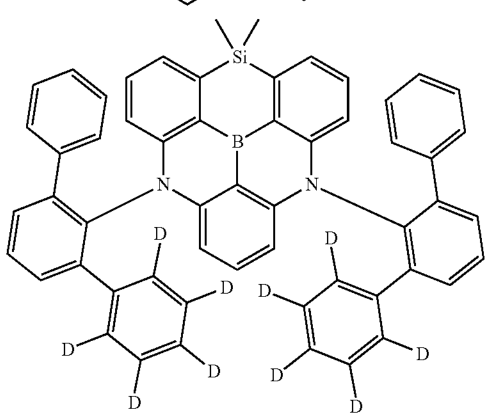
-continued
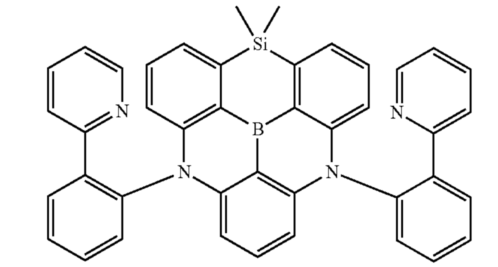
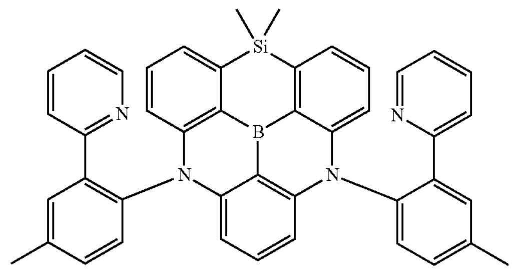
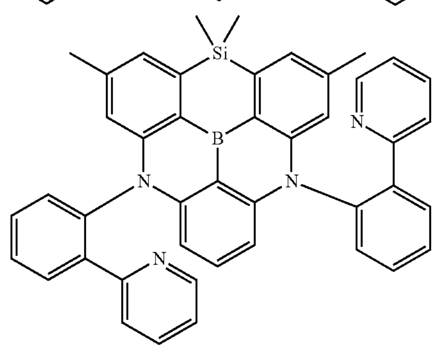
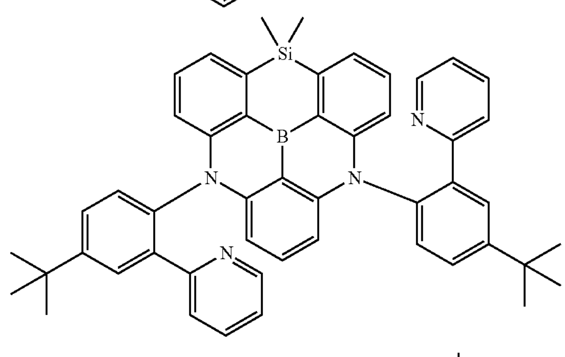
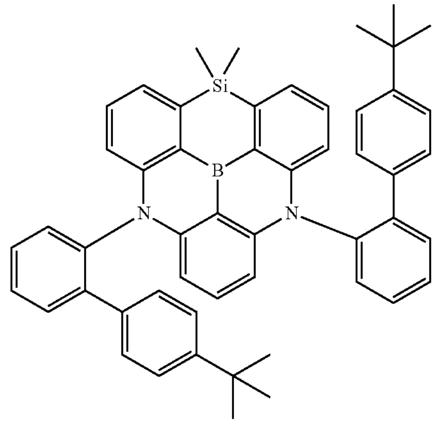

-continued
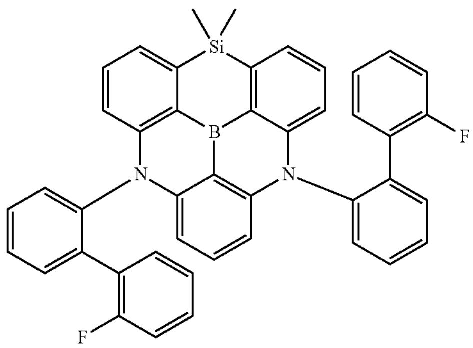
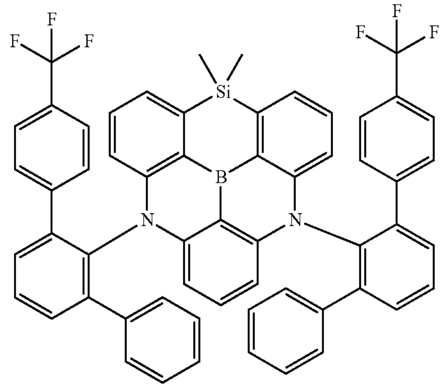
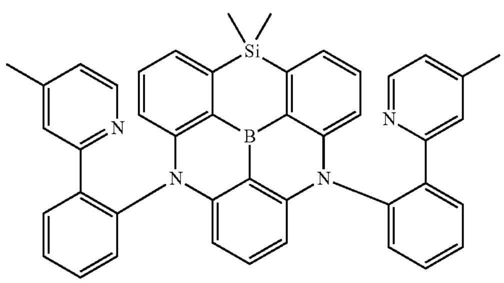
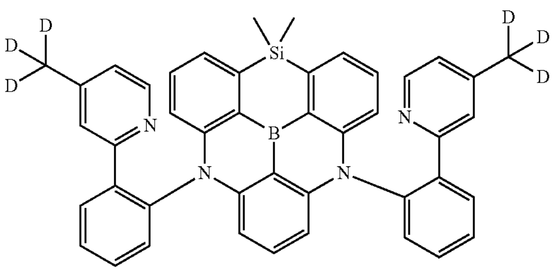
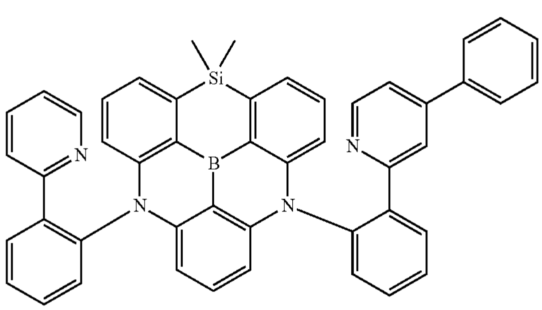
-continued
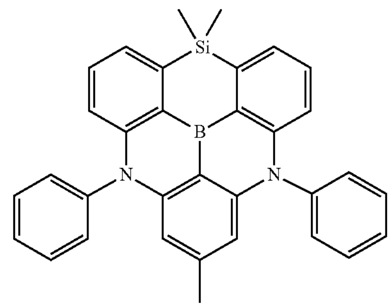
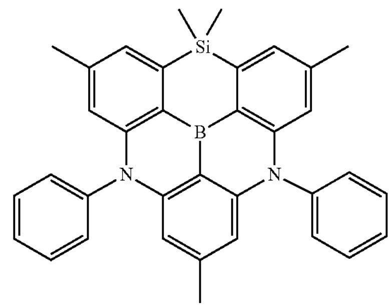
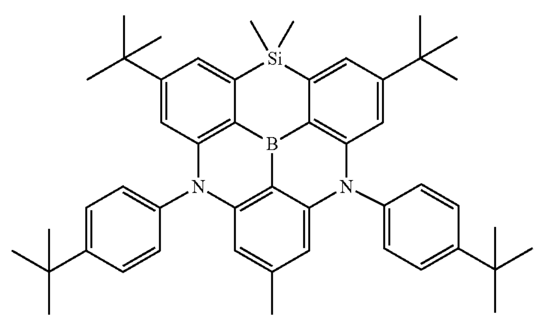
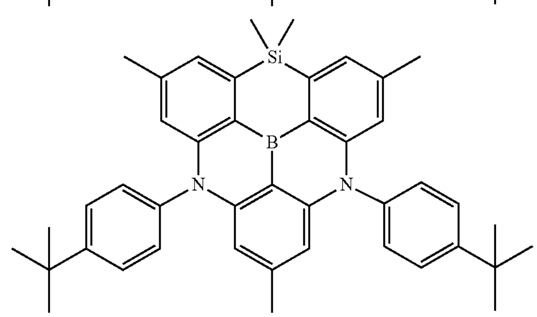
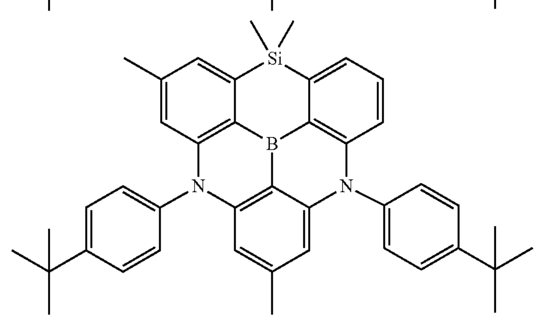

-continued
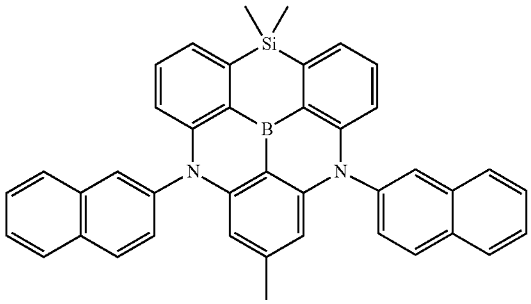
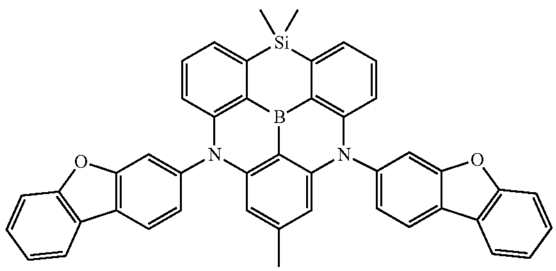
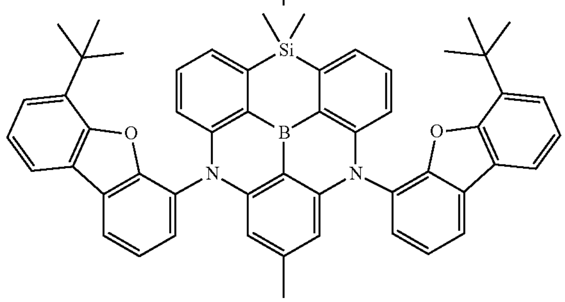
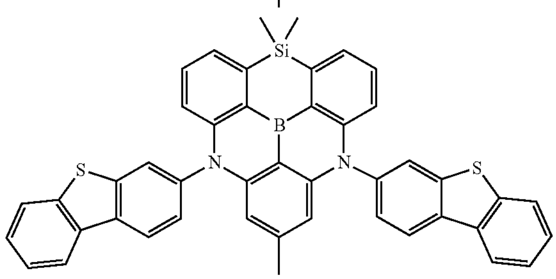
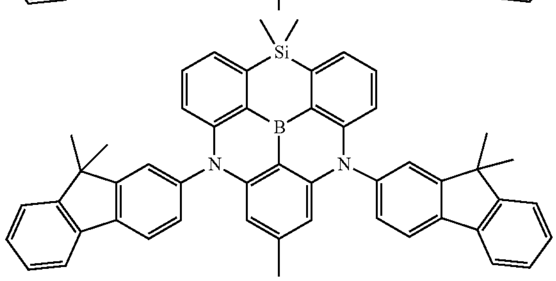
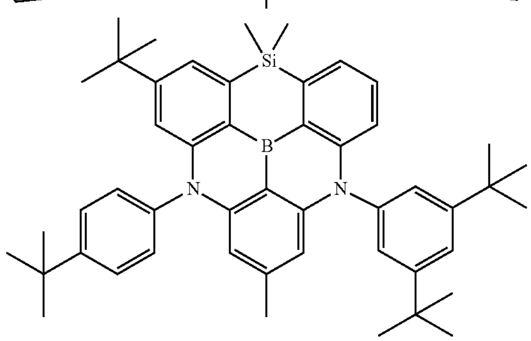
-continued
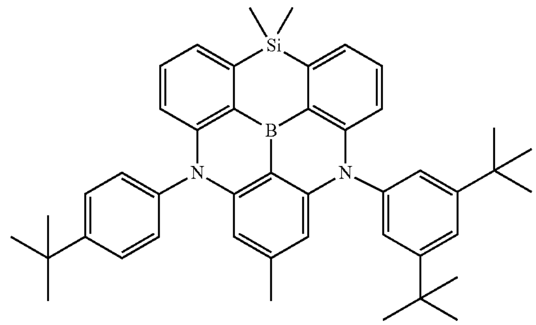
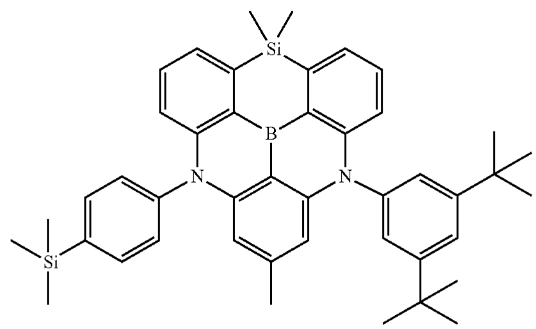
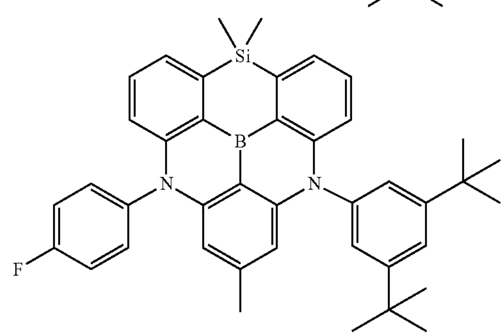
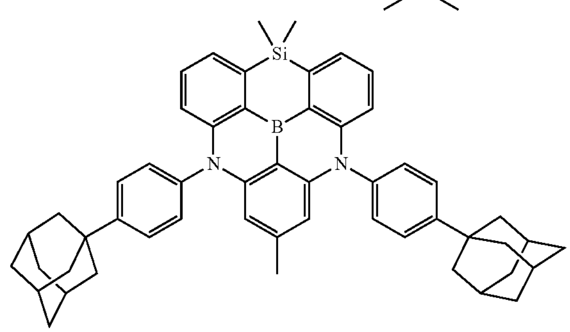
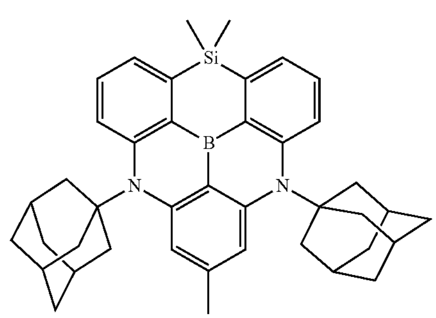

-continued
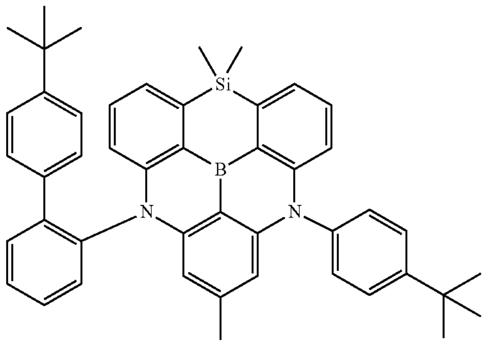
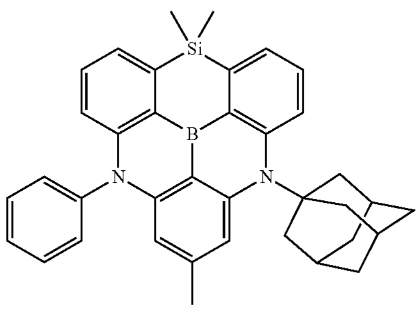
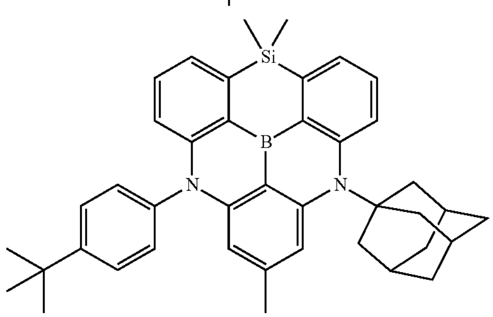
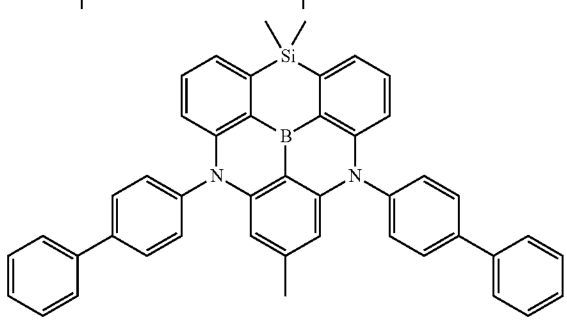
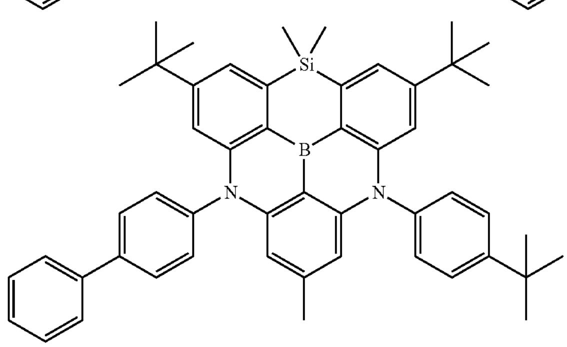
-continued
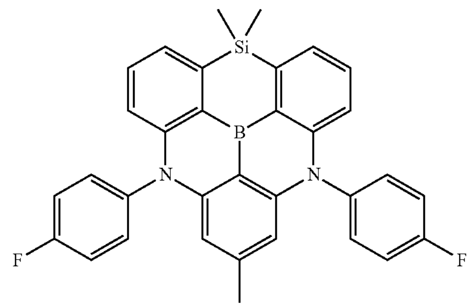
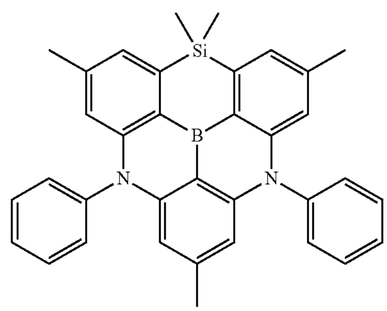
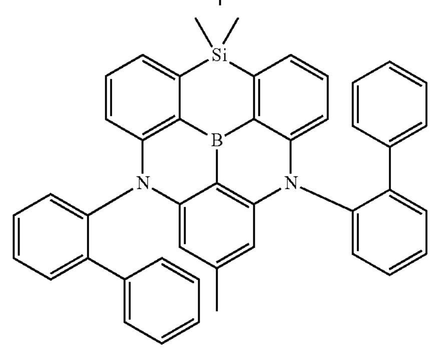
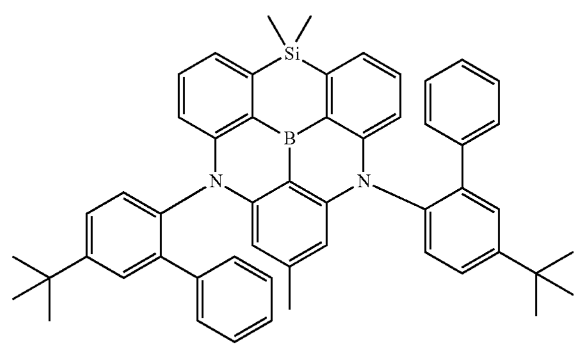
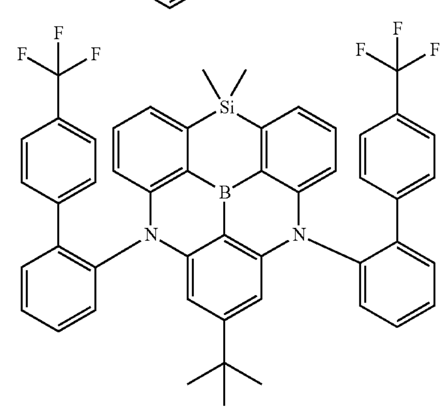

-continued
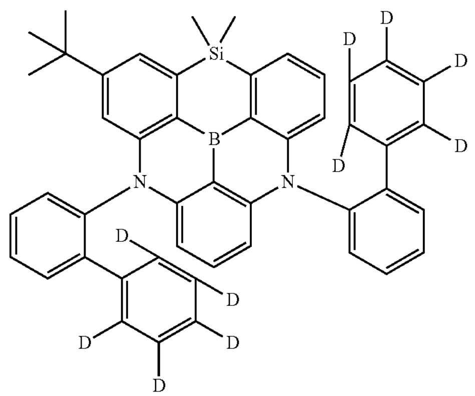
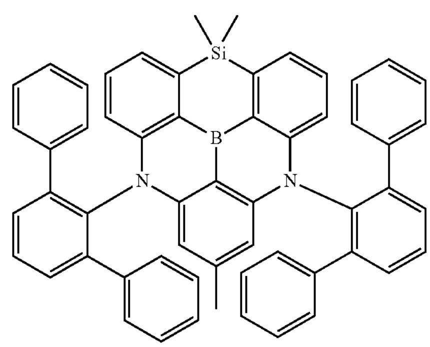
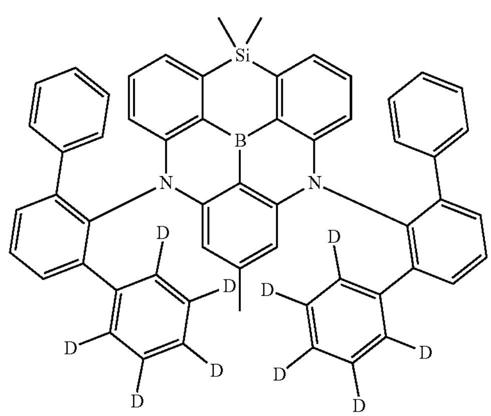
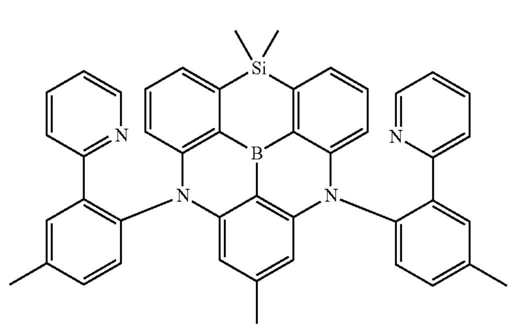
-continued
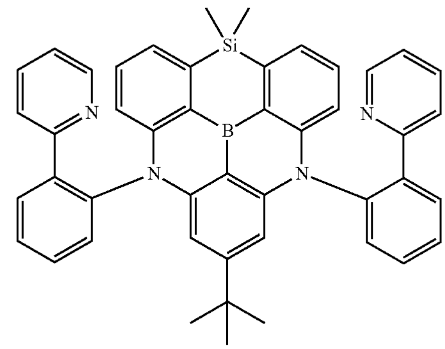
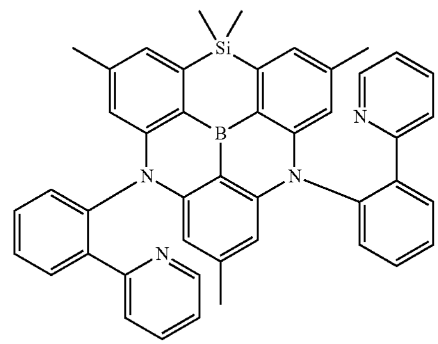
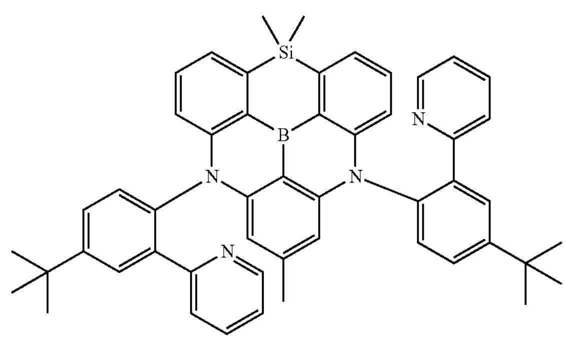
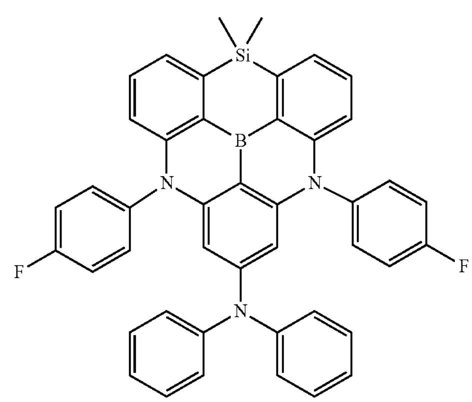

-continued
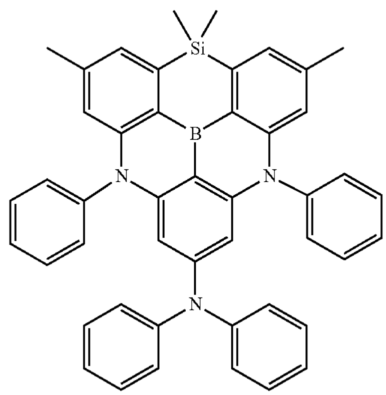
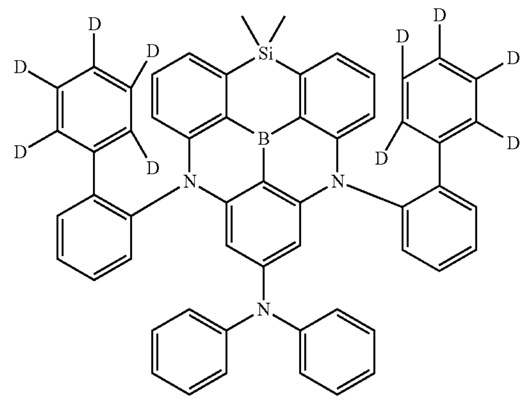
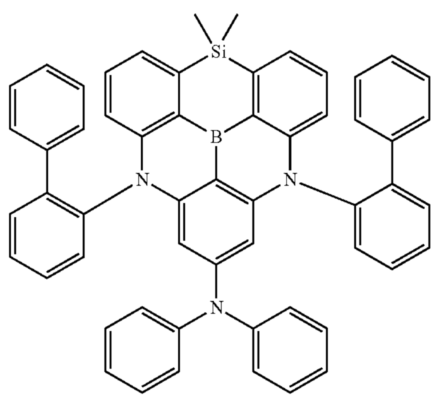
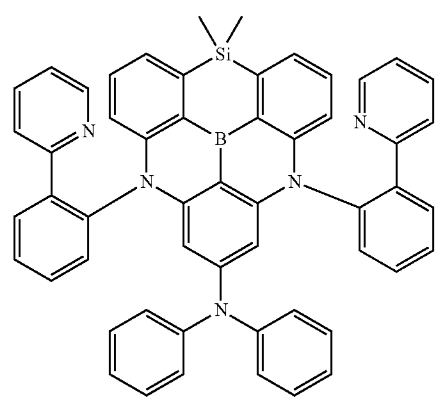
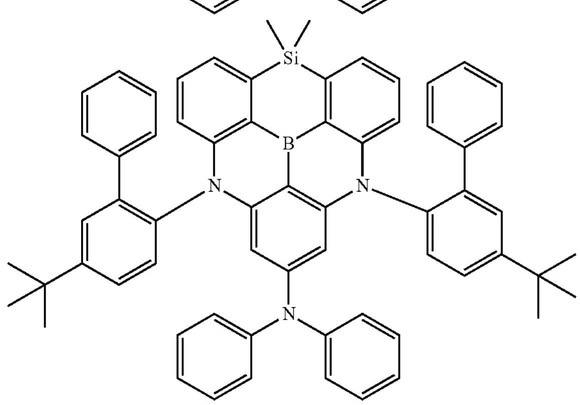
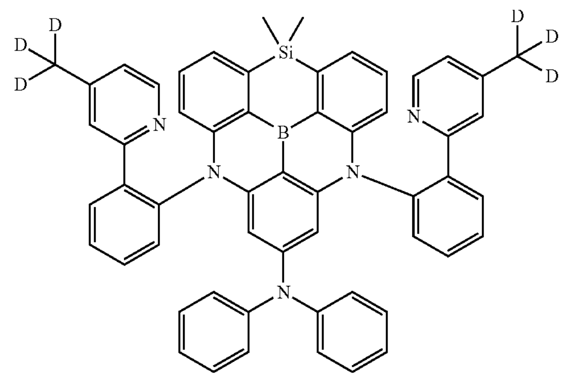
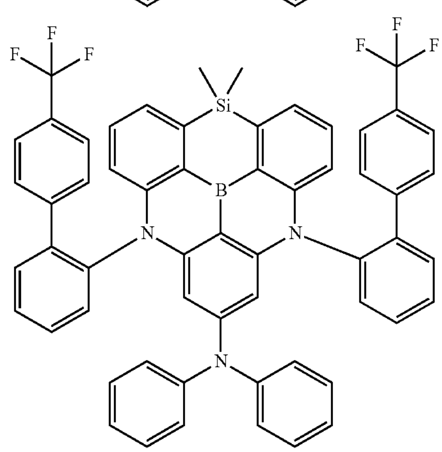
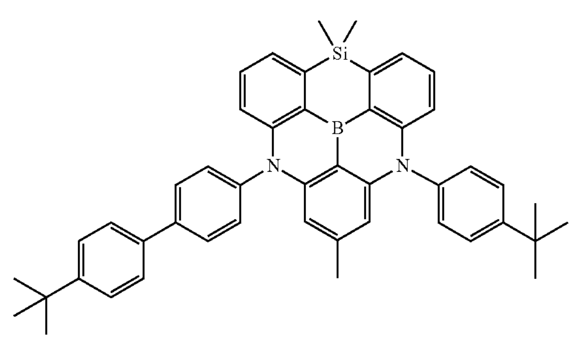

-continued
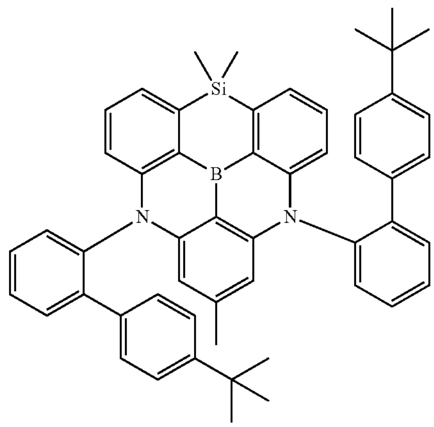
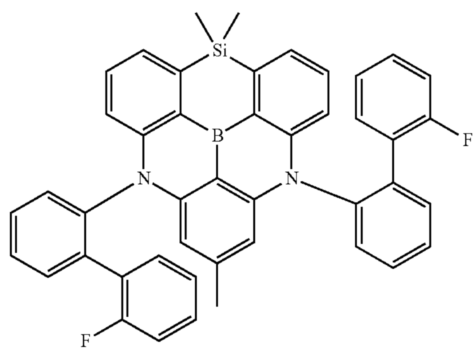
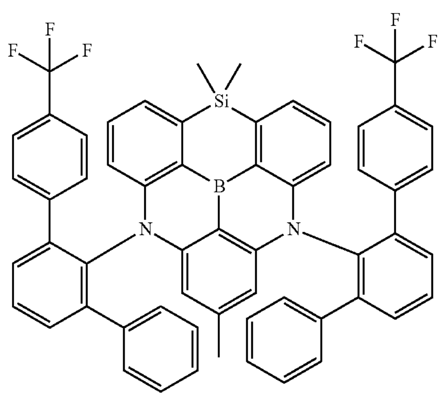
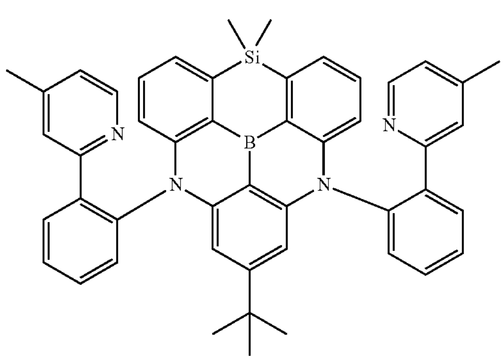
-continued
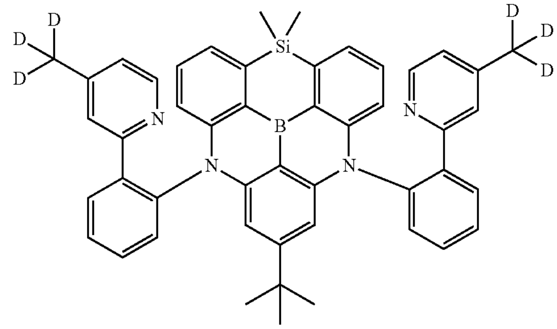
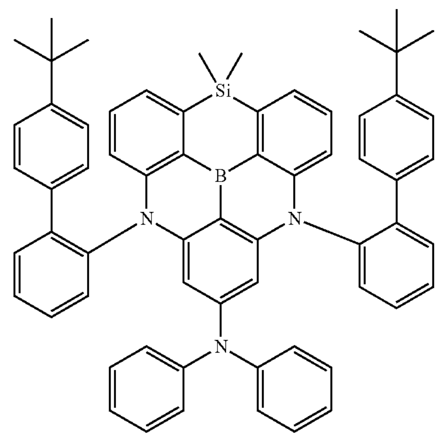
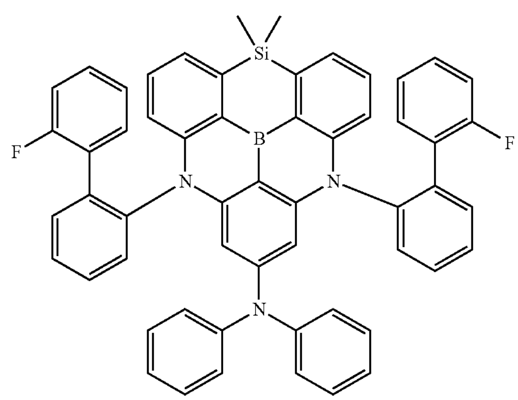
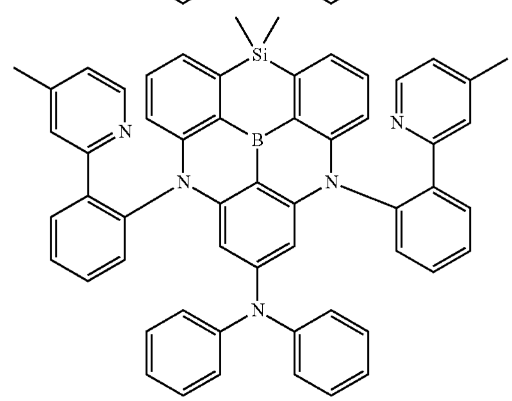

-continued
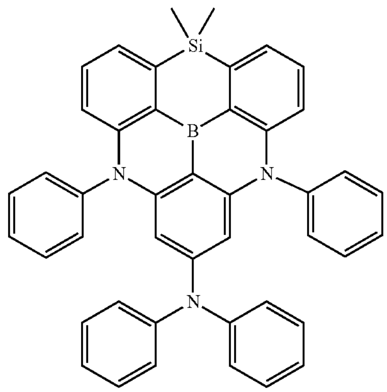
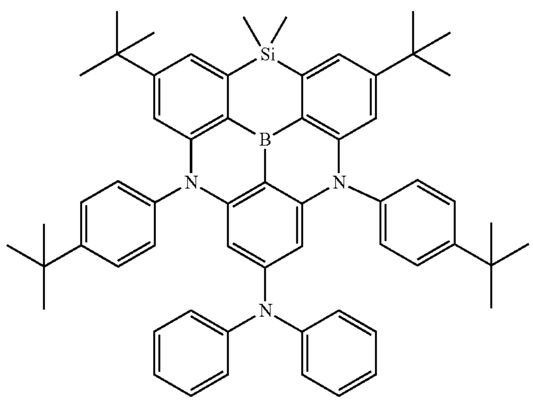
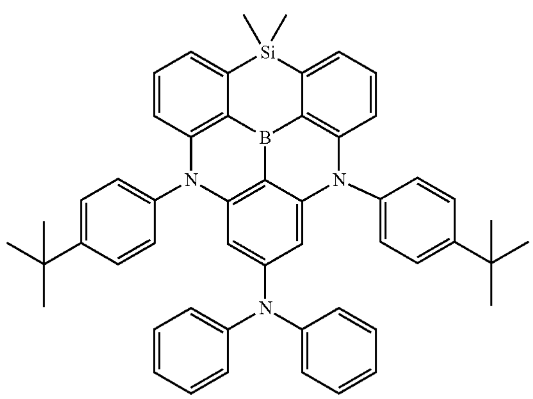
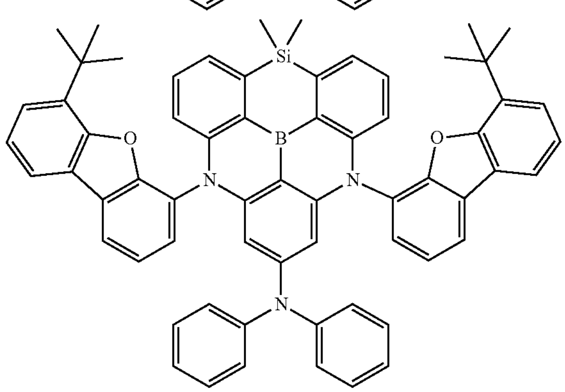
-continued
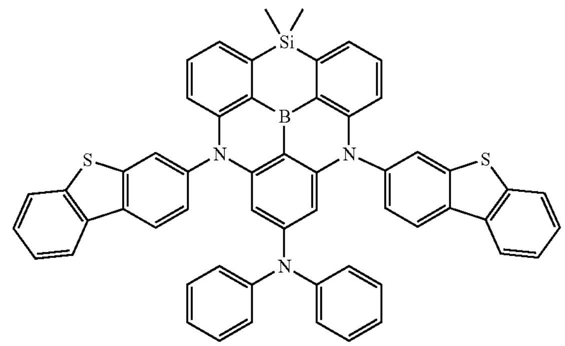
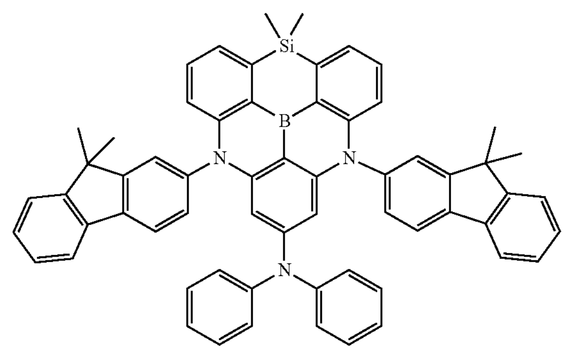
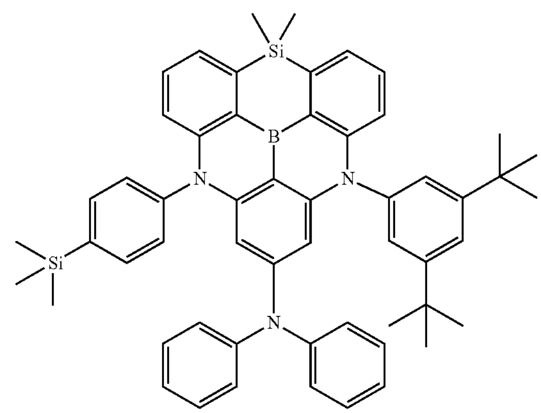
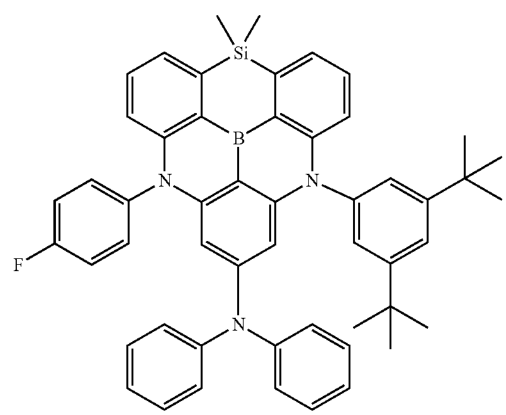

-continued
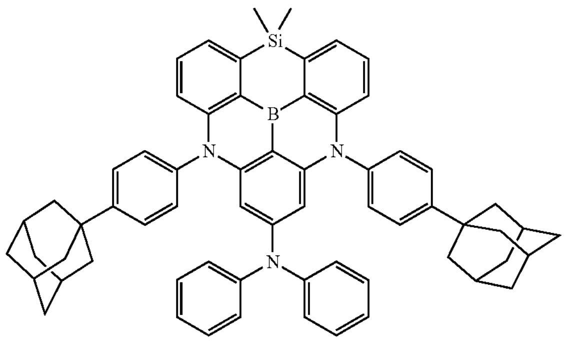
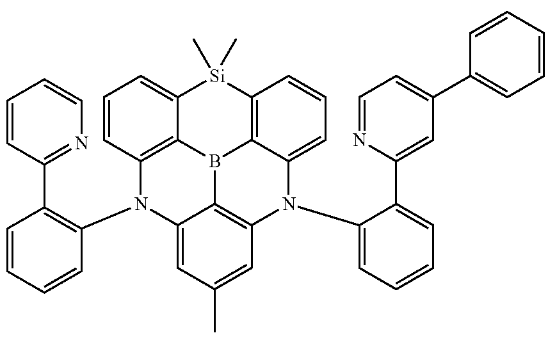
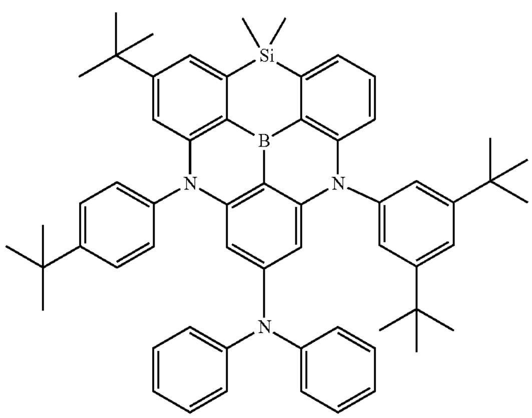
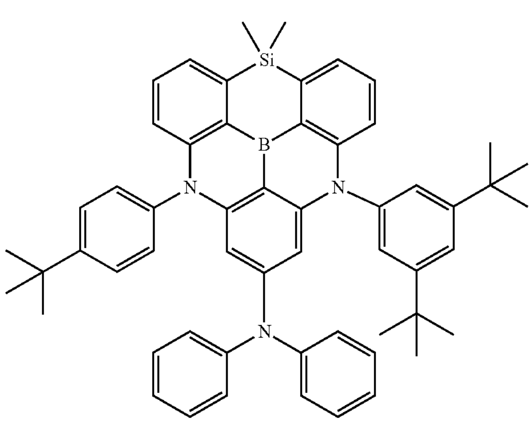
-continued
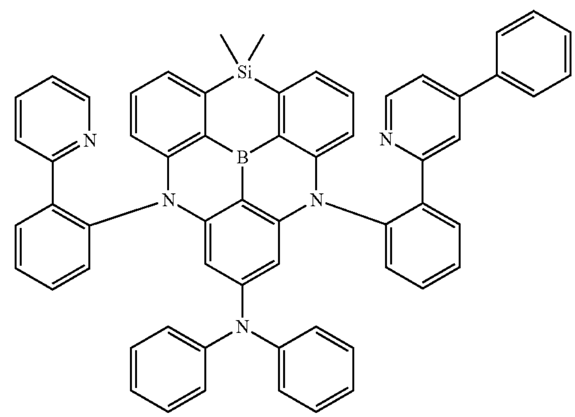
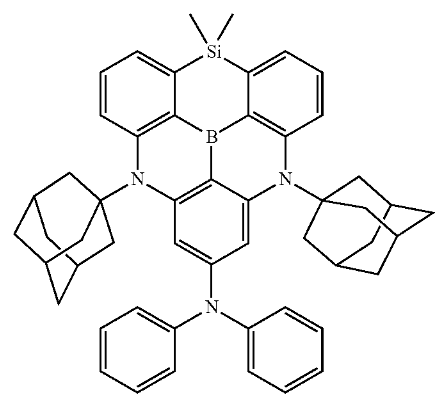
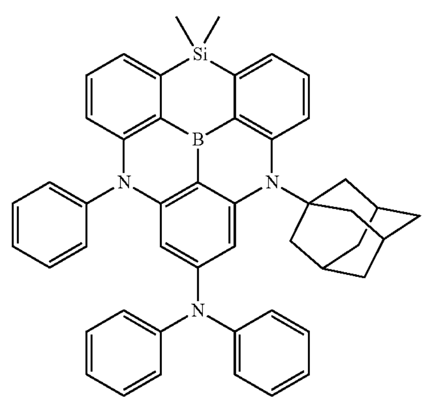
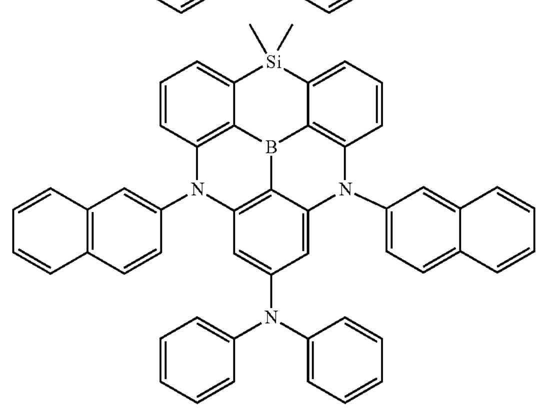

-continued
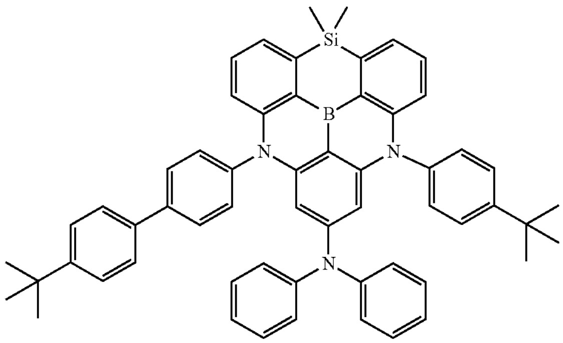
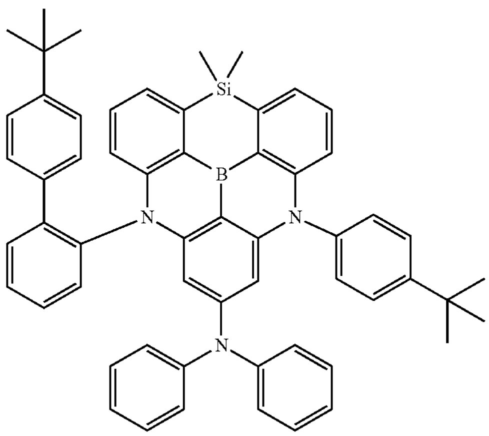
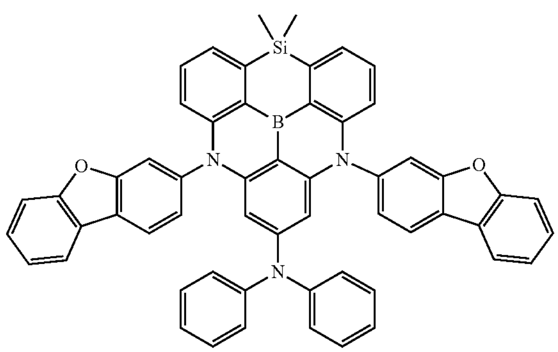
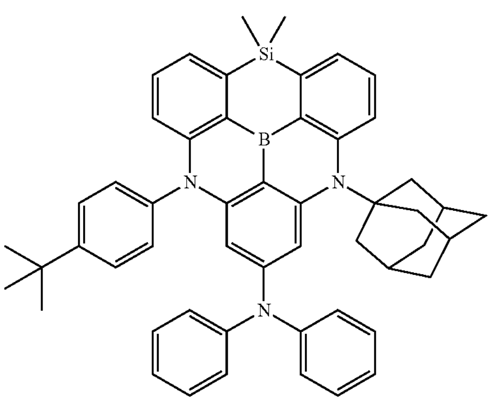
-continued
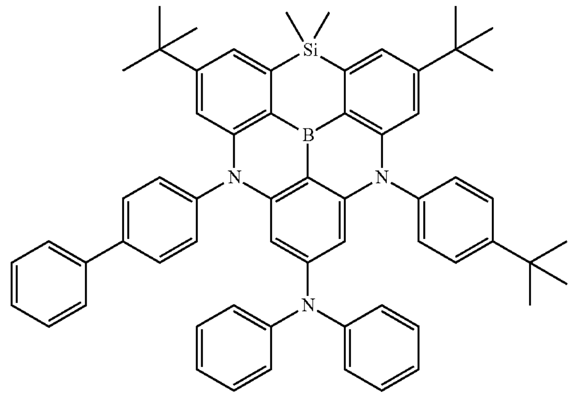
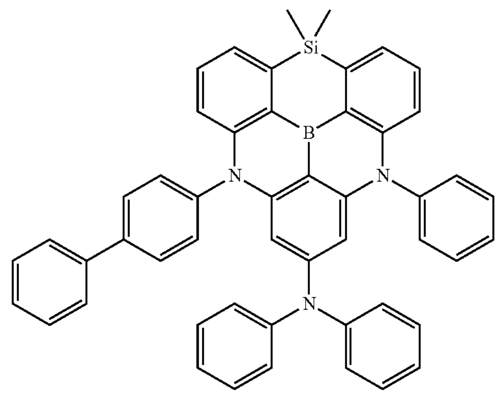
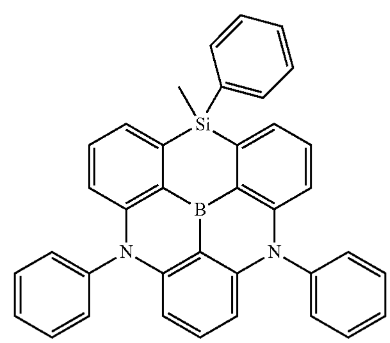
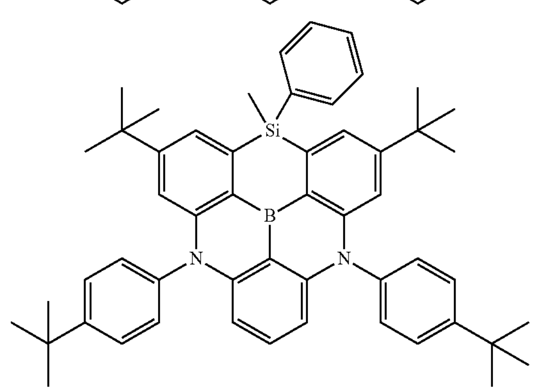

-continued
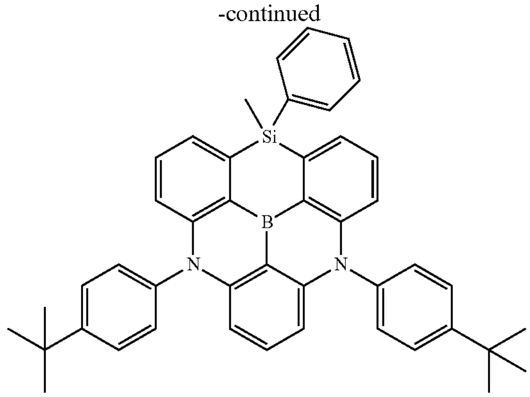
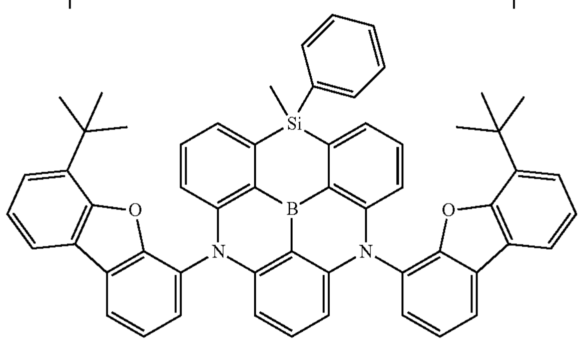
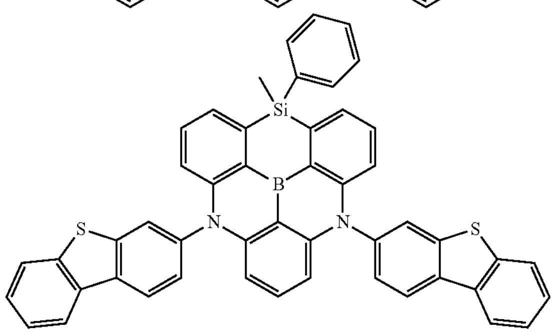
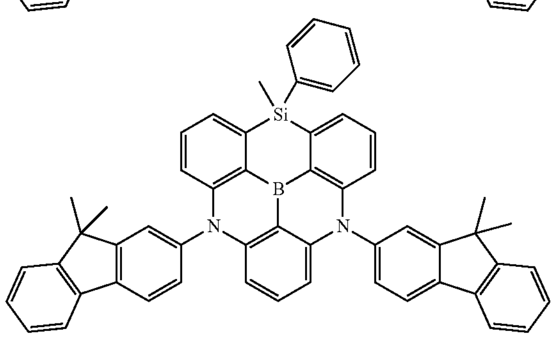
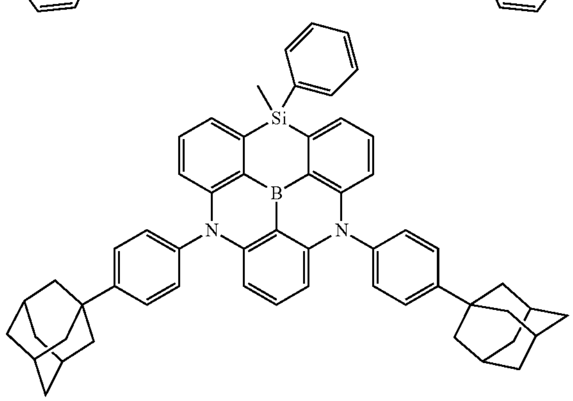
-continued
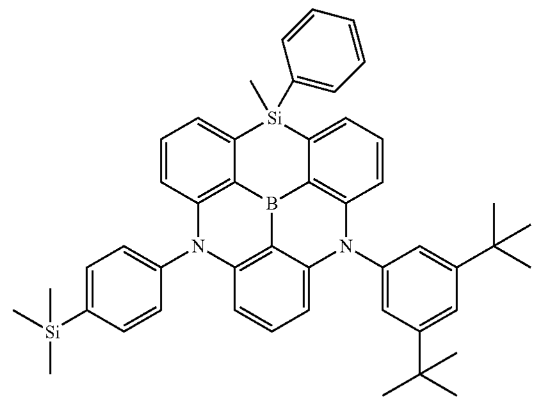
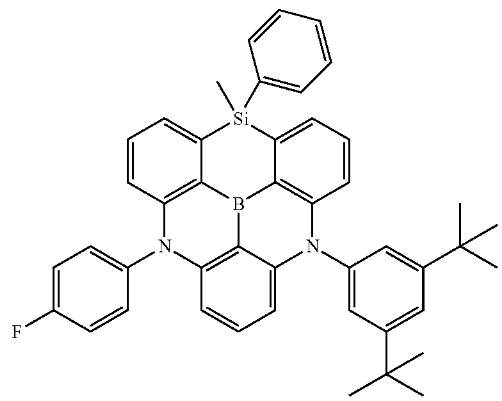
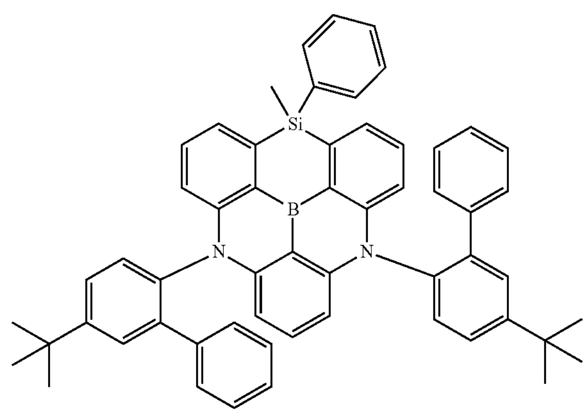
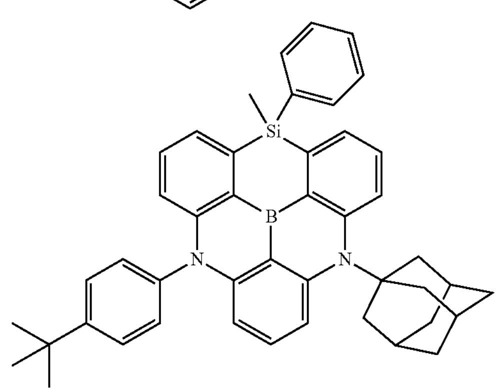

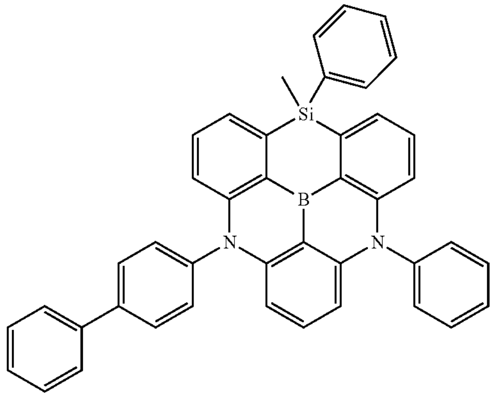
Si
B
N
N
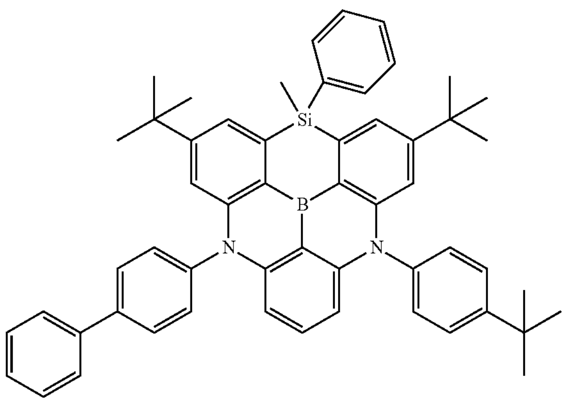
Si
B
N
N
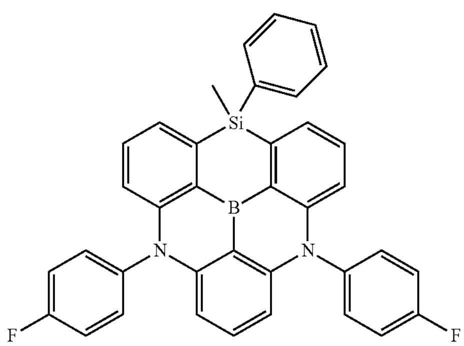
Si
B
N
N
F
F
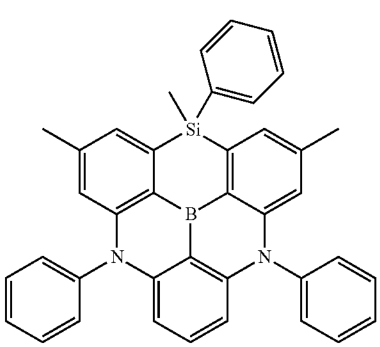
Si
B
N
N
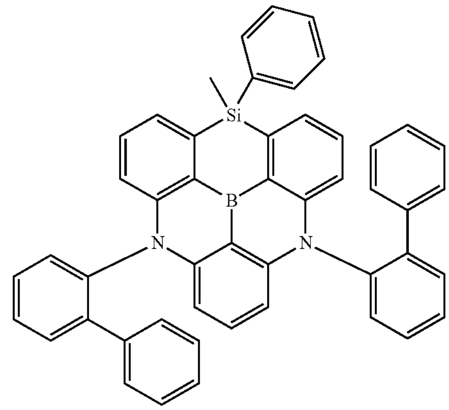
Si
B
N
N
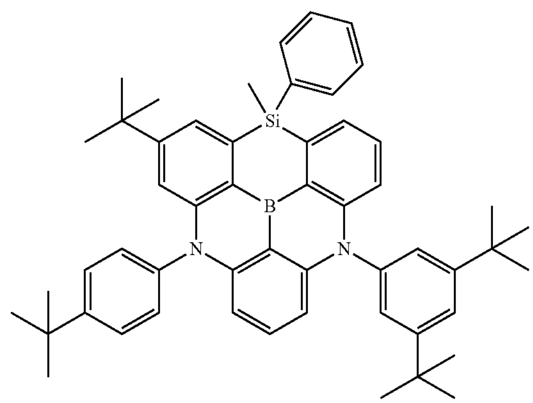
Si
B
N
N
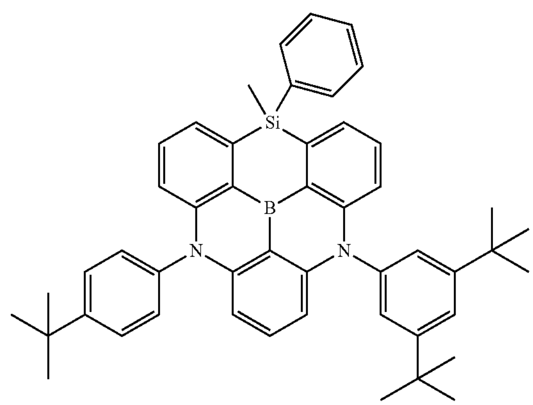
Si
B
N
N
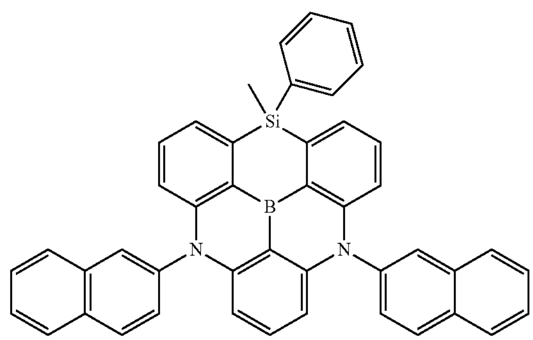
Si
B
N
N -continued
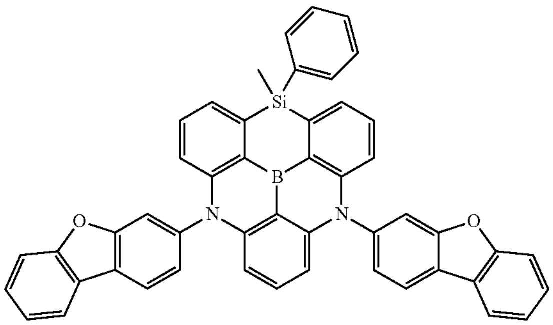
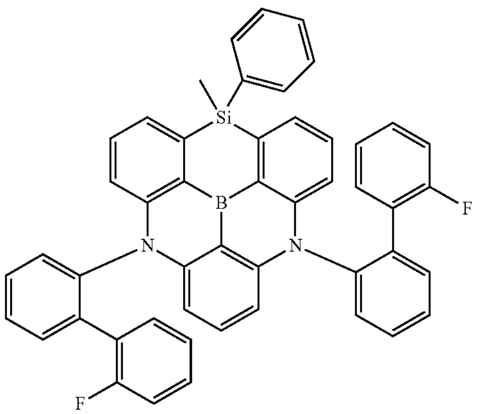
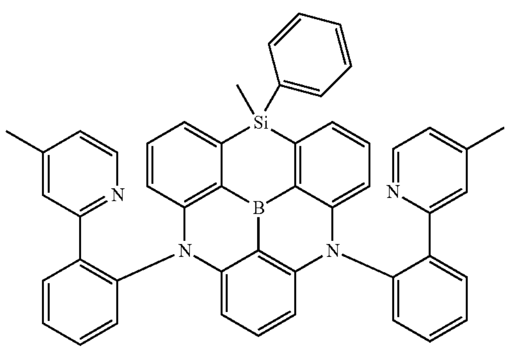
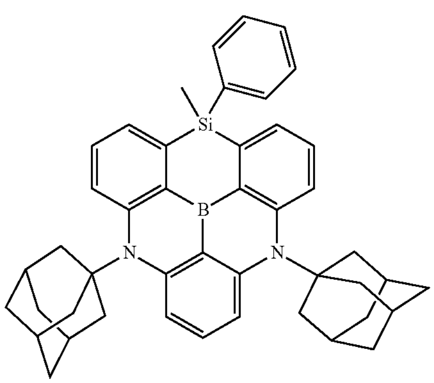
-continued
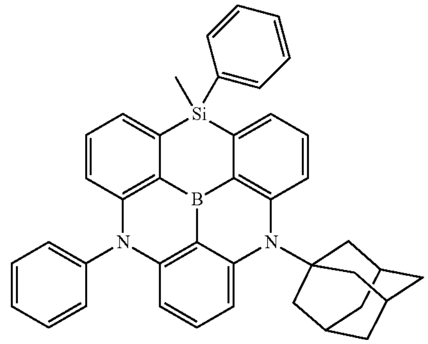
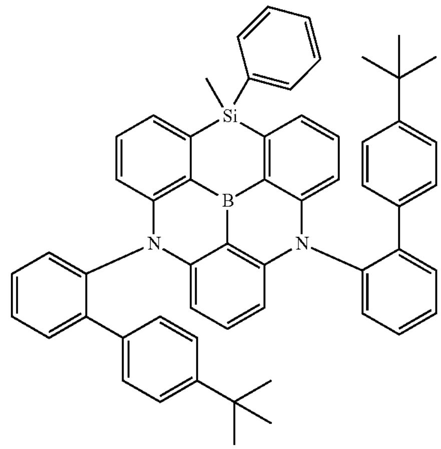
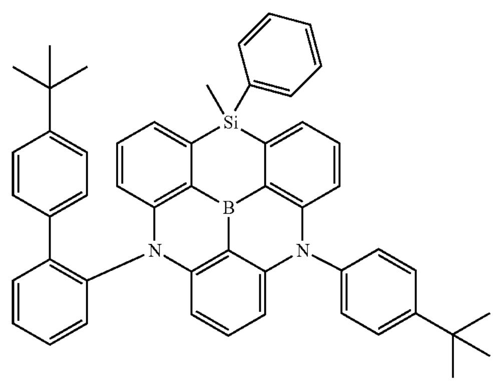
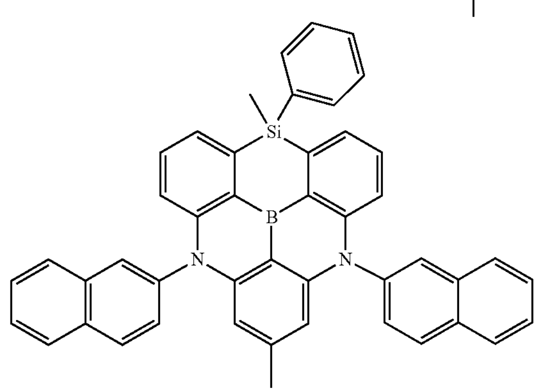

-continued
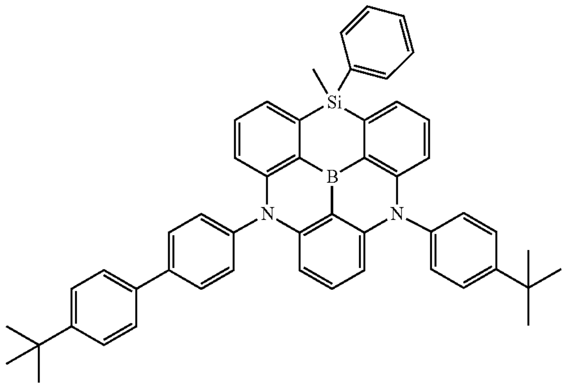
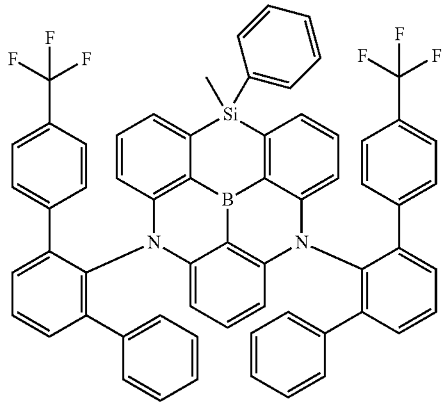
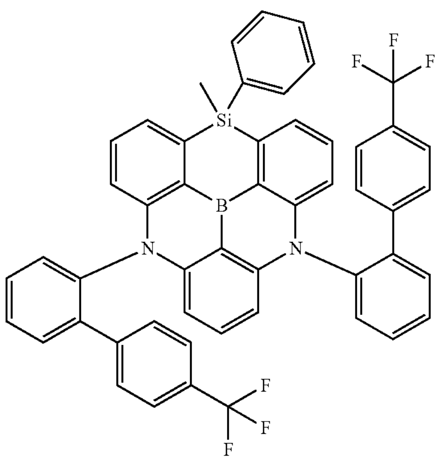
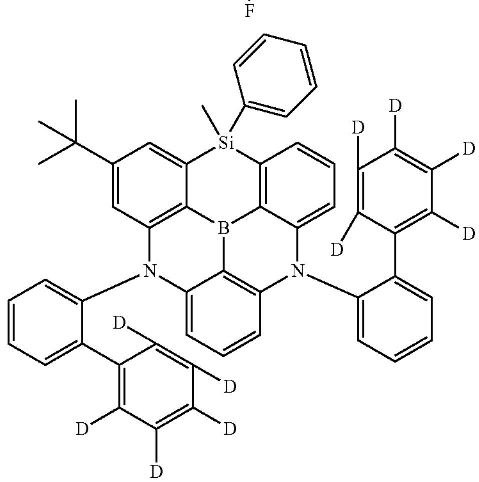
-continued
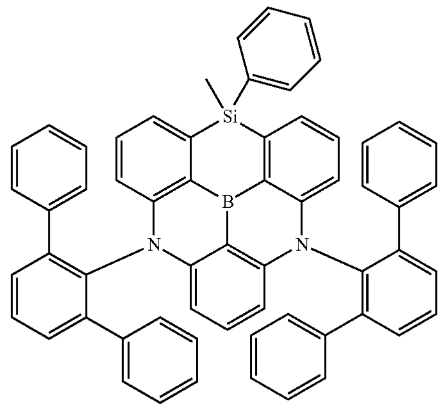
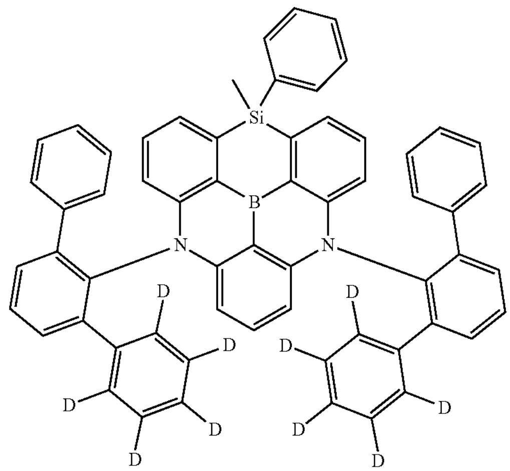
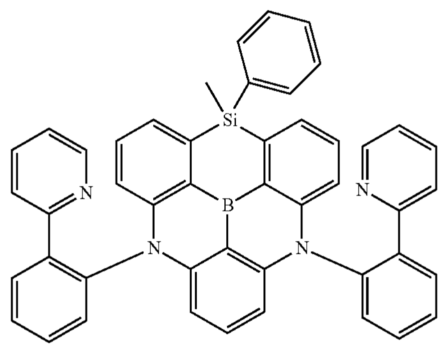
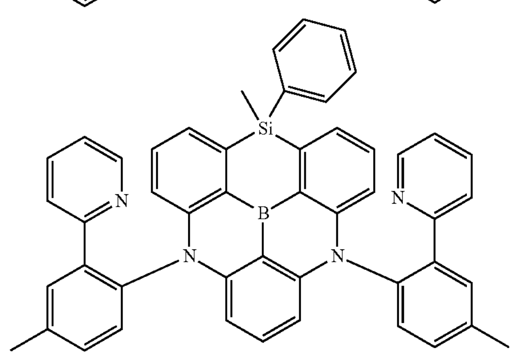

-continued
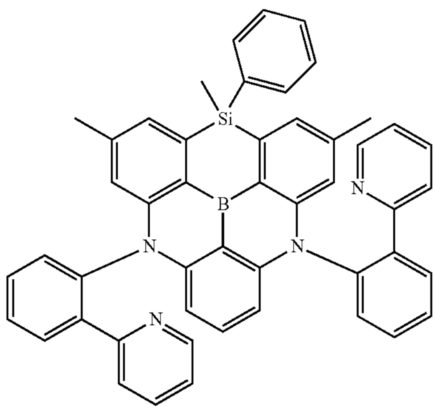
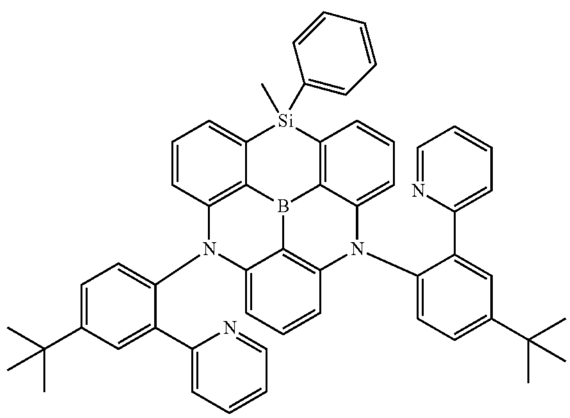
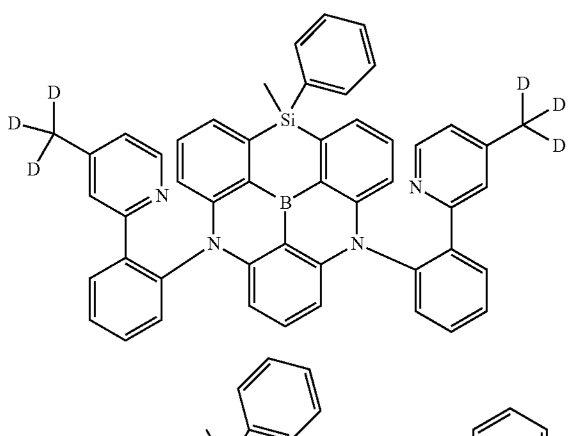
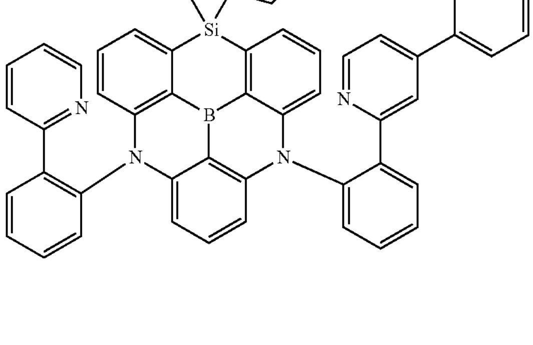
-continued
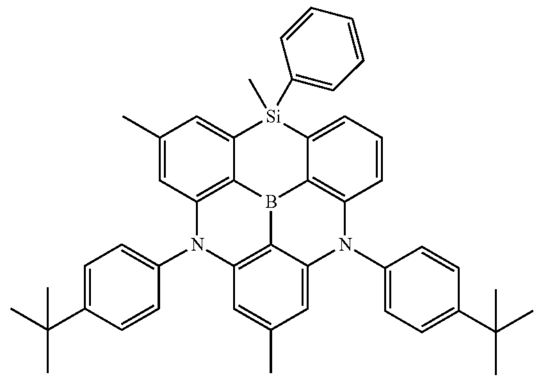
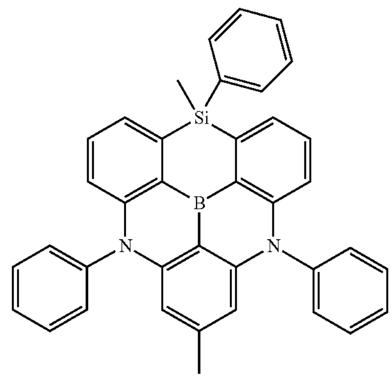
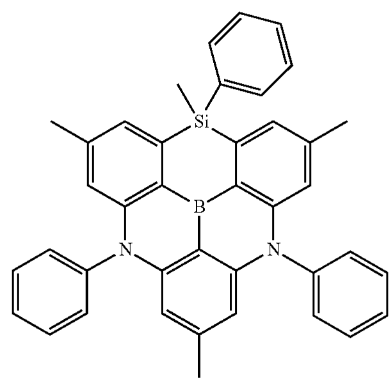
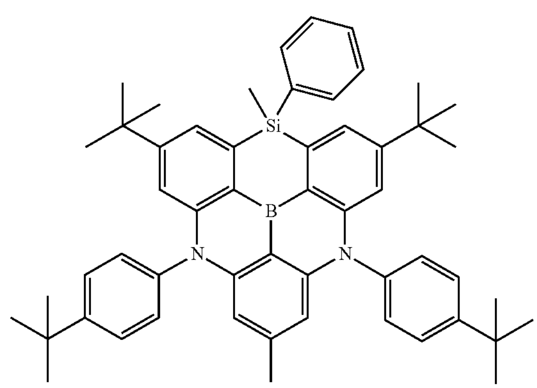

-continued
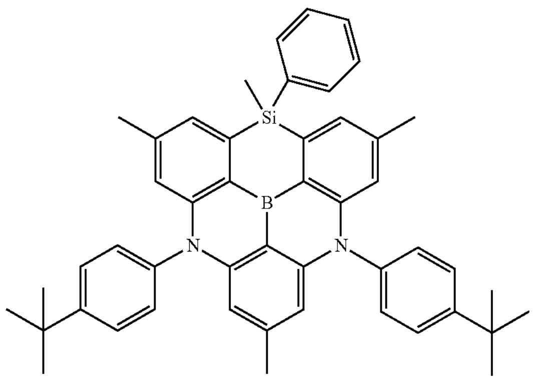
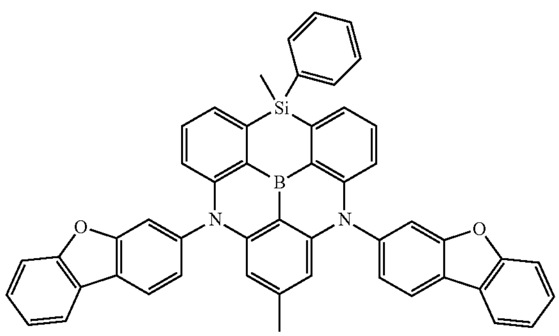
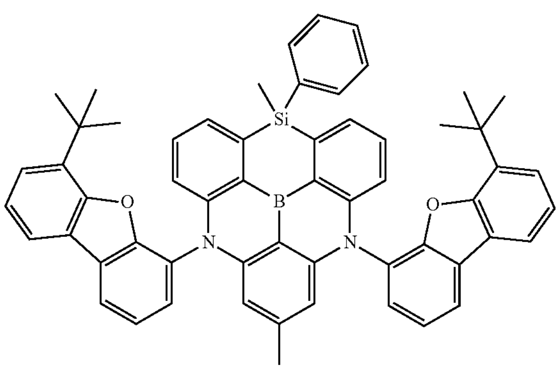
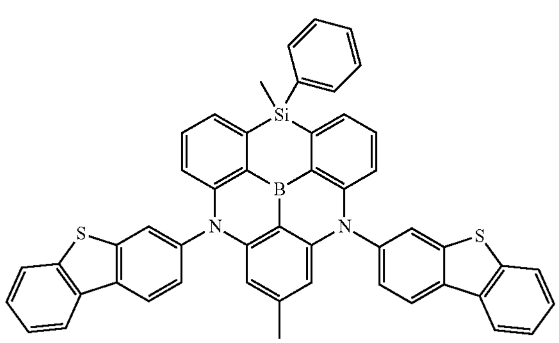
-continued
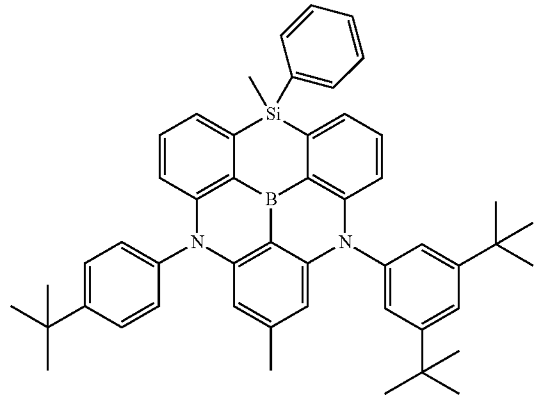
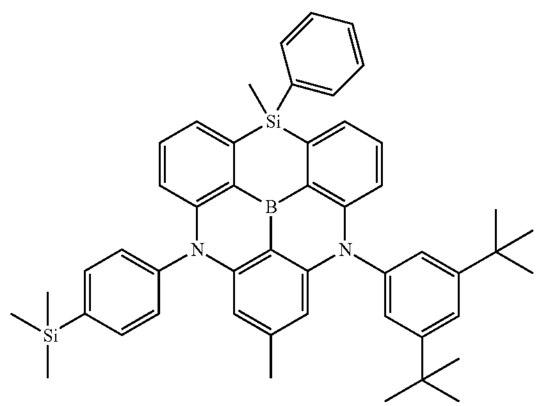
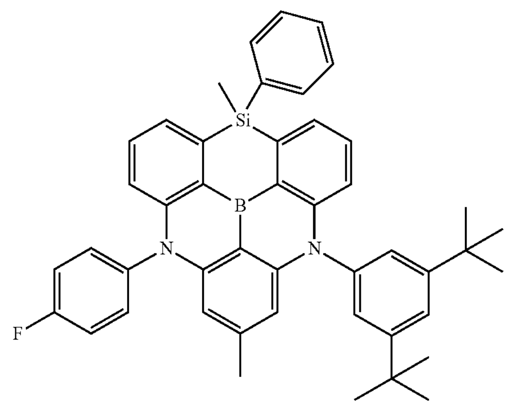
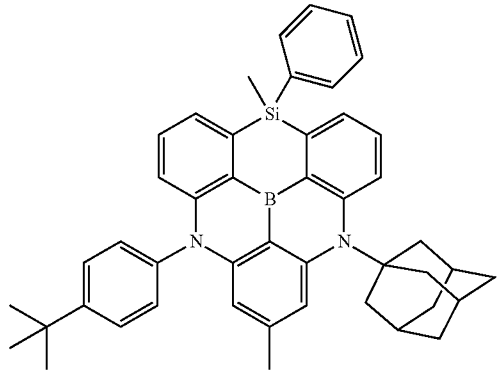

-continued
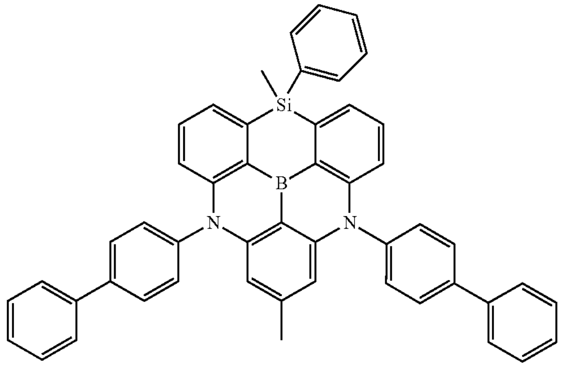
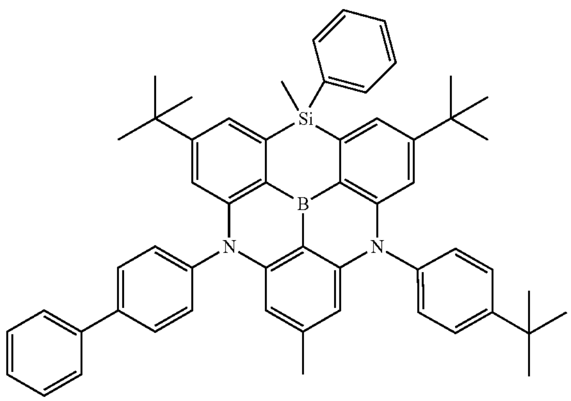
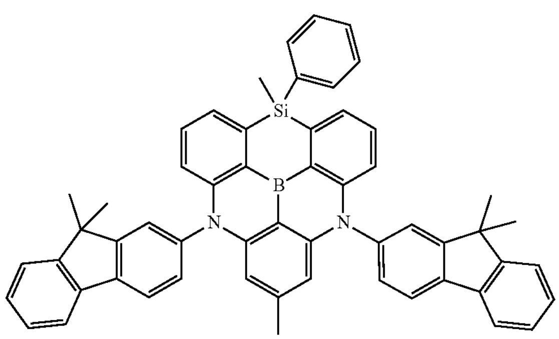
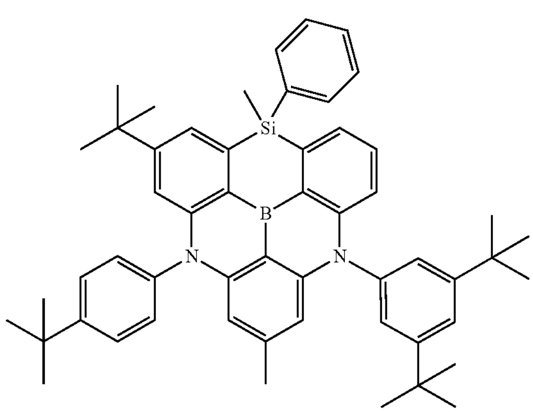
-continued
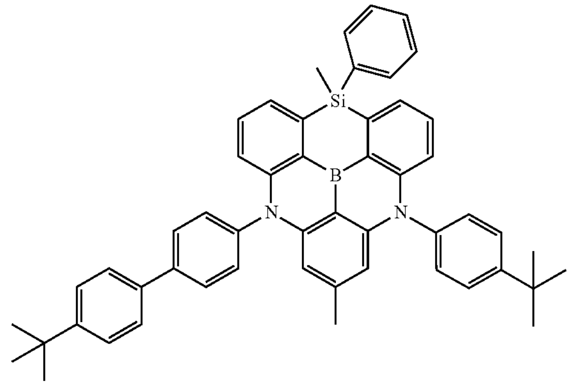
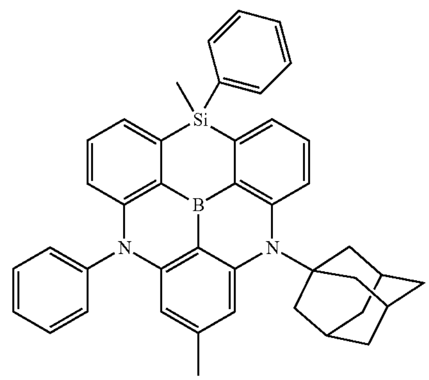
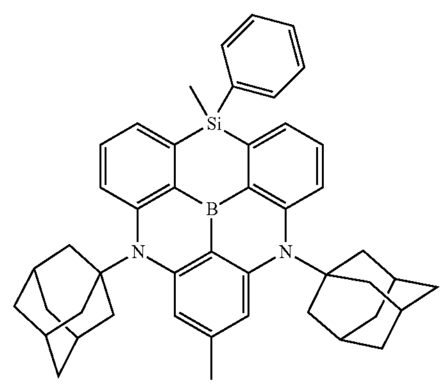
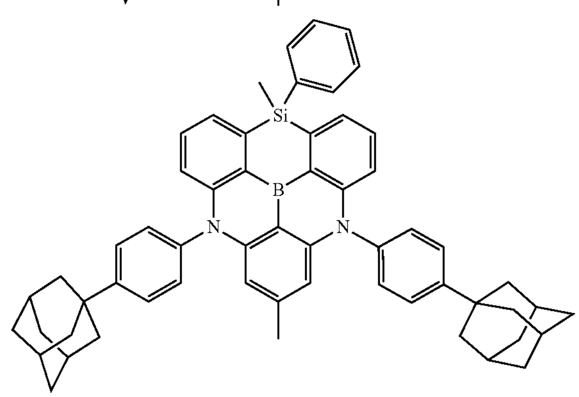

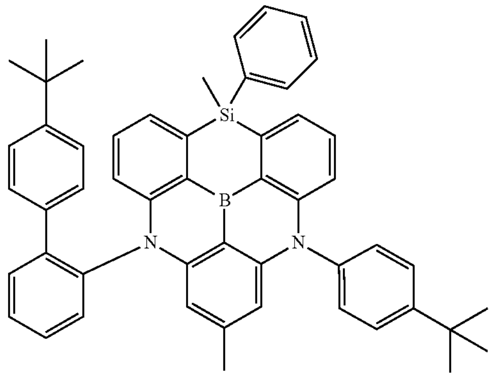
Si
B
N
N
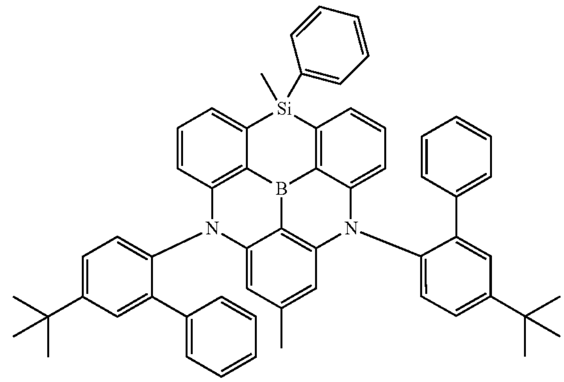
Si
B
N
N
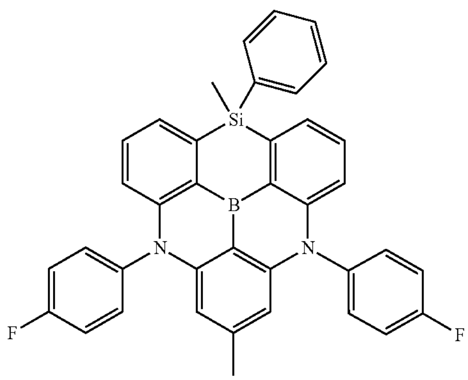
Si
B
N
N
F
F
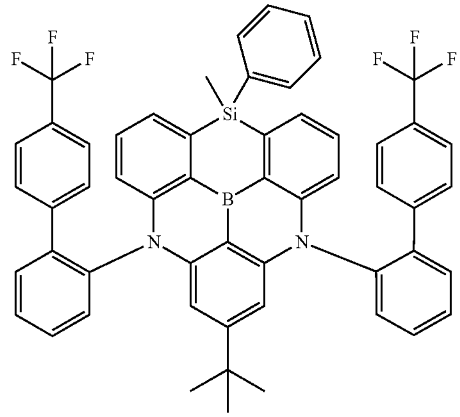
F
F
F
Si
B
N
N
F
F
F
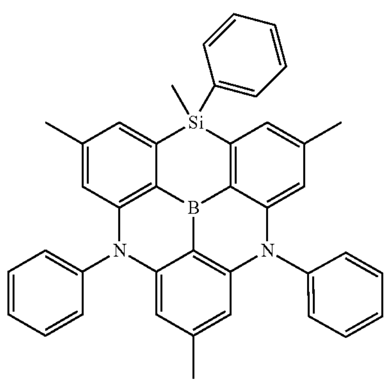
Si
B
N
N
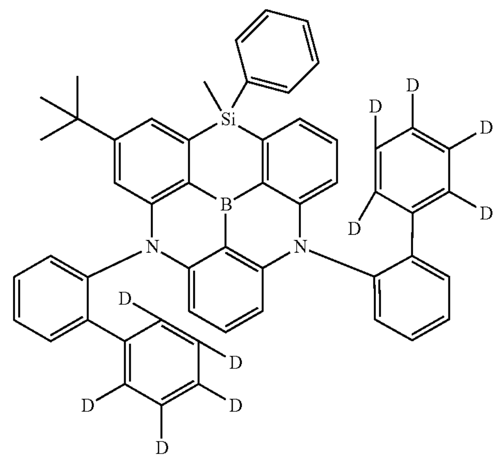
Si
B
N
N
D
D
D
D
D
D
D
D
D
D
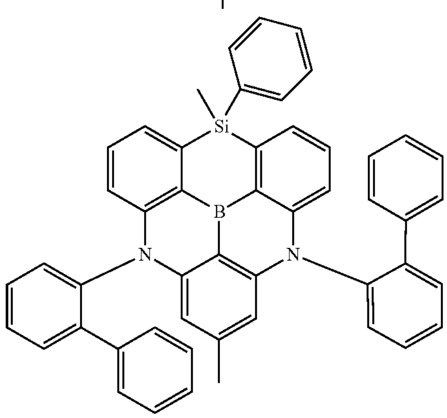
Si
B
N
N
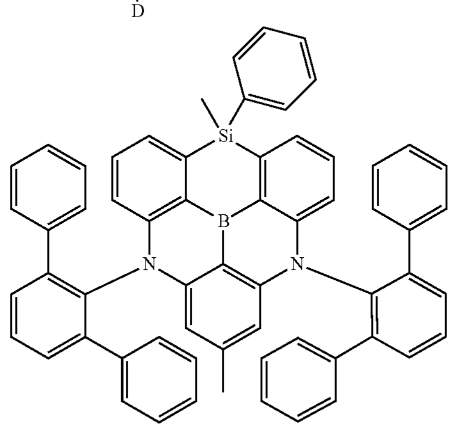
Si
B
N
N -continued
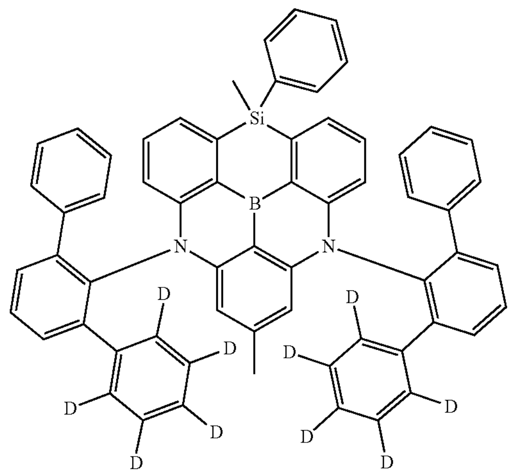
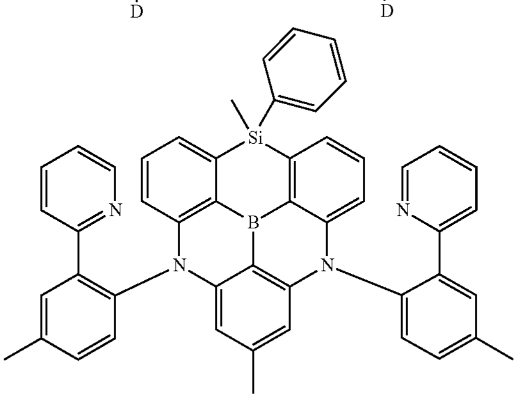
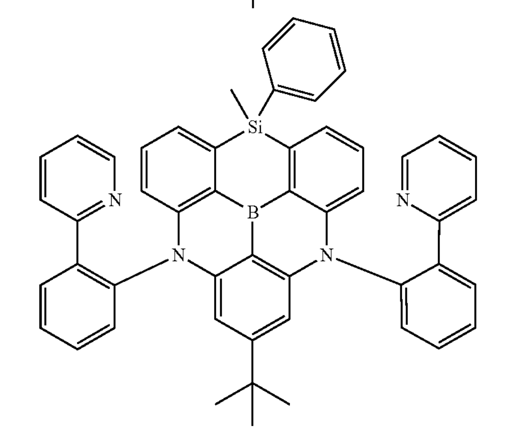
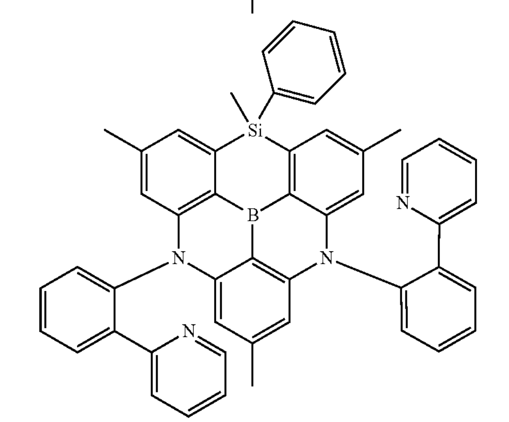
-continued
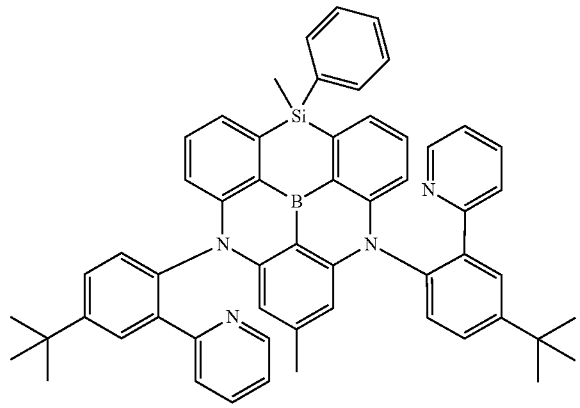
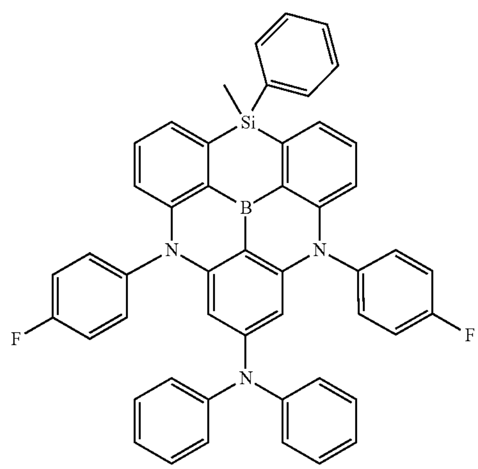
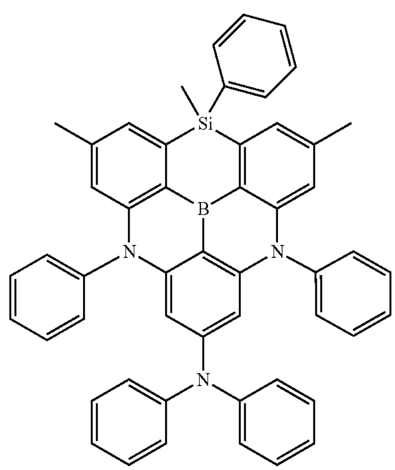

-continued
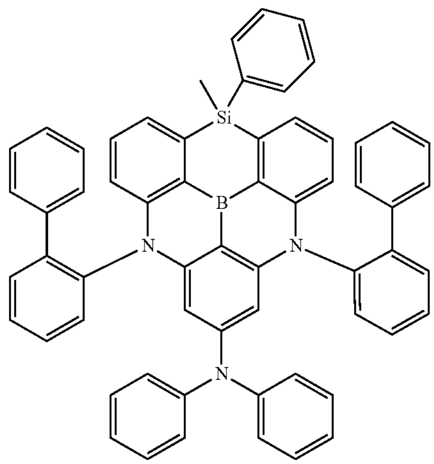
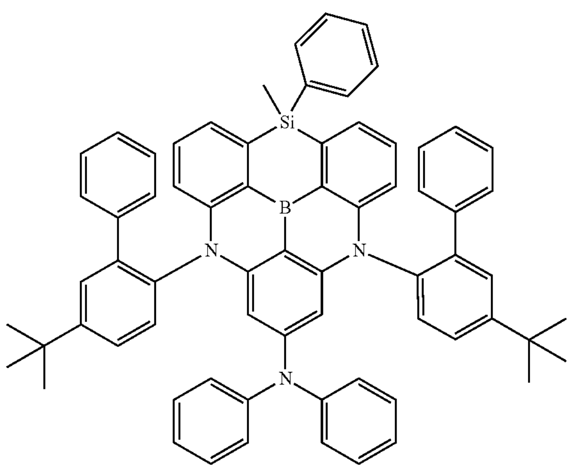
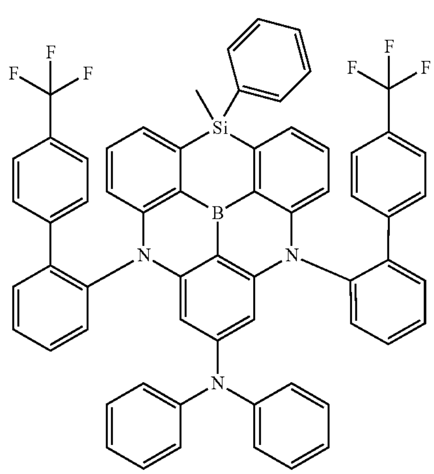
-continued
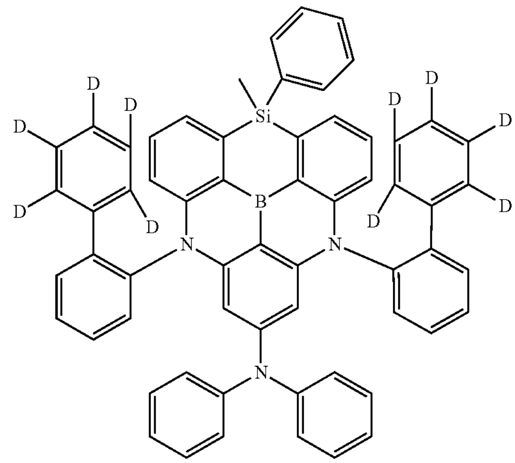
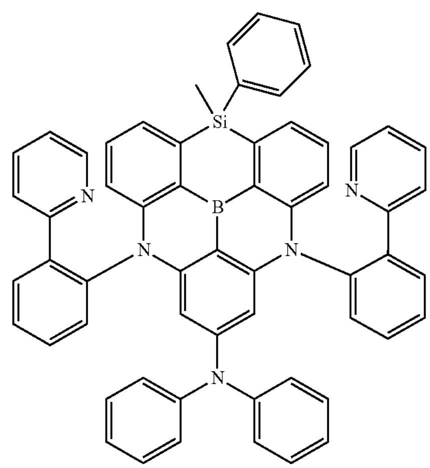
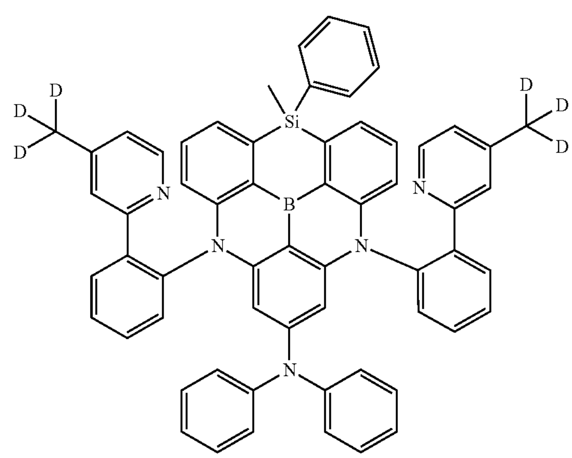

-continued
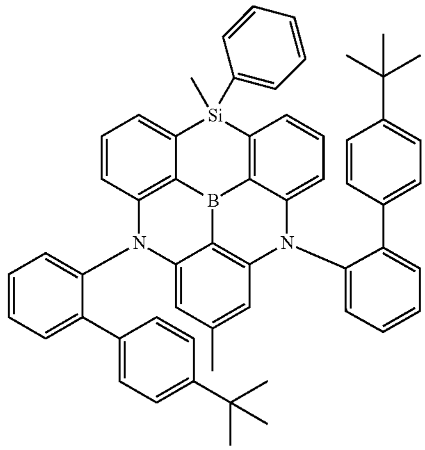
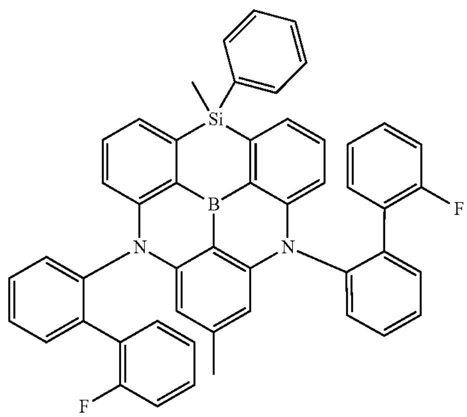
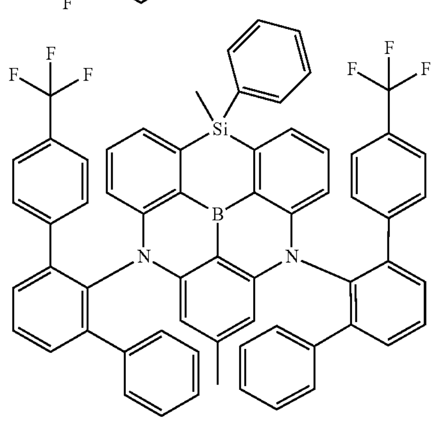
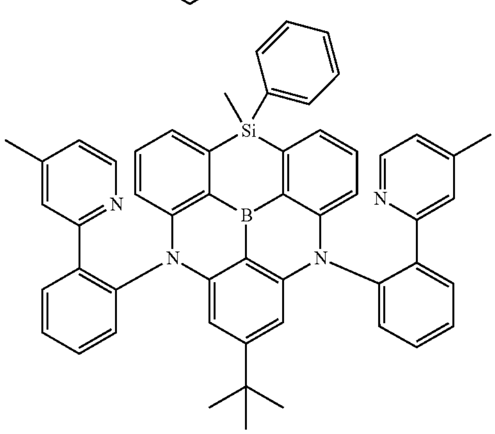
-continued
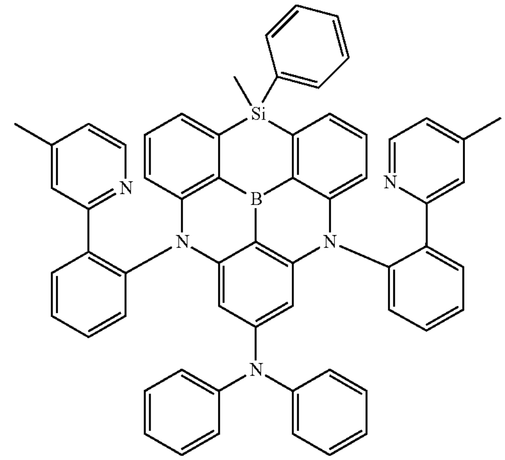
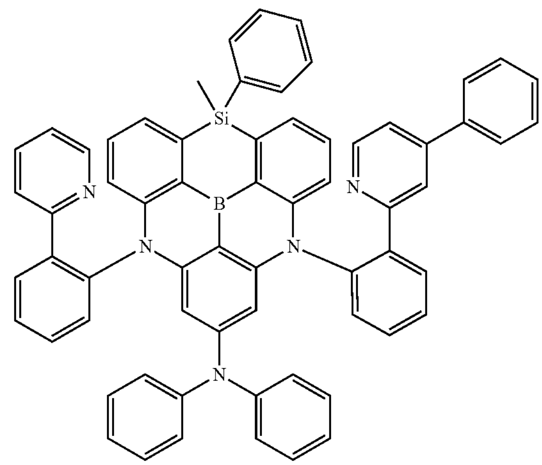
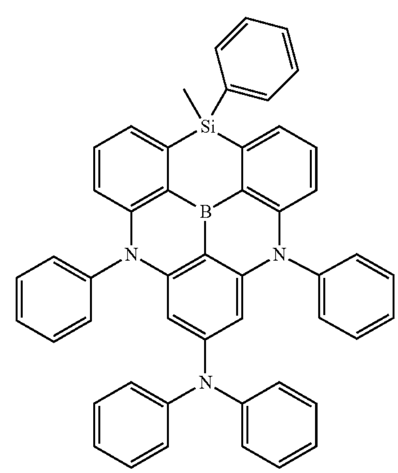

-continued
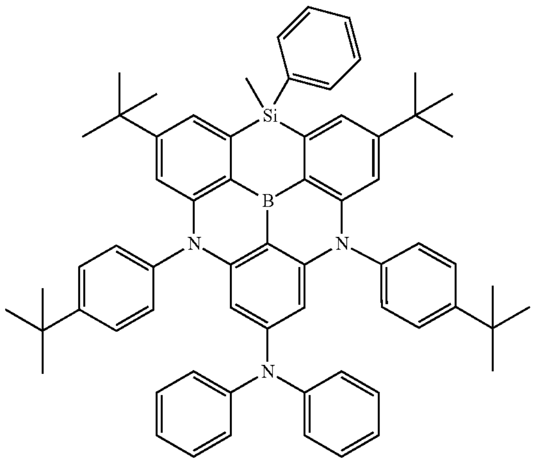
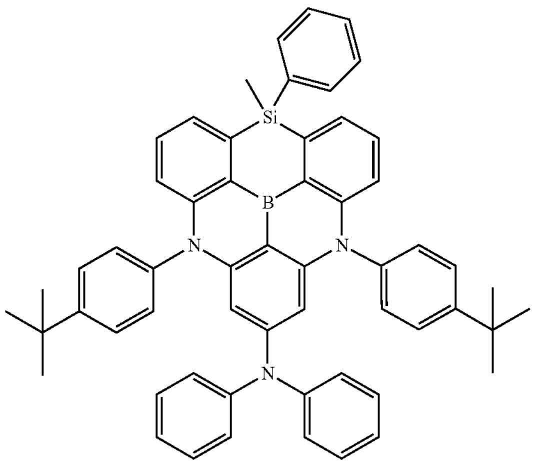
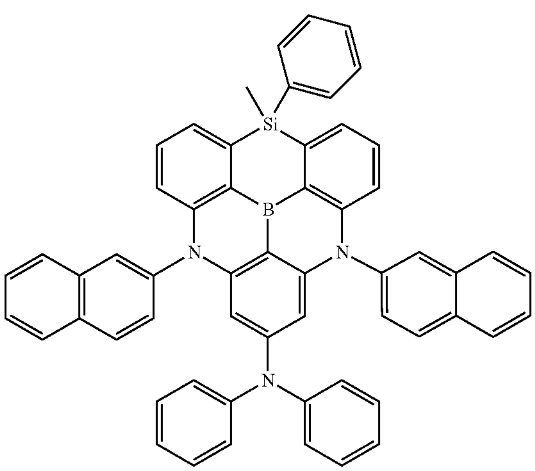
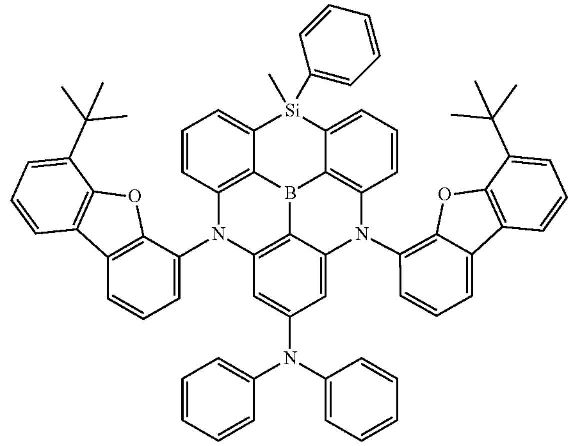
-continued
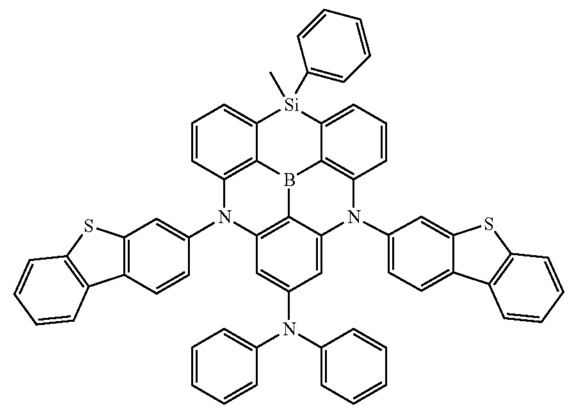
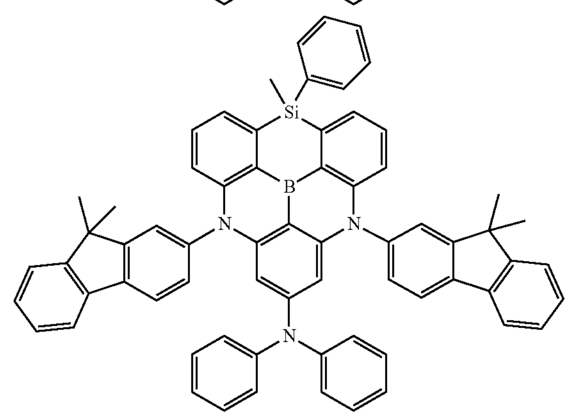
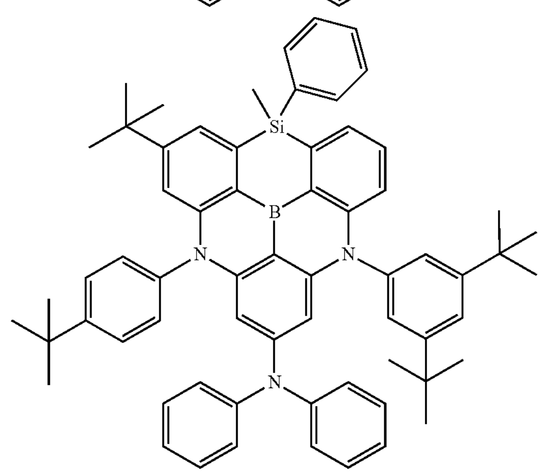

-continued
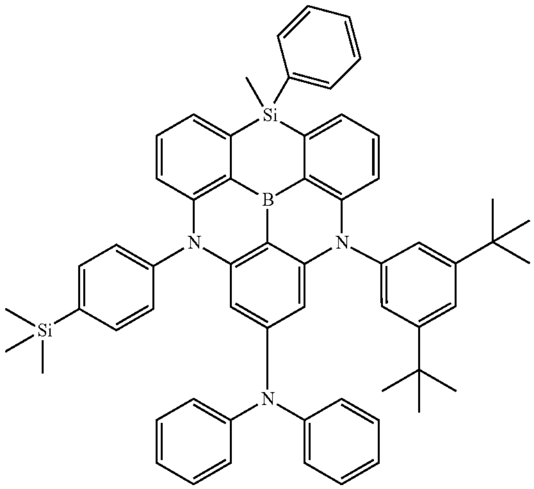
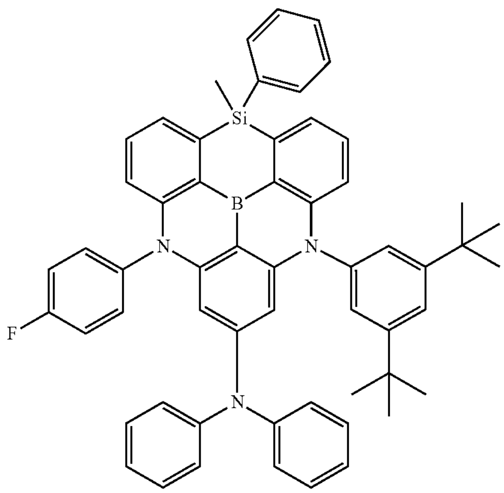
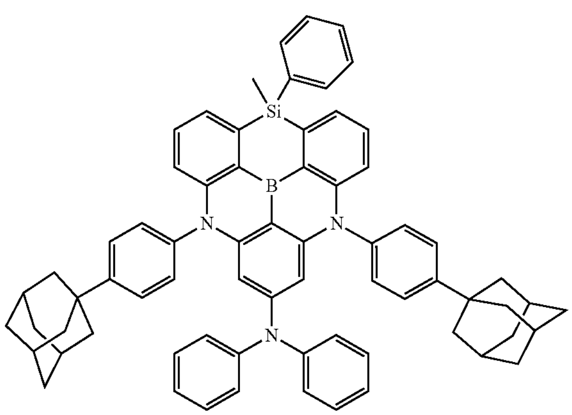
-continued
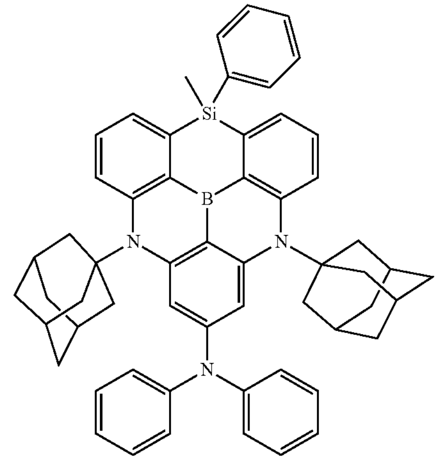
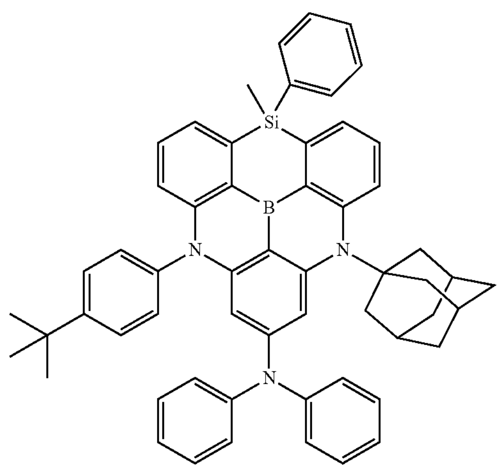
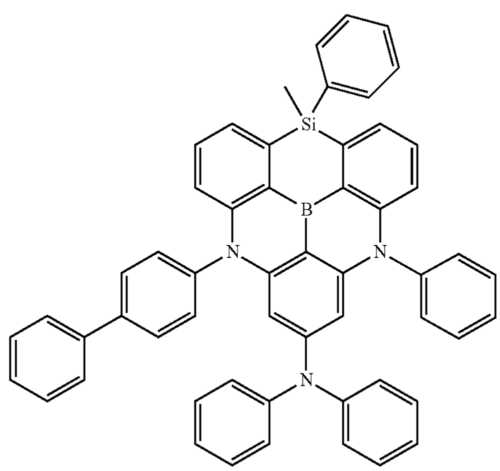

-continued
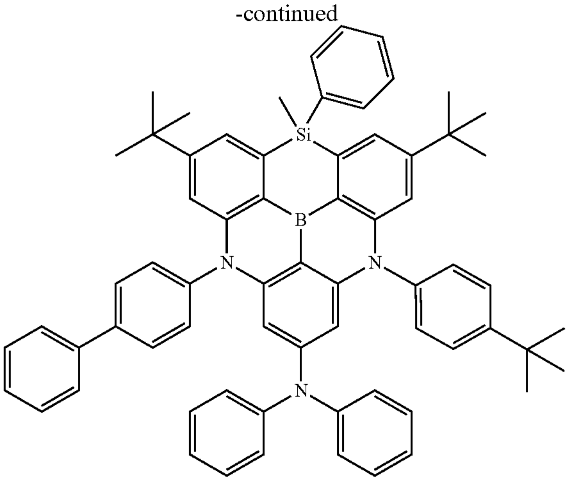
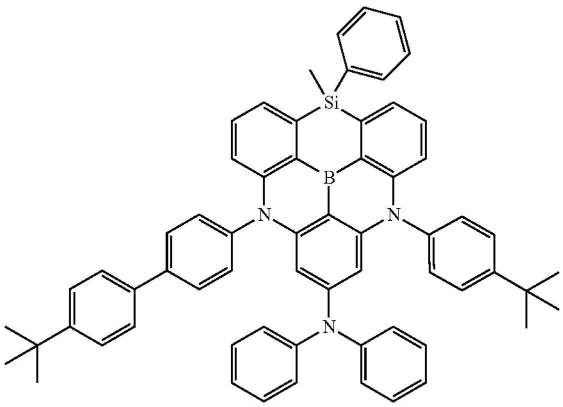
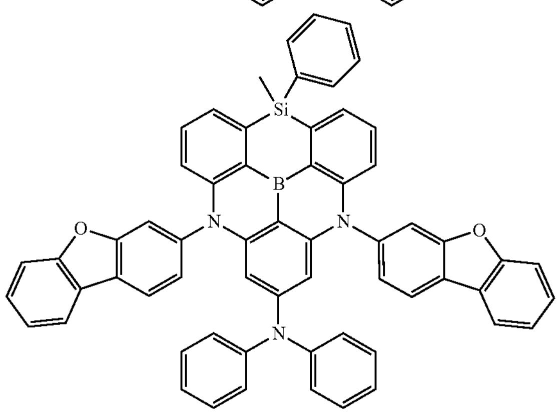
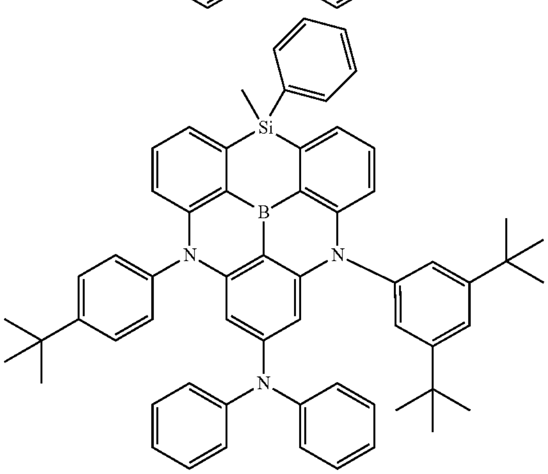
-continued
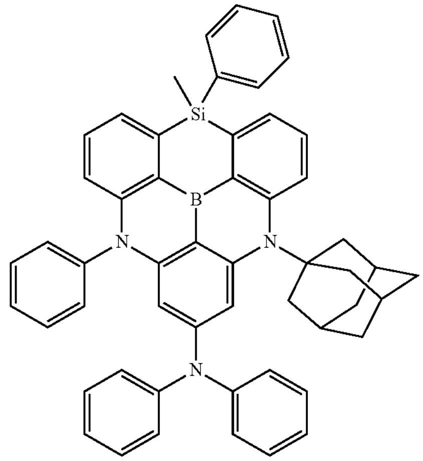
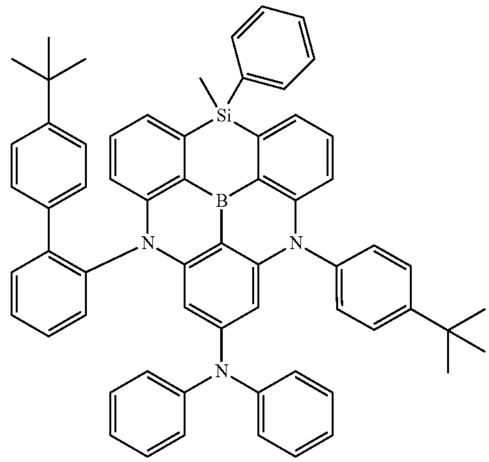
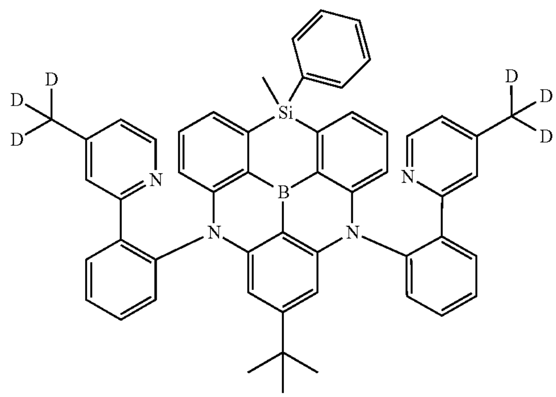
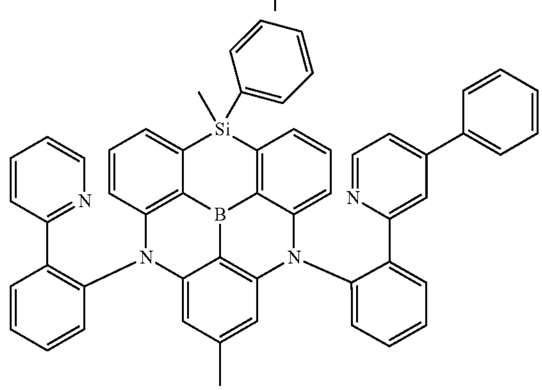

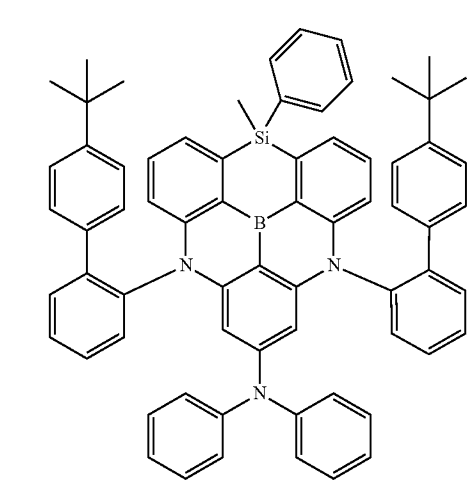
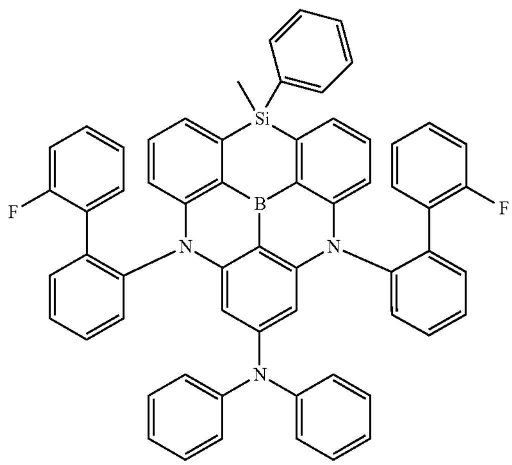 [SMILES: C[Si]1(c2ccccc2)c2cccc3c2B2c4c(cc(N(c5ccccc5)c5ccccc5)cc4N(c4ccccc4-c4ccccc4F)c4cccc1c42)N3c1ccccc1-c1ccccc1F]
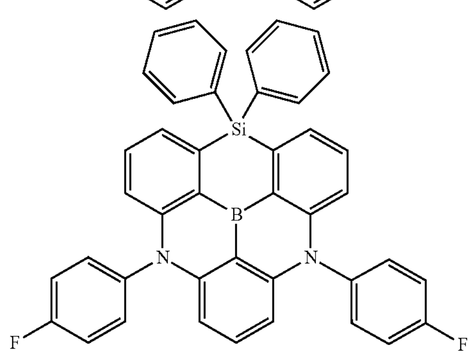
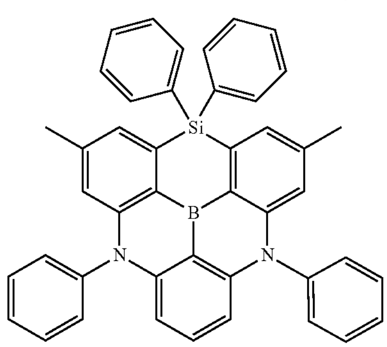
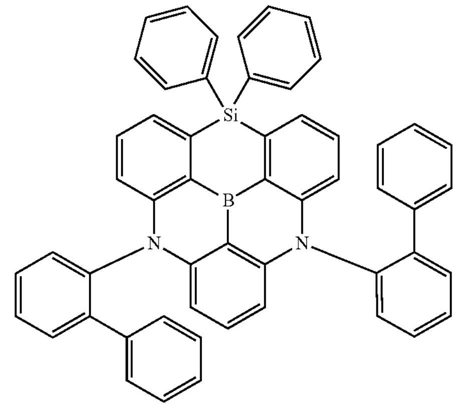
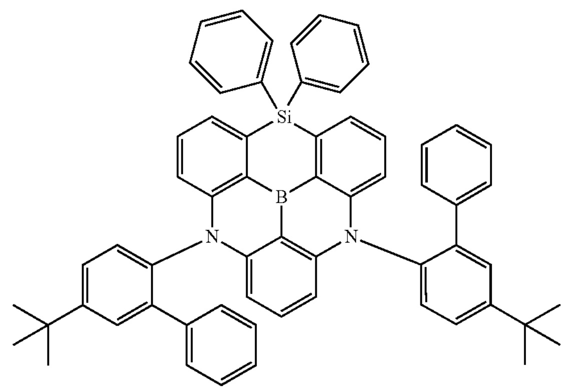
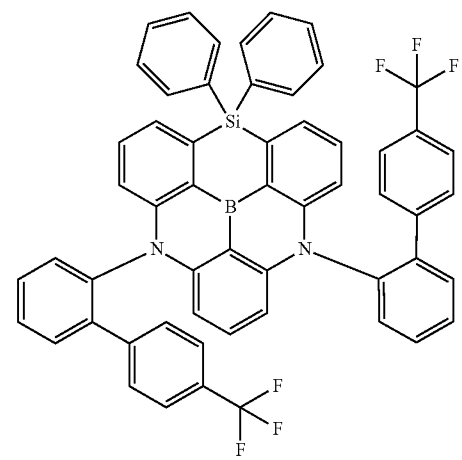
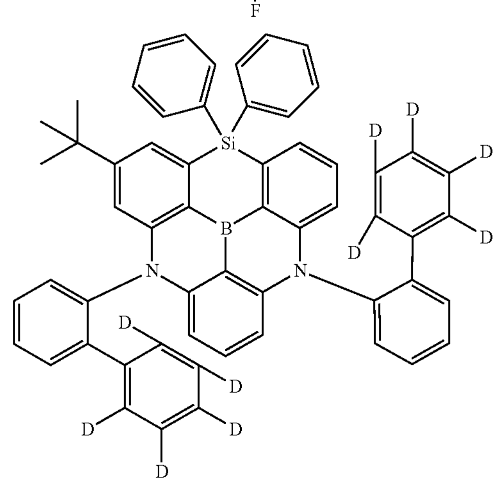

-continued
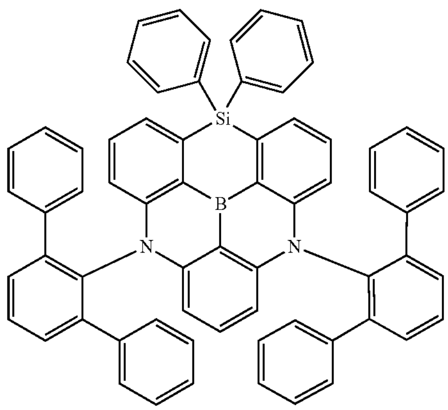
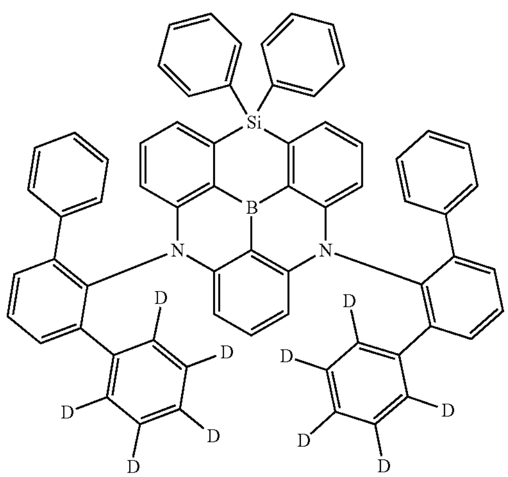
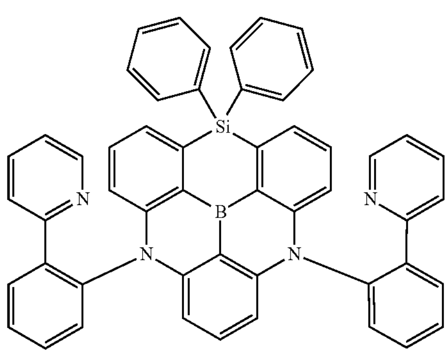
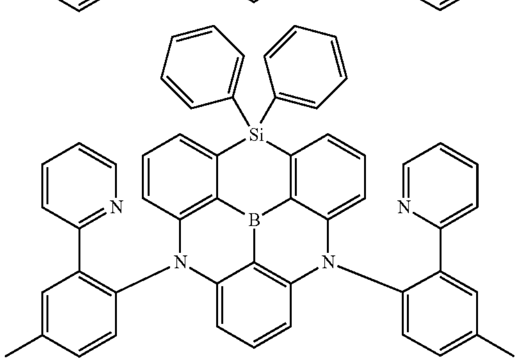
-continued
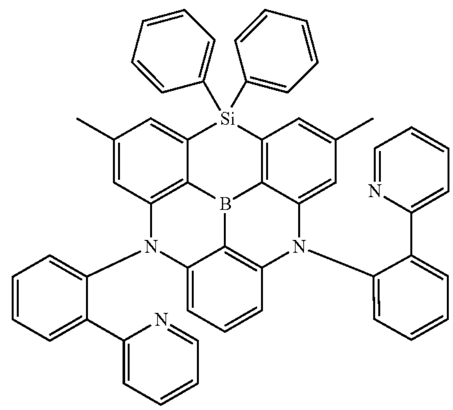
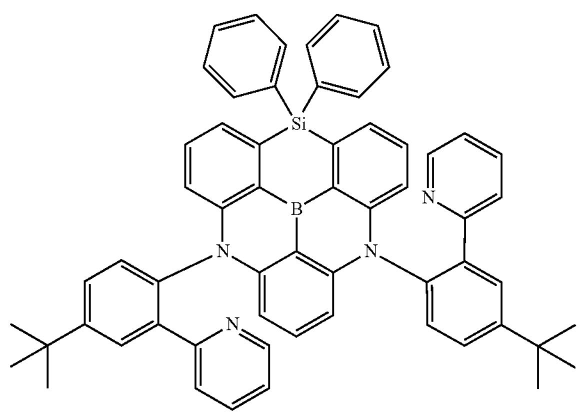
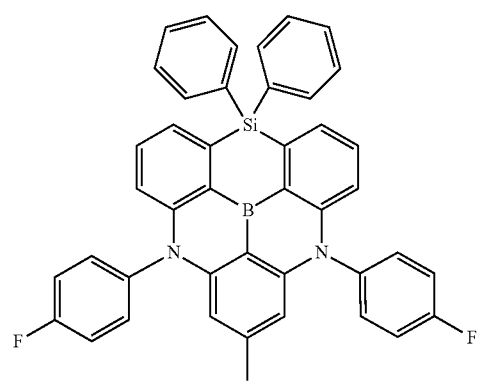
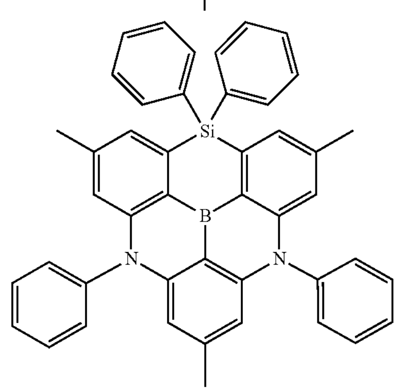

-continued
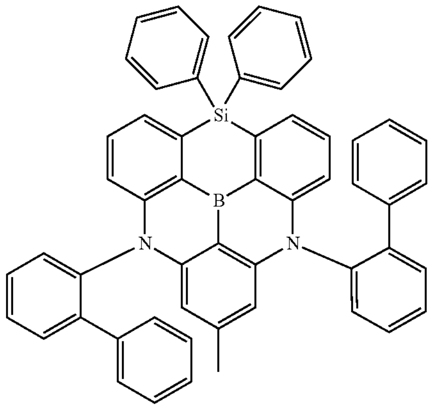
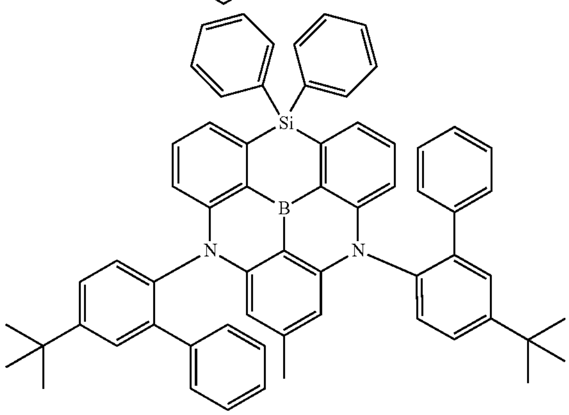
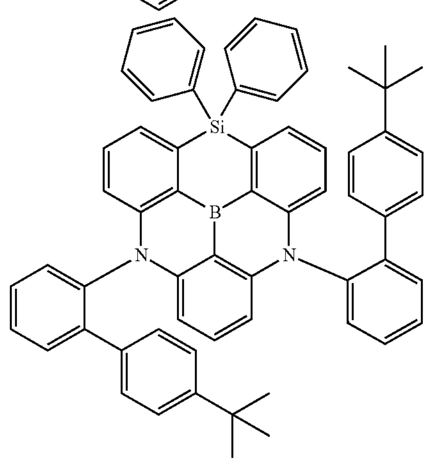
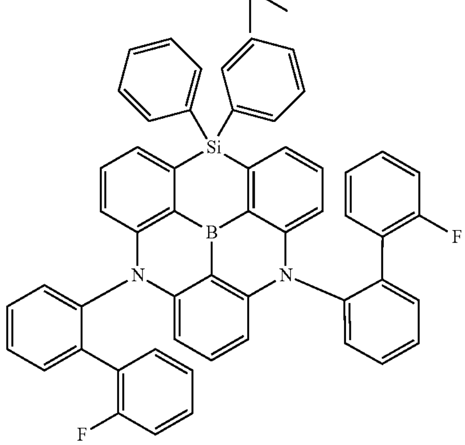
-continued
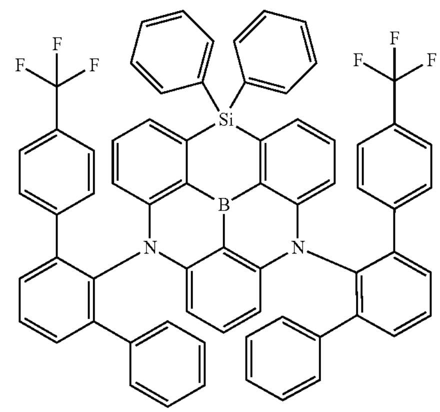
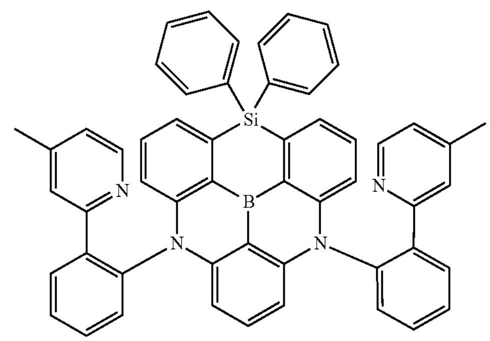
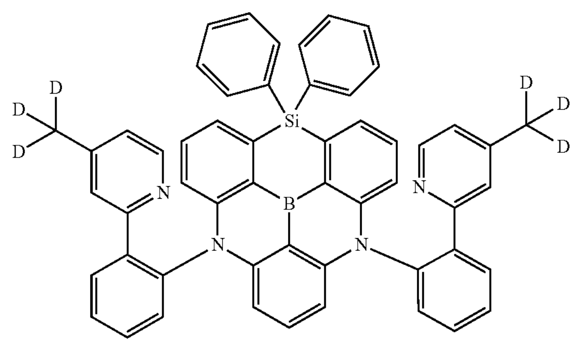
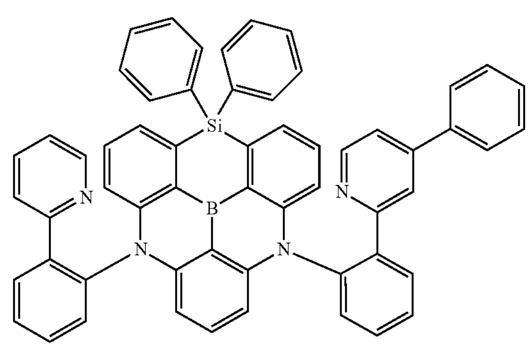

-continued
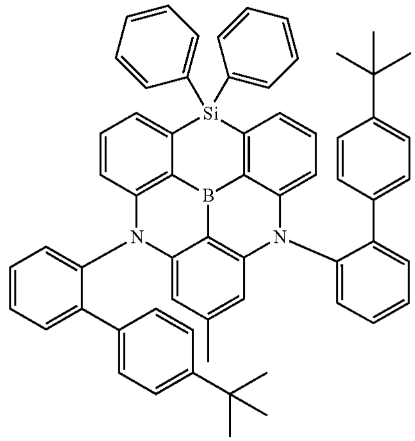
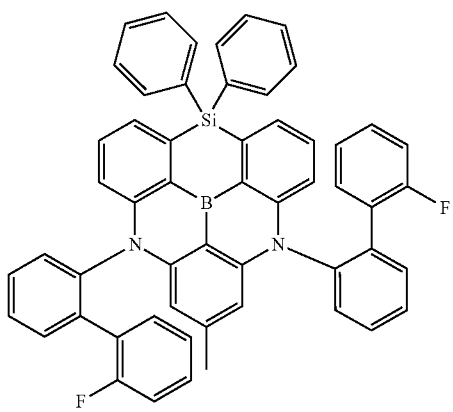
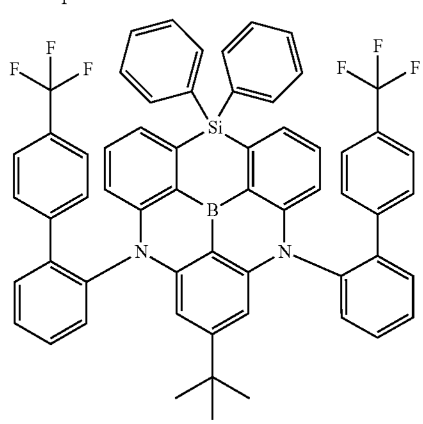
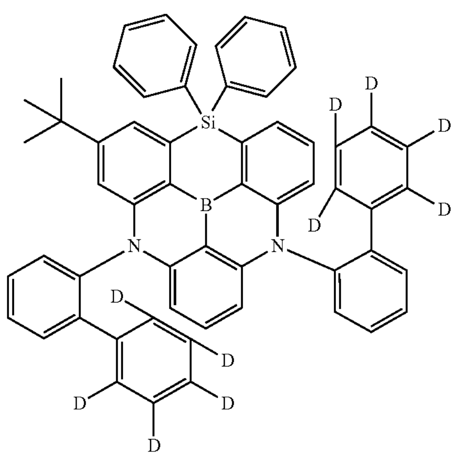
-continued
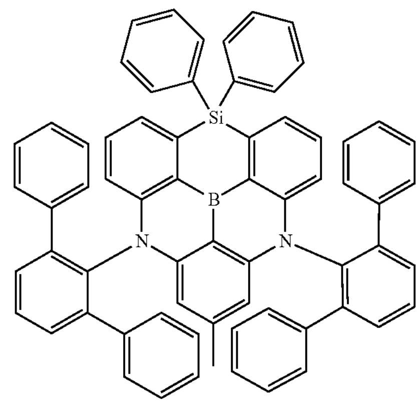
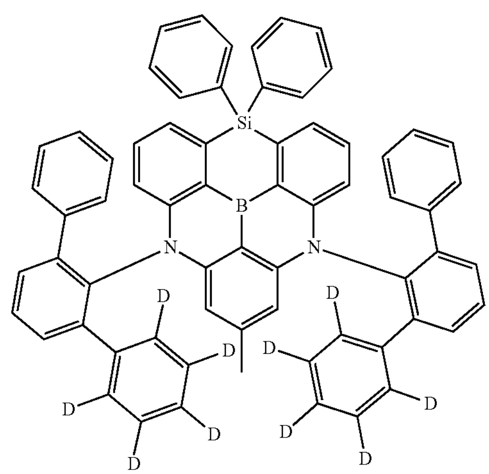
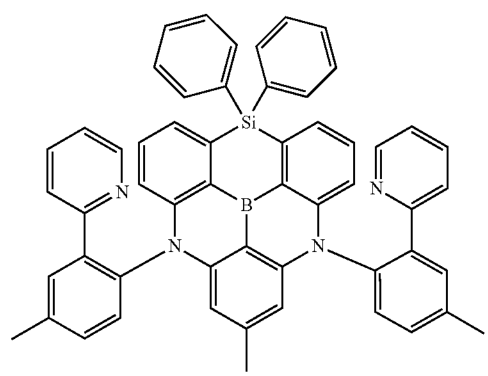
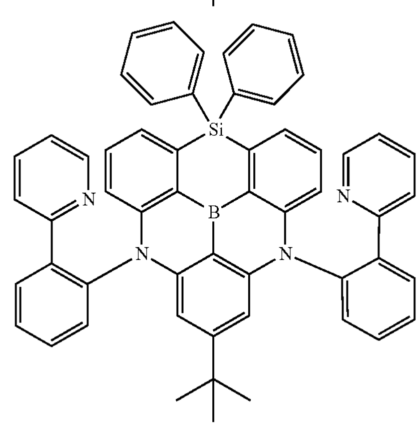

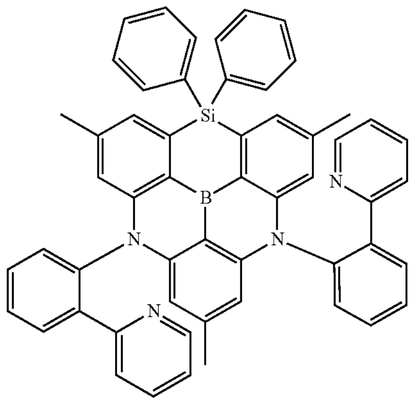
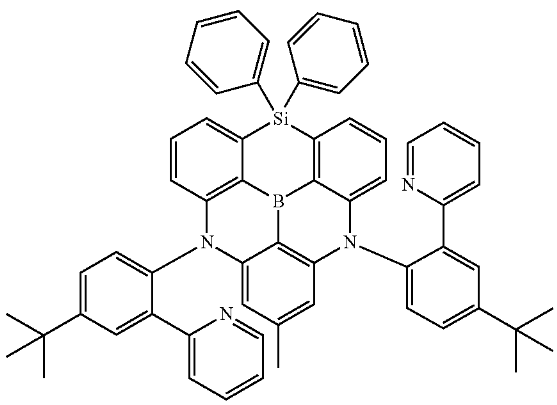
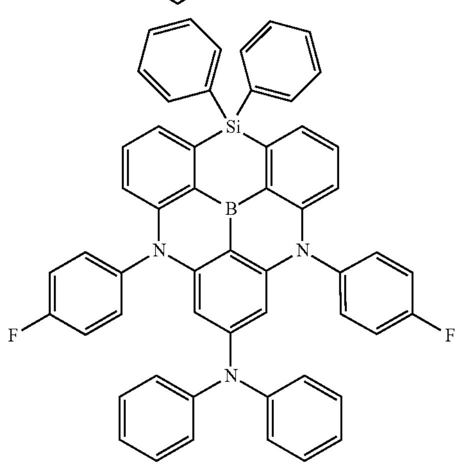
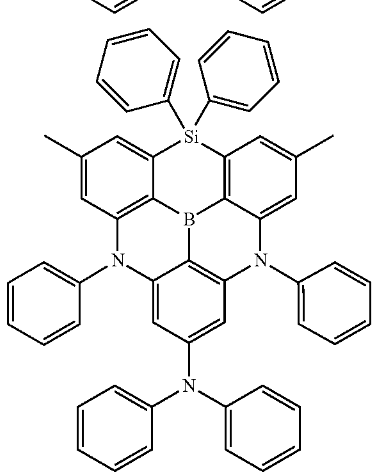
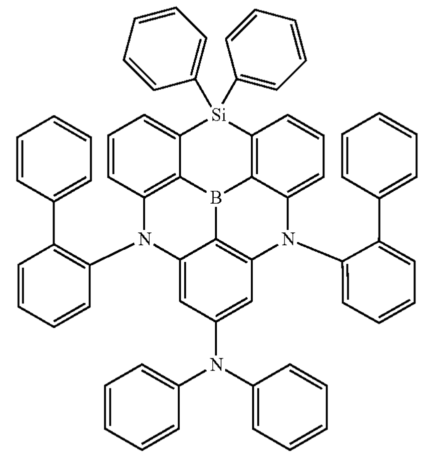
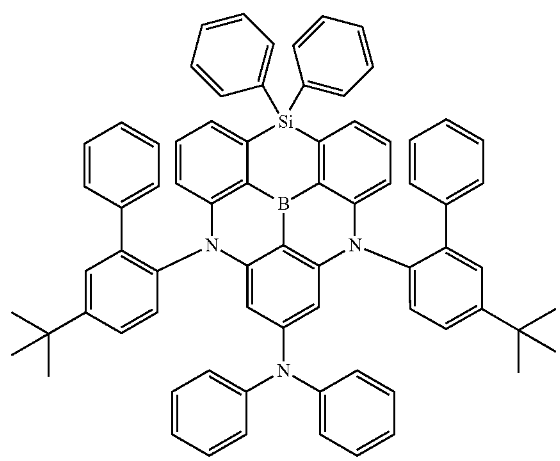
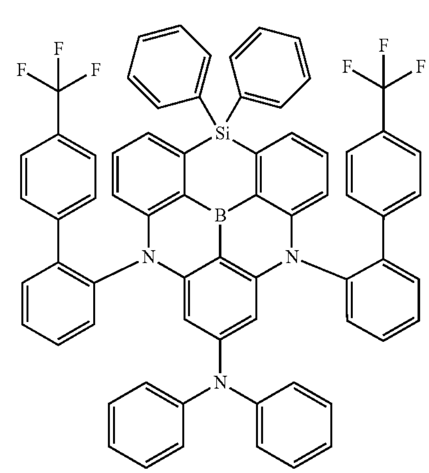

-continued
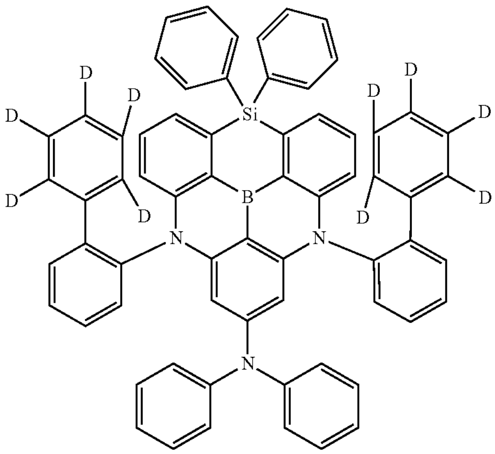
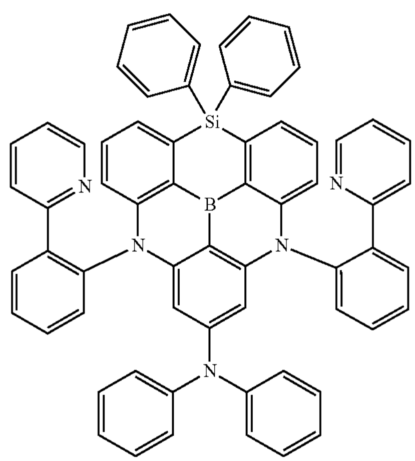
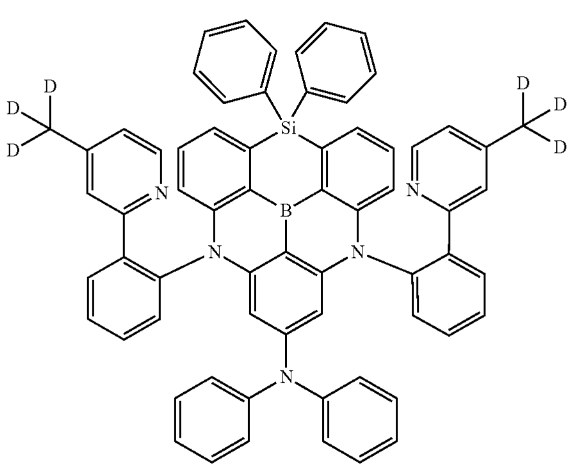
-continued
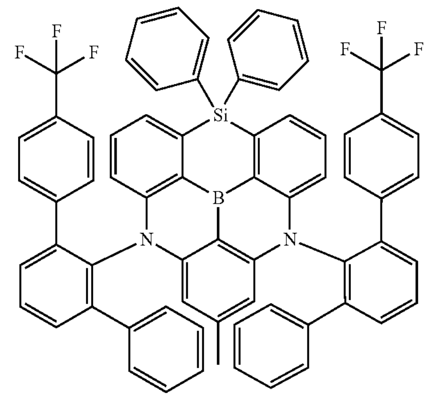
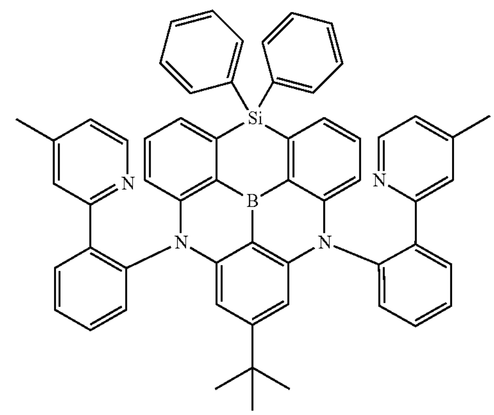
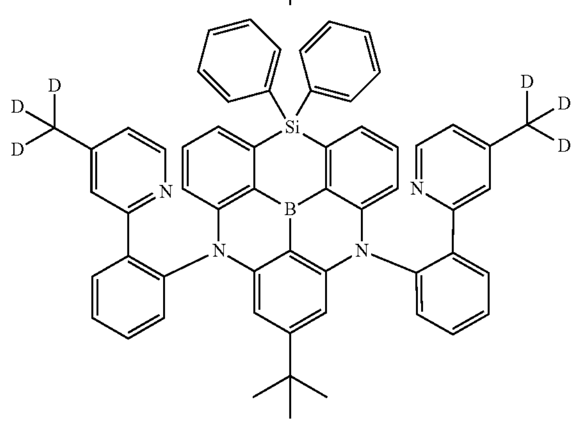
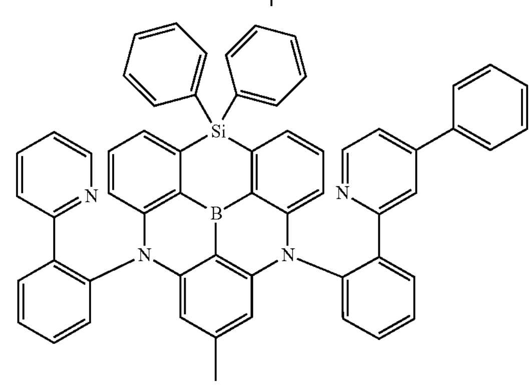

-continued
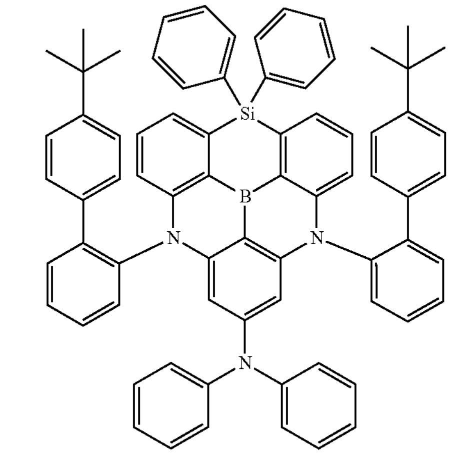
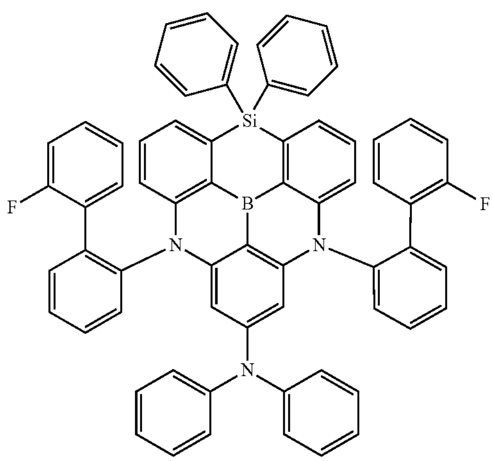
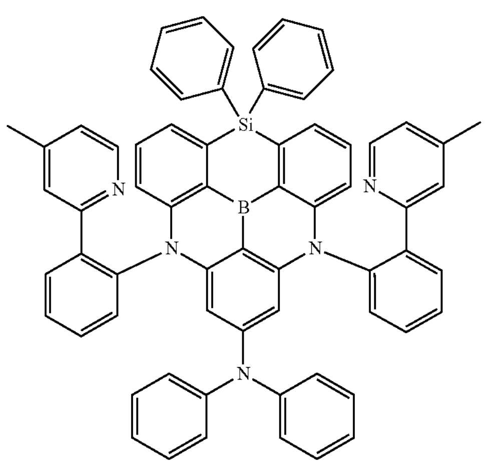
-continued
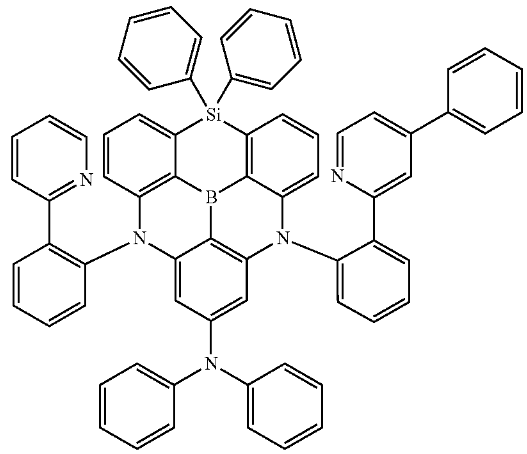 [SMILES: c1ccc(-c2ccnc(-c3ccccc3N3c4cc(N(c5ccccc5)c5ccccc5)cc5c4B4c6c(cccc6[Si](c6ccccc6)(c6ccccc6)c6cccc3c64)N5c3ccccc3-c3ccccn3)c2)cc1]
The compound of Chemical Formula 1 of the present specification may have its core structure prepared as in the following Reaction Formula 1. Substituents may bond using methods known in the art, and types, positions and the number of the substituents may vary depending on technologies known in the art.
<Reaction Formula 1>
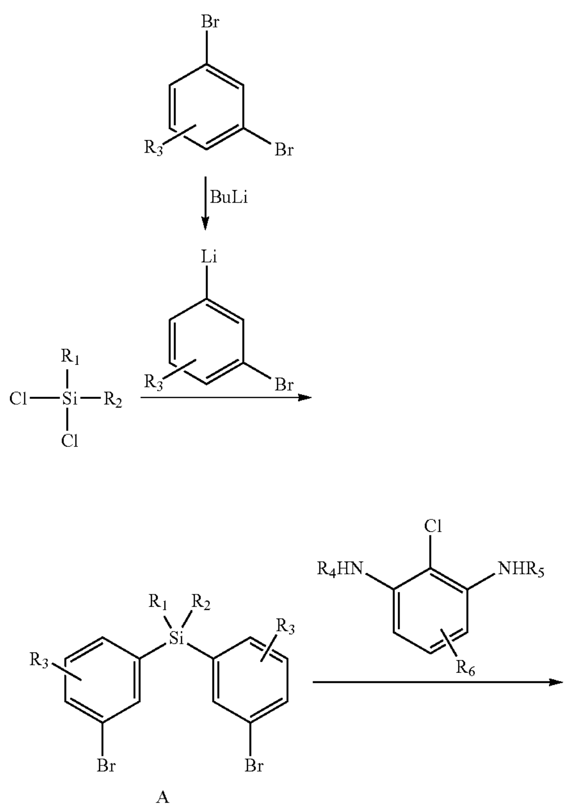

-continued

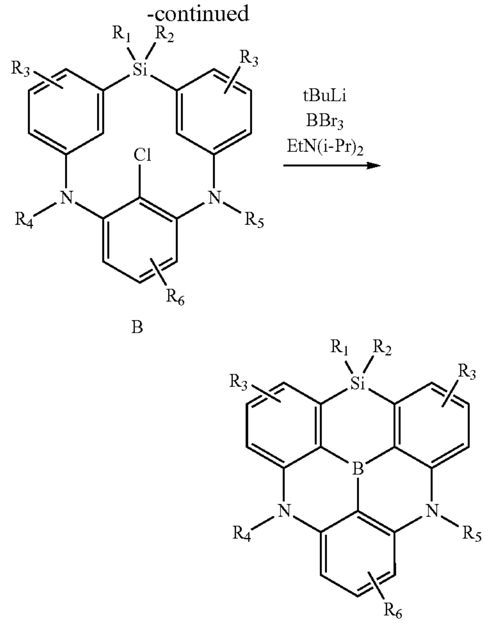

R1 and R2 in Reaction Formula 1 have the same definitions as in Chemical Formula 1, R4 and R5 in Reaction Formula 1 have the same definitions as R in Chemical Formula 1, and R3 and R6 in Reaction Formula 1 have the same definitions as Art to Ar3 in Chemical Formula 1.

In the compound of Chemical Formula 1, the linkage of a silicon (Si) atom and an energy band gap are closely related. Specifically, the compound including a portion linked by a silicon (Si) atom lowers a highest occupied molecular orbital (HOMO) energy level compared to when linked by a carbon (C) atom, and obtaining deep blue is more advantageous.

In the present disclosure, compounds having various energy band gaps may be synthesized by introducing various substituents to the core structure as above. In addition, HOMO and LUMO energy levels of the compound may also be adjusted in the present disclosure by introducing various substituents to the core structure having a structure as above.

In addition, by introducing various substituents to the core structure having a structure as above, compounds having unique properties of the introduced substituents may be synthesized. For example, by introducing substituents often used as a hole injection layer material, a material for hole transfer, a light emitting layer material and an electron transfer layer material used when manufacturing an organic light emitting device to the core structure, materials satisfying conditions required for each organic material layer may be synthesized.

In addition, an organic light emitting device according to the present disclosure includes a first electrode; a second electrode provided opposite to the first electrode; and one or more organic material layers provided between the first electrode and the second electrode, wherein one or more layers of the organic material layers include the compound described above.

The organic light emitting device of the present disclosure may be manufactured using common organic light emitting device manufacturing methods and materials except that one or more organic material layers are formed using the compound described above.

The compound of Chemical Formula 1 may be formed into an organic material layer using a solution coating method as well as a vacuum deposition method when manufacturing the organic light emitting device. Herein, the solution coating method means spin coating, dip coating, inkjet printing, screen printing, a spray method, roll coating and the like, but is not limited thereto.

The organic material layer of the organic light emitting device of the present disclosure may be formed in a single layer structure, but may be formed in a multilayer structure in which two or more organic material layers are laminated. For example, the organic light emitting device of the present disclosure may have a structure including a hole injection layer, a hole transfer layer, a layer carrying out hole injection and hole transfer at the same time, a light emitting layer, an electron transfer layer, an electron injection layer, a layer carrying out electron injection and electron transfer at the same time and the like as the organic material layer. However, the structure of the organic light emitting device is not limited thereto, and may include a smaller number of organic material layers or a larger number of organic material layers.

In the organic light emitting device of the present disclosure, the organic material layer may include one or more of an electron transfer layer, an electron injection layer, and a layer carrying out electron injection and electron transfer at the same time, and one or more layers of the above-mentioned layers may include the compound of Chemical Formula 1.

In another organic light emitting device, the organic material layer may include an electron transfer layer or an electron injection layer, and the electron transfer layer or the electron injection layer may include the compound of Chemical Formula 1.

In the organic light emitting device of the present disclosure, the organic material layer may include one or more of a hole injection layer, a hole transfer layer, and a layer carrying out hole injection and hole transfer at the same time, and one or more layers of the above-mentioned layers may include the compound of Chemical Formula 1.

In another organic light emitting device, the organic material layer may include a hole injection layer or a hole transfer layer, and the hole transfer layer or the hole injection layer may include the compound of Chemical Formula 1.

In another embodiment, the organic material layer includes a light emitting layer, and the light emitting layer includes the compound of Chemical Formula 1. As one example, the compound of Chemical Formula 1 may be included as a dopant of the light emitting layer.

In one embodiment of the present specification, the organic light emitting device is a green organic light emitting device in which the light emitting layer includes the compound of Chemical Formula 1 as a dopant.

According to one embodiment of the present specification, the organic light emitting device is a red organic light emitting device in which the light emitting layer includes the compound of Chemical Formula 1 as a dopant.

In another embodiment, the organic light emitting device is a blue organic light emitting device in which the light emitting layer includes the compound of Chemical Formula 1 as a dopant.

As another example, the organic material layer including the compound of Chemical Formula 1 includes the compound of Chemical Formula 1 as a dopant, and may further include an organic compound as a host.

As another example, the organic material layer including the compound of Chemical Formula 1 includes the compound of Chemical Formula 1 as a dopant, and may include a fluorescent host or a phosphorescent host.

In another embodiment, the organic material layer including the compound of Chemical Formula 1 includes the compound of Chemical Formula 1 as a dopant, includes a fluorescent host or a phosphorescent host, and may include other organic compounds, metals or metal compounds as a dopant.

As another example, the organic material layer including the compound of Chemical Formula 1 includes the compound of Chemical Formula 1 as a dopant, includes a fluorescent host or a phosphorescent host, and may be used with an iridium (Ir)-based dopant.

According to one embodiment of the present specification, the organic material layer of the organic light emitting device includes a light emitting layer, and the light emitting layer includes the compound of Chemical Formula 1.

In one embodiment of the present specification, the light emitting layer includes the host and the dopant in a weight ratio of 99:1 to 50:50.

In one embodiment of the present specification, the light emitting layer includes the host and the dopant in a weight ratio of 99:1 to 60:40.

In one embodiment of the present specification, the light emitting layer includes the host and the dopant in a weight ratio of 99:1 to 70:30.

In one embodiment of the present specification, the light emitting layer includes the host and the dopant in a weight ratio of 99:1 to 80:20.

In one embodiment of the present specification, the light emitting layer may include a plurality of hosts.

In one embodiment of the present specification, the light emitting layer may use a first host and a second host.

In one embodiment of the present specification, the light emitting layer includes the first host and the second host in a ratio of 1:9 to 9:1.

In one embodiment of the present specification, the light emitting layer includes the first host and the second host in a ratio of 4:6 to 6:4.

In one embodiment of the present specification, the light emitting layer includes the first host and the second host in a ratio of 1:1.

In one embodiment of the present specification, the organic material layer of the organic light emitting device includes a light emitting layer, the light emitting layer includes the compound of Chemical Formula 1, and further includes a compound of the following Chemical Formula 1-1. Herein, the compound of Chemical Formula 1 may be included as a dopant of the light emitting layer, and a compound of the following Chemical Formula 1-1 may be included as a host of the light emitting layer.

[Chemical Formula 1-1]

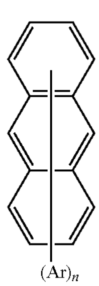

In Chemical Formula 1-1,

Ar is a substituted or unsubstituted aryl group; or a substituted or unsubstituted heteroaryl group, and n is an integer of 1 to 10, and when n is 2 or greater, the two or more Ars are the same as or different from each other.

In one embodiment of the present specification, n is 1 or 2, and when n is 2, the two Ars are the same as or different from each other.

According to one embodiment of the present specification, Ar is a substituted or unsubstituted aryl group having 6 to 60 carbon atoms; or a substituted or unsubstituted heteroaryl group having 2 to 60 carbon atoms and including one or more types selected from the group consisting of N, O and S as a heteroatom.

According to another embodiment, Ar is a substituted or unsubstituted aryl group having 6 to 30 carbon atoms; or a substituted or unsubstituted heteroaryl group having 2 to 30 carbon atoms and including one or more types selected from the group consisting of N, O and S as a heteroatom.

In another embodiment, Ar is an aryl group having 6 to 30 carbon atoms unsubstituted or substituted with an aryl group having 6 to 30 carbon atoms; or a heteroaryl group having 2 to 30 carbon atoms and including one or more types selected from the group consisting of N, O and S as a heteroatom.

According to another embodiment, Ar is a substituted or unsubstituted phenyl group; a substituted or unsubstituted biphenyl group; a substituted or unsubstituted terphenyl group; a substituted or unsubstituted quaterphenyl group; a substituted or unsubstituted naphthyl group; a substituted or unsubstituted phenanthrenyl group; a substituted or unsubstituted fluorenyl group; a substituted or unsubstituted benzofluorenyl group; a substituted or unsubstituted chrysenyl group; a substituted or unsubstituted triphenylenyl group; a substituted or unsubstituted pyrenyl group; a substituted or unsubstituted dibenzofuran group; a substituted or unsubstituted dibenzothiophene group; a substituted or unsubstituted carbazole group; or a substituted or unsubstituted benzocarbazole group.

In another embodiment, Ar is a phenyl group unsubstituted or substituted with a naphthyl group; a biphenyl group; a naphthyl group unsubstituted or substituted with a phenyl group or a naphthyl group; a phenanthrenyl group; or a dibenzofuran group.

According to one embodiment of the present specification, Chemical Formula 1-1 is of the following Chemical Formula 1-1-1.

[Chemical Formula 1-1-1]

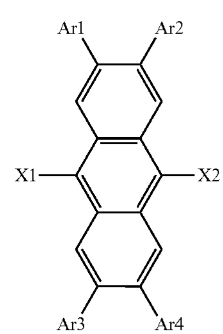

In Chemical Formula 1-1-1,

A1 to A4 are the same as or different from each other, and each independently hydrogen; a substituted or unsubstituted aryl group; or a substituted or unsubstituted heteroaryl group, and X1 and X2 are the same as or different from each other, and each independently a substituted or unsubstituted aryl group; or a substituted or unsubstituted heteroaryl group.

According to one embodiment of the present specification, A1 to A4 are the same as or different from each other, and each independently hydrogen; a substituted or unsubstituted aryl group having 6 to 60 carbon atoms; or a substituted or unsubstituted heteroaryl group having 2 to 60 carbon atoms and including one or more types selected from the group consisting of N, O and S as a heteroatom.

According to another embodiment, A1 to A4 are the same as or different from each other, and each independently hydrogen; an aryl group having 6 to 30 carbon atoms; or a heteroaryl group having 2 to 30 carbon atoms and including one or more types selected from the group consisting of N, O and S as a heteroatom.

In another embodiment, A1 to A4 are each hydrogen.

According to one embodiment of the present specification, X1 and X2 are the same as or different from each other, and each independently a substituted or unsubstituted aryl group having 6 to 60 carbon atoms; or a substituted or unsubstituted heteroaryl group having 2 to 60 carbon atoms and including one or more types selected from the group consisting of N, O and S as a heteroatom.

According to another embodiment, X1 and X2 are the same as or different from each other, and each independently a substituted or unsubstituted aryl group having 6 to 30 carbon atoms; or a substituted or unsubstituted heteroaryl group having 2 to 30 carbon atoms and including one or more types selected from the group consisting of N, O and S as a heteroatom.

In another embodiment, X1 and X2 are the same as or different from each other, and each independently an aryl group having 6 to 30 carbon atoms unsubstituted or substituted with an aryl group having 6 to 30 carbon atoms; or a heteroaryl group having 2 to 30 carbon atoms and including one or more types selected from the group consisting of N, O and S as a heteroatom.

According to another embodiment, X1 and X2 are the same as or different from each other, and each independently a substituted or unsubstituted phenyl group; a substituted or unsubstituted biphenyl group; a substituted or unsubstituted terphenyl group; a substituted or unsubstituted quaterphenyl group; a substituted or unsubstituted naphthyl group; a substituted or unsubstituted phenanthrenyl group; a substituted or unsubstituted fluorenyl group; a substituted or unsubstituted benzofluorenyl group; a substituted or unsubstituted chrysenyl group; a substituted or unsubstituted triphenylenyl group; a substituted or unsubstituted pyrenyl group; a substituted or unsubstituted dibenzofuran group; a substituted or unsubstituted dibenzothiophene group; a substituted or unsubstituted carbazole group; or a substituted or unsubstituted benzocarbazole group.

In another embodiment, X1 and X2 are the same as or different from each other, and each independently a phenyl group unsubstituted or substituted with a naphthyl group; a biphenyl group; a naphthyl group unsubstituted or substituted with a phenyl group or a naphthyl group; a phenanthrenyl group; or a dibenzofuran group.

According to one embodiment of the present specification, the compound of Chemical Formula 1-1 may be selected from among the following structures.

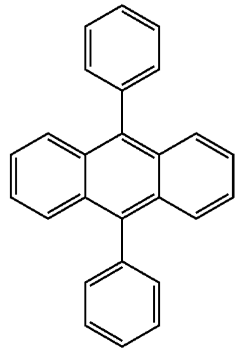

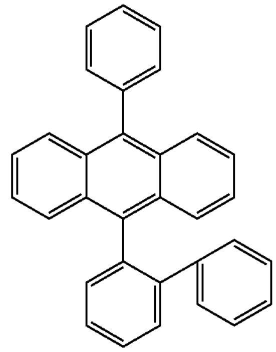

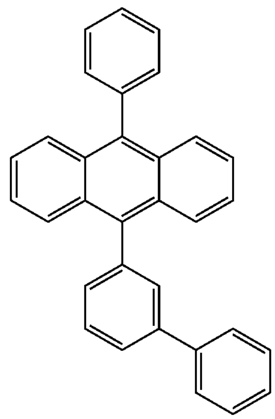

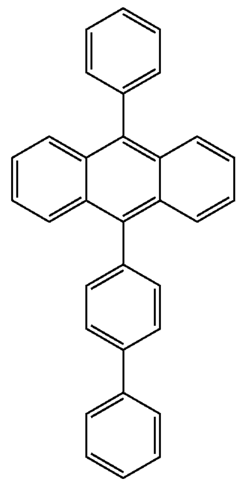

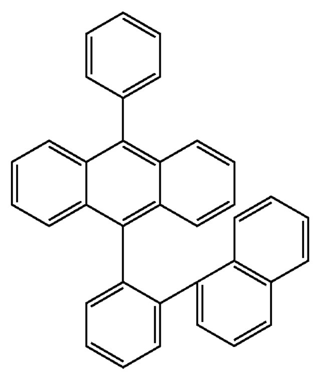

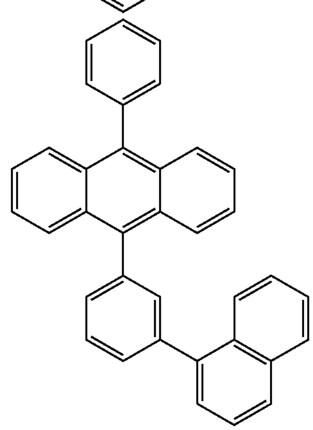

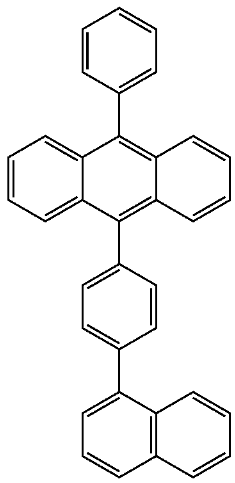
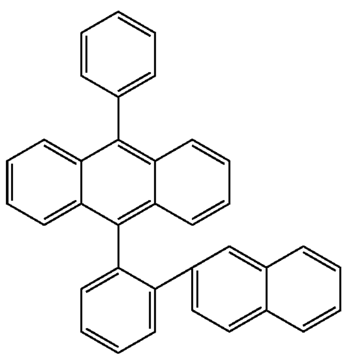
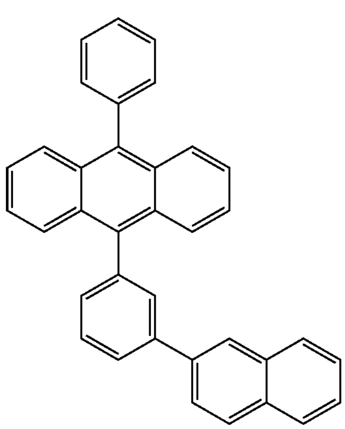
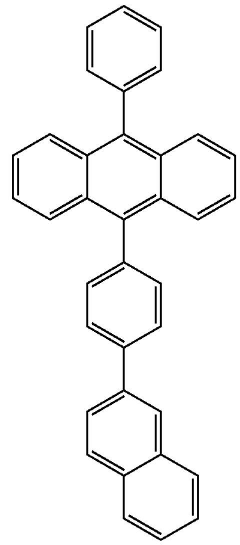
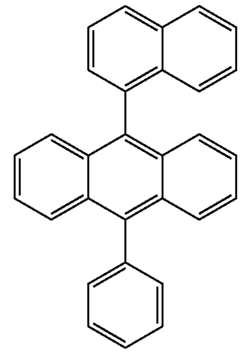
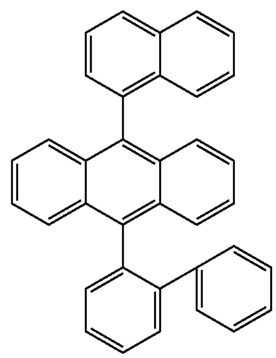
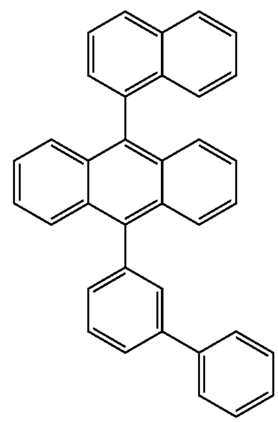
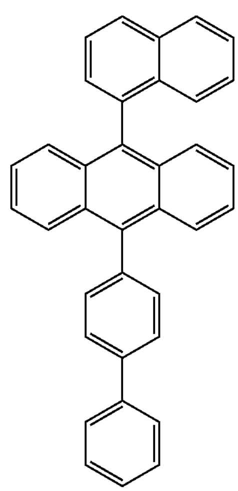
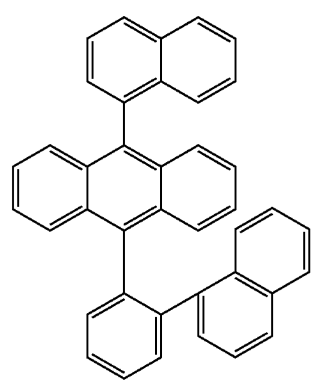

-continued
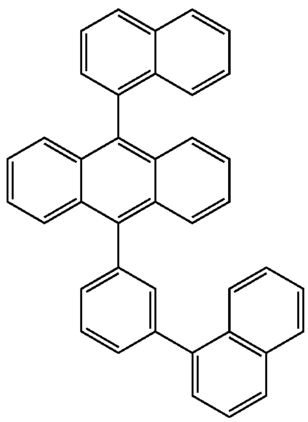
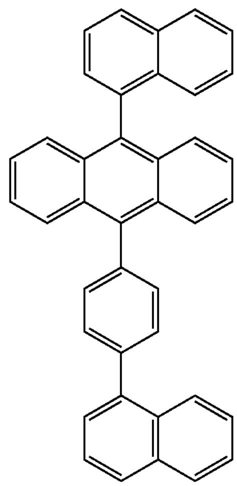
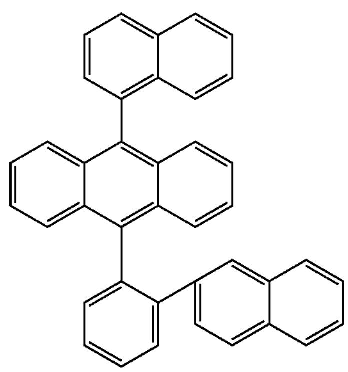
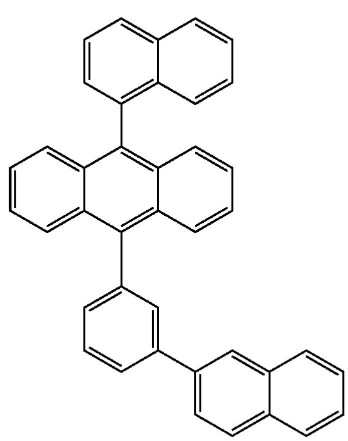
-continued
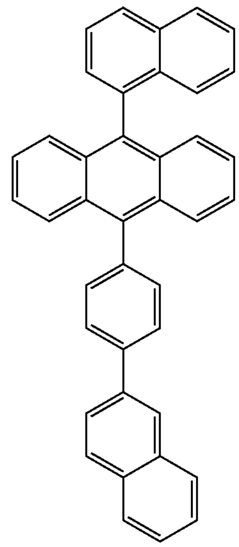
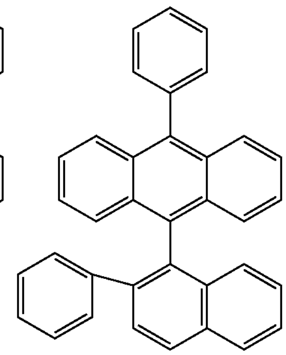
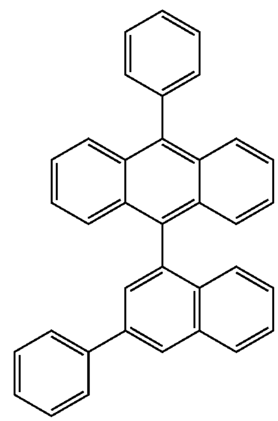
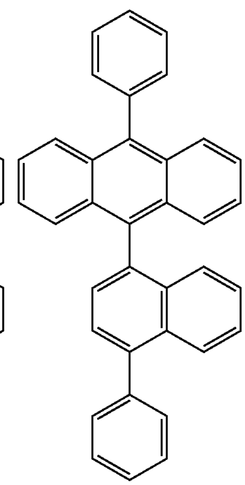
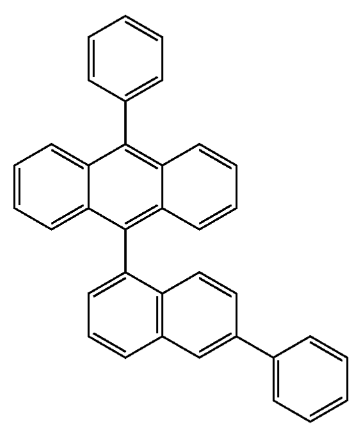

-continued
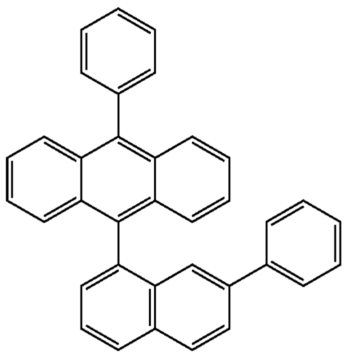
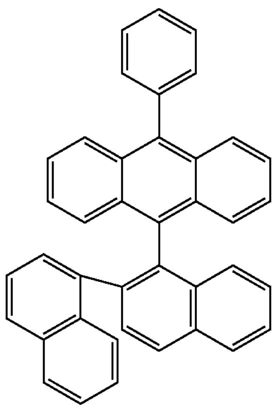
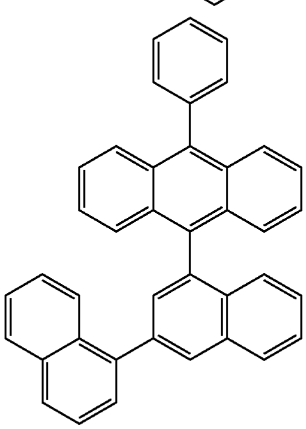
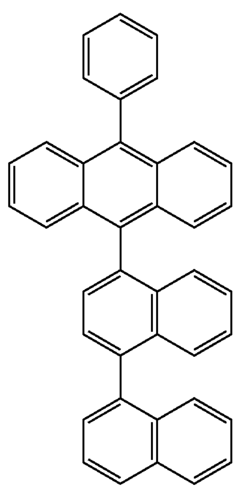
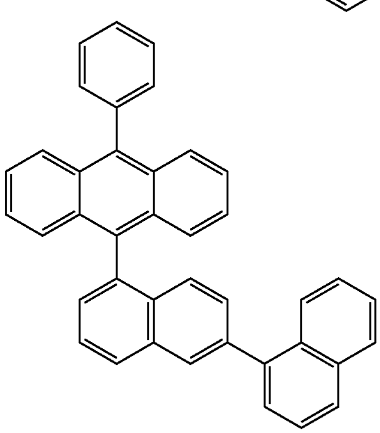
-continued
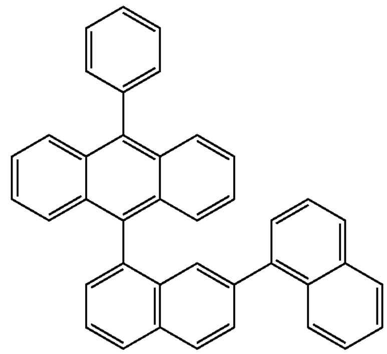
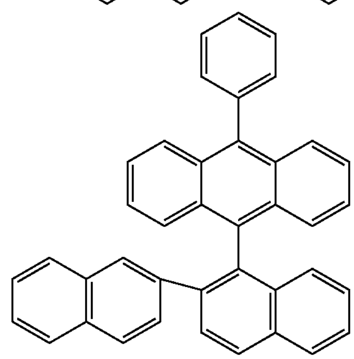
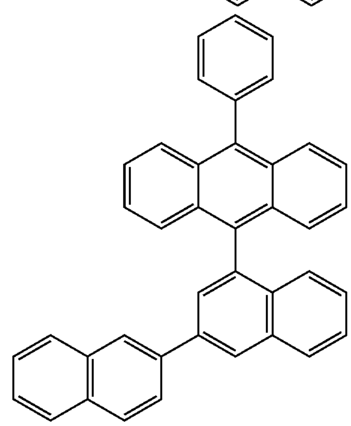
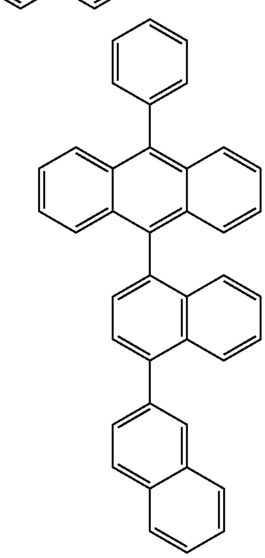

-continued
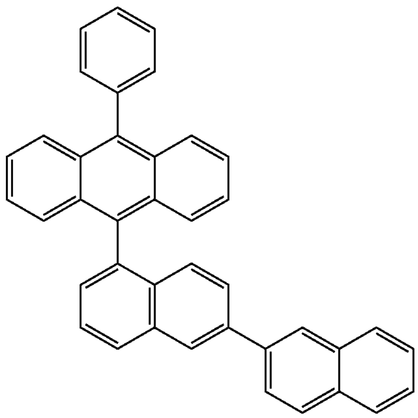
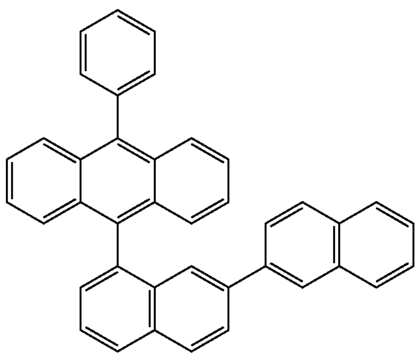
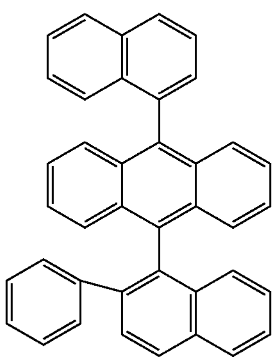
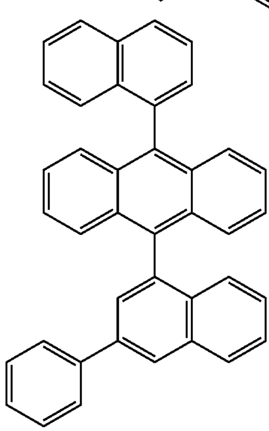
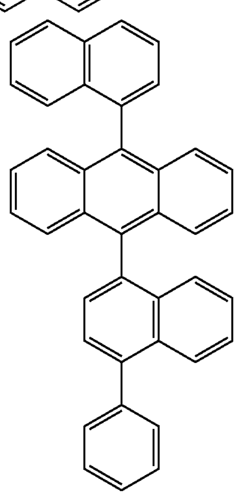
-continued
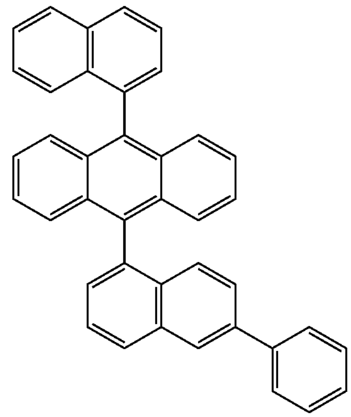
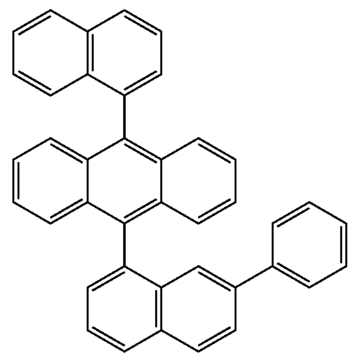
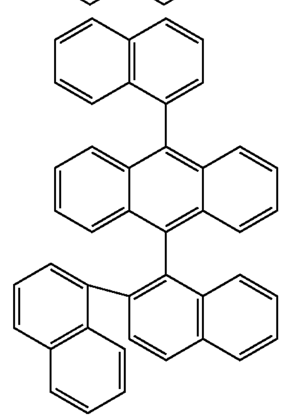
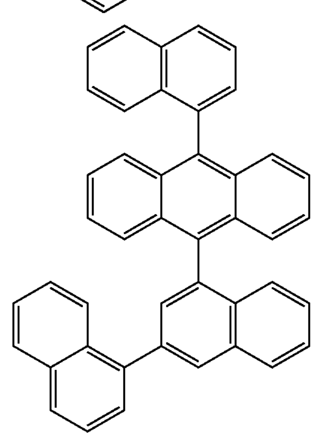

-continued
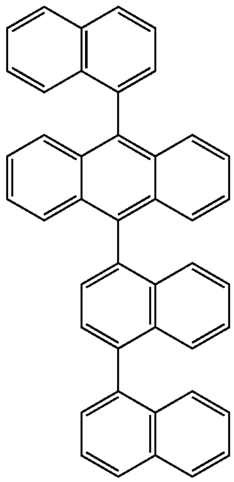
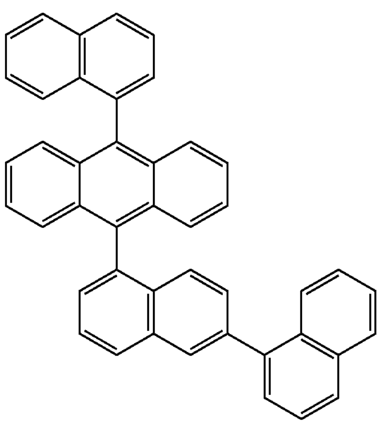
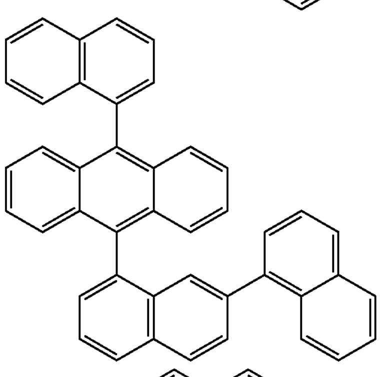
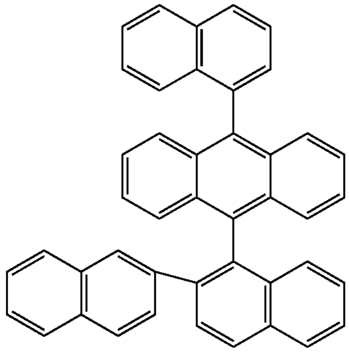
-continued
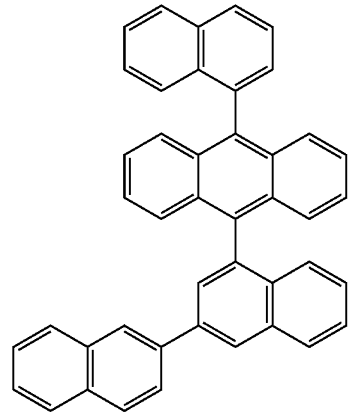
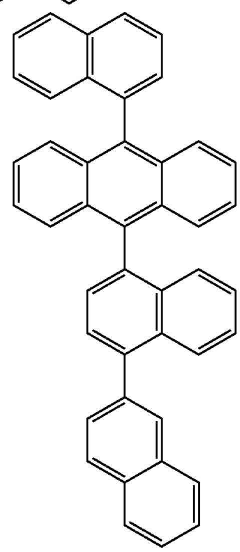
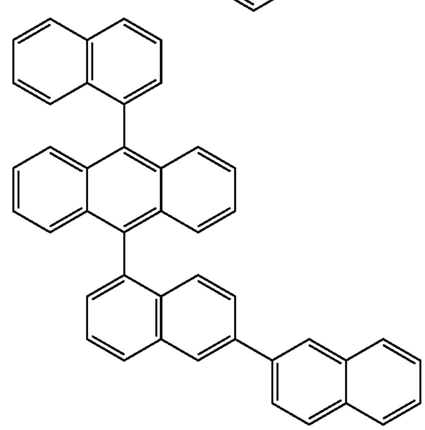
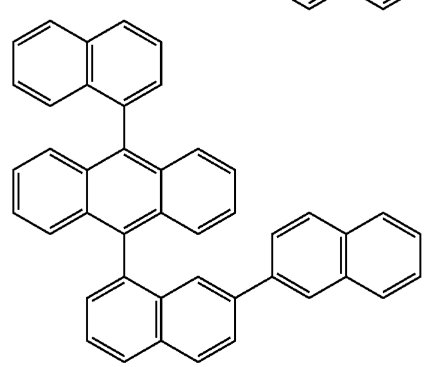

-continued
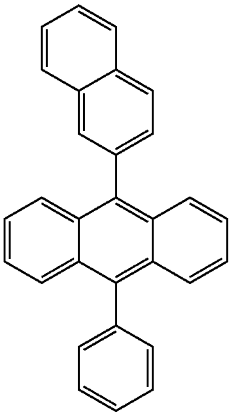
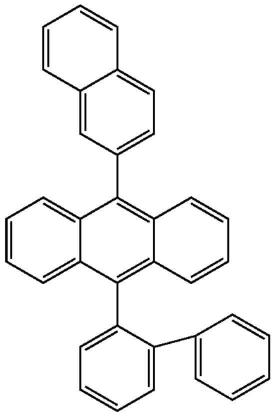
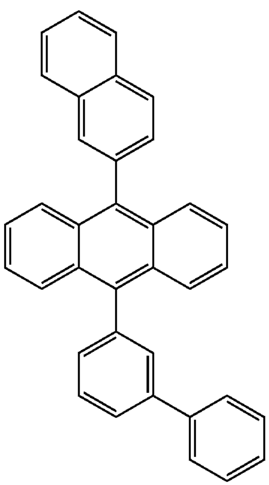
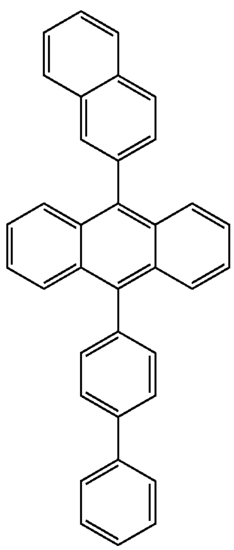
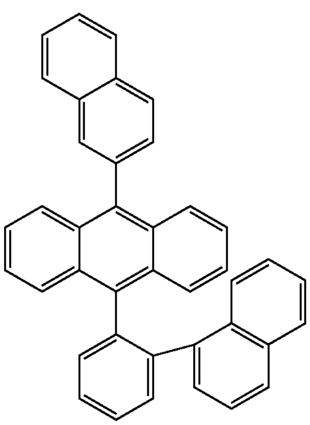
-continued
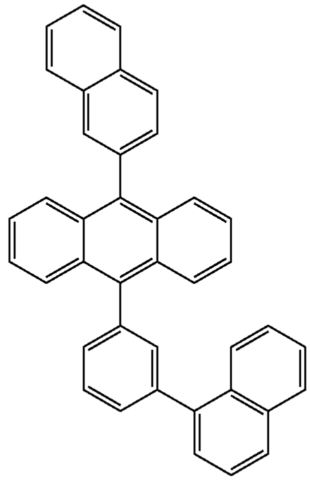
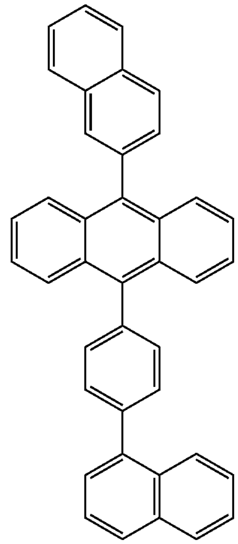
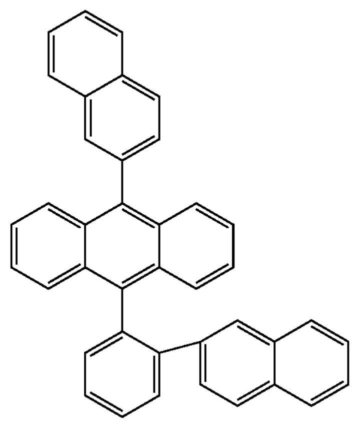
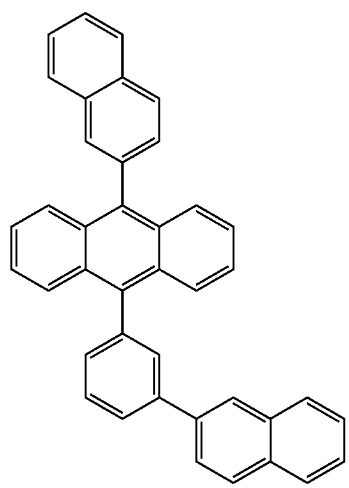

-continued
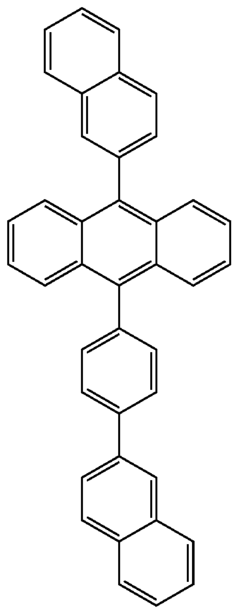
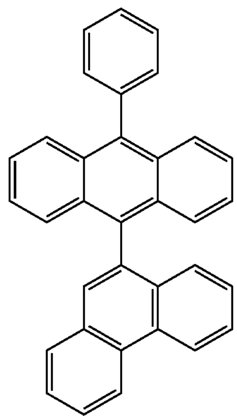
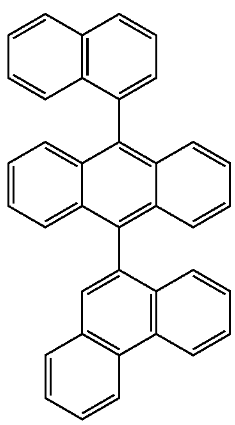
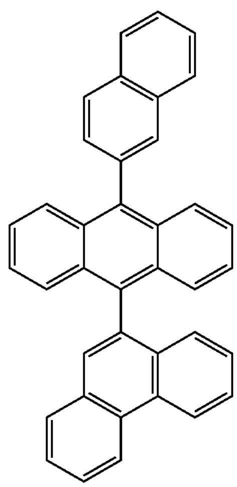
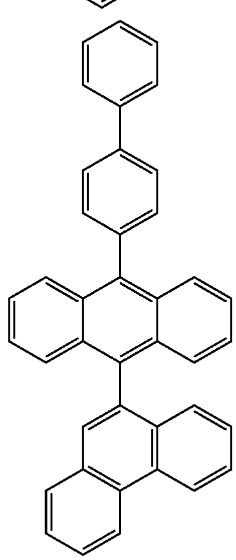
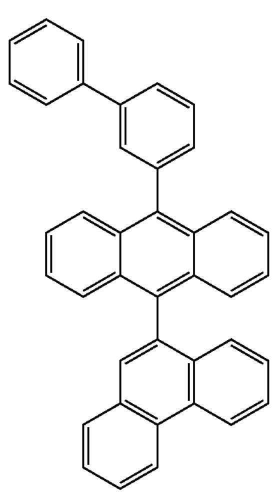
-continued
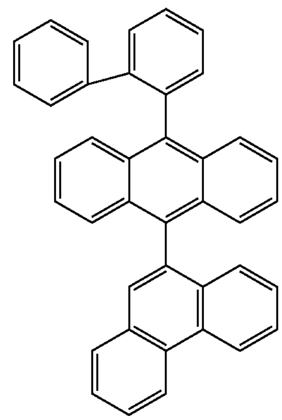
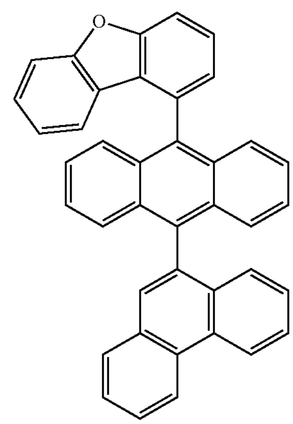
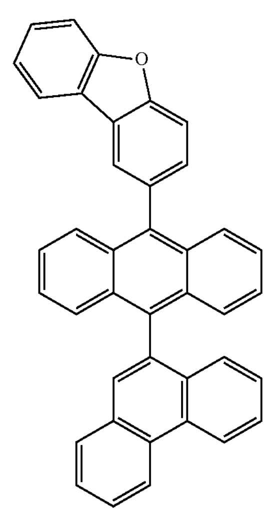
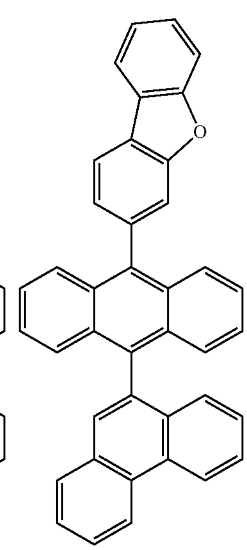

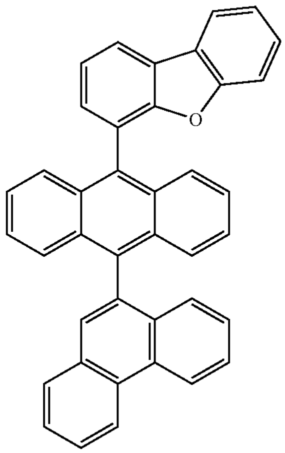
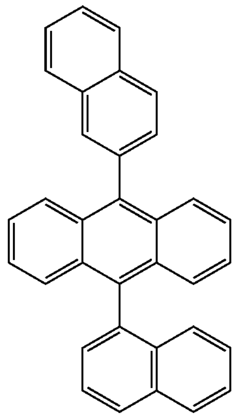
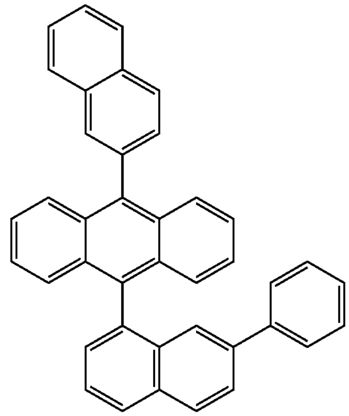
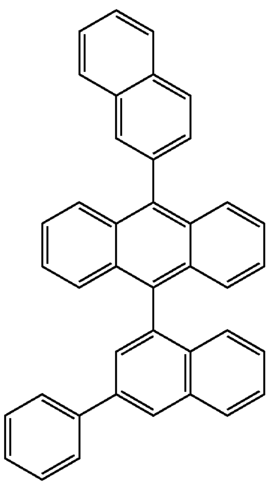
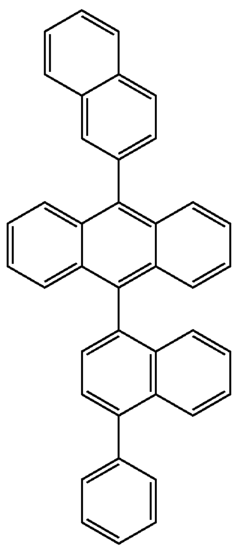
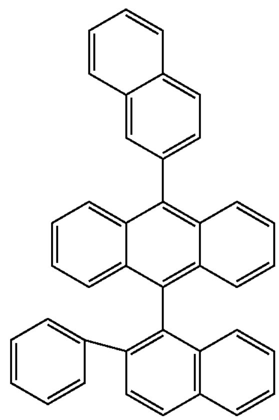
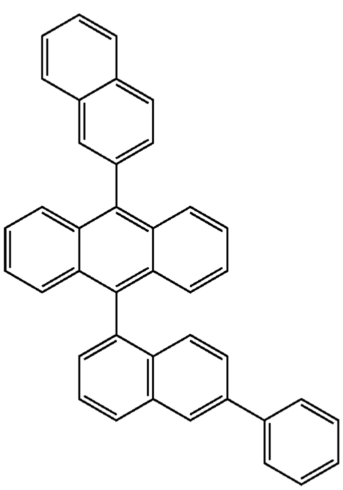
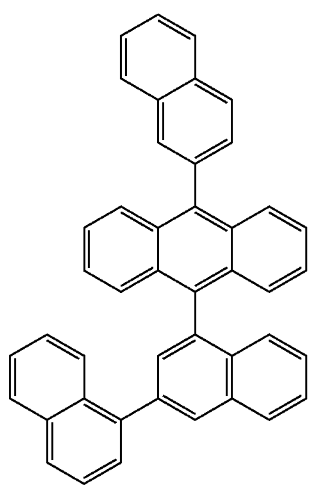
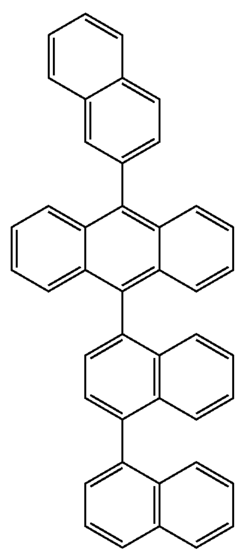

-continued
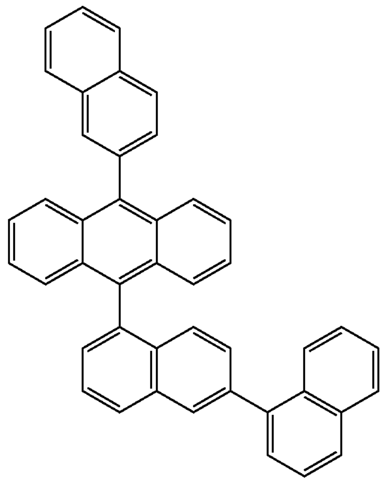
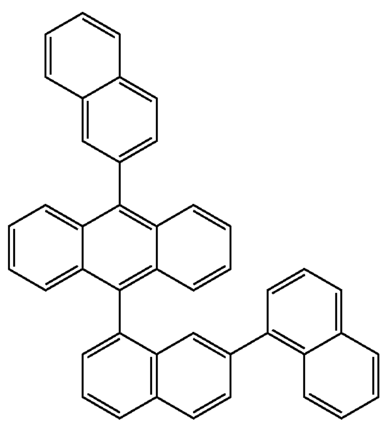
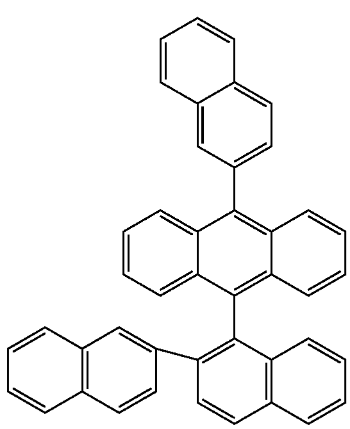
-continued
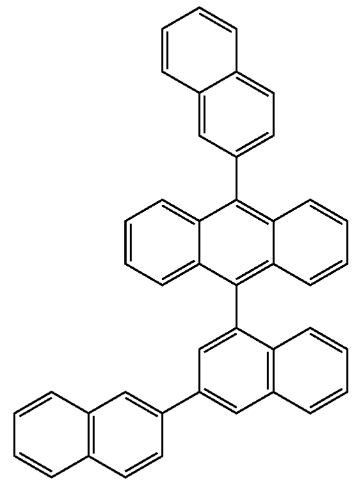
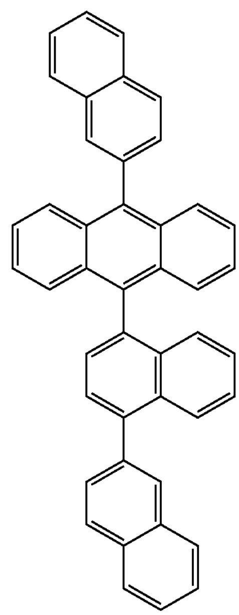
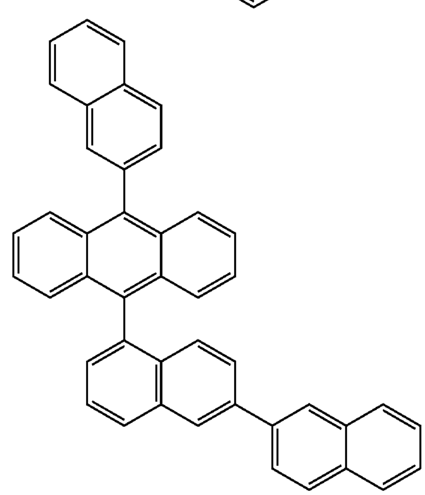

-continued
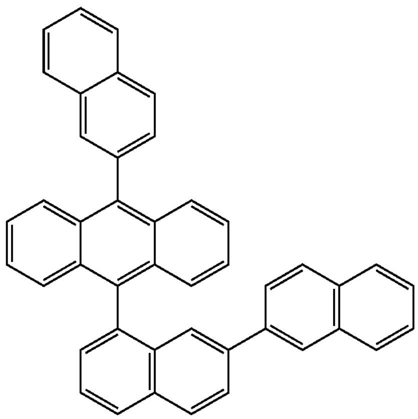
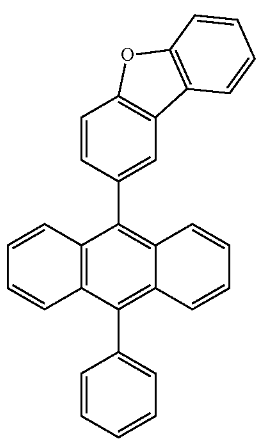
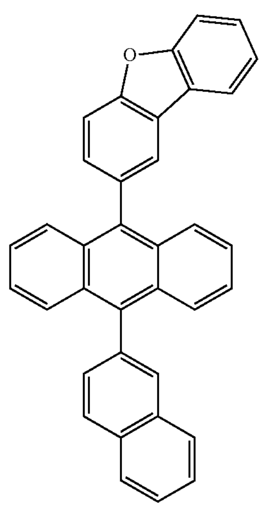
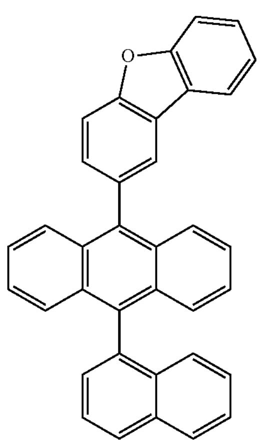
-continued
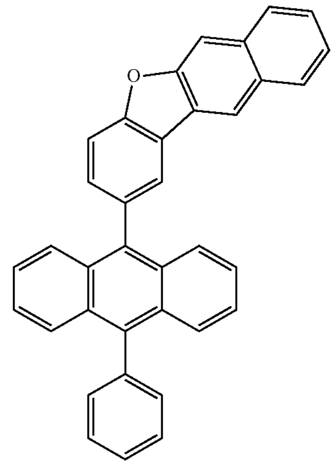
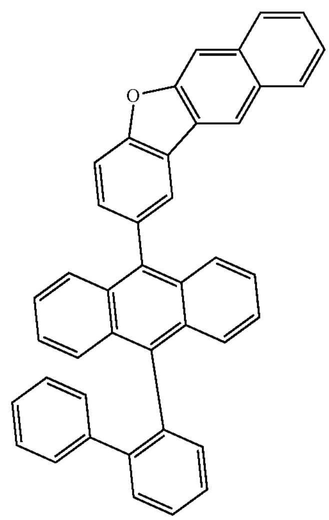
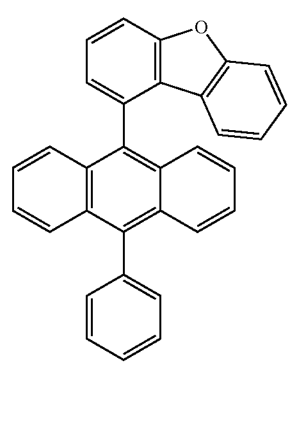
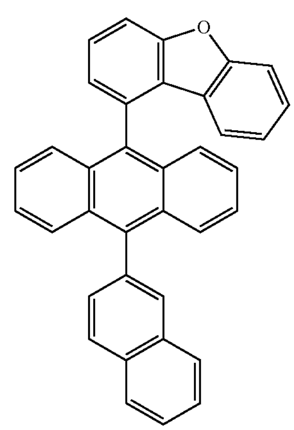

-continued

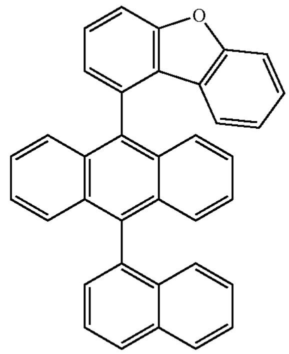

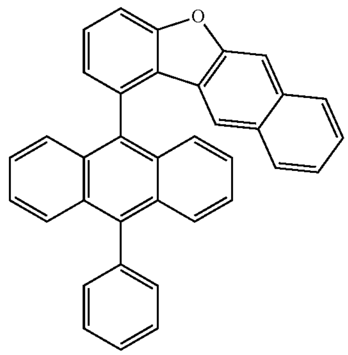

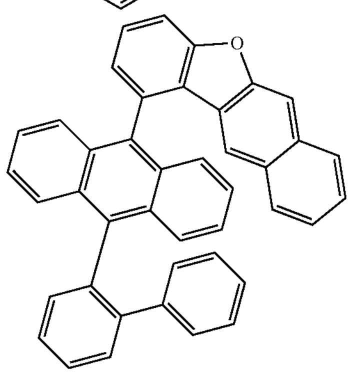

In one embodiment of the present specification, the organic material layer of the organic light emitting device includes a light emitting layer, and the light emitting layer includes the compound of Chemical Formula 1 as a dopant of the light emitting layer.

According to one embodiment of the present specification, the light emitting layer of the organic light emitting device includes the compound of Chemical Formula 1 as a host of the light emitting layer.

In one embodiment of the present specification, the first electrode is an anode, and the second electrode is a cathode.

According to another embodiment, the first electrode is a cathode, and the second electrode is an anode.

The organic light emitting device may have, for example, lamination structures as follows, however, the structure is not limited thereto.

(1) an anode/a hole transfer layer/a light emitting layer/a cathode (2) an anode/a hole injection layer/a hole transfer layer/a light emitting layer/a cathode (3) an anode/a hole transfer layer/a light emitting layer/an electron transfer layer/a cathode (4) an anode/a hole transfer layer/a light emitting layer/an electron transfer layer/an electron injection layer/a cathode (5) an anode/a hole injection layer/a hole transfer layer/a light emitting layer/an electron transfer layer/a cathode (6) an anode/a hole injection layer/a hole transfer layer/a light emitting layer/an electron transfer layer/an electron injection layer/a cathode (7) an anode/a hole transfer layer/an electron blocking layer/a light emitting layer/an electron transfer layer/a cathode (8) an anode/a hole transfer layer/an electron blocking layer/a light emitting layer/an electron transfer layer/an electron injection layer/a cathode (9) an anode/a hole injection layer/a hole transfer layer/an electron blocking layer/a light emitting layer/an electron transfer layer/a cathode

(10) an anode/a hole injection layer/a hole transfer layer/an electron blocking layer/a light emitting layer/an electron transfer layer/an electron injection layer/a cathode

(11) an anode/a hole transfer layer/a light emitting layer/a hole blocking layer/an electron transfer layer/a cathode

(12) an anode/a hole transfer layer/a light emitting layer/a hole blocking layer/an electron transfer layer/an electron injection layer/a cathode

(13) an anode/a hole injection layer/a hole transfer layer/a light emitting layer/a hole blocking layer/an electron transfer layer/a cathode

(14) an anode/a hole injection layer/a hole transfer layer/a light emitting layer/a hole blocking layer/an electron transfer layer/an electron injection layer/a cathode

(15) an anode/a hole injection layer/a hole transfer layer/an electron blocking layer/a light emitting layer/a hole blocking layer/a layer carrying out electron injection and electron transfer at the same time/a cathode The organic light emitting device of the present disclosure may have a structure as illustrated in FIG. 1, however, the structure is not limited thereto.

The organic light emitting device of the present disclosure may have structures as illustrated in FIG. 1 and FIG. 2, however, the structure is not limited thereto.

FIG. 1 illustrates a structure of the organic light emitting device in which a hole injection layer (5), a hole transfer layer (6), a light emitting layer (3), an electron transfer layer (7) and a cathode (4) are consecutively laminated on a substrate (1) and an anode (2). In such a structure, the compound of Chemical Formula 1 may be included in the hole transfer layer (6), the light emitting layer (3) or the electron transfer layer (7).

FIG. 2 illustrates a structure of the organic light emitting device in which an anode (2), a light emitting layer (3) and a cathode (4) are consecutively laminated on a substrate (1). In such a structure, the compound of Chemical Formula 1 may be included in the light emitting layer (3).

For example, the organic light emitting device according to the present disclosure may be manufactured by forming an anode on a substrate by depositing a metal, a metal oxide having conductivity, or an alloy thereof using a physical vapor deposition (PVD) method such as sputtering or e-beam evaporation, forming an organic material layer including one or more layers selected from the group consisting of a hole injection layer, a hole transfer layer, a layer carrying out hole transfer and hole injection at the same time, a light emitting layer, an electron transfer layer, an electron injection layer, and a layer carrying out electron transfer and electron injection at the same time, and then depositing a material usable as a cathode thereon. In addition to such a method, the organic light emitting device may also be manufactured by consecutively depositing a cathode material, an organic material layer and an anode material on a substrate.

The organic material layer may have a multilayer structure including a hole injection layer, a hole transfer layer, a light emitting layer, an electron transfer layer and the like, but is not limited thereto, and may have a single layer structure. In addition, using various polymer materials, the organic material layer may be prepared to a smaller number of layers using a solvent process instead of a deposition method, for example, spin coating, dip coating, doctor blading, screen printing, inkjet printing, a thermal transfer method or the like.

The anode is an electrode injecting holes, and as the anode material, materials having large work function are normally preferred so that hole injection to an organic material layer is smooth. Specific examples of the anode material usable in the present disclosure include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, but are not limited thereto.

The cathode is an electrode injecting electrons, and as the cathode material, materials having small work function are normally preferred so that electron injection to an organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

The hole injection layer is a layer performing a role of smoothly injecting holes from an anode to a light emitting layer, and the hole injection material is a material capable of favorably receiving holes from an anode at a low voltage. The highest occupied molecular orbital (HOMO) of the hole injection material is preferably in between the work function of an anode material and the HOMO of surrounding organic material layers. Specific examples of the hole injection material include metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto. The hole injection layer may have a thickness of 1 nm to 150 nm. The hole injection layer having a thickness of 1 nm or greater has an advantage of preventing hole injection properties from declining, and the thickness being 150 nm or less has an advantage of preventing a driving voltage from increasing to enhance hole migration caused by the hole injection layer being too thick.

The hole transfer layer may perform a role of smoothly transferring holes. As the hole transfer material, materials capable of receiving holes from an anode or a hole injection layer, moving the holes to a light emitting layer, and having high mobility for the holes are suited. Specific examples thereof include arylamine-based organic materials, conductive polymers, block copolymers having conjugated parts and non-conjugated parts together, and the like, but are not limited thereto.

An electron blocking layer may be provided between the hole transfer layer and the light emitting layer. As the electron blocking layer, a spiro compound or materials known in the art may be used.

The light emitting layer may emit red, green or blue light, and may be formed with a phosphorescent material or a fluorescent material. The light emitting material is a material capable of emitting light in a visible region by receiving holes and electrons from a hole transfer layer and an electron transfer layer, respectively, and binding the holes and the electrons, and is preferably a material having favorable quantum efficiency for fluorescence or phosphorescence. Specific examples thereof include 8-hydroxyquinoline aluminum complexes ($Alq_3$); carbazole-based compounds; dimerized styryl compounds; BAlq; 10-hydroxybenzoquinoline-metal compounds; benzoxazole-, benzothiazole- and benzimidazole-based compounds; poly(p-phenylenevinylene) (PPV)-based polymers; spiro compounds; polyfluorene, rubrene, and the like, but are not limited thereto.

A host material of the light emitting layer may include fused aromatic ring derivatives, heteroring-containing compounds or the like. Specifically, as the fused aromatic ring derivative, anthracene derivatives, pyrene derivatives, naphthalene derivatives, pentacene derivatives, phenanthrene compounds, fluoranthene compounds and the like may be included, and as the heteroring-containing compound, carbazole derivatives, dibenzofuran derivatives, ladder-type furan compounds, pyrimidine derivatives and the like may be included, however, the host material is not limited thereto.

When the light emitting layer emits red light, phosphorescent materials such as bis(1-phenylisoquinoline)acetylacetonate iridium (PIQIr(acac)), bis(1-phenylquinoline)acetylacetonate iridium (PQIr(acac)), tris(1-phenylquinoline) iridium (PQIr) or octaethylporphyrin platinum (PtOEP), or fluorescent materials such as tris(8-hydroxyquinolino)aluminum ($Alq_3$) may be used as the light emitting dopant, however, the light emitting dopant is not limited thereto. When the light emitting layer emits green light, phosphorescent materials such as fac tris(2-phenylpyridine)iridium ($Ir(ppy)_3$), or fluorescent materials such as tris(8-hydroxyquinolino)aluminum ($Alq_3$) may be used as the light emitting dopant, however, the light emitting dopant is not limited thereto. When the light emitting layer emits blue light, phosphorescent materials such as $(4,6\text{-}F_2ppy)_2$Irpic, or fluorescent materials such as spiro-DPVBi, spiro-6P, distyrylbenzene (DSB), distyrylarylene (DSA), PFO-based polymers or PPV-based polymers may be used as the light emitting dopant, however, the light emitting dopant is not limited thereto.

A hole blocking layer may be provided between the electron transfer layer and the light emitting layer, and materials known in the art may be used.

The electron transfer layer may perform a role of smoothly transferring electrons. As the electron transfer material, materials capable of favorably receiving electrons from a cathode, moving the electrons to a light emitting layer, and having high mobility for the electrons are suited. Specific examples thereof include Al complexes of 8-hydroxyquinoline; complexes including $Alq_3$; organic radical compounds; hydroxyflavon-metal complexes, and the like, but are not limited thereto. The electron transfer layer may have a thickness of 1 nm to 50 nm. The electron transfer layer having a thickness of 1 nm or greater has an advantage of preventing electron transfer properties from declining, and the thickness being 50 nm or less has an advantage of preventing a driving voltage from increasing to enhance electron migration caused by the electron transfer layer being too thick.

The electron injection layer may perform a role of smoothly injecting electrons. As the electron injection material, compounds having an electron transferring ability, having an electron injection effect from a cathode, having an excellent electron injection effect for a light emitting layer or light emitting material, and preventing excitons generated in the light emitting layer from moving to a hole injection layer, and in addition thereto, having an excellent thin film forming ability are preferred. Specific examples thereof may include fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited thereto.

The metal complex compound includes 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato) gallium, bis(10-hydroxybenzo[h]quinolinato)beryllium, bis (10-hydroxybenzo[h]quinolinato)zinc, bis(2-methyl-8-quinolinato)chlorogallium, bis(2-methyl-8-quinolinato) (0-cresolato)gallium, bis(2-methyl-8-quinolinato) (1-naphtholato)aluminum, bis(2-methyl-8-quinolinato) (2-naphtholato)gallium and the like, but is not limited thereto.

The hole blocking layer is a layer blocking holes from reaching a cathode, and may be generally formed under the same condition as the hole injection layer. Specific examples thereof may include oxadiazole derivatives, triazole derivatives, phenanthroline derivatives, BCP, aluminum complexes and the like, but are not limited thereto.

The organic light emitting device according to the present disclosure may be a top-emission type, a bottom-emission type or a dual-emission type depending on the materials used.

Hereinafter, the present specification will be described in detail with reference to examples. However, the examples according to the present specification may be modified to various other forms, and the scope of the present application is not to be construed as being limited to the examples described below. Examples of the present application are provided in order to more fully describe the present specification to those having average knowledge in the art.

SYNTHESIS EXAMPLE

Synthesis of Intermediate A-1

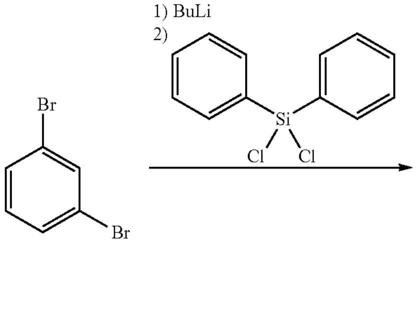

-continued

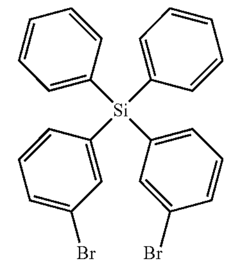

[Intermediate A-1]

1,3-Dibromobenzene (10 g, 40 mmol) was dissolved in diethyl ether (100 mL), and cooled to −78° C. under a nitrogen condition. Then, a 1.6 M n-BuLi hexane solution (26 mL, 40 mmol) was slowly added dropwise thereto, and the result was stirred for 2 hours at −78° C. Dichlorodiphenylsilane (5.10 g, 20 mmol) was introduced thereto, and the result was stirred while slowly raising the temperature to room temperature for 10 hours. Distilled water was introduced thereto to finish the reaction, diethyl ether (100 mL) was further introduced thereto for extraction, and the result was dried with anhydrous sodium sulfate. The result was purified using silica gel column chromatography (developing solution: hexane/ethyl acetate=50%/50% (volume ratio)) to obtain Intermediate A-1 (5.0 g). When measuring a mass spectrum for the obtained solids, a peak was identified at M/Z=494.

Synthesis of Intermediate B-1

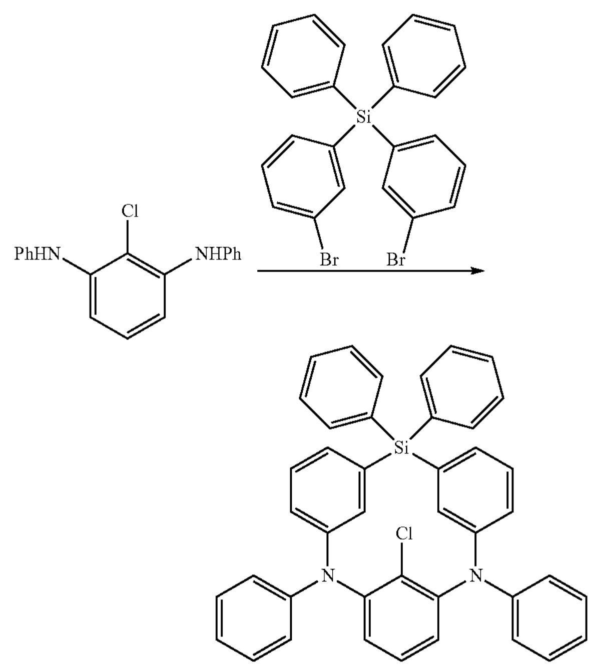

[Intermediate B-1]

2-Chloro-$N^1$,$N^3$-diphenylbenzene-1,3-diamine (11.8 g, 40 mmol), Intermediate A-1 (19.8 g, 40 mmol), $Pd(PtBu_3)_2$ (0.5 g, 1.0 mmol), NaOtBu (6.2 g, 64 mmol) and xylene (70 ml) in a flask were heated to 130° C., and stirred for 4 hours. The reaction solution was cooled to room temperature, and separated by adding water and ethyl acetate thereto, and then the solvent was removed by distillation under vacuum. The result was purified using silica gel column chromatography (developing solution: hexane/ethyl acetate=50%/50% (volume ratio)) to obtain Intermediate B-1 (1.0 g). When measuring a mass spectrum for the obtained solids, a peak was identified at M/Z=627.

Synthesis of Compound 1

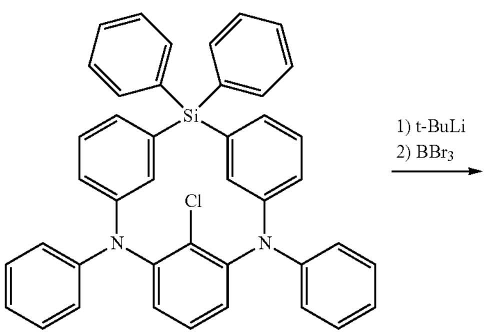

[Intermediate B-1]

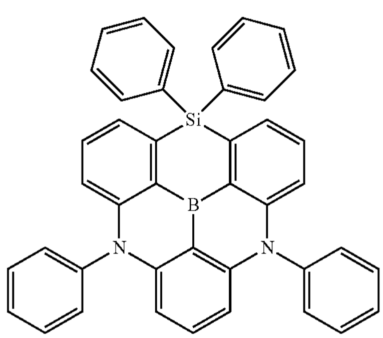

[Compound 1]

Intermediate B-1 (1.0 g, 1.6 mmol) was dissolved in tert-butylbenzene (t-BuPh, 160 mL) in a round bottom flask under the nitrogen atmosphere. 1.7 M t-butyllithium (1.9 mL, 3.2 mmol) was slowly added dropwise to this solution at room temperature, and the result was stirred for 1 hour at 60° C. The result was cooled to room temperature, boron tribromide (0.3 mL, 3.2 mmol) was slowly added dropwise thereto, and the result was stirred for 4 hours at 60° C. When the reaction was finished, the result was cooled to room temperature, extracted with toluene after adding water thereto, and the water layer was removed. The result was treated with anhydrous magnesium sulfate, then filtered and vacuum concentrated. A product was separated and purified using column chromatography, and recrystallized with ethyl acetate and hexane to obtain final Compound 1 (0.21 g, 22%). The structure was identified by NMR measurement for the obtained solids. The results of the NMR measured with Bruker 600 MHz 1H NMR using chloroform-d3 ($CDCl_3$) at room temperature are shown in FIG. 3 and FIG. 4.

Synthesis of Compound 2

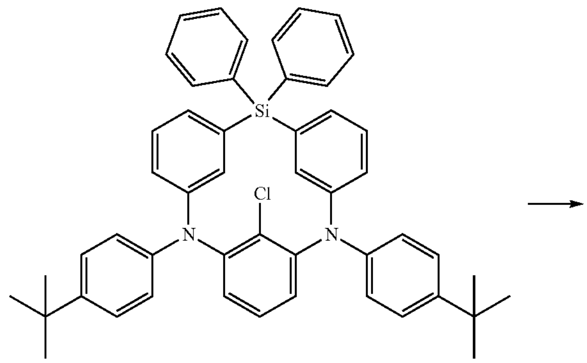

[Intermediate C]

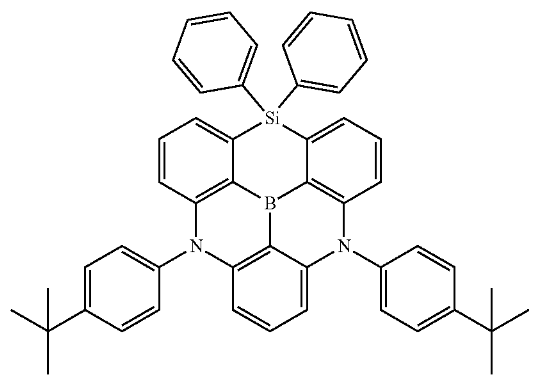

[Compound 2]

Compound 2 was prepared in the same manner as in the method for preparing Compound 1 except that Intermediate C was used instead of Intermediate B-1 in Synthesis of Compound 1. (0.23 g, yield 20%, MS: [M+H]+=713)

Synthesis of Compound 3

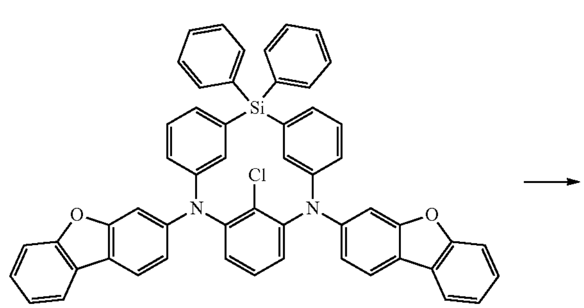

[Intermediate D]

-continued

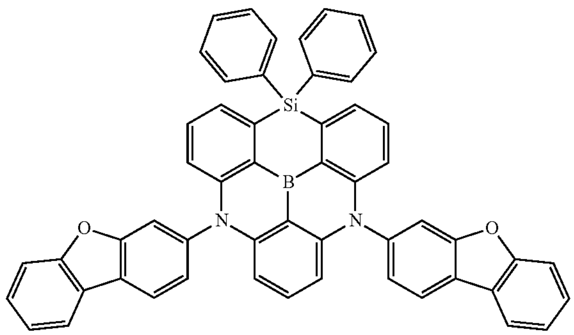

[Compound 3]

Compound 3 was prepared in the same manner as in the method for preparing Compound 1 except that Intermediate D was used instead of Intermediate B-1 in Synthesis of Compound 1. (0.28 g, yield 22%, MS: [M+H]+=781)

Synthesis of Compound 4

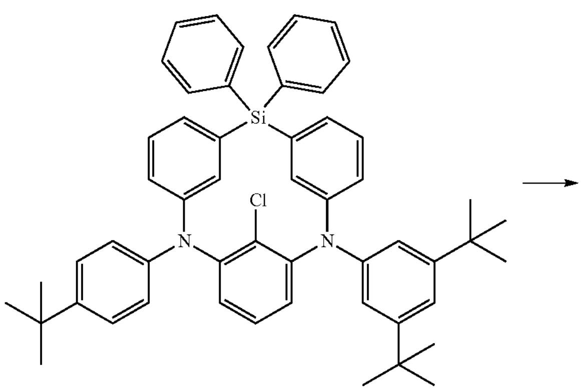

[Intermediate E]

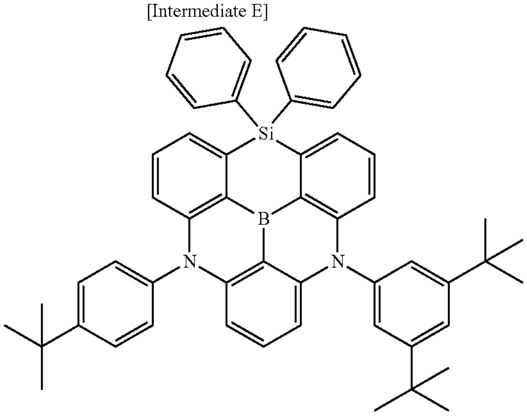

[Compound 4]

Compound 4 was prepared in the same manner as in the method for preparing Compound 1 except that Intermediate E was used instead of Intermediate B-1 in Synthesis of Compound 1. (0.30 g, yield 24%, MS: [M+H]+=769)

Synthesis of Compound 5

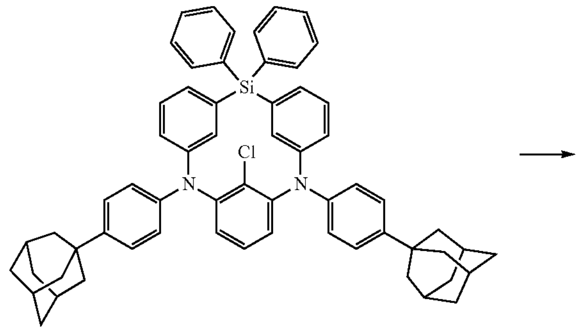

[Intermediate F]

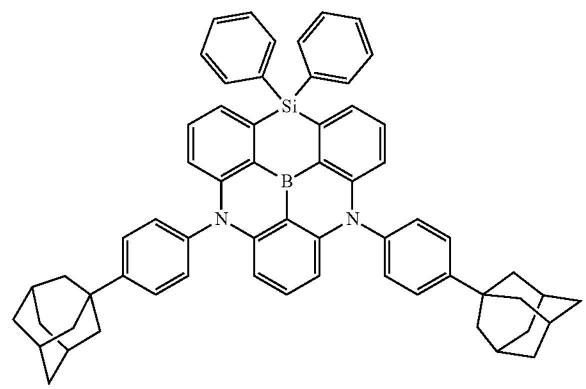

[Compound 5]

Compound 5 was prepared in the same manner as in the method for preparing Compound 1 except that Intermediate F was used instead of Intermediate B-1 in Synthesis of Compound 1. (0.26 g, yield 19%, MS: [M+H]+=869)

Synthesis of Compound 6

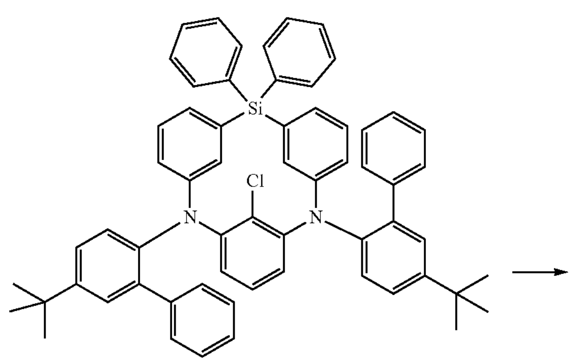

[Intermediate G]

-continued

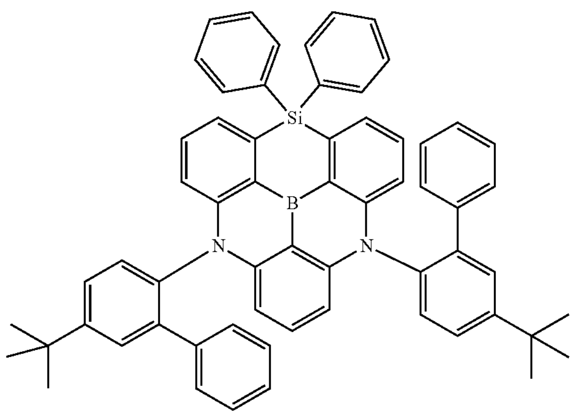

[Compound 6]

Compound 6 was prepared in the same manner as in the method for preparing Compound 1 except that Intermediate G was used instead of Intermediate B-1 in Synthesis of Compound 1. (0.32 g, yield 23%, MS: [M+H]+=865)

Synthesis of Intermediate B-2

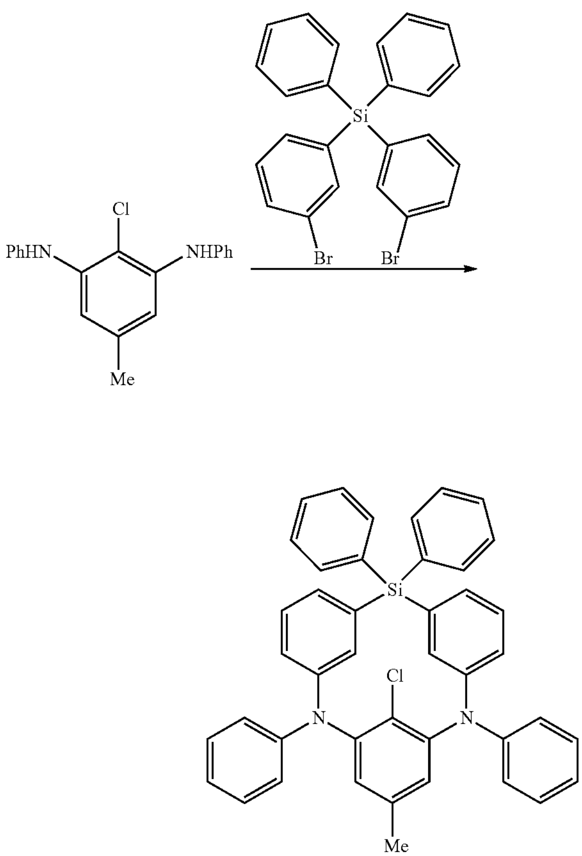

[Intermediate B-2]

2-Chloro-5-methyl-N1,N3-diphenylbenzene-1,3-diamine (12.4 g, 40 mmol), Intermediate A-1 (19.8 g, 40 mmol), $Pd(PtBu_3)_2$ (0.5 g, 1.0 mmol), NaOtBu (6.2 g, 64 mmol) and xylene (70 ml) in a flask were heated to 130° C., and stirred for 4 hours. The reaction solution was cooled to room temperature, and separated by adding water and ethyl acetate thereto, and then the solvent was removed by distillation under vacuum. The result was purified using silica gel column chromatography (developing solution: hexane/ethyl acetate=50%/50% (volume ratio)) to obtain Intermediate B-2 (1.4 g). When measuring a mass spectrum for the obtained solids, a peak was identified at M/Z=641.

Synthesis of Compound 7

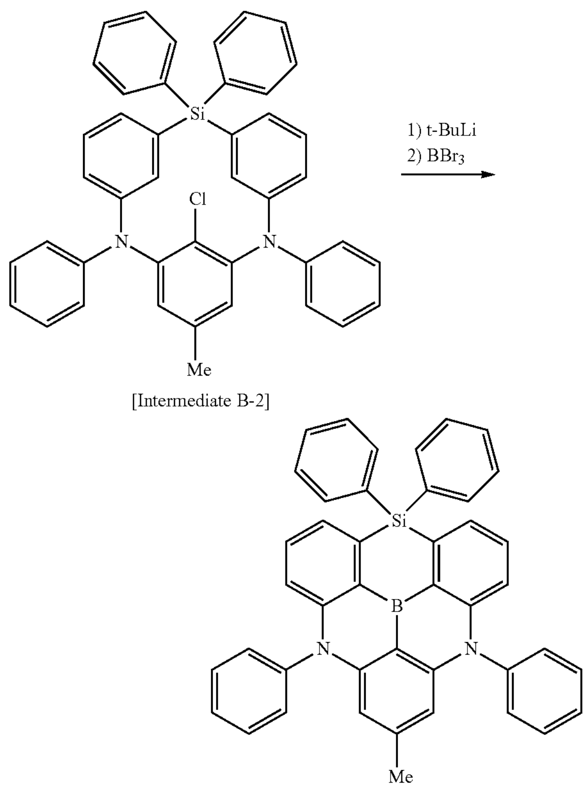

[Compound 7]

Intermediate B-2 (1.0 g, 1.6 mmol) was dissolved in tert-butylbenzene (t-BuPh, 160 mL) in a round bottom flask under the nitrogen atmosphere. 1.7 M t-butyllithium (1.9 mL, 3.2 mmol) was slowly added dropwise to this solution at room temperature, and the result was stirred for 1 hour at 60° C. The result was cooled to room temperature, boron tribromide (0.3 mL, 3.2 mmol) was slowly added dropwise thereto, and the result was stirred for 4 hours at 60° C. When the reaction was finished, the result was cooled to room temperature, extracted with toluene after adding water thereto, and the water layer was removed. The result was treated with anhydrous magnesium sulfate, then filtered and vacuum concentrated. A product was separated and purified using column chromatography, and recrystallized with ethyl acetate and hexane to obtain final Compound 7 (0.21 g, 22%). MS: [M+H]+=615

Synthesis of Compound 8

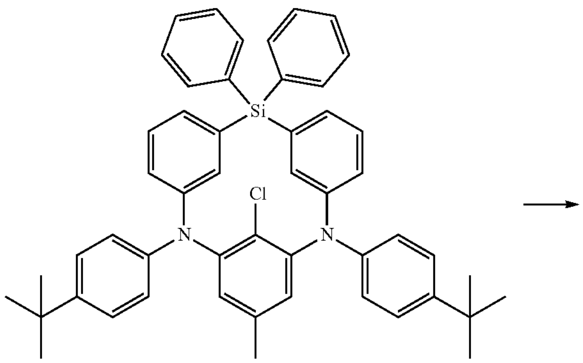

[Intermediate G2]

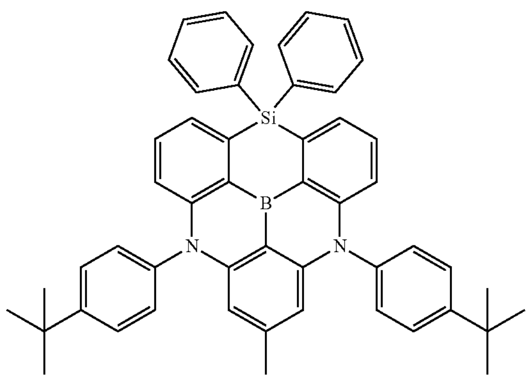

[Compound 8]

Compound 8 was prepared in the same manner as in the method for preparing Compound 7 except that Intermediate G2 was used instead of Intermediate B-2 in Synthesis of Compound 7. (0.34 g, yield 29%, MS: [M+H]+=727)

Synthesis of Compound 9

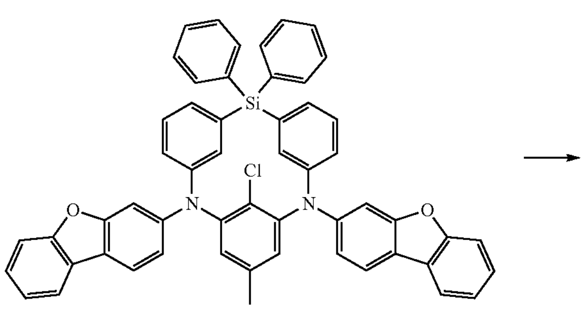

[Intermediate H]

-continued

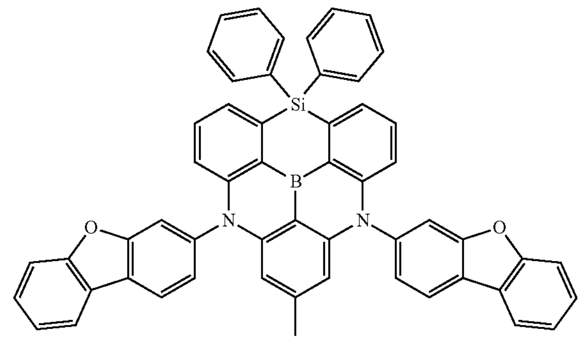

[Compound 9]

Compound 9 was prepared in the same manner as in the method for preparing Compound 7 except that Intermediate H was used instead of Intermediate B-2 in Synthesis of Compound 7. (0.36 g, yield 28%, MS: [M+H]+=795

Synthesis of Compound 10

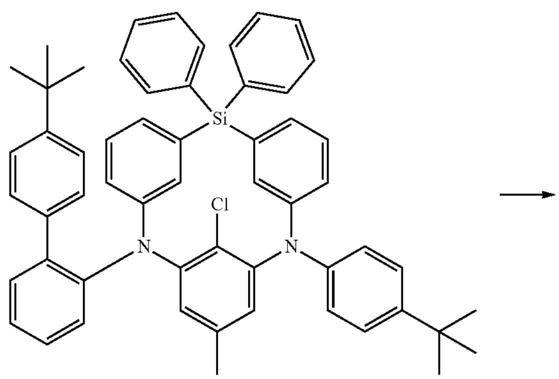

[Intermediate I]

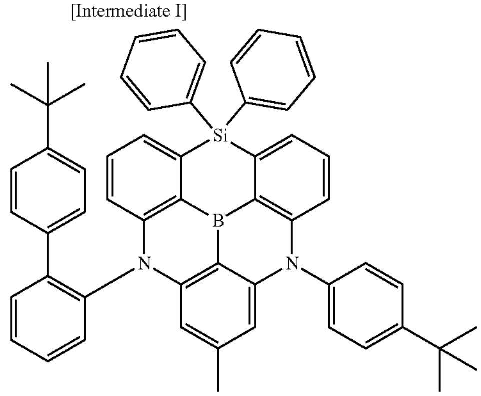

[Compound 10]

Compound 10 was prepared in the same manner as in the method for preparing Compound 7 except that Intermediate I was used instead of Intermediate B-2 in Synthesis of Compound 7. (0.38 g, yield 30%, MS: [M+H]+=803

Synthesis of Compound 11

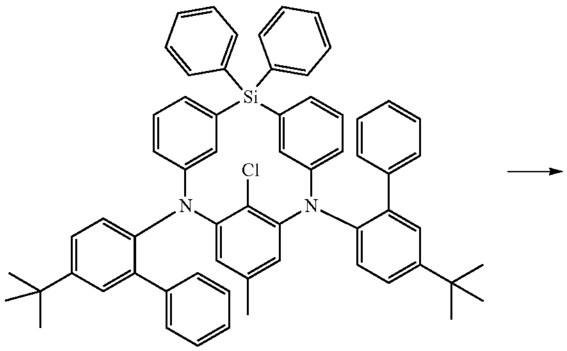

[Intermediate J]

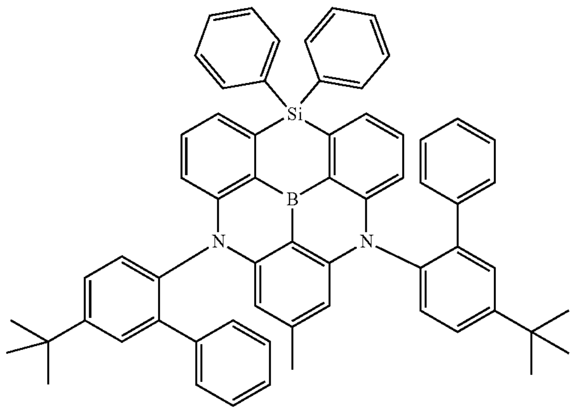

[Compound 11]

Compound 11 was prepared in the same manner as in the method for preparing Compound 7 except that Intermediate J was used instead of Intermediate B-2 in Synthesis of Compound 7. (0.36 g, yield 26%, MS: [M+H]+=879

Synthesis of Compound 12

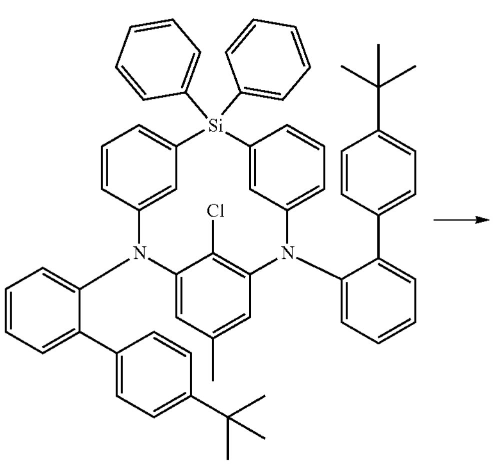

[Intermediate K]

-continued

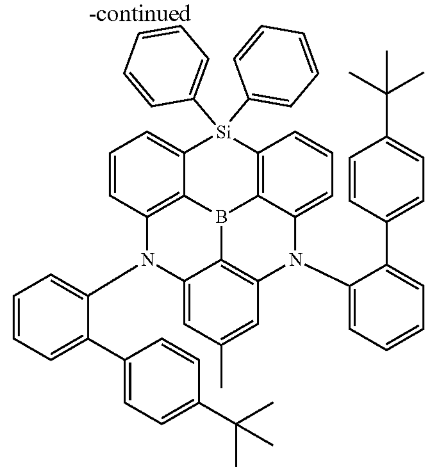

[Compound 12]

Compound 12 was prepared in the same manner as in the method for preparing Compound 7 except that Intermediate K was used instead of Intermediate B-2 in Synthesis of Compound 7. (0.38 g, yield 27%, MS: [M+H]+=879

Synthesis of Compound 13

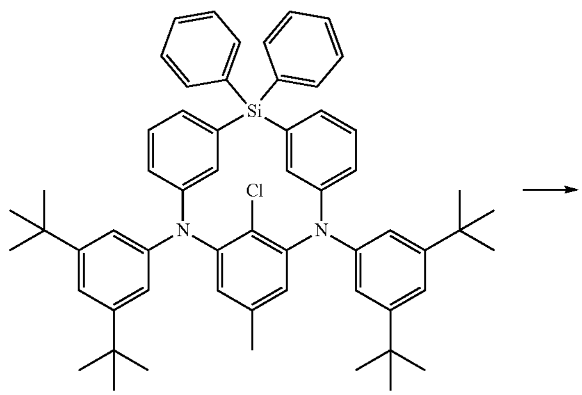

[Intermediate L]

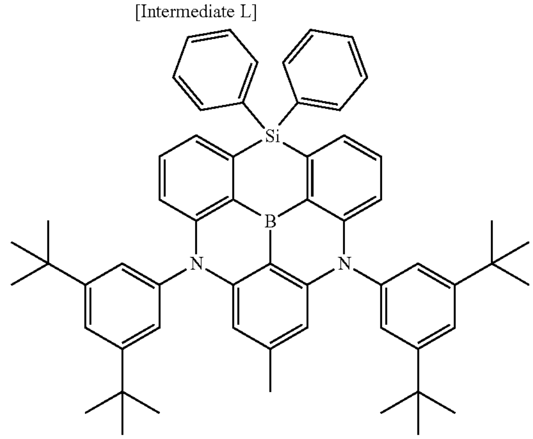

[Compound 13]

Compound 13 was prepared in the same manner as in the method for preparing Compound 7 except that Intermediate L was used instead of Intermediate B-2 in Synthesis of Compound 7. (0.38 g, yield 28%, MS: [M+H]+=839

Synthesis of Intermediate B-3

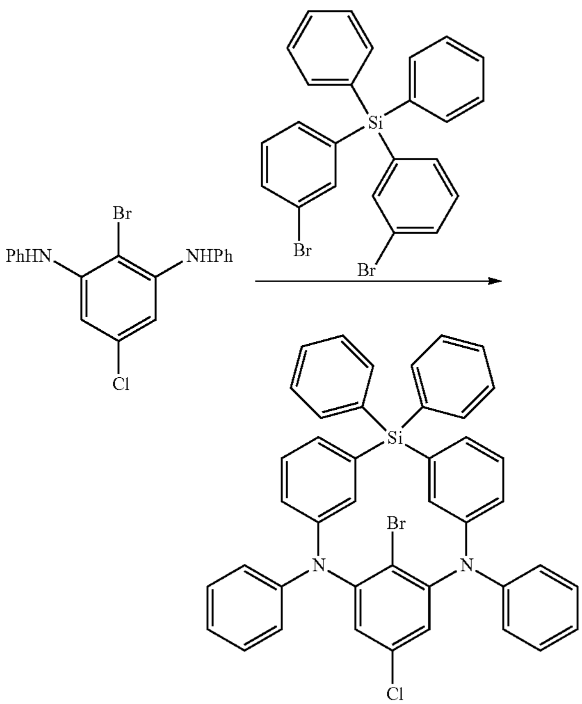

[Intermediate B-3]

2-Bromo-5-chloro-N1,N3-diphenylbenzene-1,3-diamine (14.9 g, 40 mmol), Intermediate A-1 (19.8 g, 40 mmol), $Pd(PtBu_3)_2$ (0.5 g, 1.0 mmol), NaOtBu (6.2 g, 64 mmol) and xylene (70 ml) in a flask were heated to 130° C., and stirred for 4 hours. The reaction solution was cooled to room temperature, and separated by adding water and ethyl acetate thereto, and then the solvent was removed by distillation under vacuum. The result was purified using silica gel column chromatography (developing solution: hexane/ethyl acetate=50%/50% (volume ratio)) to obtain Intermediate B-3 (1.4 g). When measuring a mass spectrum for the obtained solids, a peak was identified at M/Z=705.

Synthesis of Compound 14

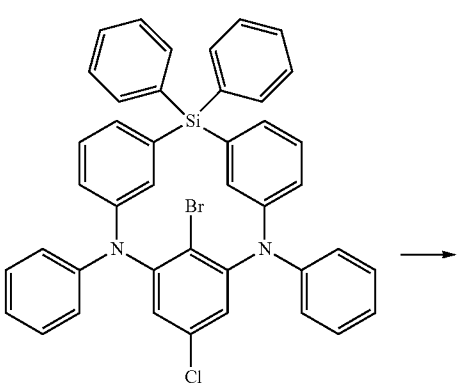

[Intermediate B-3]

-continued

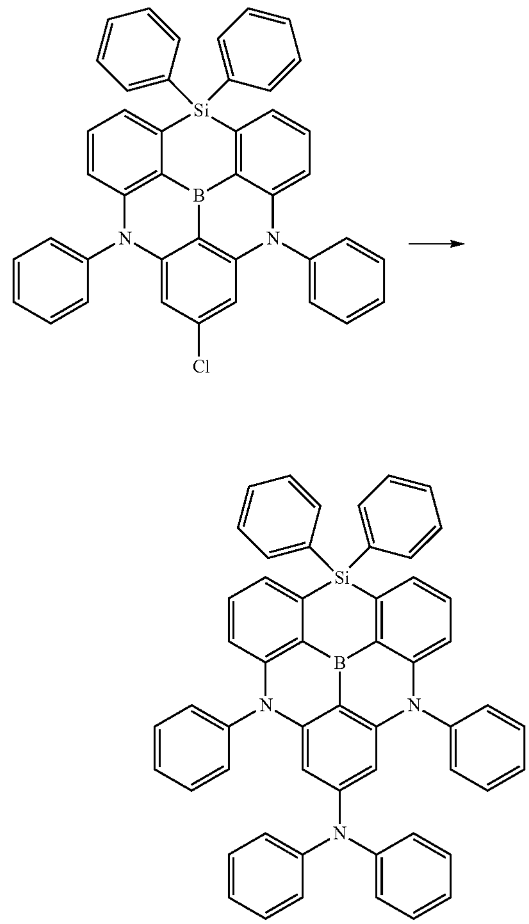

[Compound 14]

Intermediate B-3 (4.5 g, 6.4 mmol) was dissolved in tert-butylbenzene (t-BuPh, 320 mL) in a round bottom flask under the nitrogen atmosphere. 1.7 M t-butyllithium (7.6 mL, 12.8 mmol) was slowly added dropwise to this solution at room temperature, and the result was stirred for 1 hour at 60° C. The result was cooled to room temperature, boron tribromide (1.2 mL, 12.8 mmol) was slowly added dropwise thereto, and the result was stirred for 4 hours at 60° C. When the reaction was finished, the result was cooled to room temperature, extracted with toluene after adding water thereto, and the water layer was removed. The result was treated with anhydrous magnesium sulfate, then filtered and vacuum concentrated. A product was separated and purified using column chromatography, and recrystallized with ethyl acetate and hexane to obtain 0.90 g.

Then, 0.90 g obtained above, diphenylamine (0.3 g, 1.5 mmol), $Pd(PtBu_3)_2$ (0.05 g, 0.1 mmol), NaOtBu (0.62 g, 6.4 mmol) and xylene (7 ml) in a flask were heated to 130° C., and stirred for 4 hours. The reaction solution was cooled to room temperature, and separated by adding water and ethyl acetate thereto, and then the solvent was removed by distillation under vacuum. The result was purified using silica gel column chromatography (developing solution: hexane/ethyl acetate=50%/50% (volume ratio)) to obtain Compound 14 (0.4 g). When measuring a mass spectrum for the obtained solids, a peak was identified at M/Z=768.

Synthesis of Compound 15

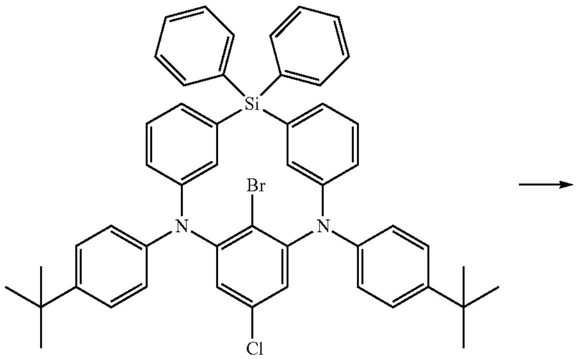

[Intermediate M]

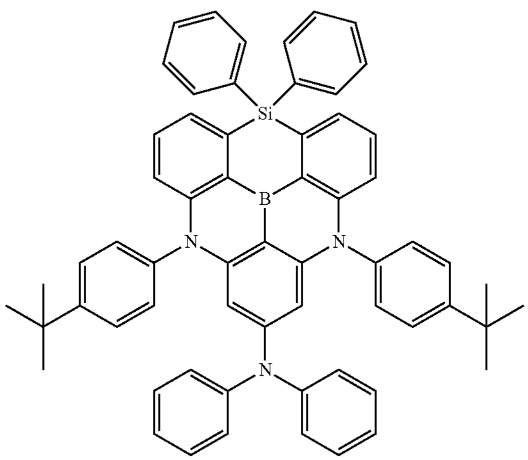

[Compound 15]

Compound 15 was prepared in the same manner as in the method for preparing Compound 14 except that Intermediate M was used instead of Intermediate B-3 in Synthesis of Compound 14. (0.42 g, yield 7.5%, MS: [M+H]+=880)

Synthesis of Compound 16

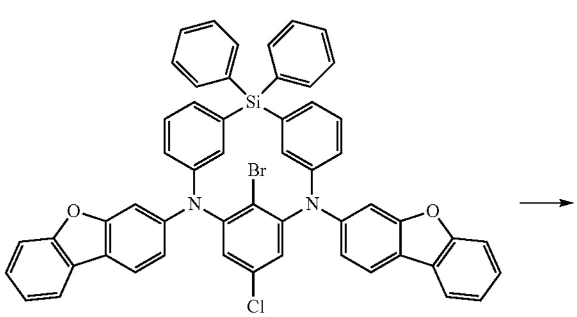

[Intermediate N]

-continued

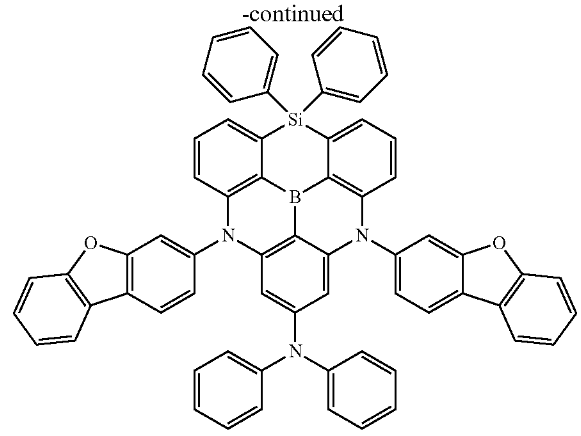

[Compound 16]

Compound 16 was prepared in the same manner as in the method for preparing Compound 14 except that Intermediate N was used instead of Intermediate B-3 in Synthesis of Compound 14. (0.54 g, yield 9.0%, MS: [M+H]+=948)

Synthesis of Compound 17

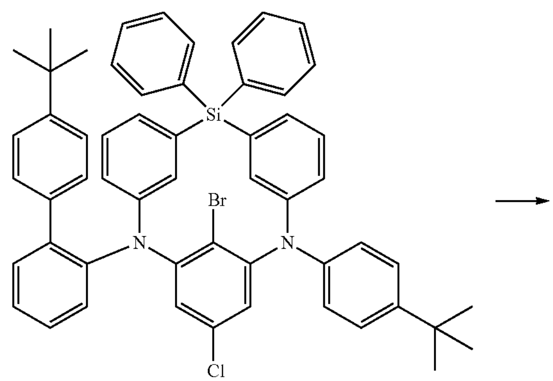

[Intermediate O]

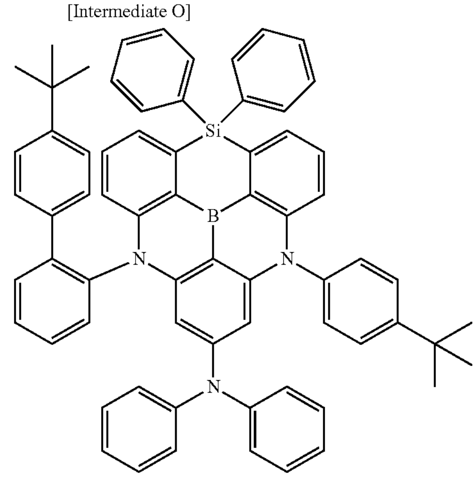

[Compound 17]

Compound 17 was prepared in the same manner as in the method for preparing Compound 14 except that Intermediate 0 was used instead of Intermediate B-3 in Synthesis of Compound 14. (0.58 g, yield 9.5%, MS: [M+H]+=956)

Synthesis of Compound 18

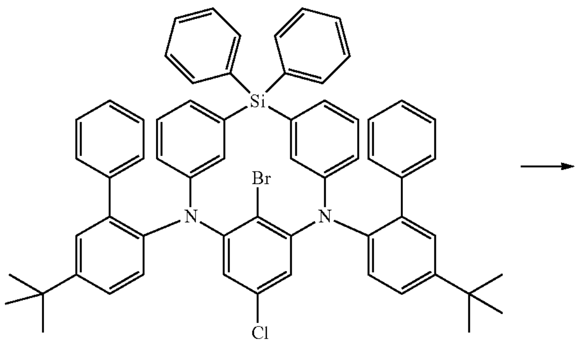

[Intermediate P]

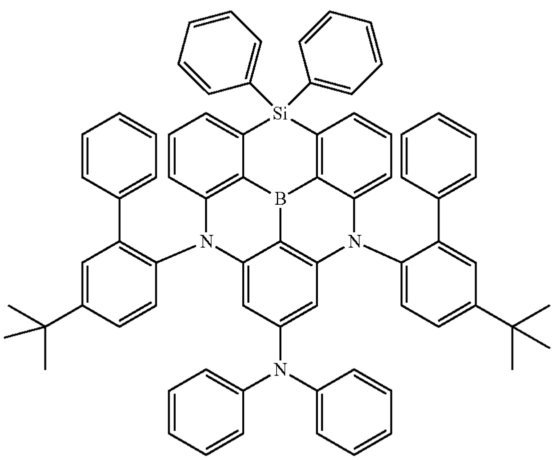

[Compound 18]

Compound 18 was prepared in the same manner as in the method for preparing Compound 14 except that Intermediate P was used instead of Intermediate B-3 in Synthesis of Compound 14. (0.60 g, yield 9.0%, MS: [M+H]+=1032)

Synthesis of Compound 19

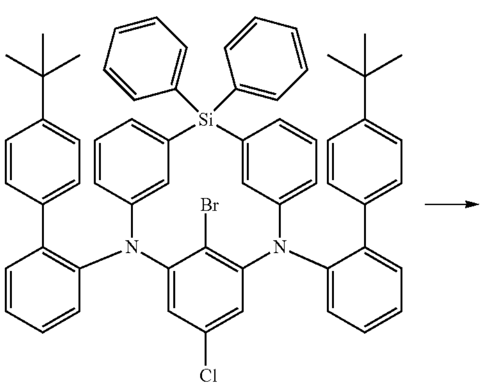

[Intermediate R]

-continued

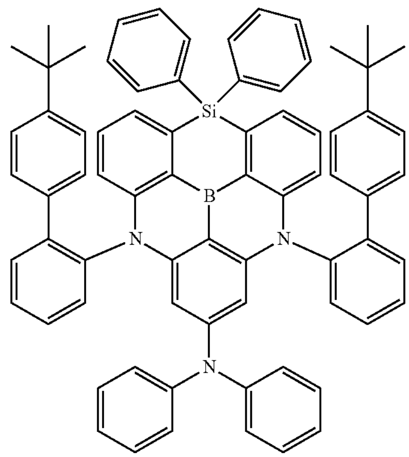

[Compound 19]

Compound 19 was prepared in the same manner as in the method for preparing Compound 14 except that Intermediate R was used instead of Intermediate B-3 in Synthesis of Compound 14. (0.62 g, yield 9.4%, MS: [M+H]+=1032)

Synthesis of Intermediate A-2

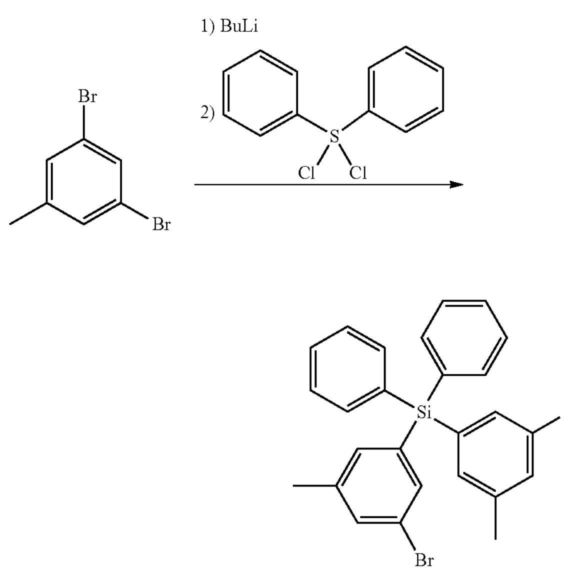

[Intermediate A-2]

Intermediate A-2 was prepared in the same manner as in the method for preparing Intermediate A-1 except that 1,3-dibromo-5-methylbenzene was used instead of 1,3-dibromobenzene (10 g, 40 mmol) in Synthesis of Intermediate A-1.

Synthesis of Intermediate B-4

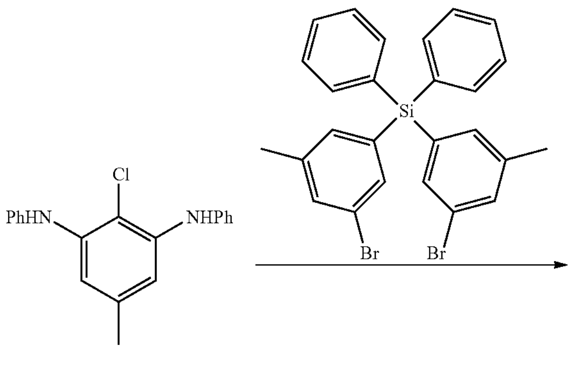

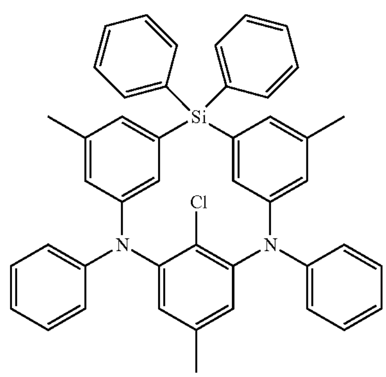

[Intermediate B-4]

Intermediate B-4 was prepared in the same manner as in the method for preparing Intermediate B-2 except that Intermediate A-2 was used instead of Intermediate A-1 (19.8 g, 40 mmol) in Synthesis of Intermediate B-2.

Synthesis of Compound 20

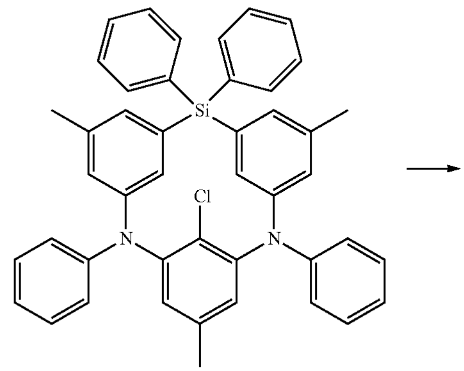

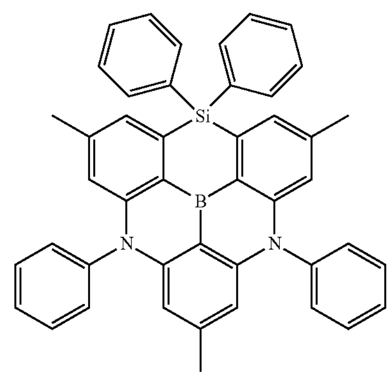

[Compound 20]

Compound 20 was prepared in the same manner as in the method for preparing Compound 7 except that Intermediate B-4 was used instead of Intermediate B-2 (1.0 g, 1.6 mmol) in Synthesis of Compound 7. MS: [M+H]+=643

Synthesis of Intermediate B-5

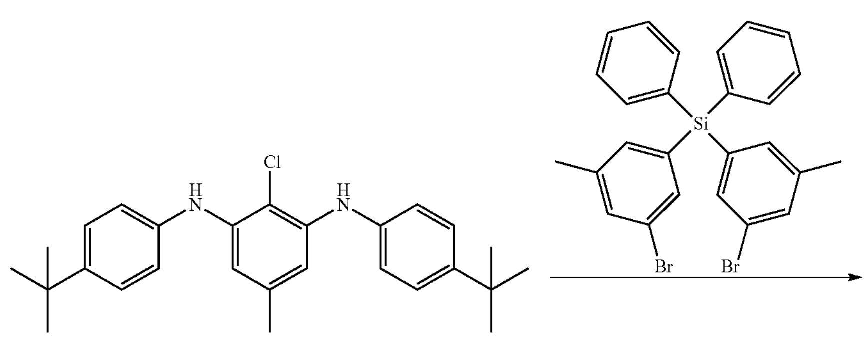

-continued

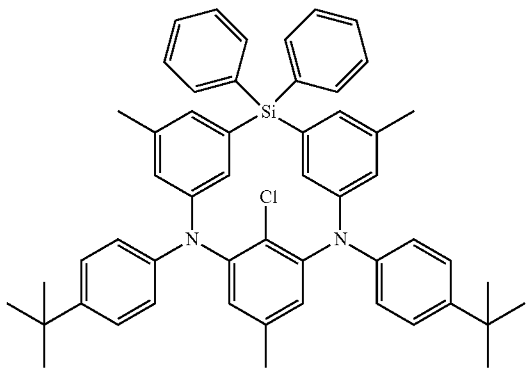

[Intermediate B-5]

Intermediate B-5 was prepared in the same manner as in the method for preparing Intermediate B-4 except that N1,N3-bis(4-(tert-butyl)phenyl)-2-chloro-5-methylbenzene-1,3-diamine was used instead of 2-chloro-5-methyl-N1,N3-diphenylbenzene-1,3-diamine (12.4 g, 40 mmol) in Synthesis of Intermediate B-4.

Synthesis of Compound 21

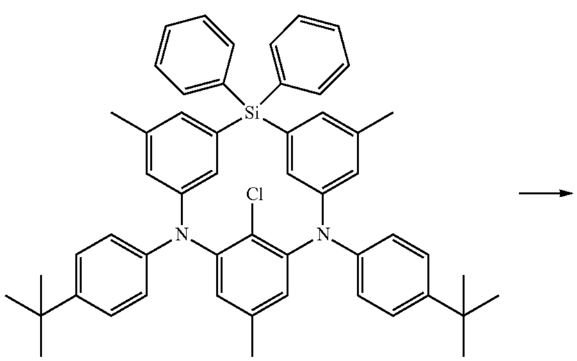

-continued

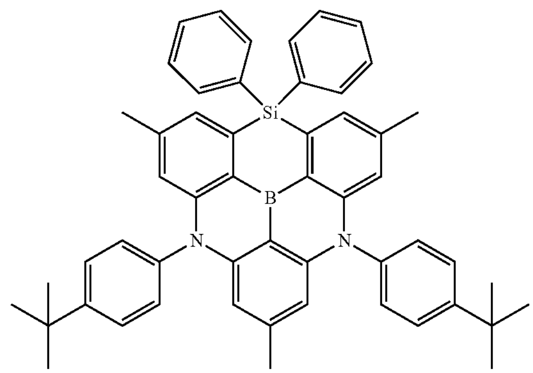

[Compound 21]

Compound 21 was prepared in the same manner as in the method for preparing Compound 20 except that Intermediate B-5 was used instead of Intermediate B-4 (1.2 g, 1.6 mmol) in Synthesis of Compound 20. MS: [M+H]+=755

Synthesis of Intermediate B-6

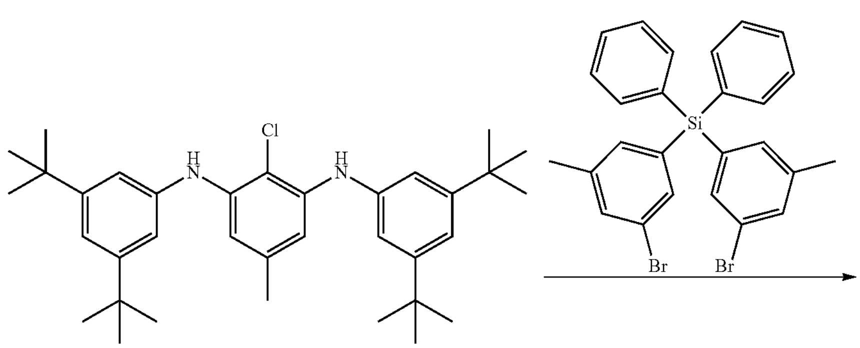

-continued

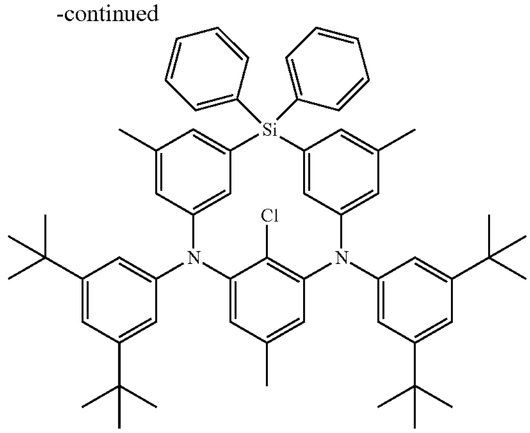

[Intermediate B-6]

Intermediate B-6 was prepared in the same manner as in the method for preparing Intermediate B-4 except that N1,N3-diamine was used instead of 2-chloro-5-methyl-N1, N3-diphenylbenzene-1,3-diamine (12.4 g, 40 mmol) in Synthesis of Intermediate B-4.

Synthesis of Compound 22

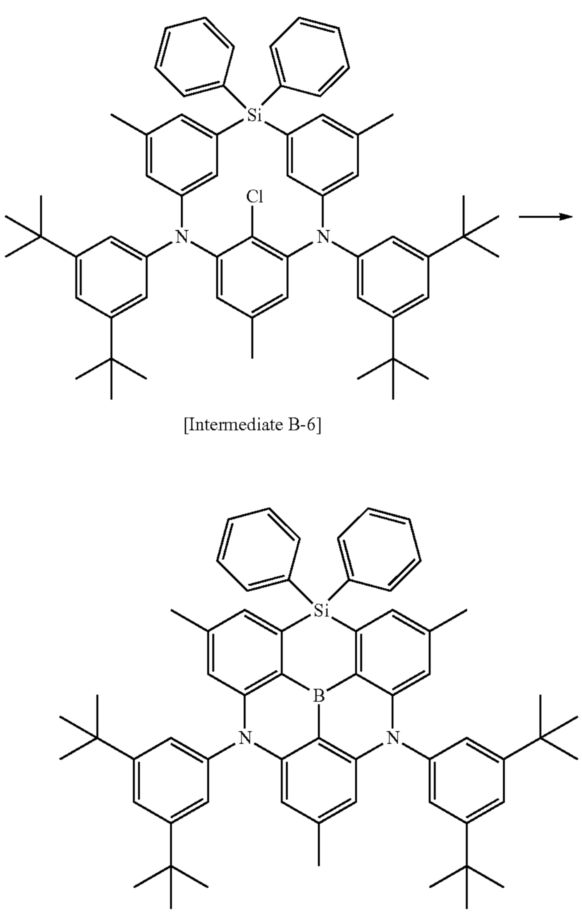

[Intermediate B-6]

[Compound 22]

Compound 22 was prepared in the same manner as in the method for preparing Compound 20 except that Intermediate B-6 was used instead of Intermediate B-4 (1.2 g, 1.6 mmol) in Synthesis of Compound 20. MS: [M+H]+=868

Synthesis of Intermediate B-7

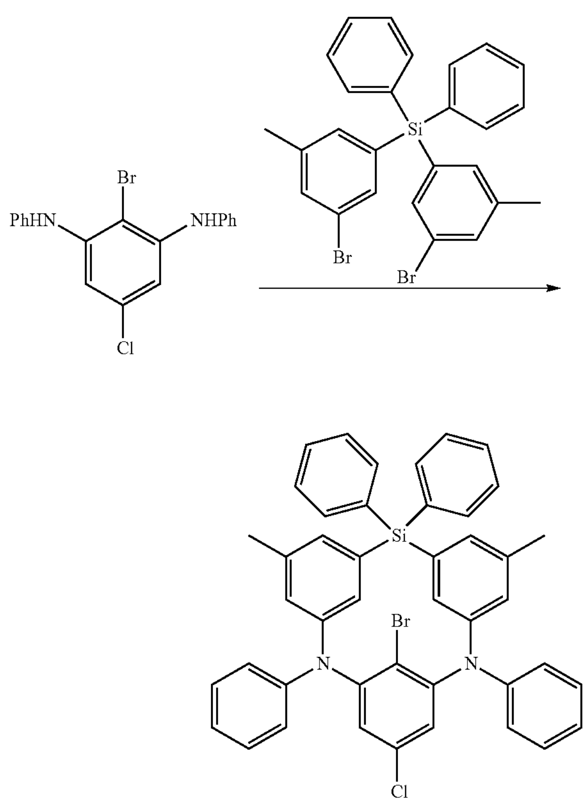

[Intermediate B-7]

Intermediate B-7 was prepared in the same manner as in the method for preparing Intermediate B-3 except that Intermediate A-2 was used instead of Intermediate A-1 (19.8 g, 40 mmol) in Synthesis of Intermediate B-3.

Synthesis of Compound 23

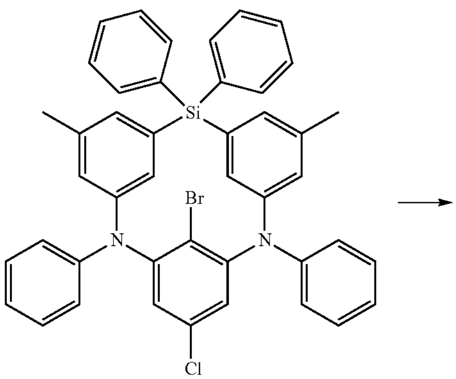

[Intermediate B-7]

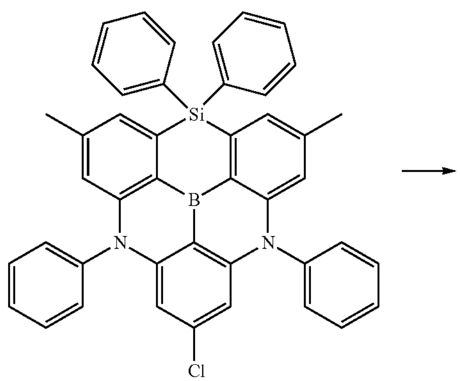

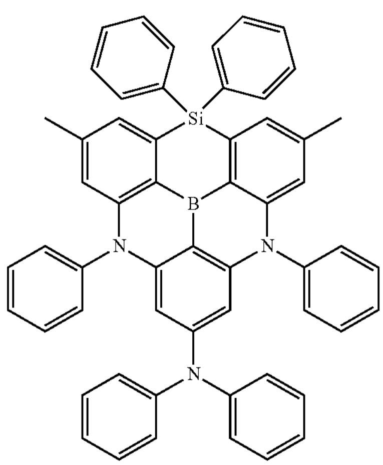

[Compound 23]

Intermediate B-7 (4.7 g, 6.4 mmol) was dissolved in tert-butylbenzene (t-BuPh, 320 mL) in a round bottom flask under the nitrogen atmosphere. 1.7 M t-butyllithium (7.6 mL, 12.8 mmol) was slowly added dropwise to this solution at room temperature, and the result was stirred for 1 hour at 60° C. The result was cooled to room temperature, boron tribromide (1.2 mL, 12.8 mmol) was slowly added dropwise thereto, and the result was stirred for 4 hours at 60° C. When the reaction was finished, the result was cooled to room temperature, extracted with toluene after adding water thereto, and the water layer was removed. The result was treated with anhydrous magnesium sulfate, then filtered and vacuum concentrated. A product was separated and purified using column chromatography, and recrystallized with ethyl acetate and hexane to obtain 0.92 g.

Then, 0.92 g obtained above, diphenylamine (0.3 g, 1.5 mmol), $Pd(PtBu_3)_2$ (0.05 g, 0.1 mmol), NaOtBu (0.62 g, 6.4 mmol) and xylene (7 ml) in a flask were heated to 130° C., and stirred for 4 hours. The reaction solution was cooled to room temperature, and separated by adding water and ethyl acetate thereto, and then the solvent was removed by distillation under vacuum. The result was purified using silica gel column chromatography (developing solution: hexane/ethyl acetate=50%/50% (volume ratio)) to obtain Compound 23 (0.4 g). When measuring a mass spectrum for the obtained solids, a peak was identified at M/Z=796.

Synthesis of Compound 24

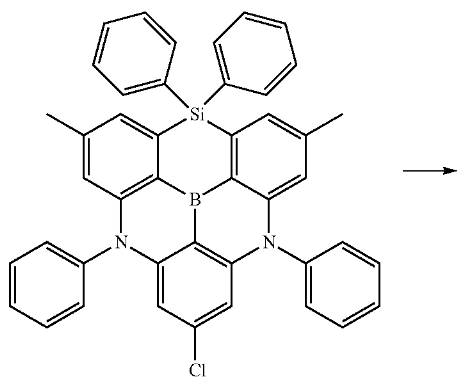

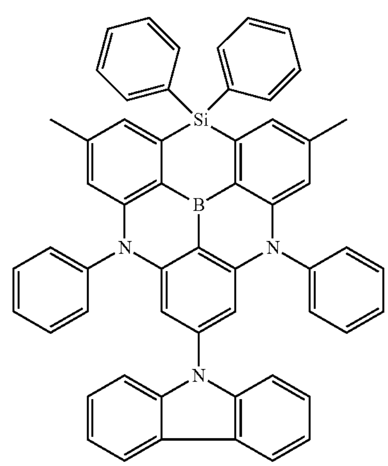

[Compound 24]

Compound 24 was prepared in the same manner as in the method for preparing Compound 23 except that 9H-carbazole was used instead of diphenylamine (0.3 g, 1.5 mmol) in Synthesis of Compound 23. MS: [M+H]+=794

Synthesis of Intermediate A-3

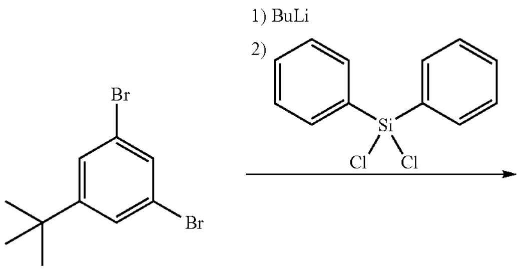

-continued

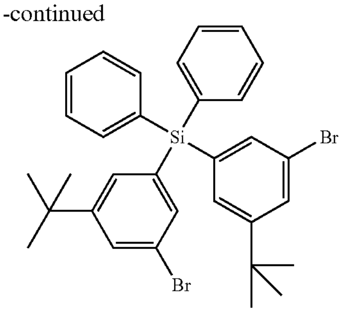

[Intermediate A-3]

Intermediate A-3 was prepared in the same manner as in the method for preparing Intermediate A-1 except that 1,3-dibromo-5-tert-butylbenzene was used instead of 1,3-dibromobenzene (10 g, 40 mmol) in Synthesis of Intermediate A-1.

Synthesis of Intermediate B-8

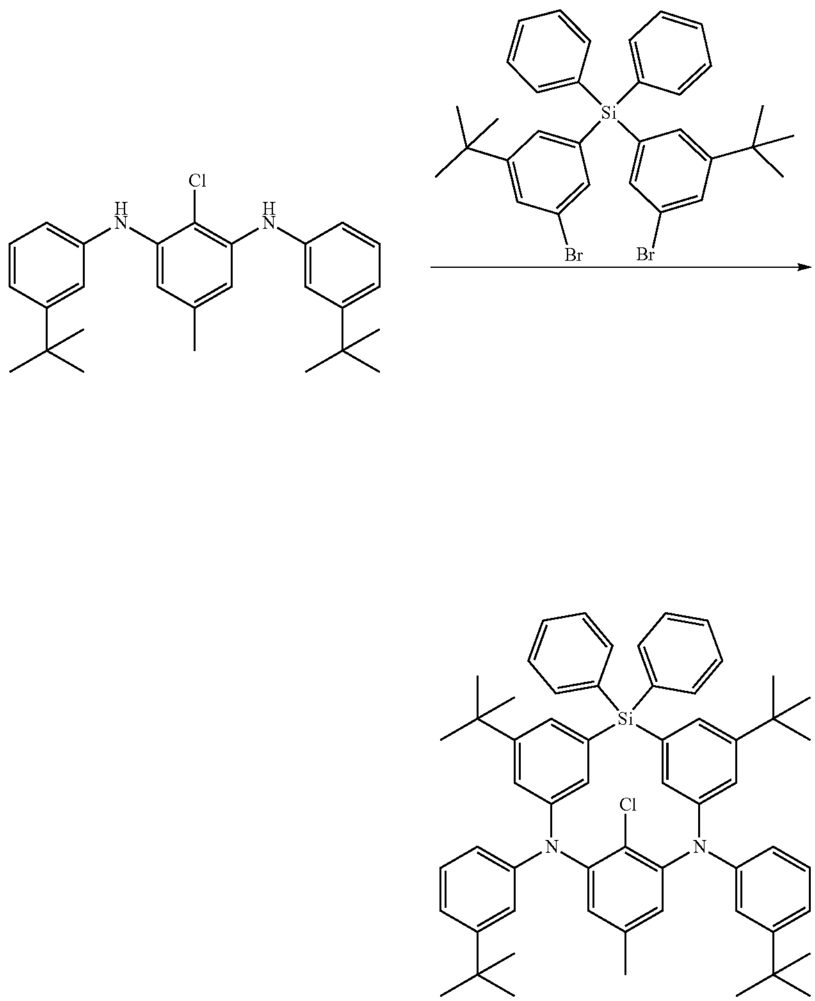

[Intermediate B-8]

N1,N3-bis(3-(tert-butyl)phenyl)-2-chloro-5-methylbenzene-1,3-diamine (16.8 g, 40 mmol) and xylene (70 ml) in a flask were heated to 130° C., and stirred for 4 hours. The reaction solution was cooled to room temperature, and separated by adding water and ethyl acetate thereto, and then the solvent was removed by distillation under vacuum. The result was purified using silica gel column chromatography (developing solution: hexane/ethyl acetate=50%/50% (volume ratio)) to obtain Intermediate B-8 (1.6 g). When measuring a mass spectrum for the obtained solids, a peak was identified at M/Z=865.

Synthesis of Compound 25

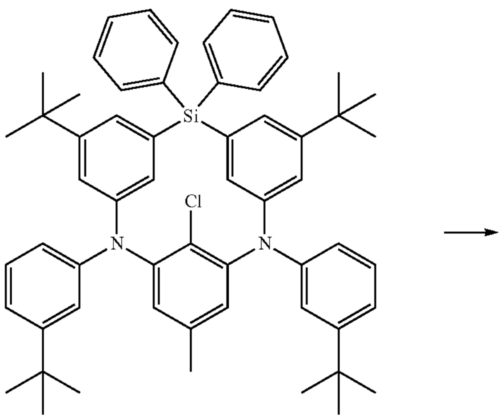

[Intermediate B-8]

-continued

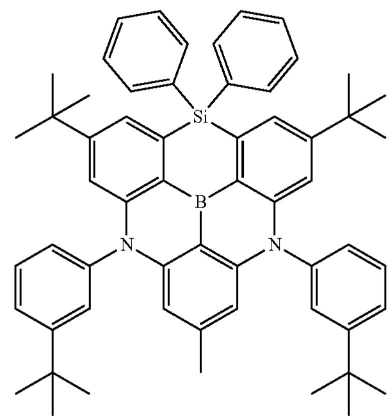

[Compound 25]

Intermediate B-8 (1.4 g, 1.6 mmol) was dissolved in tert-butylbenzene (t-BuPh, 160 mL) in a round bottom flask under the nitrogen atmosphere. 1.7 M t-butyllithium (1.9 mL, 3.2 mmol) was slowly added dropwise to this solution at room temperature, and the result was stirred for 1 hour at 60° C. The result was cooled to room temperature, boron tribromide (0.3 mL, 3.2 mmol) was slowly added dropwise thereto, and the result was stirred for 4 hours at 60° C. When the reaction was finished, the result was cooled to room temperature, extracted with toluene after adding water thereto, and the water layer was removed. The result was treated with anhydrous magnesium sulfate, then filtered and vacuum concentrated. A product was separated and purified using column chromatography, and recrystallized with ethyl acetate and hexane to obtain final Compound 25 (0.26 g, 19%). MS: [M+H]+=839

Synthesis of Intermediate B-9

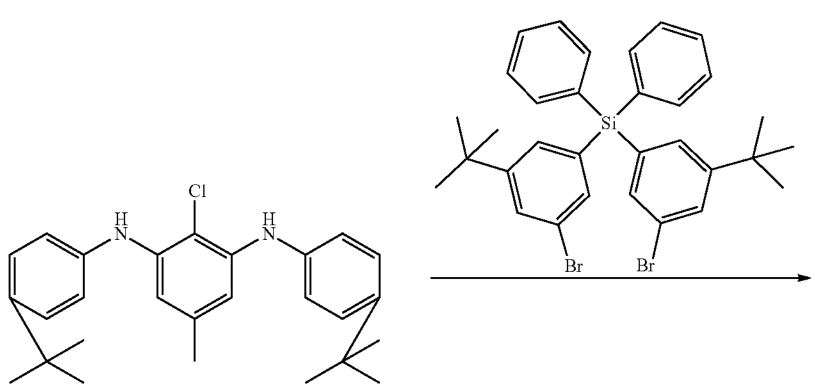

-continued

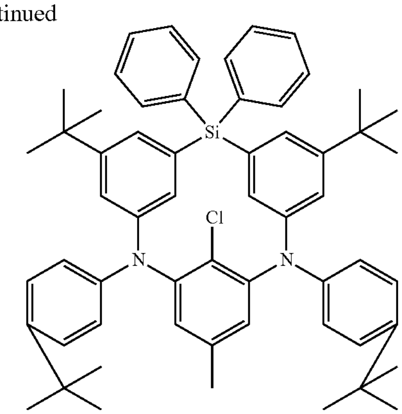

[Intermediate B-9]

Intermediate B-9 was prepared in the same manner as in the method for preparing Intermediate B-8 except that N1,N3-bis(4-(tert-butyl)phenyl)-2-chloro-5-methylbenzene-1,3-diamine was used instead of N1,N3-bis(3-(tert-butyl)phenyl)-2-chloro-5-methylbenzene-1,3-diamine (16.8 g, 40 mmol) in Synthesis of Intermediate B-8. When measuring a mass spectrum for the obtained solids, a peak was identified at M/Z=865.

Synthesis of Compound 26

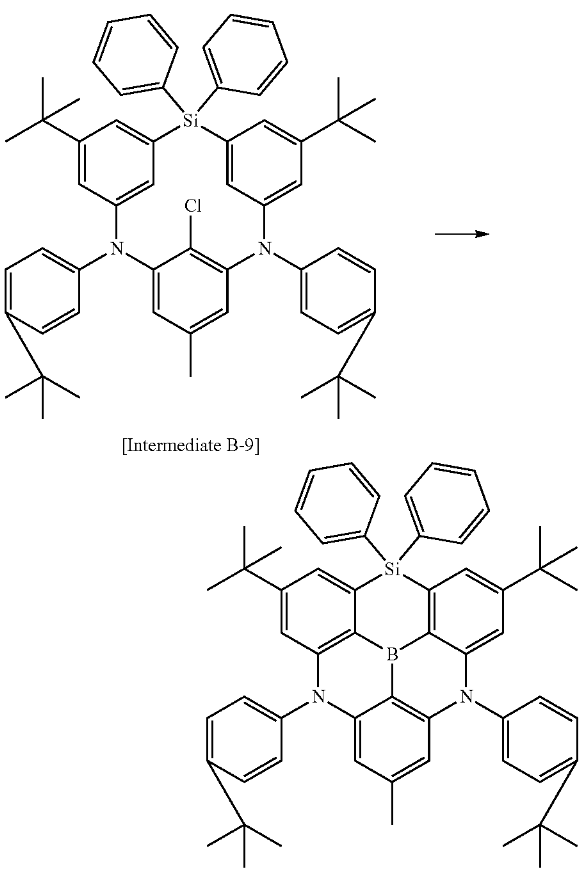

[Intermediate B-9]

[Compound 26]

Compound 26 was prepared in the same manner as in the method for preparing Compound 25 except that Intermediate B-9 was used instead of Intermediate B-8 (1.4 g, 1.6 mmol) in Synthesis of Compound 25. MS: [M+H]+=839

Synthesis of Intermediate B-10

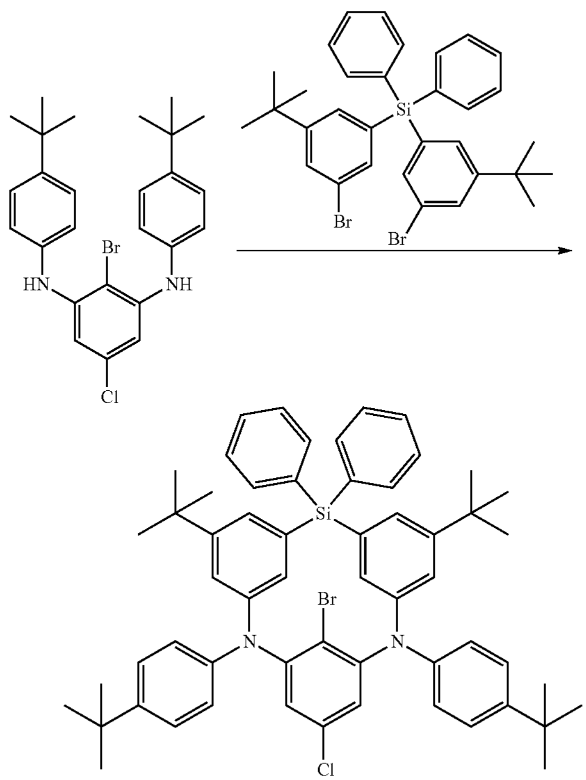

[Intermediate B-10]

2-Bromo-N1,N3-bis(4-(tert-butyl)phenyl)-5-chlorobenzene-1,3-diamine (19.4 g, 40 mmol), Intermediate A-3 (24.3 g, 40 mmol), $Pd(PtBu_3)_2$ (0.5 g, 1.0 mmol), NaOtBu (6.2 g, 64 mmol) and xylene (70 ml) in a flask were heated to 130° C., and stirred for 4 hours. The reaction solution was cooled to room temperature, and separated by adding water and ethyl acetate thereto, and then the solvent was removed by distillation under vacuum. The result was purified using silica gel column chromatography (developing solution:

hexane/ethyl acetate=50%/50% (volume ratio)) to obtain Intermediate B-10 (2.0 g). When measuring a mass spectrum for the obtained solids, a peak was identified at M/Z=929.

Synthesis of Compound 27

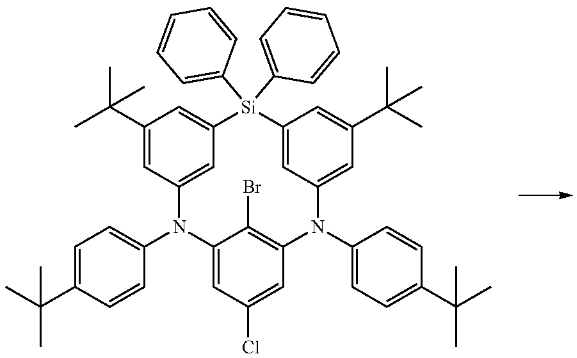

[Intermediate B-10]

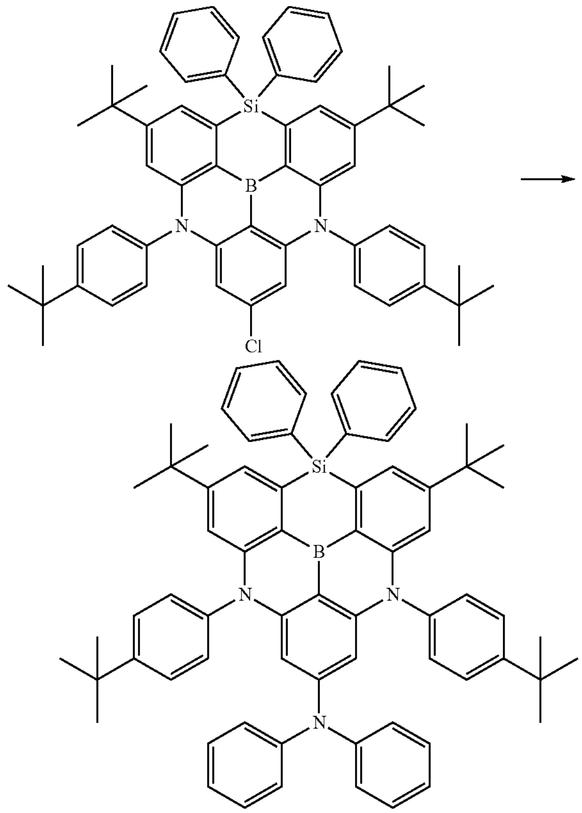

[Compound 27]

Intermediate B-10 (5.9 g, 6.4 mmol) was dissolved in tert-butylbenzene (t-BuPh, 320 mL) in a round bottom flask under the nitrogen atmosphere. 1.7 M t-butyllithium (7.6 mL, 12.8 mmol) was slowly added dropwise to this solution at room temperature, and the result was stirred for 1 hour at 60° C. The result was cooled to room temperature, boron tribromide (1.2 mL, 12.8 mmol) was slowly added dropwise thereto, and the result was stirred for 4 hours at 60° C. When the reaction was finished, the result was cooled to room temperature, extracted with toluene after adding water thereto, and the water layer was removed. The result was treated with anhydrous magnesium sulfate, then filtered and vacuum concentrated. A product was separated and purified using column chromatography, and recrystallized with ethyl acetate and hexane to obtain 0.98 g.

Then, 0.98 g obtained above, diphenylamine (0.3 g, 1.5 mmol), $Pd(PtBu_3)_2$ (0.05 g, 0.1 mmol), NaOtBu (0.62 g, 6.4 mmol) and xylene (7 ml) in a flask were heated to 130° C., and stirred for 4 hours. The reaction solution was cooled to room temperature, and separated by adding water and ethyl acetate thereto, and then the solvent was removed by distillation under vacuum. The result was purified using silica gel column chromatography (developing solution: hexane/ethyl acetate=50%/50% (volume ratio)) to obtain Compound 27 (0.4 g). When measuring a mass spectrum for the obtained solids, a peak was identified at M/Z=992.

Synthesis of Intermediate A-4

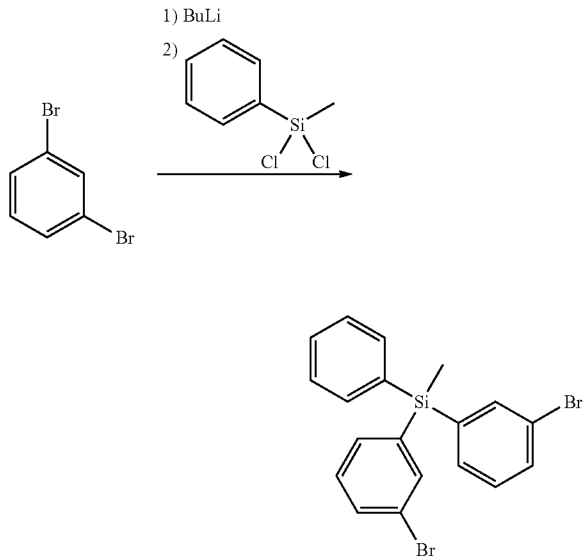

[Intermediate A-4]

Intermediate A-4 was prepared in the same manner as in the method for preparing Intermediate A-1 except that dichloro(methyl)(phenyl)silane was used instead of dichlorodiphenylsilane (5.10 g, 20 mmol) in Synthesis of Intermediate A-1.

Synthesis of Compound 28

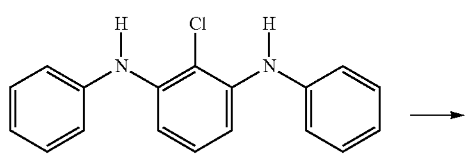

2-chloro-$N^1$,$N^3$-diphenylbenzene-1,3-diamine

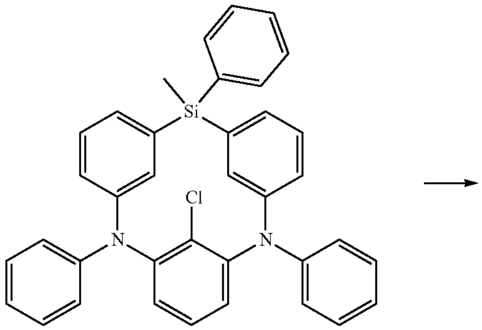

[Intermediate B-11]

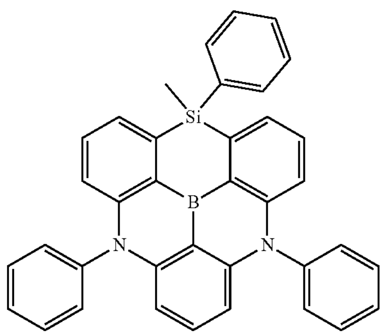

[Compound 28]

Intermediate B-11 was prepared in the same manner as in the method for preparing Intermediate B-1 except that Intermediate A-4 was used instead of Intermediate A-1 (19.8 g, 40 mmol) in Synthesis of Intermediate B-1. When measuring a mass spectrum for the obtained solids, a peak was identified at M/Z=565.

Then, Compound 28 was prepared in the same manner as in the method for preparing Compound 1 except that Intermediate B-11 was used instead of Intermediate B-1 (1.0 g, 1.6 mmol). MS: [M+H]+=539

Synthesis of Compound 29

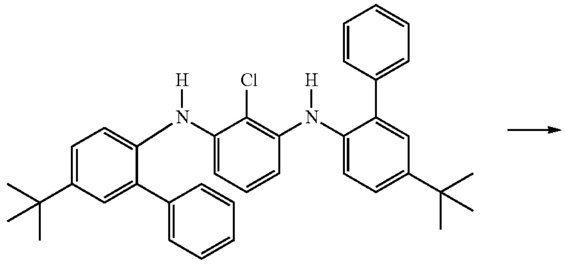

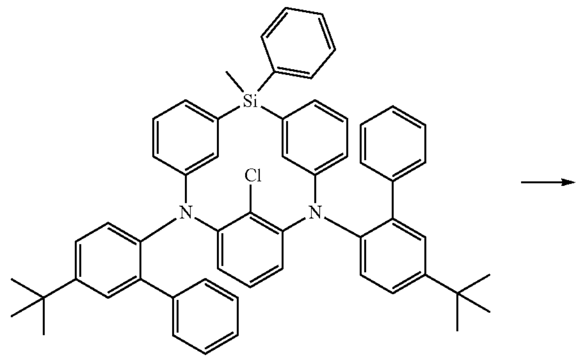

[Intermediate B-12]

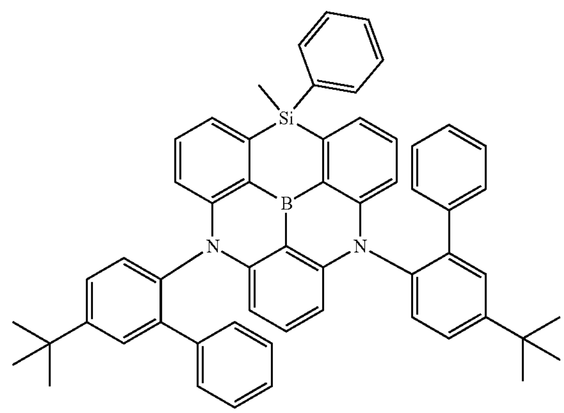

[Compound 29]

Intermediate B-12 was prepared in the same manner as in the method for preparing Intermediate B-11 except that N1,N3-bis(5-(tert-butyl)-[1,1'-biphenyl]-2-yl)-2-chlorobenzene-1,3-diamine was used instead of 2-chloro-N1,N3-diphenylbenzene-1,3-diamine (11.8 g, 40 mmol) in Synthesis of Intermediate B-11. When measuring a mass spectrum for the obtained solids, a peak was identified at M/Z=829. Then, Compound 29 was prepared in the same manner as in the method for preparing Compound 28 except that Intermediate B-12 was used instead of Intermediate B-11 (1.0 g, 1.6 mmol). MS: [M+H]+=803

Synthesis of Compound 30

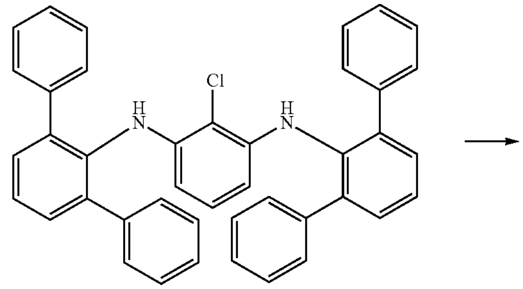

-continued

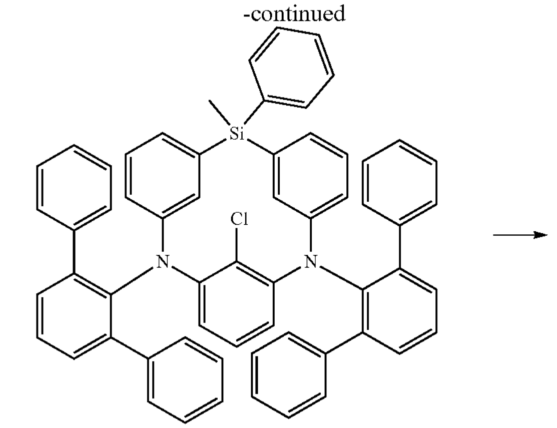

[Intermediate B-13]

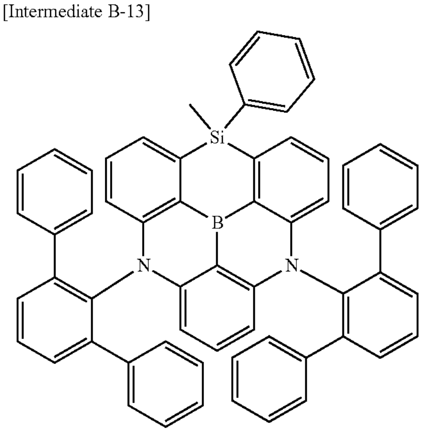

[Compound 30]

Intermediate B-13 was prepared in the same manner as in the method for preparing Intermediate B-11 except that N1,N3-di([1,1':3',1"-terphenyl]-2'-yl)-2-chlorobenzene-1,3-diamine was used instead of 2-chloro-N1,N3-diphenylbenzene-1,3-diamine (11.8 g, 40 mmol) in Synthesis of Intermediate B-11. When measuring a mass spectrum for the obtained solids, a peak was identified at M/Z=869. Then, Compound 30 was prepared in the same manner as in the method for preparing Compound 28 except that Intermediate B-13 was used instead of Intermediate B-11 (1.0 g, 1.6 mmol). MS: [M+H]+=843

Synthesis of Compound 31

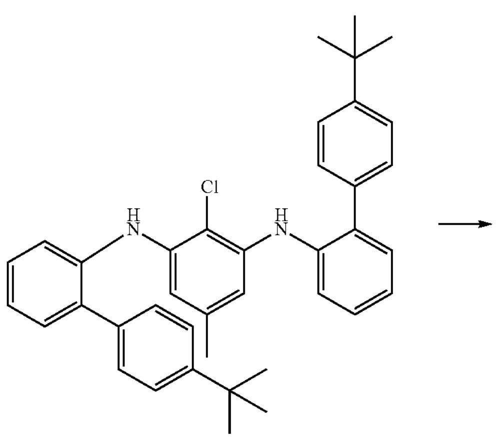

-continued

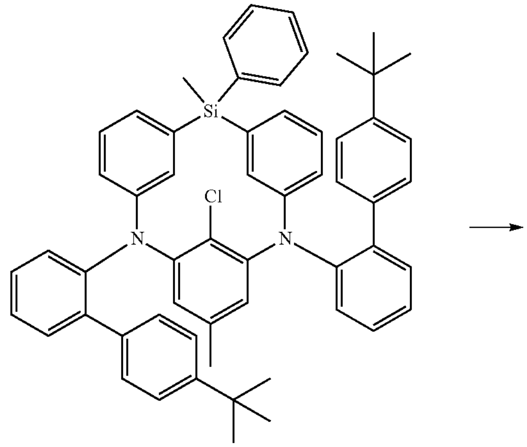

[Intermediate B-14]

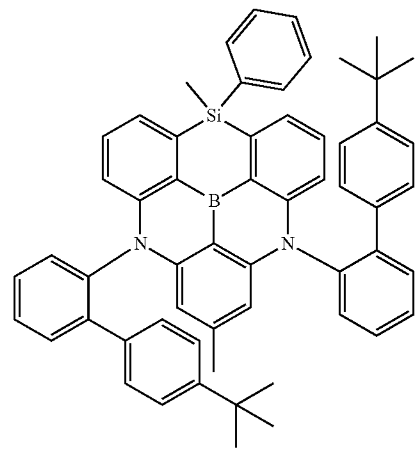

[Compound 31]

Intermediate B-14 was prepared in the same manner as in the method for preparing Intermediate B-11 except that N1,N3-bis(4'-(tert-butyl)-[1,1'-biphenyl]-2-yl)-2-chloro-5-methylbenzene-1,3-diamine was used instead of 2-chloro-N1,N3-diphenylbenzene-1,3-diamine (11.8 g, 40 mmol) in Synthesis of Intermediate B-11. When measuring a mass spectrum for the obtained solids, a peak was identified at M/Z=843. Then, Compound 31 was prepared in the same manner as in the method for preparing Compound 28 except that Intermediate B-14 was used instead of Intermediate B-11 (1.0 g, 1.6 mmol). MS: [M+H]+=817

Synthesis of Intermediate A-5

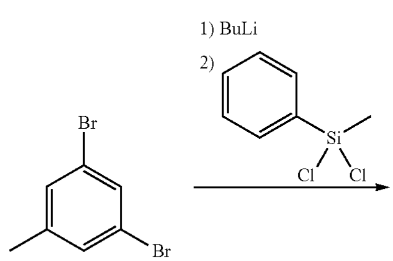

-continued

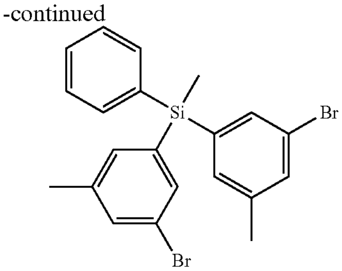

[Intermediate A-5]

Intermediate A-5 was prepared in the same manner as in the method for preparing Intermediate A-4 except that 1,3-dibromo-5-methylbenzene was used instead of 1,3-dibromobenzene (10 g, 40 mmol) in Synthesis of Intermediate A-4.

Synthesis of Compound 32

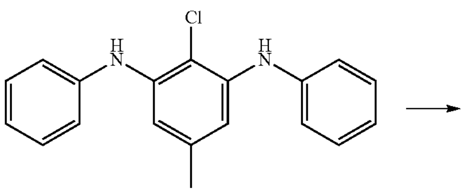

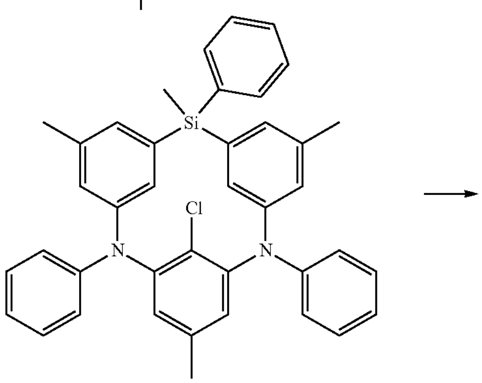

[Intermediate B-15]

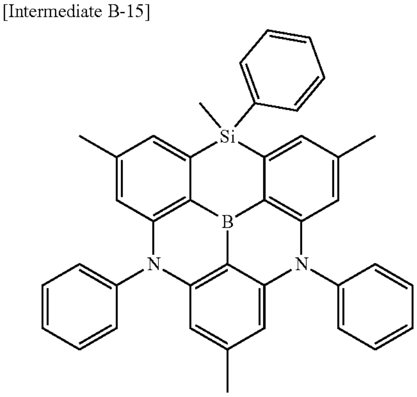

[Compound 32]

Intermediate B-15 was prepared in the same manner as in the method for preparing Intermediate B-11 except that 2-chloro-5-methyl-N1,N3-diphenylbenzene-1,3-diamine was used instead of 2-chloro-N1,N3-diphenylbenzene-1,3-diamine (11.8 g, 40 mmol) in Synthesis of Intermediate B-11. When measuring a mass spectrum for the obtained solids, a peak was identified at M/Z=607. Then, Compound 32 was prepared in the same manner as in the method for preparing Compound 28 except that Intermediate B-15 was used instead of Intermediate B-11 (1.0 g, 1.6 mmol). MS: [M+H]+=581

Synthesis of Intermediate A-6

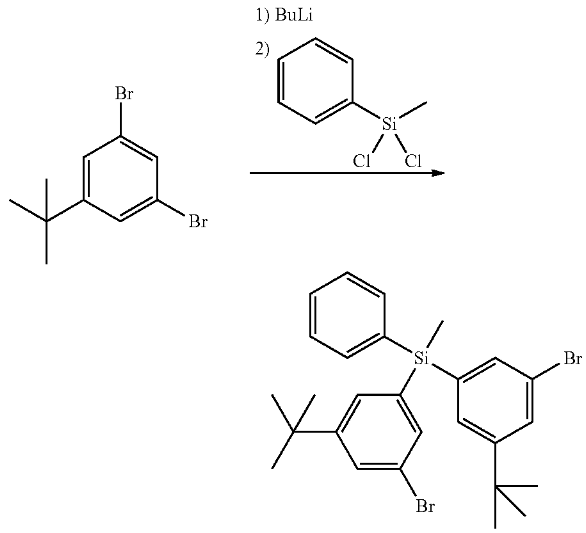

[Intermediate A-6]

Intermediate A-6 was prepared in the same manner as in the method for preparing Intermediate A-4 except that 1,3-dibromo-5-tert-butylbenzene was used instead of 1,3-dibromobenzene (10 g, 40 mmol) in Synthesis of Intermediate A-4.

Synthesis of Compound 33

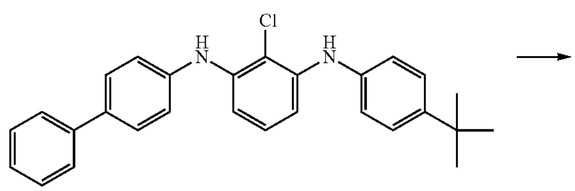

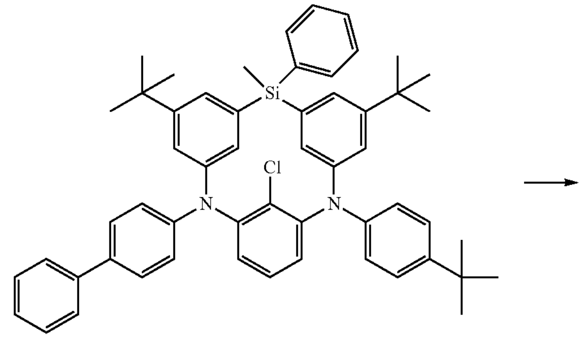

[Intermediate B-16]

-continued

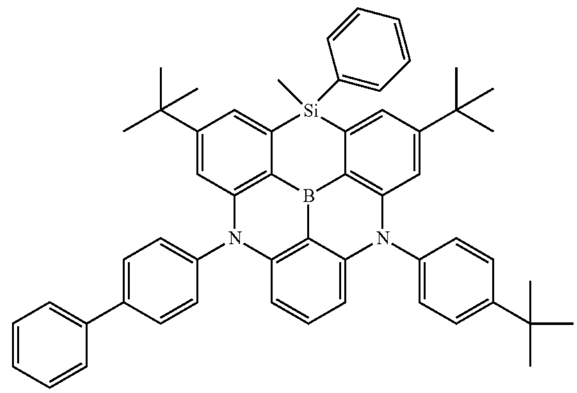

[Compound 33]

N1-([1,1'-biphenyl]-4-yl)-N3-(4-(tert-butyl)phenyl)-2-chlorobenzene-1,3-diamine (17.1 g, 40 mmol), Intermediate A-6 (21.8 g, 40 mmol), $Pd(PtBu_3)_2$ (0.5 g, 1.0 mmol), NaOtBu (6.2 g, 64 mmol) and xylene (70 ml) in a flask were heated to 130° C., and stirred for 4 hours. The reaction solution was cooled to room temperature, and separated by adding water and ethyl acetate thereto, and then the solvent was removed by distillation under vacuum. The result was purified using silica gel column chromatography (developing solution: hexane/ethyl acetate=50%/50% (volume ratio)) to obtain Intermediate B-16 (2.0 g). When measuring a mass spectrum for the obtained solids, a peak was identified at M/Z=809.

Intermediate B-16 (1.3 g, 1.6 mmol) was dissolved in tert-butylbenzene (t-BuPh, 160 mL) in a round bottom flask under the nitrogen atmosphere. 1.7 M t-butyllithium (1.9 mL, 3.2 mmol) was slowly added dropwise to this solution at room temperature, and the result was stirred for 1 hour at 60° C. The result was cooled to room temperature, boron tribromide (0.3 mL, 3.2 mmol) was slowly added dropwise thereto, and the result was stirred for 4 hours at 60° C. When the reaction was finished, the result was cooled to room temperature, extracted with toluene after adding water thereto, and the water layer was removed. The result was treated with anhydrous magnesium sulfate, then filtered and vacuum concentrated. A product was separated and purified using column chromatography, and recrystallized with ethyl acetate and hexane to obtain final Compound 33 (0.30 g, 24%). MS: [M+H]+=783

Synthesis of Compound 34

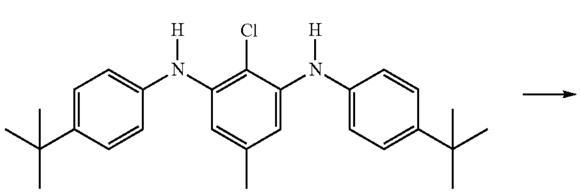

-continued

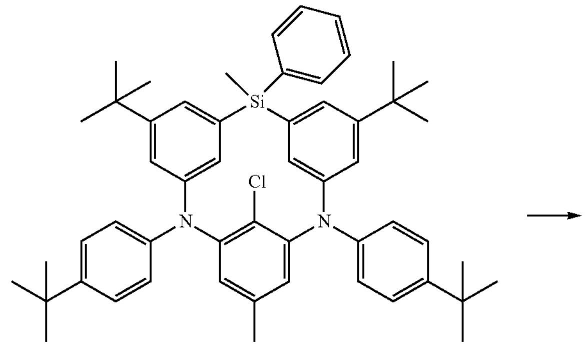

[Intermediate B-17]

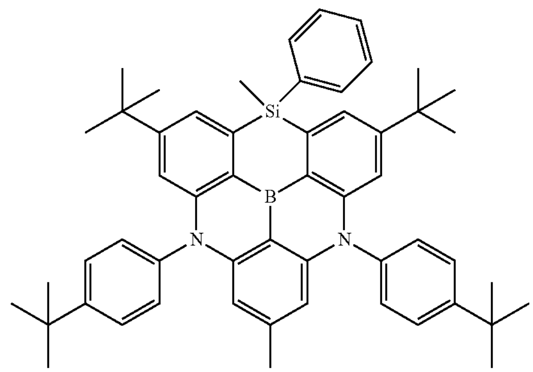

[Compound 34]

Intermediate B-17 was prepared in the same manner as in the method for preparing Compound 33 except that N1,N3-bis(4-(tert-butyl)phenyl)-2-chloro-5-methylbenzene-1,3-diamine was used instead of N1-([1,1f-biphenyl]-4-yl)-N3-(4-(tert-butyl)phenyl)-2-chlorobenzene-1,3-diamine (17.1 g, 40 mmol) in Synthesis of Compound 33.

Then, Compound 34 was prepared in the same manner as in the method for preparing Compound 33 except that Intermediate B-17 was used instead of Intermediate B-16 (1.3 g, 1.6 mmol). MS: [M+H]+=777

Synthesis of Intermediate B-18

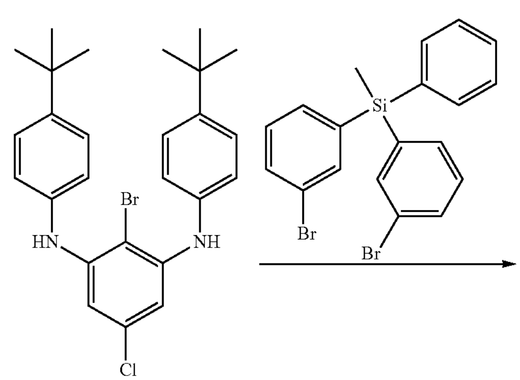

-continued

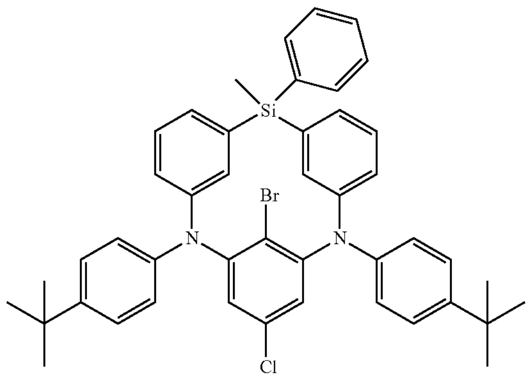

[Intermediate B-18]

2-Bromo-N1,N3-bis(4-(tert-butyl)phenyl)-5-chlorobenzene-1,3-diamine (19.4 g, 40 mmol), Intermediate A-4 (17.3 g, 40 mmol), $Pd(PtBu_3)_2$ (0.5 g, 1.0 mmol), NaOtBu (6.2 g, 64 mmol) and xylene (70 ml) in a flask were heated to 130° C., and stirred for 4 hours. The reaction solution was cooled to room temperature, and separated by adding water and ethyl acetate thereto, and then the solvent was removed by distillation under vacuum. The result was purified using silica gel column chromatography (developing solution: hexane/ethyl acetate=50%/50% (volume ratio)) to obtain Intermediate B-18 (2.0 g). When measuring a mass spectrum for the obtained solids, a peak was identified at M/Z=755.

Synthesis of Compound 35

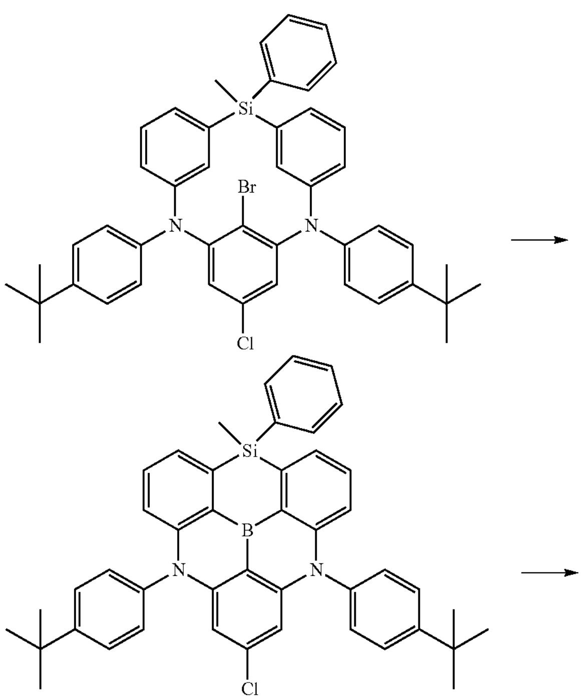

[Intermediate B-18]

-continued

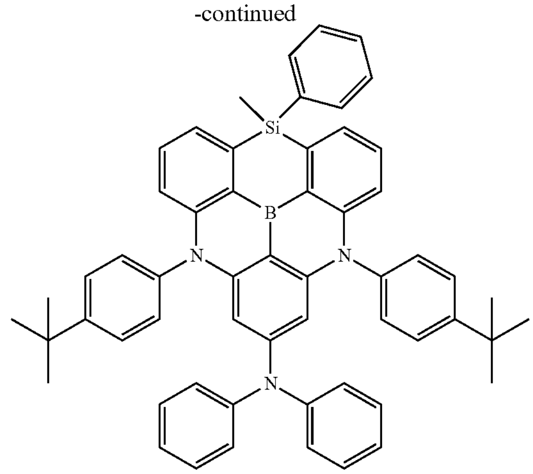

[Compound 35]

Intermediate B-18 (4.8 g, 6.4 mmol) was dissolved in tert-butylbenzene (t-BuPh, 320 mL) in a round bottom flask under the nitrogen atmosphere. 1.7 M t-butyllithium (7.6 mL, 12.8 mmol) was slowly added dropwise to this solution at room temperature, and the result was stirred for 1 hour at 60° C. The result was cooled to room temperature, boron tribromide (1.2 mL, 12.8 mmol) was slowly added dropwise thereto, and the result was stirred for 4 hours at 60° C. When the reaction was finished, the result was cooled to room temperature, extracted with toluene after adding water thereto, and the water layer was removed. The result was treated with anhydrous magnesium sulfate, then filtered and vacuum concentrated. A product was separated and purified using column chromatography, and recrystallized with ethyl acetate and hexane to obtain 1.0 g.

Then, 0.98 g obtained above, diphenylamine (0.3 g, 1.5 mmol), $Pd(PtBu_3)_2$ (0.05 g, 0.1 mmol), NaOtBu (0.62 g, 6.4 mmol) and xylene (7 ml) in a flask were heated to 130° C., and stirred for 4 hours. The reaction solution was cooled to room temperature, and separated by adding water and ethyl acetate thereto, and then the solvent was removed by distillation under vacuum. The result was purified using silica gel column chromatography (developing solution: hexane/ethyl acetate=50%/50% (volume ratio)) to obtain Compound 35 (0.54 g). When measuring a mass spectrum for the obtained solids, a peak was identified at M/Z=818.

Synthesis of Intermediate B-19

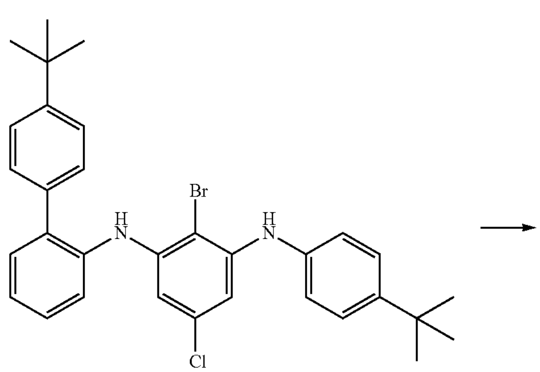

-continued

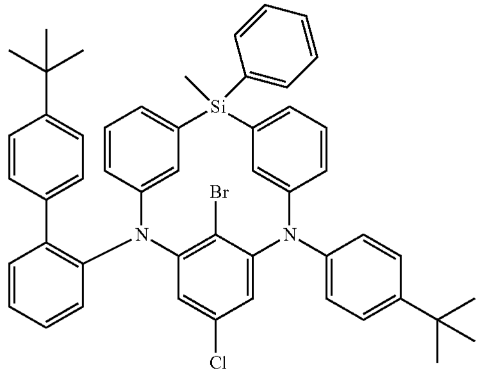

[Intermediate B-19]

Intermediate B-19 was prepared in the same manner as in the method for preparing Intermediate B-18 except that 2-bromo-N1-(4'-(tert-butyl)-[1,1'-biphenyl]-2-yl)-N3-(4-(tert-butyl)phenyl)-5-chlorobenzene-1,3-diamine was used instead of 2-bromo-N1,N3-bis(4-(tert-butyl)phenyl)-5-chlorobenzene-1,3-diamine (19.4 g, 40 mmol) in Synthesis of Intermediate B-18.

Synthesis of Compound 36

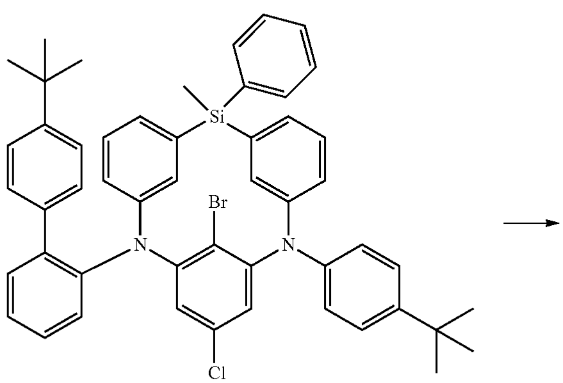

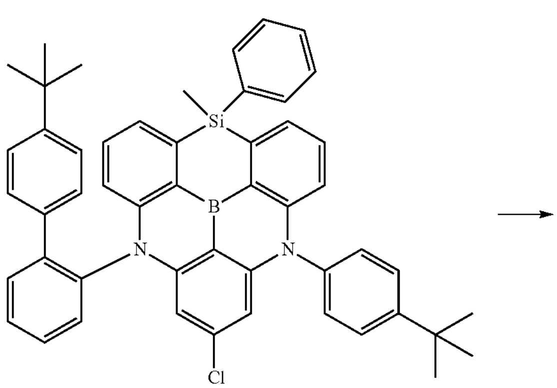

[Intermediate B-19]

-continued

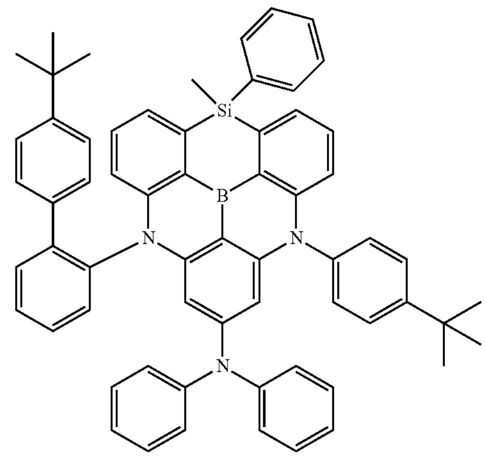

[Compound 36]

Compound 36 was prepared in the same manner as in the method for preparing Compound 35 except that Intermediate B-19 was used instead of Intermediate B-18 (4.8 g, 6.4 mmol) in Synthesis of Compound 35. MS: [M+H]+=840

Synthesis of Intermediate A-7

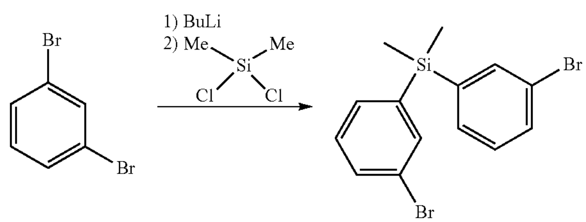

[Intermediate A-7]

Intermediate A-7 was prepared in the same manner as in the method for preparing Intermediate A-1 except that dichlorodimethylsilane was used instead of dichlorodiphenylsilane (5.10 g, 20 mmol) in Synthesis of Intermediate A-1.

Synthesis of Intermediate B-20

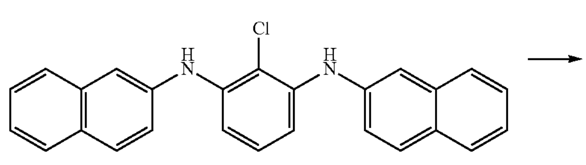

-continued

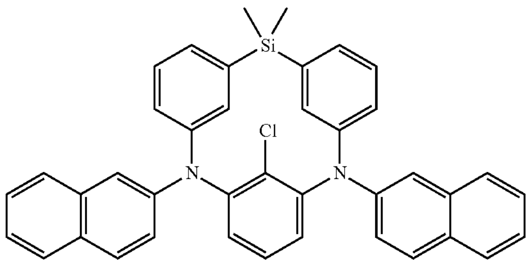

[Intermediate B-20]

Intermediate B-20 was prepared in the same manner as in the method for preparing Intermediate B-1 except that 2-chloro-N1,N3-di(naphthalen-2-yl)benzene-1,3-diamine was used instead of 2-chloro-$N^1$,$N^3$-diphenylbenzene-1,3-diamine (11.8 g, 40 mmol) in Synthesis of Intermediate B-1.

Synthesis of Compound 37

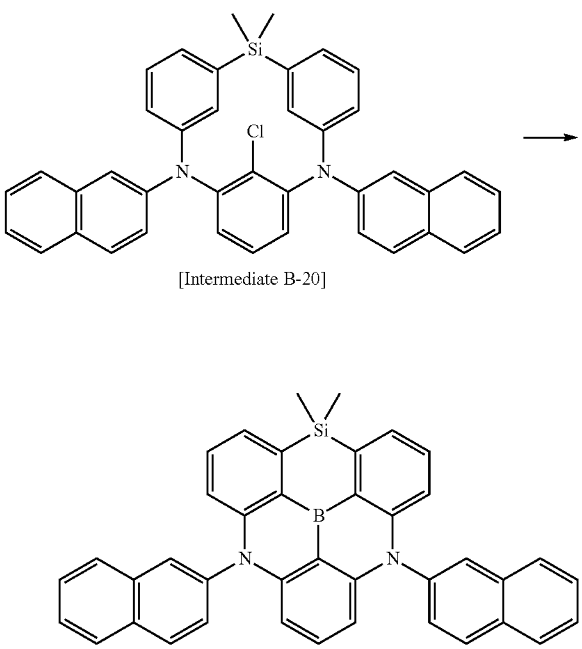

[Intermediate B-20]

[Compound 37]

Compound 37 was prepared in the same manner as in the method for preparing Compound 1 except that Intermediate B-20 was used instead of Intermediate B-1 (1.0 g, 1.6 mmol) in Synthesis of Compound 1.

Synthesis of Intermediate B-21

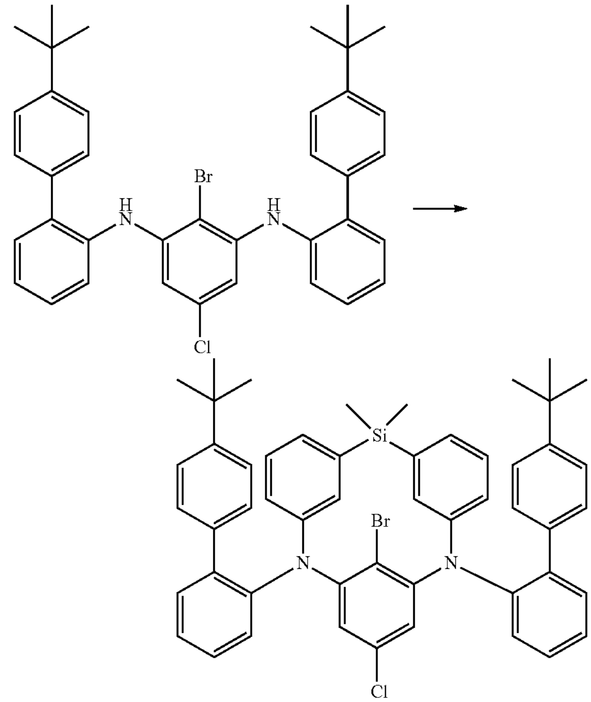

[Intermediate B-21]

2-Bromo-N1,N3-bis(4'-(tert-butyl)-[1,1'-biphenyl]-2-yl)-5-chlorobenzene-1,3-diamine (14.8 g, 40 mmol), Intermediate A-7 (24.3 g, 40 mmol), $Pd(PtBu_3)_2$ (0.5 g, 1.0 mmol), NaOtBu (6.2 g, 64 mmol) and xylene (70 ml) in a flask were heated to 130° C., and stirred for 4 hours. The reaction solution was cooled to room temperature, and separated by adding water and ethyl acetate thereto, and then the solvent was removed by distillation under vacuum. The result was purified using silica gel column chromatography (developing solution: hexane/ethyl acetate=50%/50% (volume ratio)) to obtain Intermediate B-21 (2.0 g). When measuring a mass spectrum for the obtained solids, a peak was identified at M/Z=845.

Synthesis of Compound 38

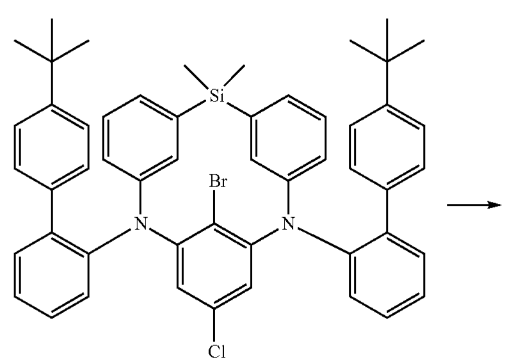

[Intermediate B-21]

-continued

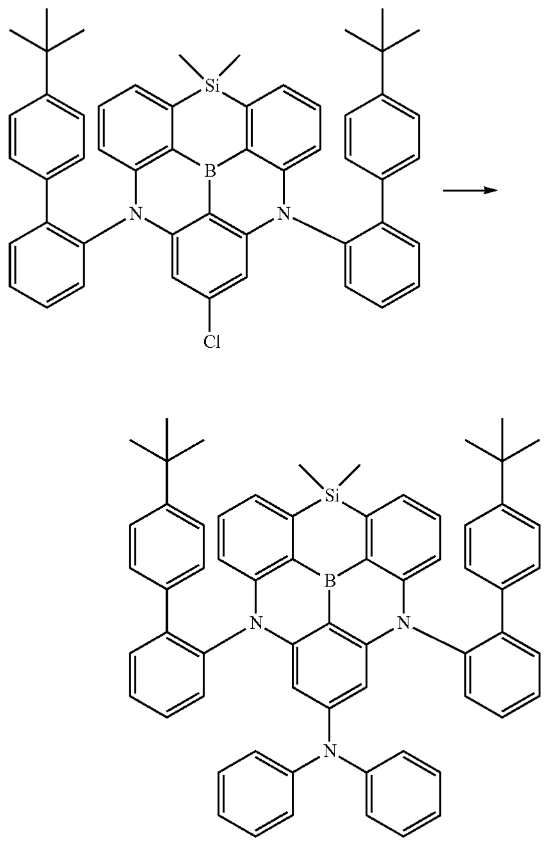

[Compound 38]

Intermediate B-21 (5.4 g, 6.4 mmol) was dissolved in tert-butylbenzene (t-BuPh, 320 mL) in a round bottom flask under the nitrogen atmosphere. 1.7 M t-butyllithium (7.6 mL, 12.8 mmol) was slowly added dropwise to this solution at room temperature, and the result was stirred for 1 hour at 60° C. The result was cooled to room temperature, boron tribromide (1.2 mL, 12.8 mmol) was slowly added dropwise thereto, and the result was stirred for 4 hours at 60° C. When the reaction was finished, the result was cooled to room temperature, extracted with toluene after adding water thereto, and the water layer was removed. The result was treated with anhydrous magnesium sulfate, then filtered and vacuum concentrated. A product was separated and purified using column chromatography, and recrystallized with ethyl acetate and hexane to obtain 1.0 g.

Then, 1.0 g obtained above, diphenylamine (0.3 g, 1.5 mmol), $Pd(PtBu_3)_2$ (0.05 g, 0.1 mmol), NaOtBu (0.62 g, 6.4 mmol) and xylene (7 ml) in a flask were heated to 130° C., and stirred for 4 hours. The reaction solution was cooled to room temperature, and separated by adding water and ethyl acetate thereto, and then the solvent was removed by distillation under vacuum. The result was purified using silica gel column chromatography (developing solution: hexane/ethyl acetate=50%/50% (volume ratio)) to obtain Compound 38 (0.6 g). When measuring a mass spectrum for the obtained solids, a peak was identified at M/Z=908.

Synthesis of Intermediate B-22

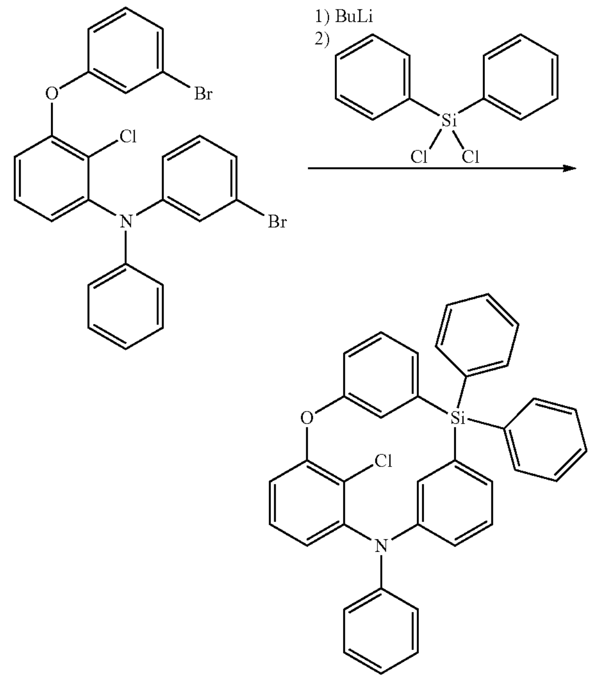

[Intermediate B-22]

3-(3-Bromophenoxy)-N-(3-bromophenyl)-2-chloro-N-phenylaniline (21.2 g, 40 mmol) was dissolved in tetrahydrofuran (200 mL), and cooled to −78° C. under a nitrogen condition. Then, a 1.6 M n-BuLi hexane solution (26 mL, 40 mmol) was slowly added dropwise thereto, and the result was stirred for 2 hours at −78° C. Dichlorodiphenylsilane (5.10 g, 20 mmol) was introduced thereto, and the result was stirred while slowly raising the temperature to room temperature for 10 hours. Distilled water was introduced thereto to finish the reaction, diethyl ether (100 mL) was further introduced thereto for extraction, and the result was dried with anhydrous sodium sulfate. The result was purified using silica gel column chromatography (developing solution: hexane/ethyl acetate=50%/50% (volume ratio)) to obtain Intermediate B-22 (2.2 g). When measuring a mass spectrum for the obtained solids, a peak was identified at M/Z=552.

Synthesis of Compound 39

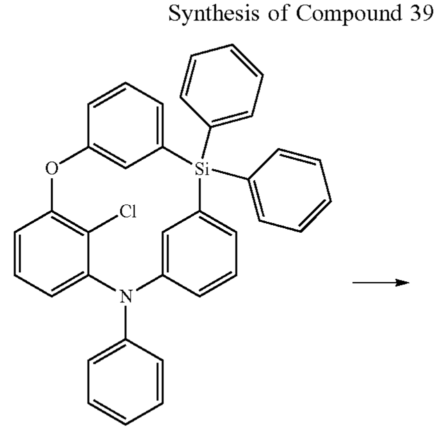

[Intermediate B-22]

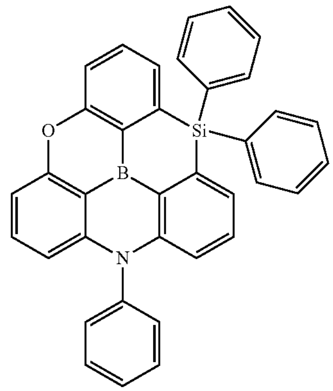

[Compound 39]

Intermediate B-22 (3.5 g, 6.4 mmol) was dissolved in tert-butylbenzene (t-BuPh, 320 mL) in a round bottom flask under the nitrogen atmosphere. 1.7 M t-butyllithium (7.6 mL, 12.8 mmol) was slowly added dropwise to this solution at room temperature, and the result was stirred for 1 hour at 60° C. The result was cooled to room temperature, boron tribromide (1.2 mL, 12.8 mmol) was slowly added dropwise thereto, and the result was stirred for 4 hours at 60° C. When the reaction was finished, the result was cooled to room temperature, extracted with toluene after adding water thereto, and the water layer was removed. The result was treated with anhydrous magnesium sulfate, then filtered and vacuum concentrated. A product was separated and purified using column chromatography, and recrystallized with ethyl acetate and hexane to obtain Compound 39 (1.0 g). MS: [M+H]+=526

Synthesis of Intermediate B-23

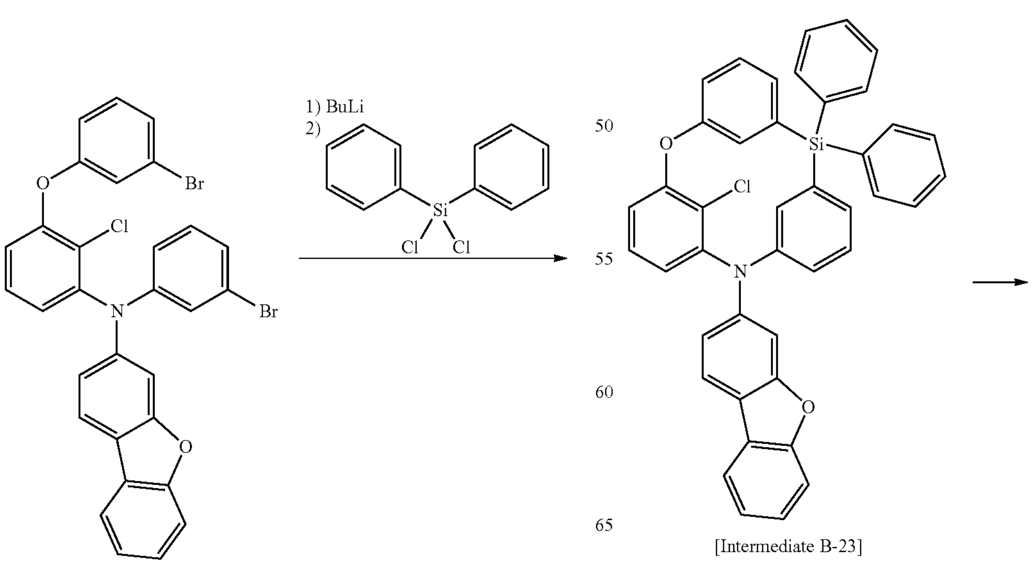

[Intermediate B-23]

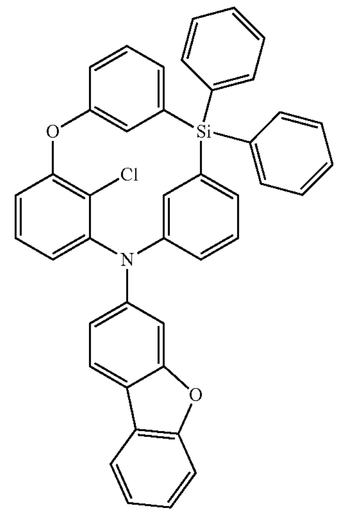

[Intermediate B-23]

Intermediate B-23 was prepared in the same manner as in the method for preparing Intermediate B-22 except that N-(3-(3-bromophenoxy)-2-chlorophenyl)-N-(3-bromophenyl)dibenzo[b,d]furan-3-amine was used instead of 3-(3-bromophenoxy)-N-(3-bromophenyl)-2-chloro-N-phenylaniline (21.2 g, 40 mmol) in Synthesis of Intermediate B-22. MS: [M+H]+=642

Synthesis of Compound 40

-continued

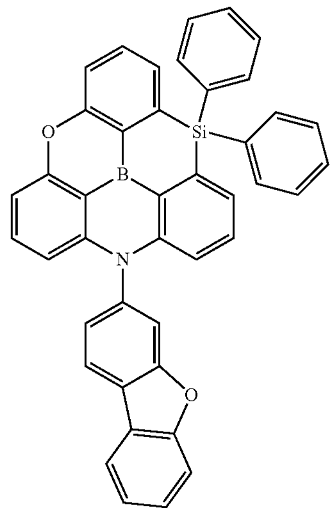

[Compound 40]

Compound 40 was prepared in the same manner as in the method for preparing Compound 39 except that Intermediate B-23 was used instead of Intermediate B-22 (3.5 g, 6.4 mmol) in Synthesis of Compound 39. MS: [M+H]+=616

EXAMPLE

Example 1

A glass substrate (corning 7059 glass) on which indium tin oxide (ITO) was coated as a thin film to a thickness of 1,000 Å was placed in dispersant-dissolved distilled water and ultrasonic cleaned. A product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonic cleaned with solvents of isopropyl alcohol, acetone and methanol in this order, then dried.

On the transparent ITO electrode prepared as above, a hole injection layer was formed by thermal vacuum depositing the following compound HAT to a thickness of 50 Å. As a hole transfer layer, the following compound HT-A was vacuum deposited to 1000 Å thereon, and the following compound HT-B was subsequently deposited to 100 Å. A light emitting layer was vacuum deposited to a thickness of 200 Å using BH-1 as a host, and Compound 1 as a dopant in 2% by weight with respect to the weight of the light emitting layer material.

Then, the following compound ET-A and the following compound Liq were deposited to 300 Å in a ratio of 1:1, and magnesium (Mg) doped with silver (Ag) by 10% by weight having a thickness of 150 Å and aluminum having a thickness of 1,000 Å were consecutively deposited thereon to form a cathode, and as a result, an organic light emitting device was manufactured.

In the above-mentioned process, the deposition rates of the organic materials were maintained at 1 Å/sec, and the deposition rates of the LiF and the aluminum were maintained at 0.2 Å/sec and 3 Å/sec to 7 Å/sec, respectively.

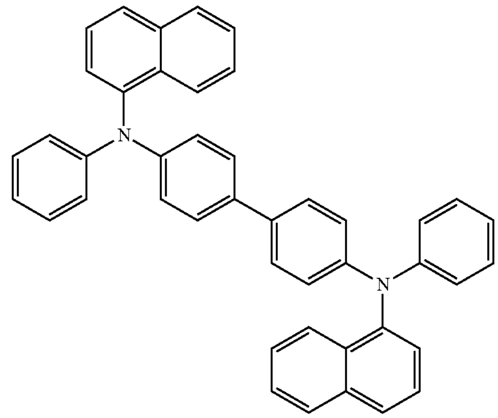

HT-A

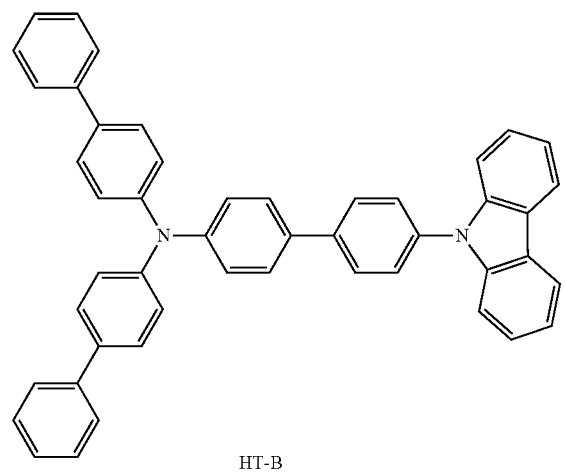

HT-B

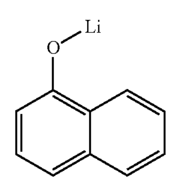

Liq

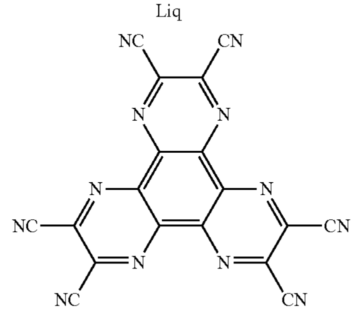

HAT

-continued

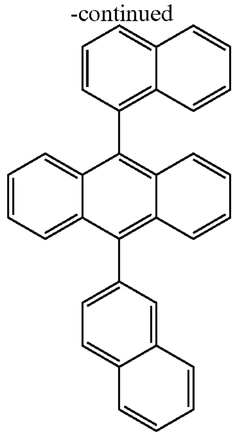

BH-1

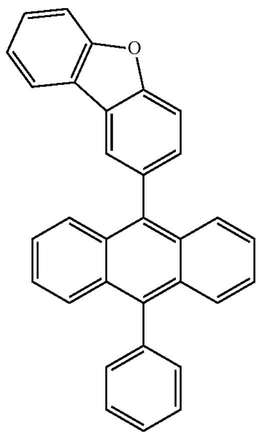

BH-2

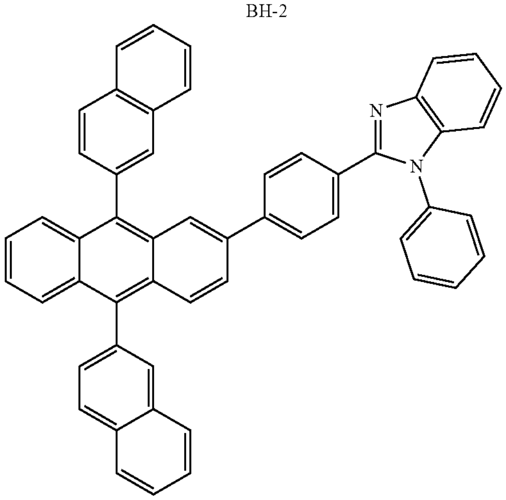

ET-A

Example 2

An organic light emitting device was manufactured in the same manner as in Example 1 except that Compound 2 was used instead of Compound 1.

Example 3

An organic light emitting device was manufactured in the same manner as in Example 1 except that Compound 3 was used instead of Compound 1.

Example 4

An organic light emitting device was manufactured in the same manner as in Example 1 except that Compound 4 was used instead of Compound 1.

Example 5

An organic light emitting device was manufactured in the same manner as in Example 1 except that Compound 5 was used instead of Compound 1.

Example 6

An organic light emitting device was manufactured in the same manner as in Example 1 except that Compound 6 was used instead of Compound 1.

Example 7

An organic light emitting device was manufactured in the same manner as in Example 1 except that Compound 7 was used instead of Compound 1.

Example 8

An organic light emitting device was manufactured in the same manner as in Example 1 except that Compound 8 was used instead of Compound 1.

Example 9

An organic light emitting device was manufactured in the same manner as in Example 1 except that Compound 9 was used instead of Compound 1.

Example 10

An organic light emitting device was manufactured in the same manner as in Example 1 except that Compound 10 was used instead of Compound 1.

Example 11

An organic light emitting device was manufactured in the same manner as in Example 1 except that Compound 11 was used instead of Compound 1.

Example 12

An organic light emitting device was manufactured in the same manner as in Example 1 except that Compound 12 was used instead of Compound 1.

Example 13

An organic light emitting device was manufactured in the same manner as in Example 1 except that Compound 13 was used instead of Compound 1.

Example 14

An organic light emitting device was manufactured in the same manner as in Example 1 except that Compound 14 was used instead of Compound 1.

Example 15

An organic light emitting device was manufactured in the same manner as in Example 1 except that Compound 15 was used instead of Compound 1.

Example 16

An organic light emitting device was manufactured in the same manner as in Example 1 except that Compound 16 was used instead of Compound 1.

Example 17

An organic light emitting device was manufactured in the same manner as in Example 1 except that Compound 17 was used instead of Compound 1.

Example 18

An organic light emitting device was manufactured in the same manner as in Example 1 except that Compound 18 was used instead of Compound 1.

Example 19

An organic light emitting device was manufactured in the same manner as in Example 1 except that Compound 19 was used instead of Compound 1.

Example 20

An organic light emitting device was manufactured in the same manner as in Example 1 except that Compound 20 was used instead of Compound 1.

Example 21

An organic light emitting device was manufactured in the same manner as in Example 1 except that Compound 21 was used instead of Compound 1.

Example 22

An organic light emitting device was manufactured in the same manner as in Example 1 except that Compound 22 was used instead of Compound 1.

Example 23

An organic light emitting device was manufactured in the same manner as in Example 1 except that Compound 23 was used instead of Compound 1.

Example 24

An organic light emitting device was manufactured in the same manner as in Example 1 except that Compound 24 was used instead of Compound 1.

Example 25

An organic light emitting device was manufactured in the same manner as in Example 1 except that Compound 25 was used instead of Compound 1.

Example 26

An organic light emitting device was manufactured in the same manner as in Example 1 except that Compound 26 was used instead of Compound 1.

Example 27

An organic light emitting device was manufactured in the same manner as in Example 1 except that Compound 27 was used instead of Compound 1.

Example 28

An organic light emitting device was manufactured in the same manner as in Example 1 except that Compound 28 was used instead of Compound 1.

Example 29

An organic light emitting device was manufactured in the same manner as in Example 1 except that Compound 29 was used instead of Compound 1.

Example 30

An organic light emitting device was manufactured in the same manner as in Example 1 except that Compound 30 was used instead of Compound 1.

Example 31

An organic light emitting device was manufactured in the same manner as in Example 1 except that Compound 31 was used instead of Compound 1.

Example 32

An organic light emitting device was manufactured in the same manner as in Example 1 except that Compound 32 was used instead of Compound 1.

Example 33

An organic light emitting device was manufactured in the same manner as in Example 1 except that Compound 33 was used instead of Compound 1.

Example 34

An organic light emitting device was manufactured in the same manner as in Example 1 except that Compound 34 was used instead of Compound 1.

Example 35

An organic light emitting device was manufactured in the same manner as in Example 1 except that Compound 35 was used instead of Compound 1.

Example 36

An organic light emitting device was manufactured in the same manner as in Example 1 except that Compound 36 was used instead of Compound 1.

Example 37

An organic light emitting device was manufactured in the same manner as in Example 1 except that Compound 37 was used instead of Compound 1.

Example 38

An organic light emitting device was manufactured in the same manner as in Example 1 except that Compound 38 was used instead of Compound 1.

Example 39

An organic light emitting device was manufactured in the same manner as in Example 1 except that Compound 39 was used instead of Compound 1.

Example 40

An organic light emitting device was manufactured in the same manner as in Example 1 except that Compound 40 was used instead of Compound 1.

Example 41

An organic light emitting device was manufactured in the same manner as in Example 17 except that Compound BH-2 is further included (weight ratio of BH-1 and BH-2: 1:1).

Example 42

An organic light emitting device was manufactured in the same manner as in Example 20 except that Compound BH-2 is further included (weight ratio of BH-1 and BH-2: 1:1).

COMPARATIVE EXAMPLE

Comparative Example 1

An organic light emitting device was manufactured in the same manner as in Example 1 except that the following Compound D-1 was used instead of Compound 1.

[D-1]

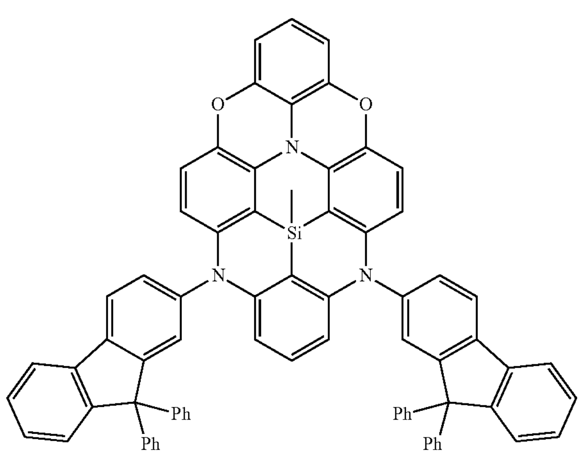

Comparative Example 2

An organic light emitting device was manufactured in the same manner as in Example 1 except that the following Compound D-2 was used instead of Compound 1.

[D-2]

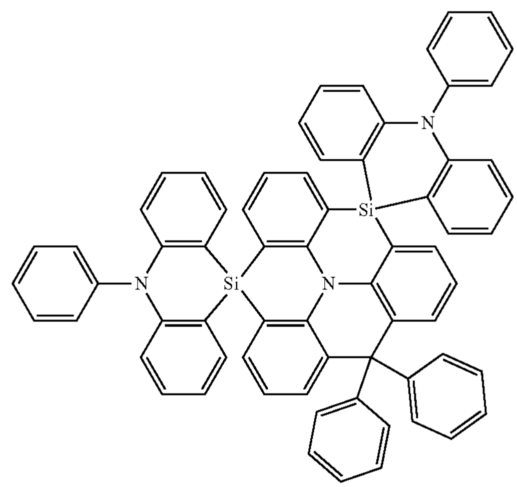

Comparative Example 3

An organic light emitting device was manufactured in the same manner as in Example 1 except that the following Compound D-3 was used instead of Compound 1.

[D-3]

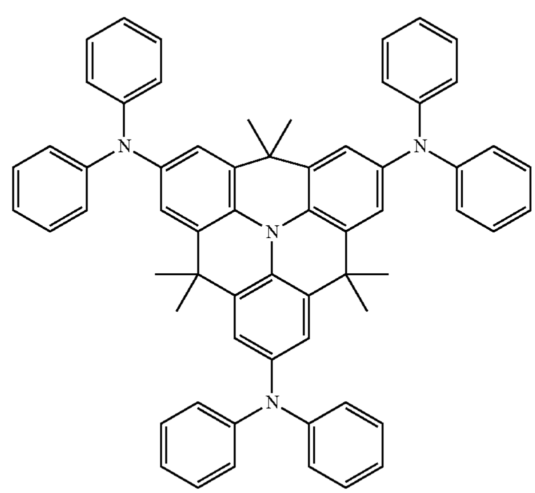

Comparative Example 4

An organic light emitting device was manufactured in the same manner as in Example 1 except that the following Compound D-4 was used instead of Compound 1.

[D-4]

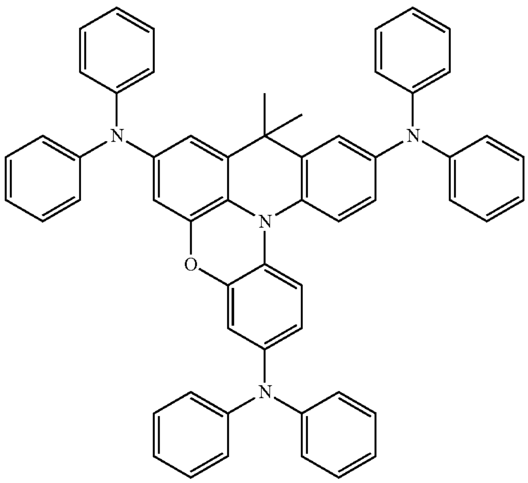

Comparative Example 5

An organic light emitting device was manufactured in the same manner as in Example 1 except that the following Compound D-5 was used instead of Compound 1.

[D-5]

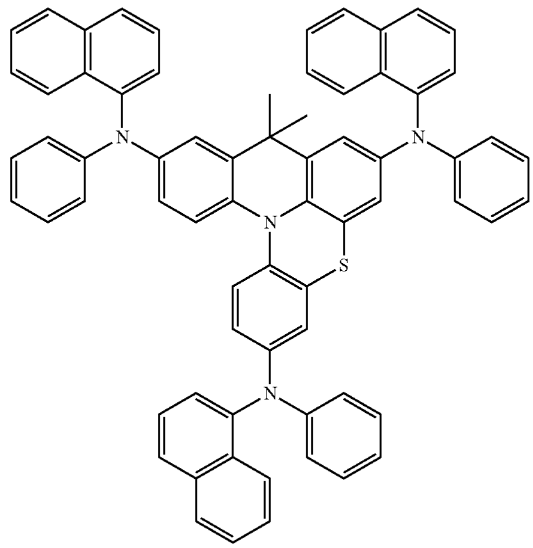

For the organic light emitting devices of Examples 1 to 42 and Comparative Examples 1 to 5, driving voltage, light emission efficiency and color coordinate were measured at current density of 10 mA/cm$^2$, and time taken for the luminance becoming 95% compared to its initial luminance (LT95) was measured at current density of 20 mA/cm$^2$. The results are shown in the following Table 1.

TABLE 1

| | | | 10 mA/cm$^2$ | | | 20 mA/cm$^2$ |
|---|---|---|---|---|---|---|
| Example | Host | Dopant | Driving Voltage (v) | Efficiency (cd/A) | CIEy | Lifetime (hr) |
| Example 1 | BH-1 | Compound 1 | 4.3 | 6.2 | 0.098 | 200 |
| Example 2 | BH-1 | Compound 2 | 4.5 | 6.2 | 0.095 | 200 |
| Example 3 | BH-1 | Compound 3 | 4.5 | 6.2 | 0.098 | 208 |
| Example 4 | BH-1 | Compound 4 | 4.4 | 6.4 | 0.094 | 228 |
| Example 5 | BH-1 | Compound 5 | 4.5 | 6.3 | 0.096 | 220 |
| Example 6 | BH-1 | Compound 6 | 4.4 | 6.4 | 0.092 | 206 |
| Example 7 | BH-1 | Compound 7 | 4.3 | 6.4 | 0.090 | 206 |
| Example 8 | BH-1 | Compound 8 | 4.2 | 6.1 | 0.098 | 220 |
| Example 9 | BH-1 | Compound 9 | 4.6 | 6.3 | 0.096 | 210 |
| Example 10 | BH-1 | Compound 10 | 4.2 | 6.4 | 0.094 | 210 |
| Example 11 | BH-1 | Compound 11 | 4.4 | 6.4 | 0.096 | 208 |
| Example 12 | BH-1 | Compound 12 | 4.4 | 6.0 | 0.094 | 210 |
| Example 13 | BH-1 | Compound 13 | 4.2 | 6.4 | 0.092 | 204 |
| Example 14 | BH-1 | Compound 14 | 4.0 | 6.6 | 0.092 | 203 |
| Example 15 | BH-1 | Compound 15 | 4.1 | 6.2 | 0.096 | 210 |
| Example 16 | BH-1 | Compound 16 | 3.9 | 6.2 | 0.092 | 210 |
| Example 17 | BH-1 | Compound 17 | 4.4 | 6.1 | 0.094 | 216 |
| Example 18 | BH-1 | Compound 18 | 4.0 | 6.3 | 0.088 | 206 |
| Example 19 | BH-1 | Compound 19 | 4.0 | 6.2 | 0.090 | 206 |
| Example 20 | BH-1 | Compound 20 | 4.4 | 6.4 | 0.090 | 200 |
| Example 21 | BH-1 | Compound 21 | 4.2 | 6.0 | 0.094 | 210 |
| Example 22 | BH-1 | Compound 22 | 4.2 | 6.6 | 0.092 | 208 |
| Example 23 | BH-1 | Compound 23 | 4.4 | 6.2 | 0.092 | 204 |
| Example 24 | BH-1 | Compound 24 | 4.4 | 6.4 | 0.098 | 204 |
| Example 25 | BH-1 | Compound 25 | 4.0 | 6.2 | 0.098 | 210 |
| Example 26 | BH-1 | Compound 26 | 4.2 | 6.6 | 0.096 | 216 |
| Example 27 | BH-1 | Compound 27 | 4.0 | 6.2 | 0.092 | 202 |
| Example 28 | BH-1 | Compound 28 | 4.4 | 6.4 | 0.100 | 206 |

TABLE 1-continued

| Example | Host | Dopant | 10 mA/cm² Driving Voltage (v) | 10 mA/cm² Efficiency (cd/A) | 10 mA/cm² CIEy | 20 mA/cm² Lifetime (hr) |
|---|---|---|---|---|---|---|
| Example 29 | BH-1 | Compound 29 | 4.2 | 6.0 | 0.094 | 200 |
| Example 30 | BH-1 | Compound 30 | 4.4 | 6.6 | 0.098 | 200 |
| Example 31 | BH-1 | Compound 31 | 4.0 | 6.2 | 0.096 | 209 |
| Example 32 | BH-1 | Compound 32 | 4.4 | 6.2 | 0.098 | 200 |
| Example 33 | BH-1 | Compound 33 | 4.0 | 6.8 | 0.094 | 202 |
| Example 34 | BH-1 | Compound 34 | 3.8 | 6.4 | 0.098 | 202 |
| Example 35 | BH-1 | Compound 35 | 4.2 | 6.4 | 0.096 | 201 |
| Example 36 | BH-1 | Compound 36 | 4.0 | 6.0 | 0.093 | 214 |
| Example 37 | BH-1 | Compound 37 | 4.0 | 6.4 | 0.098 | 204 |
| Example 38 | BH-1 | Compound 38 | 4.2 | 6.4 | 0.100 | 204 |
| Example 39 | BH-1 | Compound 39 | 4.4 | 6.0 | 0.098 | 206 |
| Example 40 | BH-1 | Compound 40 | 4.4 | 6.2 | 0.096 | 207 |
| Example 41 | BH-1/ BH-2 | Compound 17 | 4.6 | 6.3 | 0.098 | 222 |
| Example 42 | BH-1/ BH-2 | Compound 20 | 4.2 | 6.2 | 0.098 | 214 |
| Comparative Example 1 | BH-1 | D-1 | 4.3 | 5.4 | 0.180 | 104 |
| Comparative Example 2 | BH-1 | D-2 | 4.6 | 5.4 | 0.164 | 106 |
| Comparative Example 3 | BH-1 | D-3 | 4.3 | 5.2 | 0.192 | 123 |
| Comparative Example 4 | BH-1 | D-4 | 4.6 | 5.6 | 0.180 | 99 |
| Comparative Example 5 | BH-1 | D-5 | 4.6 | 5.8 | 0.168 | 106 |

As shown in the table, it was identified that Example 1 to Example 40 using an identical host and varying just a dopant material were effective in obtaining higher efficiency and longer lifetime compared to Comparative Example 1 to Comparative Example 5.

In addition, Example 41 and Example 42 used identical dopant materials as Example 17 and Example 20, and further included BH-2, a host material, when forming the host. It was identified that, compared to when using BH-1 alone as the host material, equal efficiency and lifetime effects were also obtained when using two host materials.

The invention claimed is:

1. A compound of the following Chemical Formula 1:

[Chemical Formula 1]

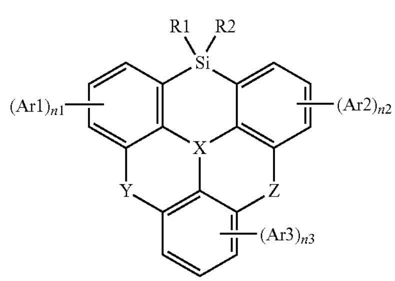

wherein, in Chemical Formula 1,

X is B;

Y and Z are each O, S or NR;

R1 and R2 are the same as or different from each other, and are each independently a substituted or unsubstituted alkyl group; or a substituted or unsubstituted aryl group;

R is hydrogen; deuterium; a halogen group; a cyano group; a substituted or unsubstituted alkyl group; a substituted or unsubstituted cycloalkyl group; a substituted or unsubstituted aryl group; or a substituted or unsubstituted heterocyclic group;

Ar1 and Ar2 are the same as or different from each other, and are each independently hydrogen; deuterium; a halogen group; a cyano group; a substituted or unsubstituted silyl group; a substituted or unsubstituted boron group; a substituted or unsubstituted alkyl group; a substituted or unsubstituted cycloalkyl group; or a substituted or unsubstituted amine group, Ar3 is hydrogen; deuterium; a halogen group; a cyano group; a substituted or unsubstituted silyl group; a substituted or unsubstituted boron group; a substituted or unsubstituted alkyl group; a substituted or unsubstituted cycloalkyl group; a substituted or unsubstituted amine group; a substituted or unsubstituted aryl group; or a substituted or unsubstituted heterocyclic group, and n1 to n3 are each an integer of 0 to 3, and when n1 to n3 are each 2 or greater, substituents in the two or more parentheses are the same as or different from each other.

2. The compound of claim 1, wherein R1 and R2 are the same as or different from each other, and are each independently a substituted or unsubstituted alkyl group having 1 to 20 carbon atoms; or a substituted or unsubstituted aryl group having 6 to 30 carbon atoms.

3. The compound of claim 1, wherein Chemical Formula 1 is of the following Chemical Formula 3 or Chemical Formula 4:

[Chemical Formula 3]

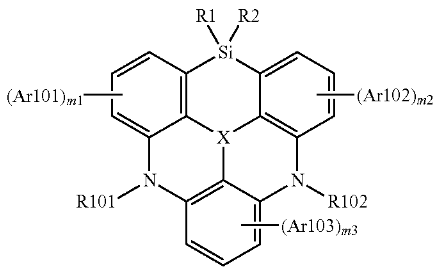

[Chemical Formula 4]

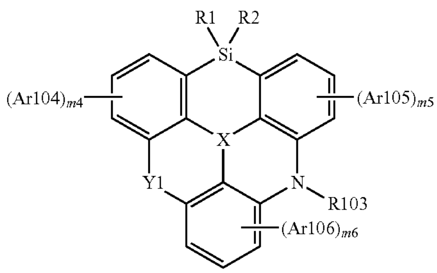

in Chemical Formulae 3 and 4,

R1, R2 and X have the same definitions as in Chemical Formula 1;

Y1 is O or S;

R101 to R103 are the same as or different from each other, and are each independently hydrogen; deuterium; a halogen group; a cyano group; a substituted or unsubstituted alkyl group; a substituted or unsubstituted cycloalkyl group; a substituted or unsubstituted aryl group; or a substituted or unsubstituted heterocyclic group;

Ar101 to Ar106 are the same as or different from each other, and are each independently hydrogen; deuterium; a halogen group; a cyano group; a substituted or unsubstituted silyl group; a substituted or unsubstituted boron group; a substituted or unsubstituted alkyl group; a substituted or unsubstituted cycloalkyl group; a substituted or unsubstituted amine group; a substituted or unsubstituted aryl group; or a substituted or unsubstituted heterocyclic group; and m1 to m6 are each an integer of 0 to 3, and when m1 to m6 are each 2 or greater, substituents in the two or more parentheses are the same as or different from each other.

4. The compound of claim 1, wherein the compound of Chemical Formula 1 is any one of the following compounds:

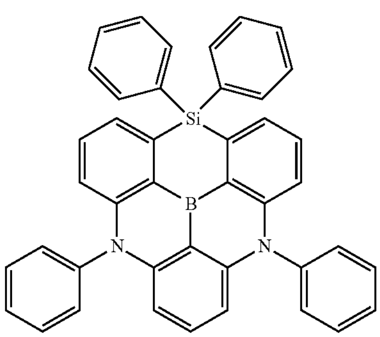

-continued

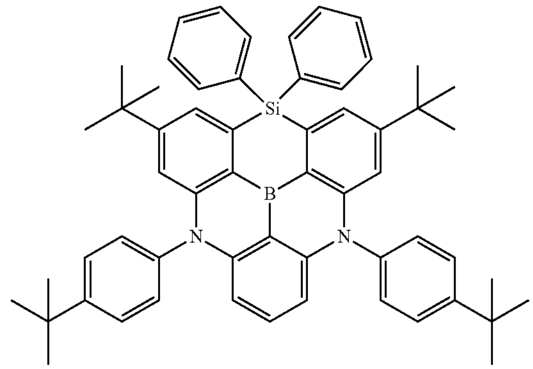

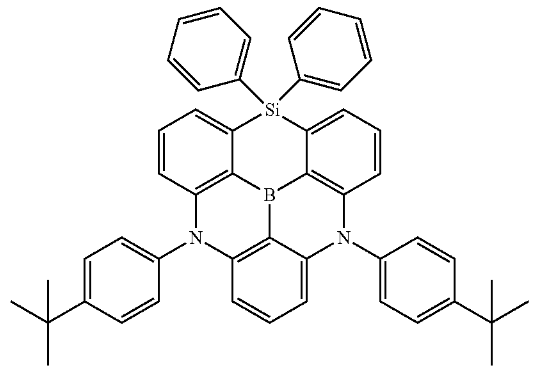

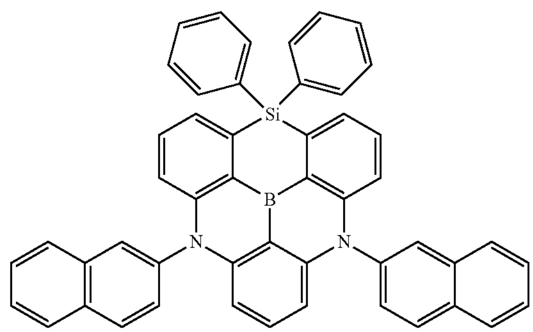

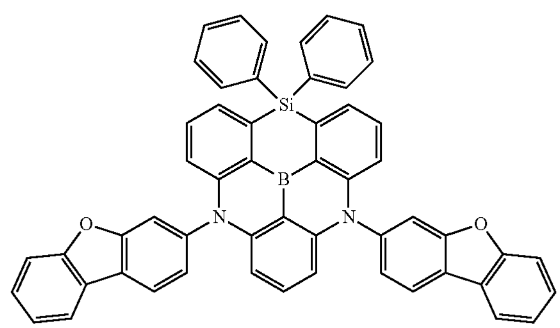

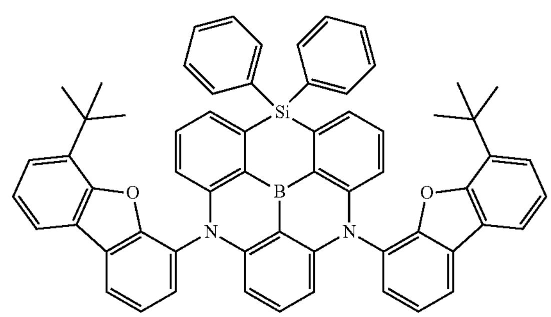

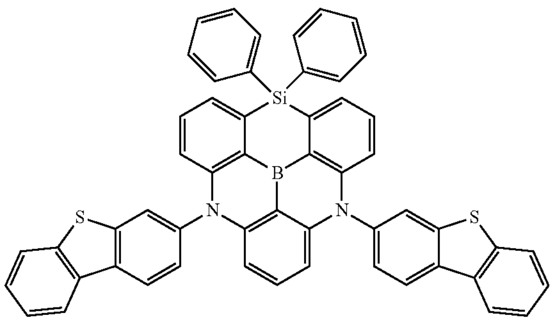
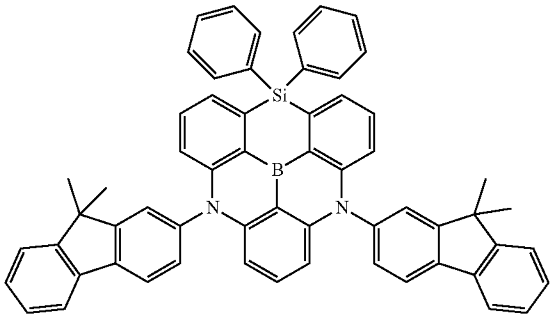
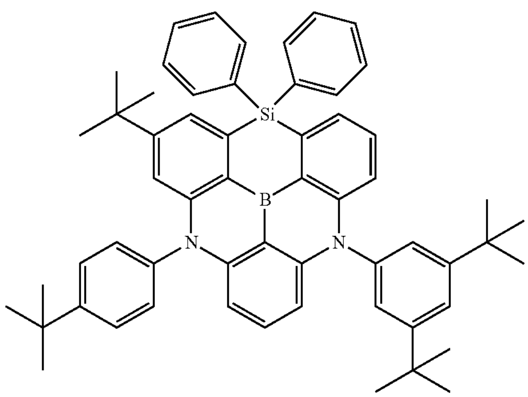
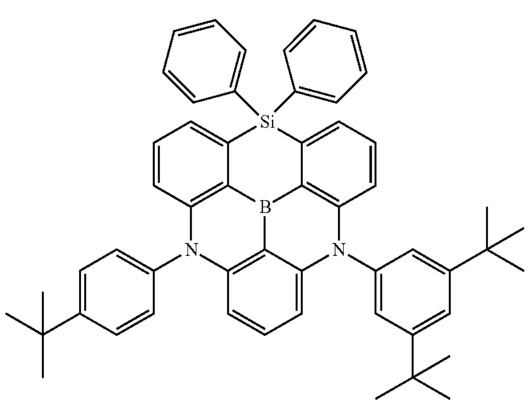
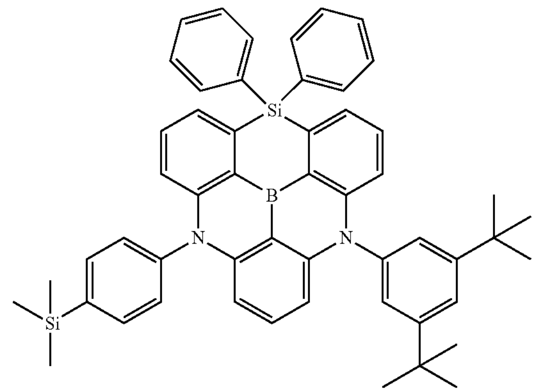
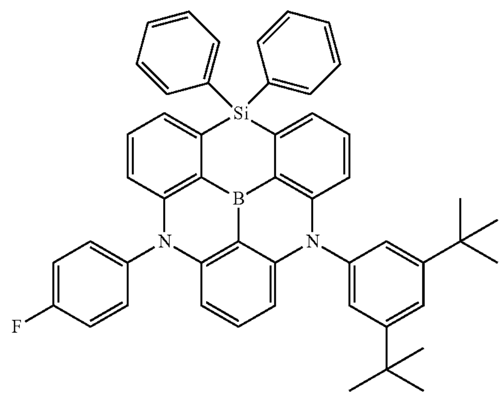
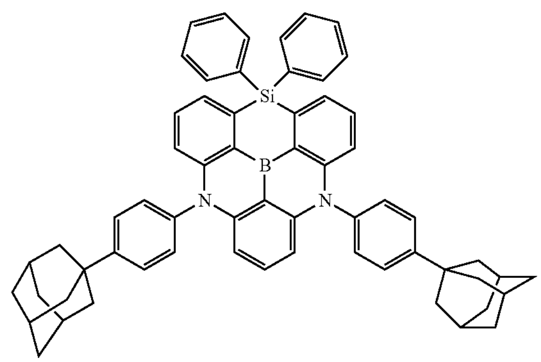
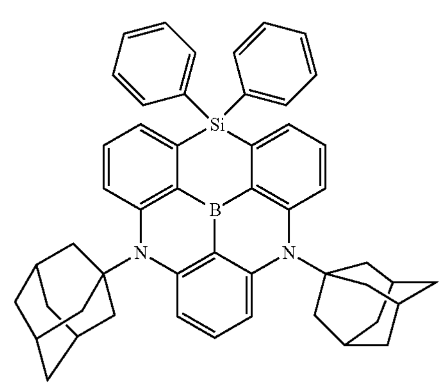

-continued
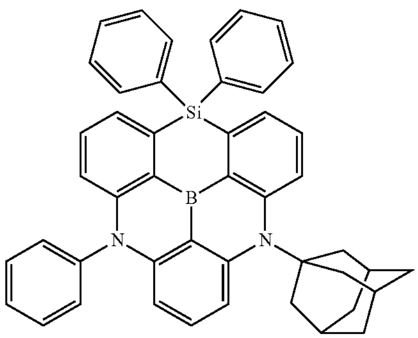
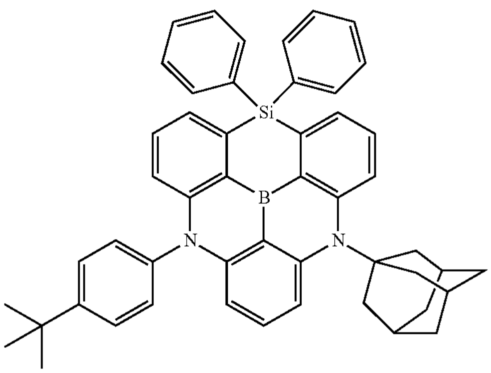
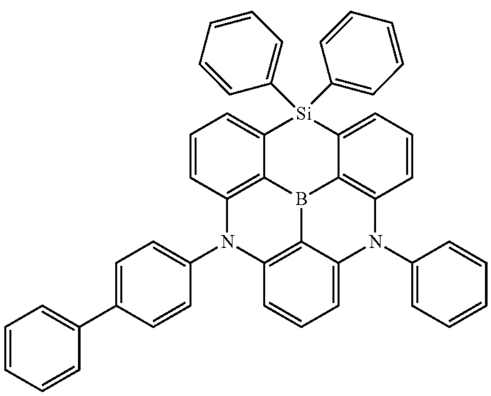
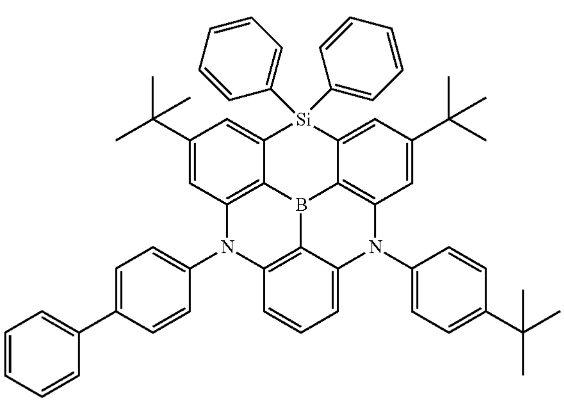
-continued
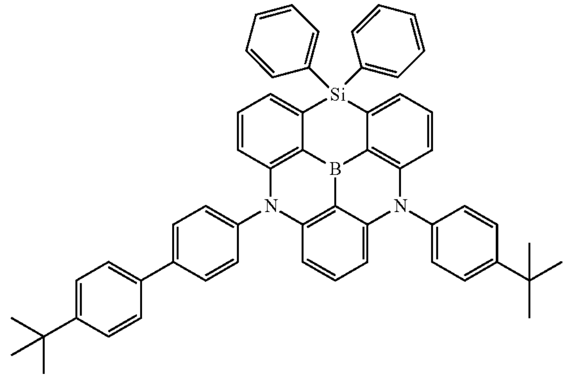
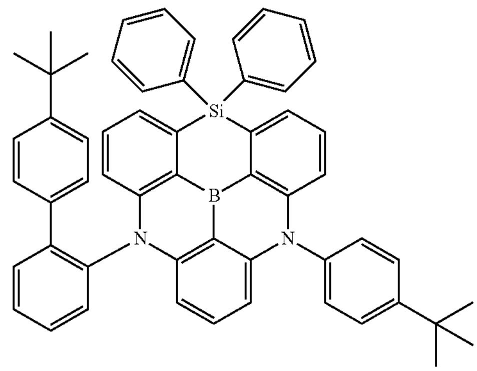
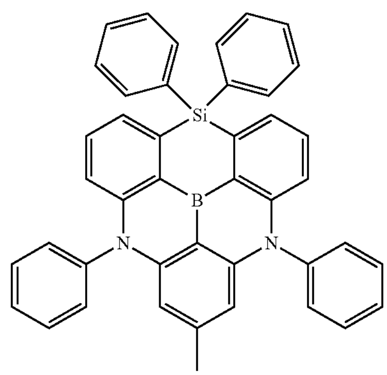
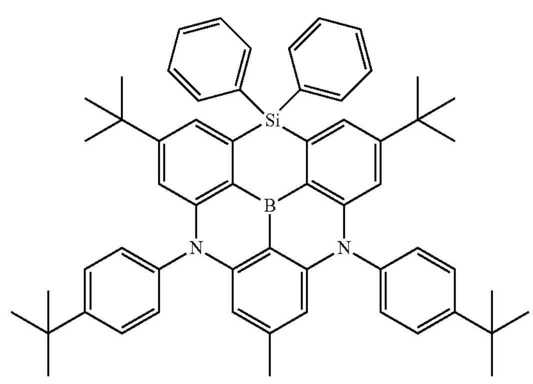

-continued
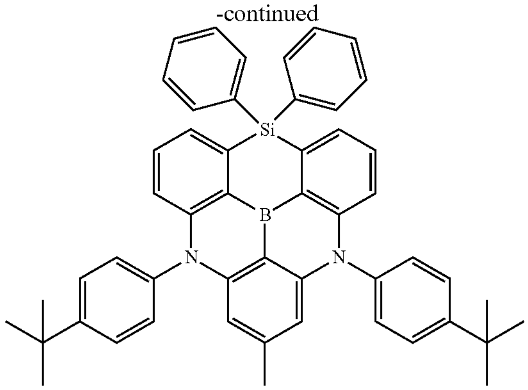
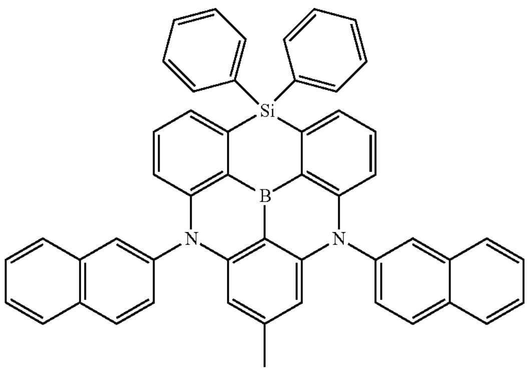
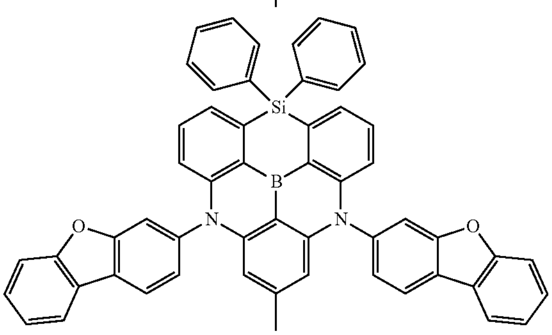
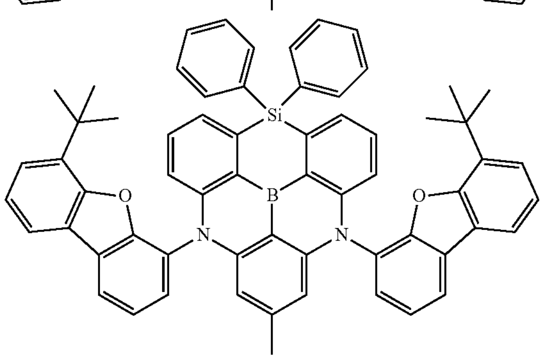
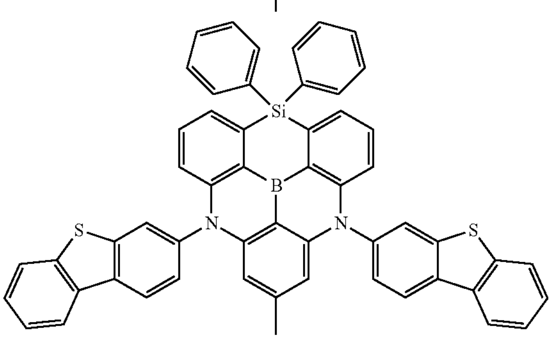
-continued
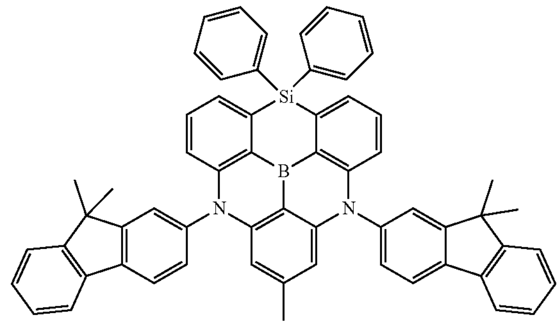
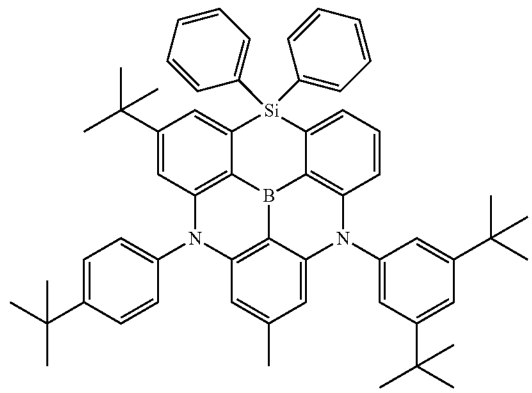
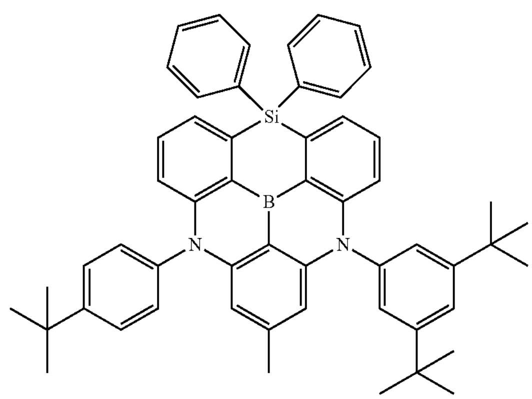
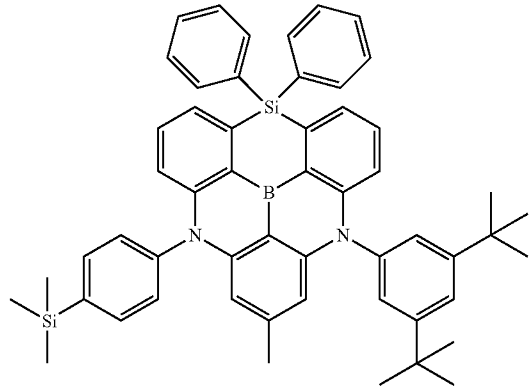

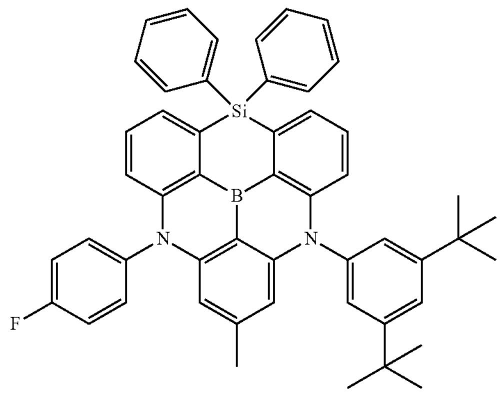
Si
B
N
N
F
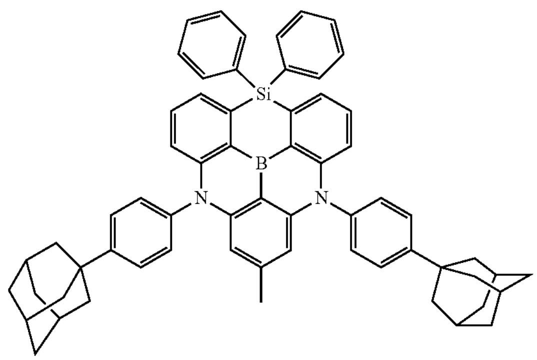
Si
B
N
N
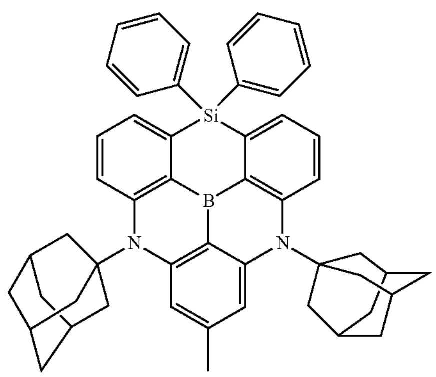
Si
B
N
N
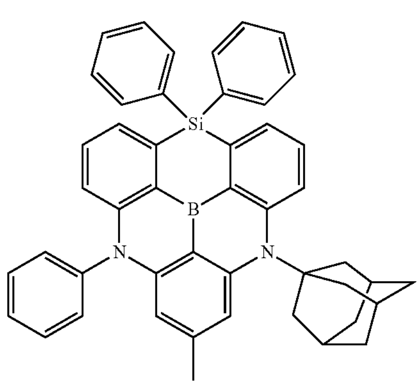
Si
B
N
N
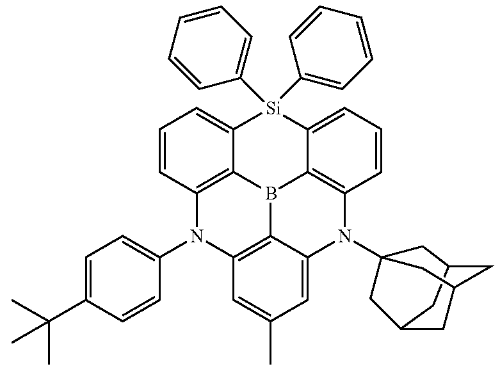
Si
B
N
N
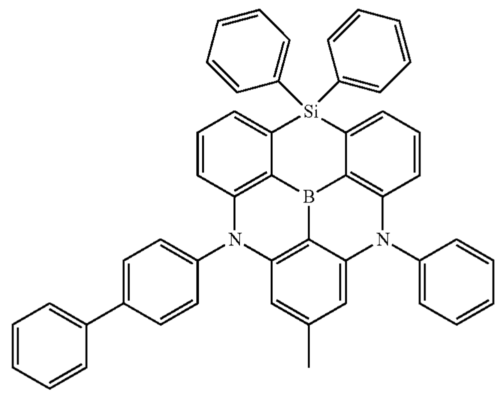
Si
B
N
N
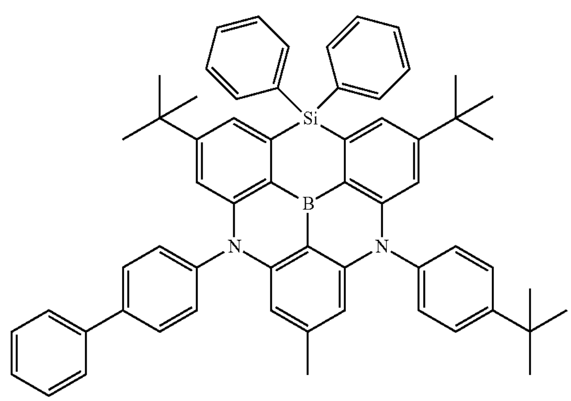
Si
B
N
N
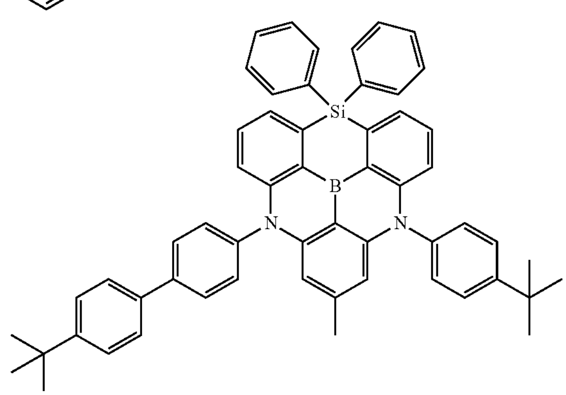
Si
B
N
N

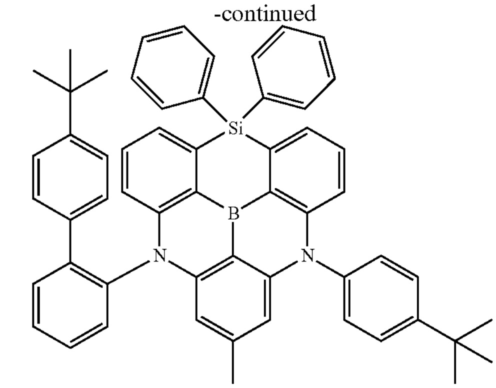
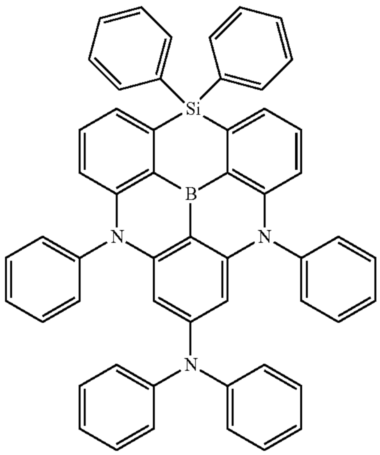
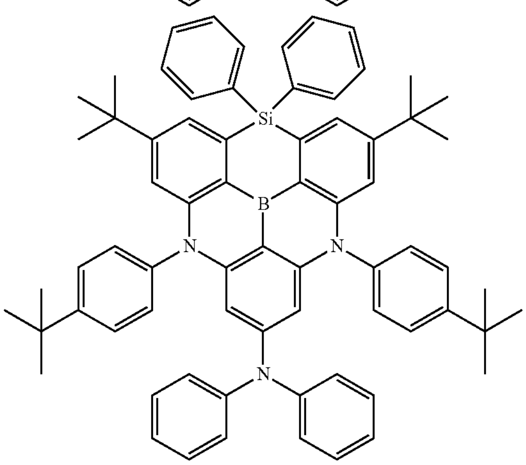
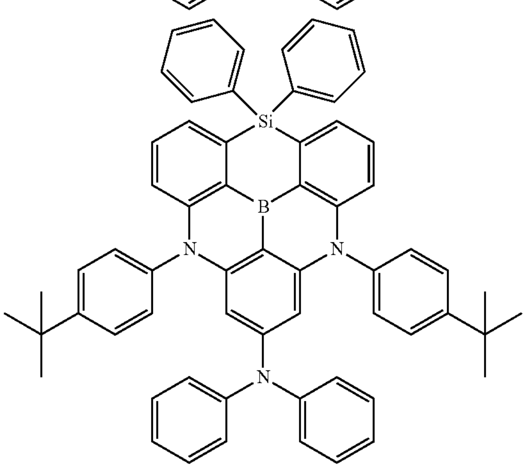
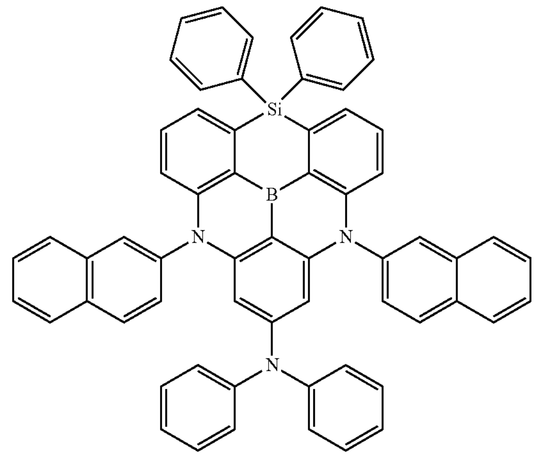
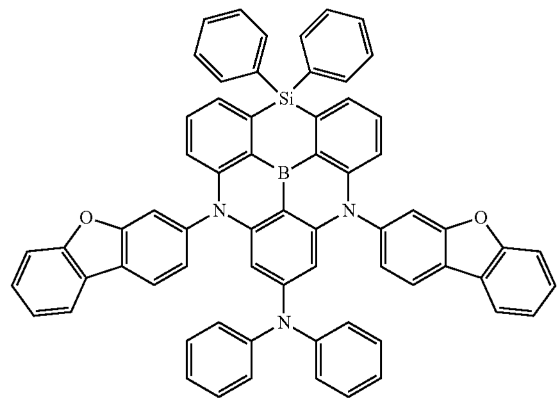
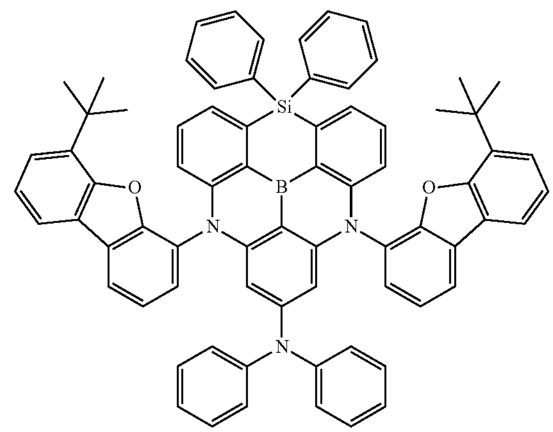
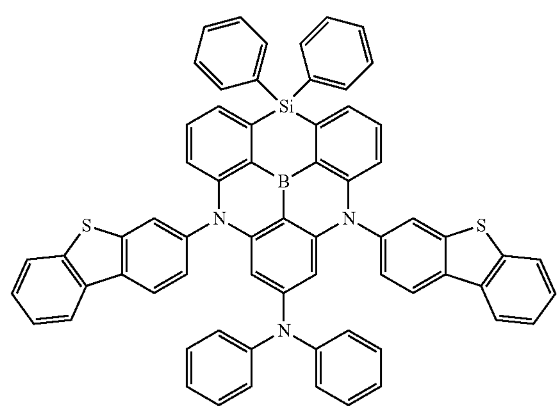

-continued
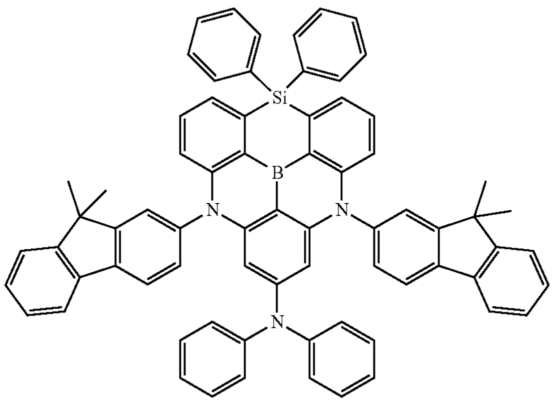
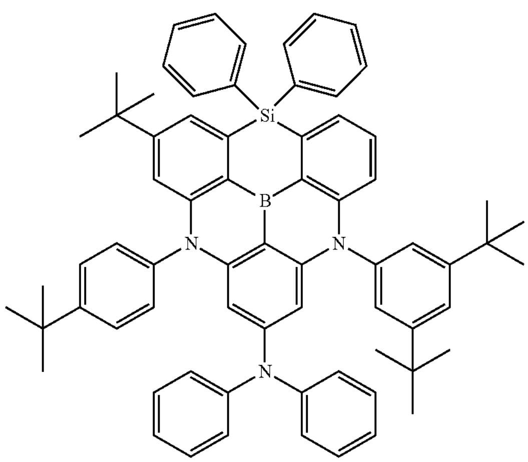
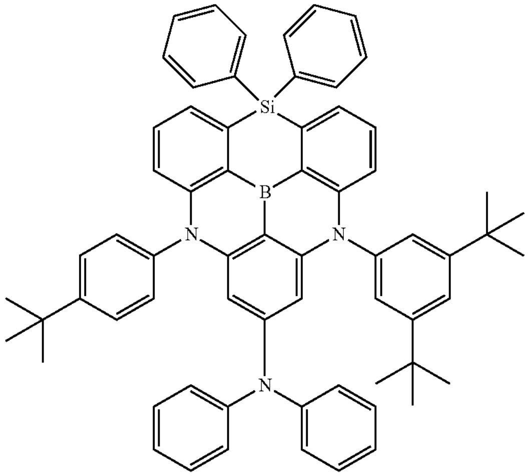
-continued
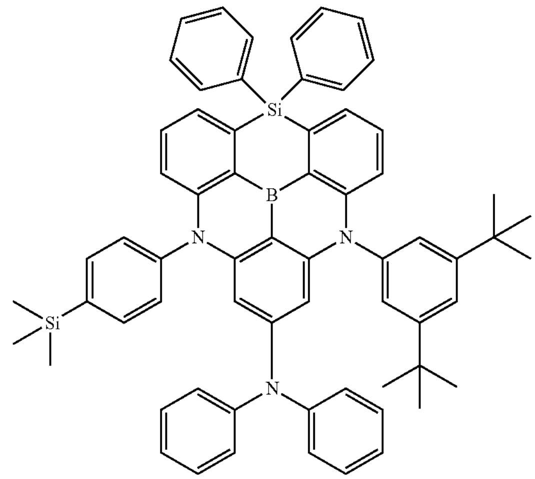
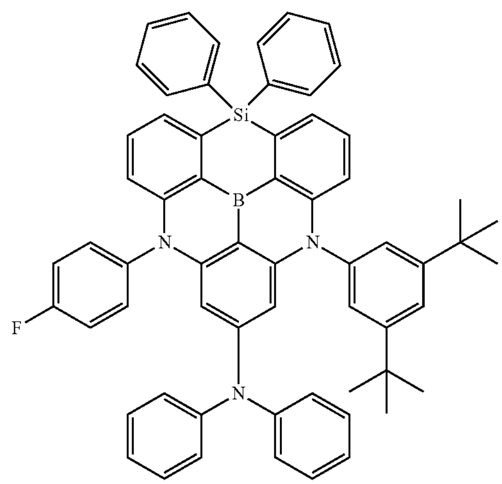
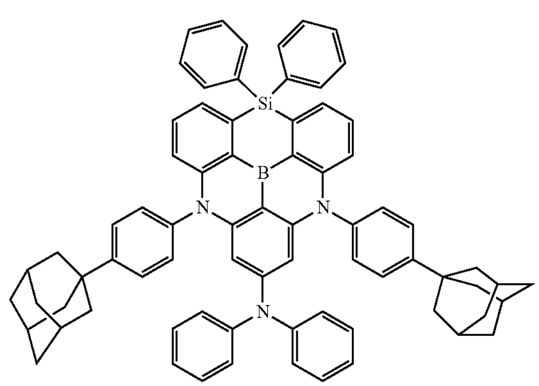

-continued
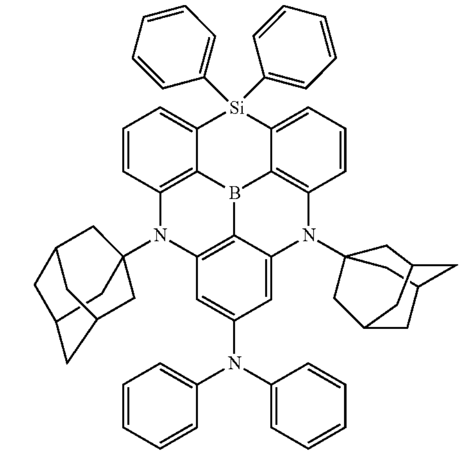
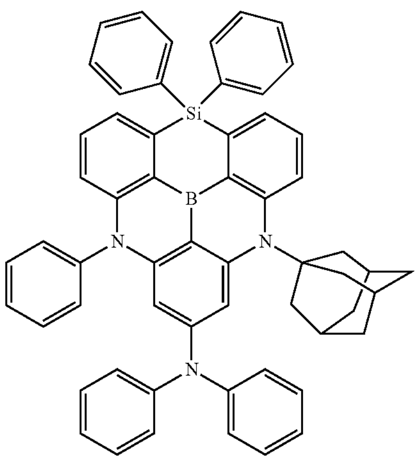
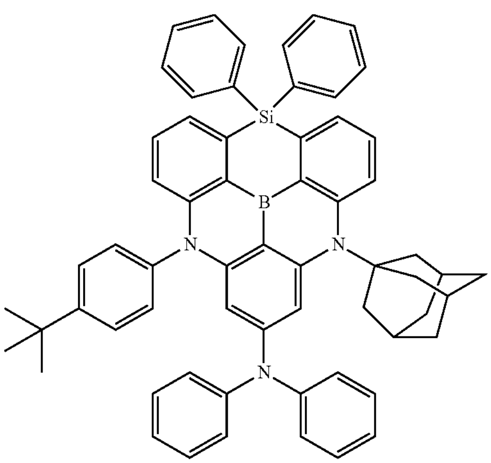
-continued
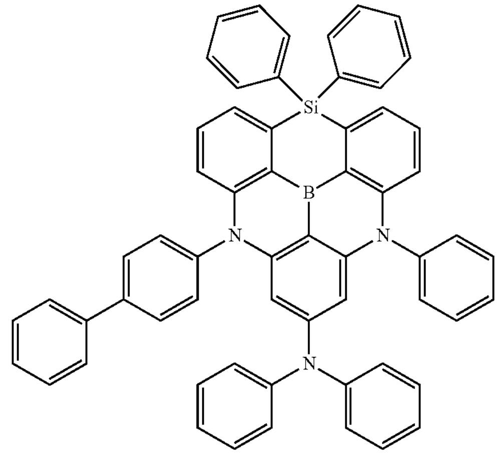
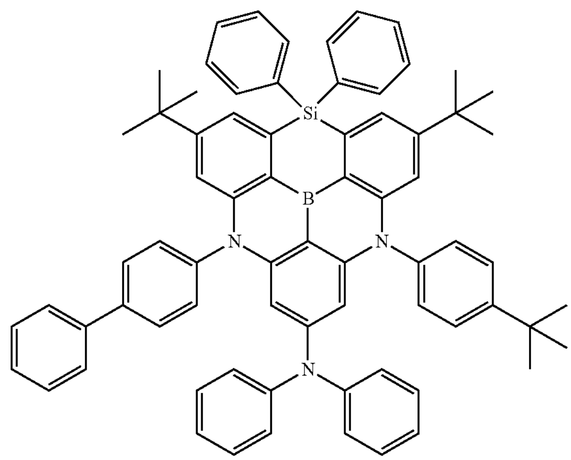
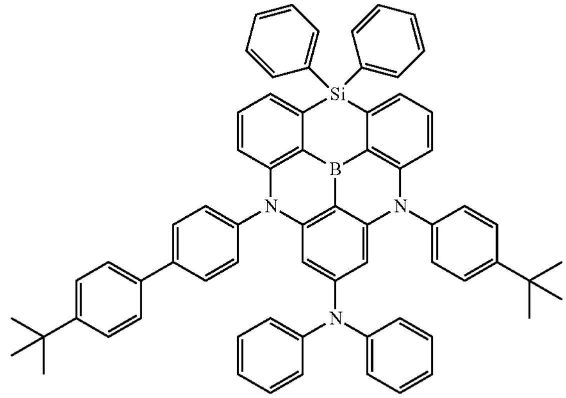

-continued
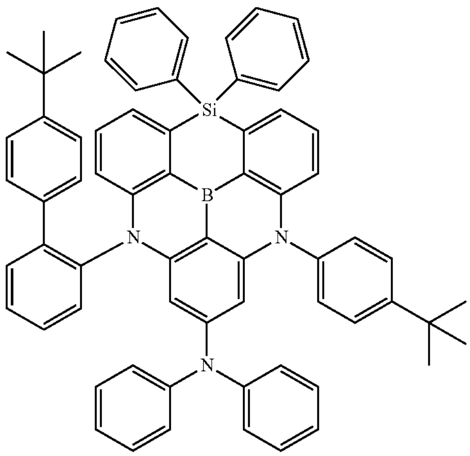
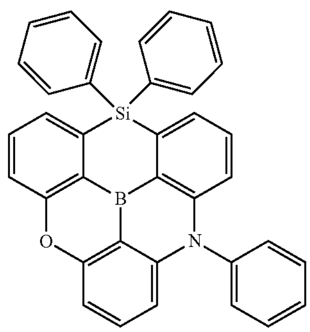
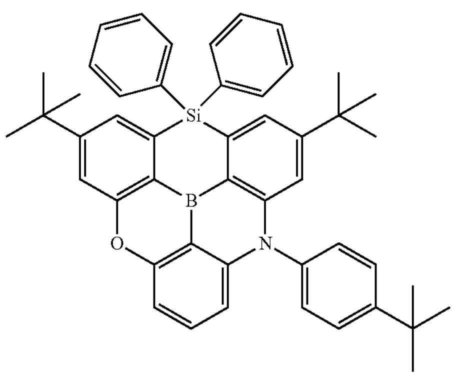
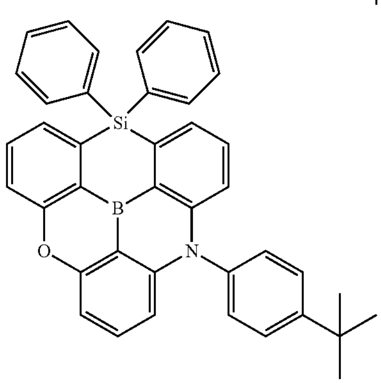
-continued
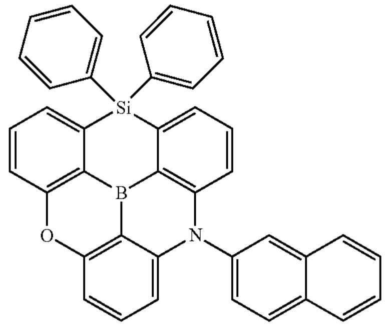
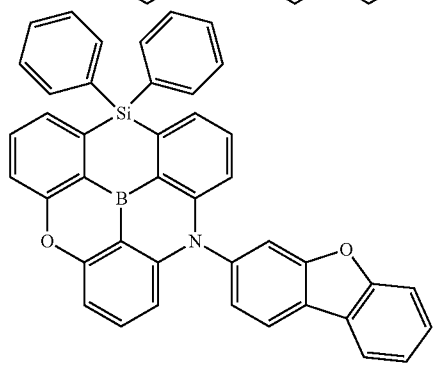
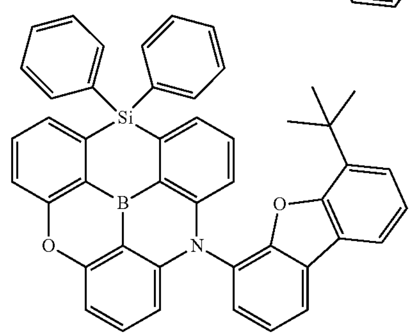
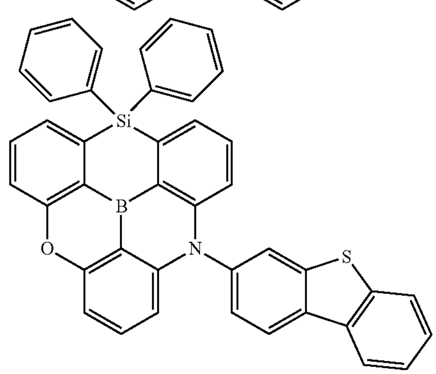
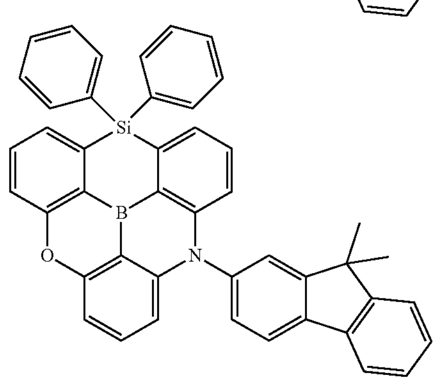

-continued
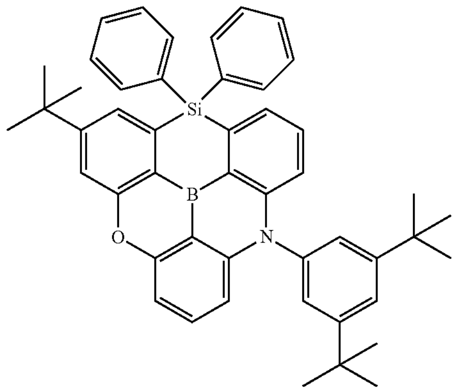
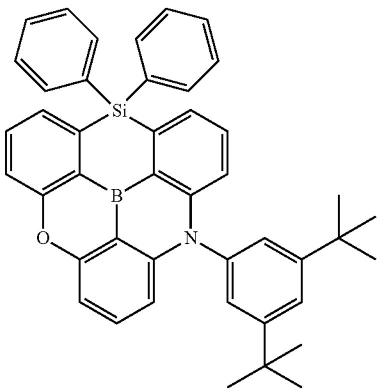
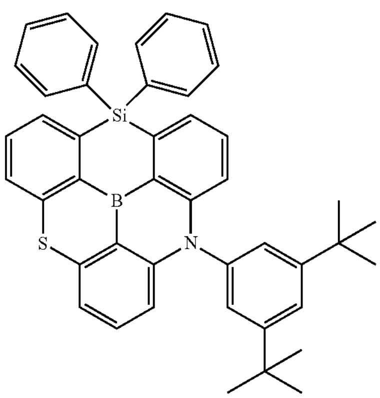
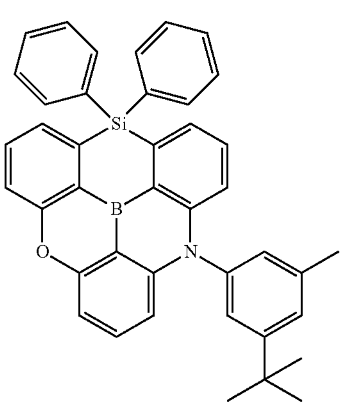
-continued
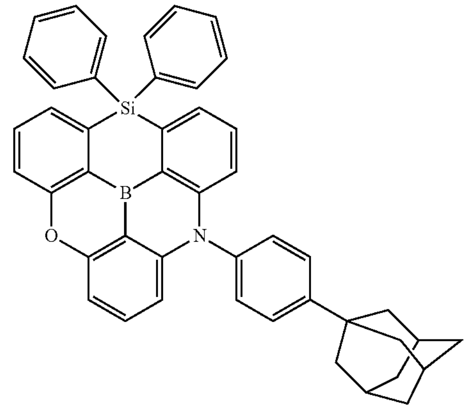
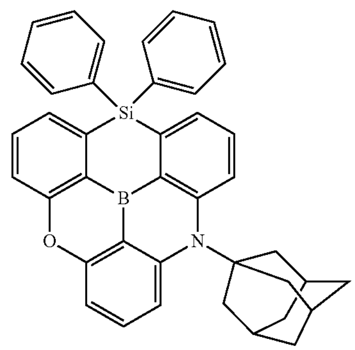
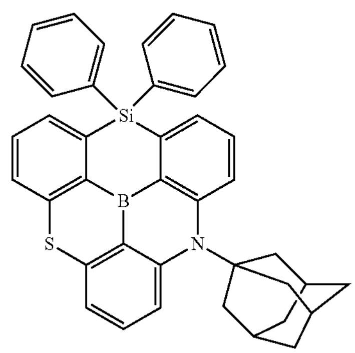
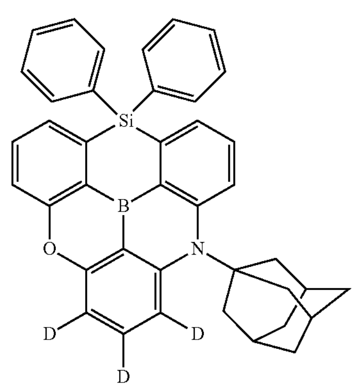

-continued
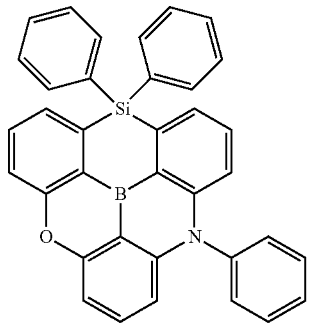
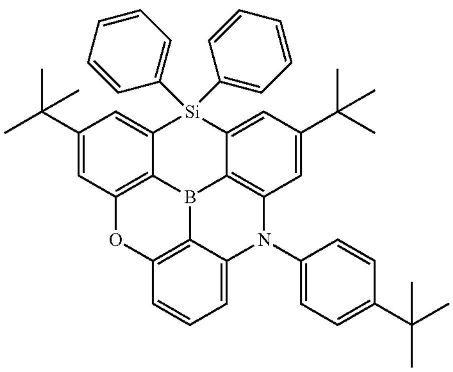
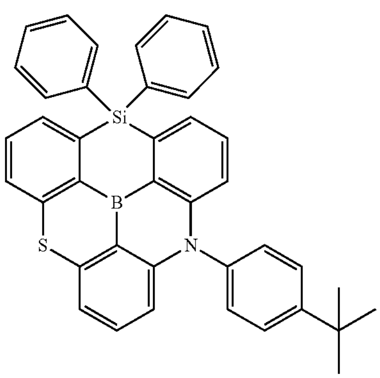
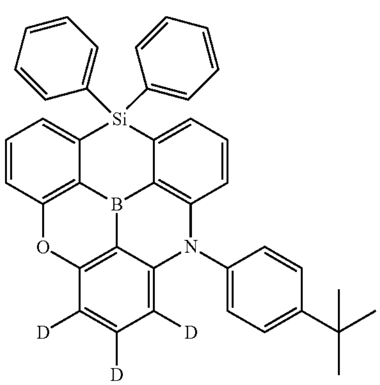
-continued
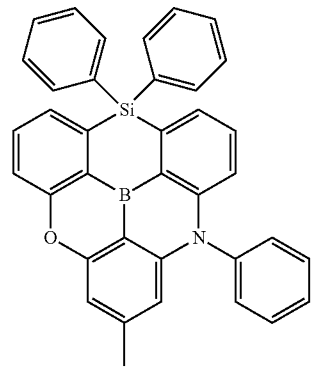
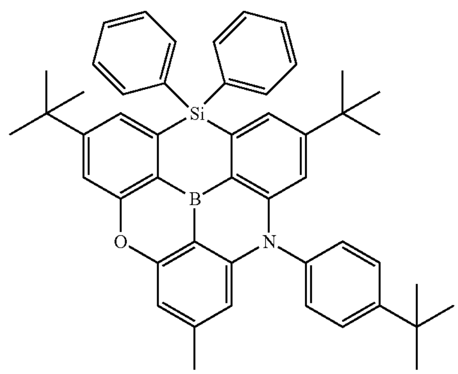
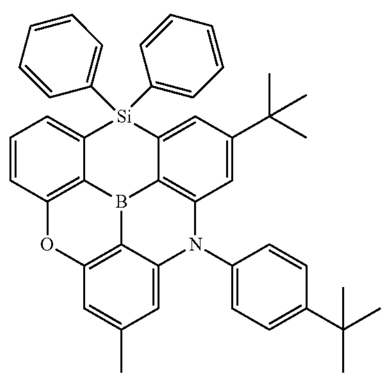
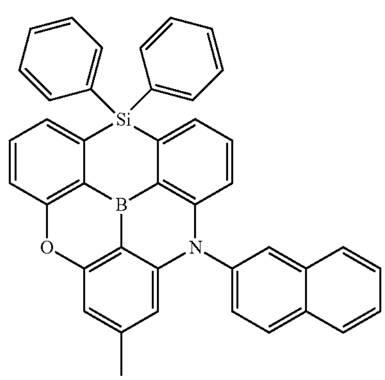

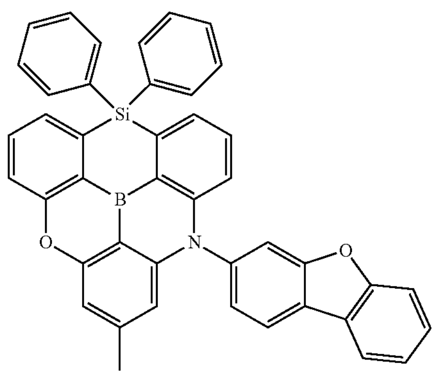
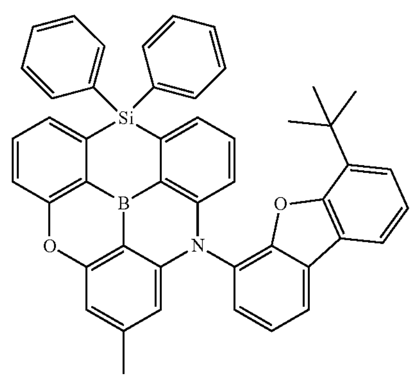
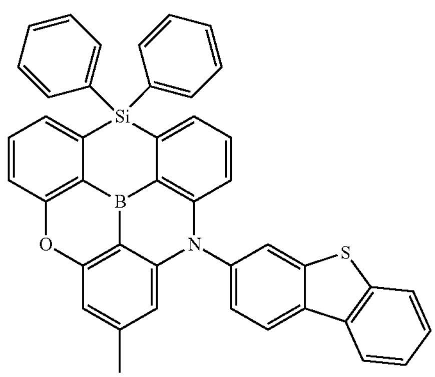
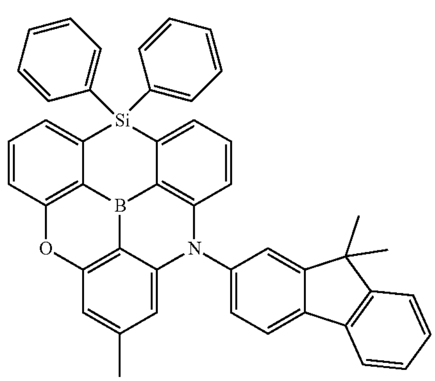
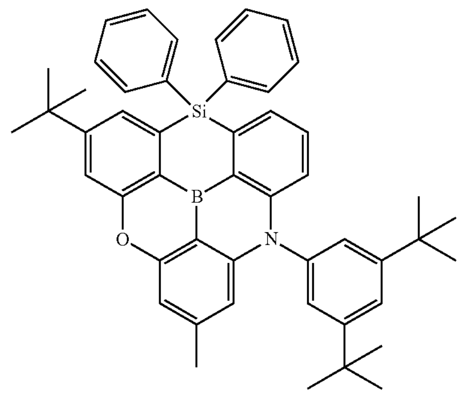
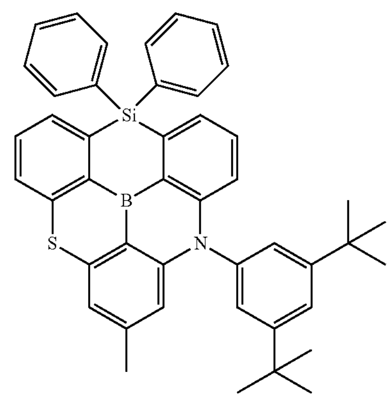
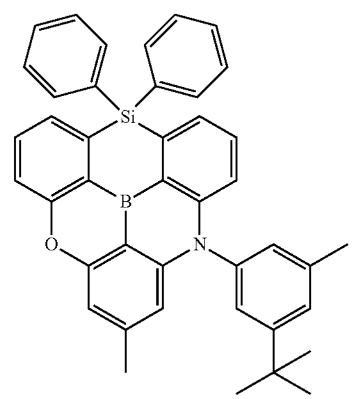
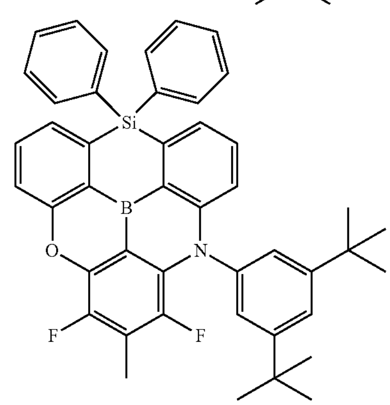

-continued
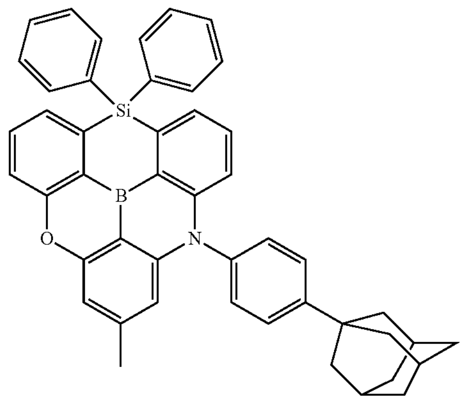
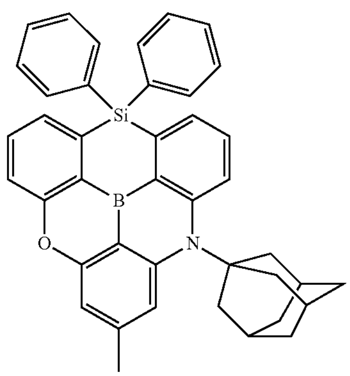
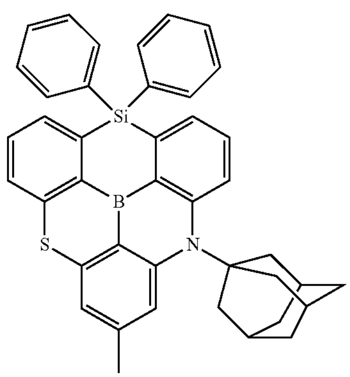
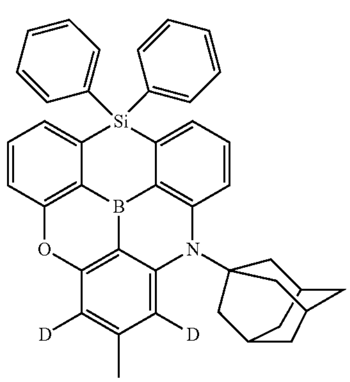
-continued
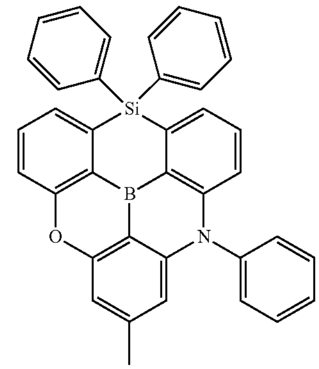
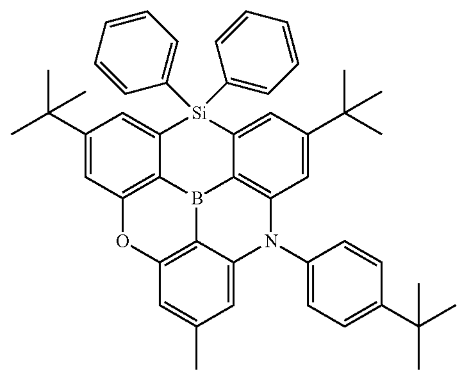
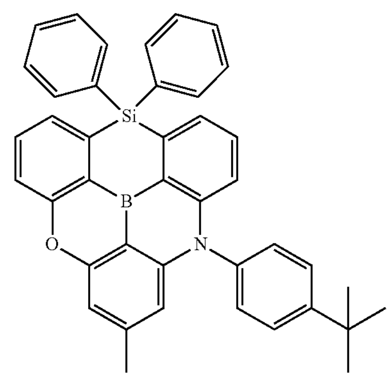
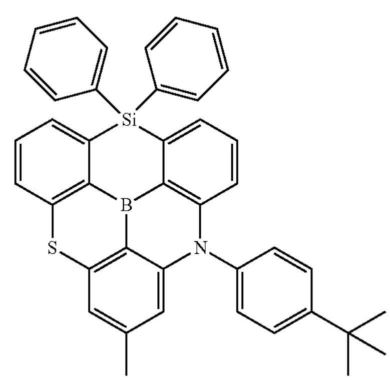

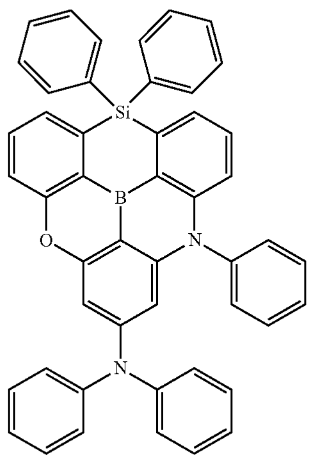
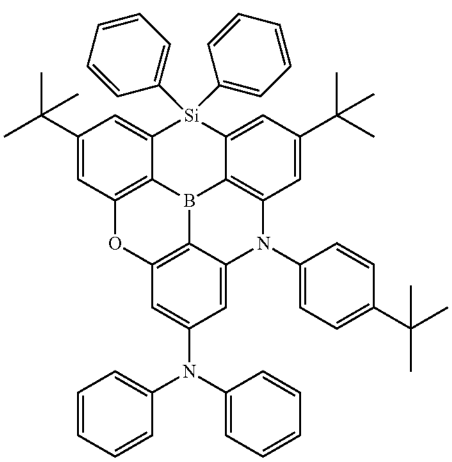
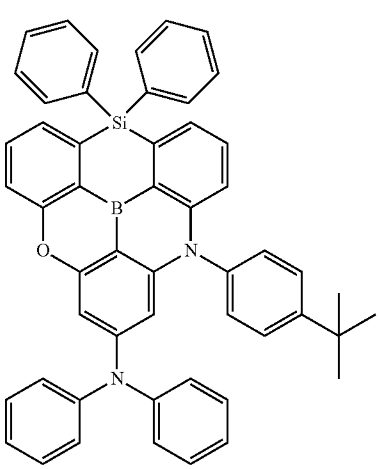
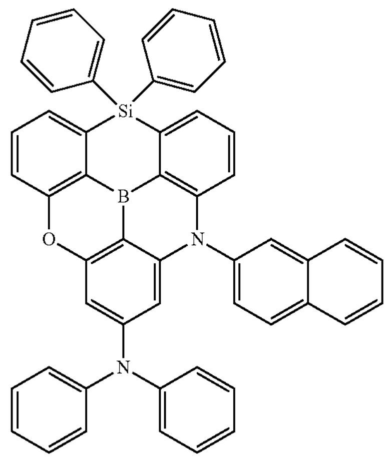
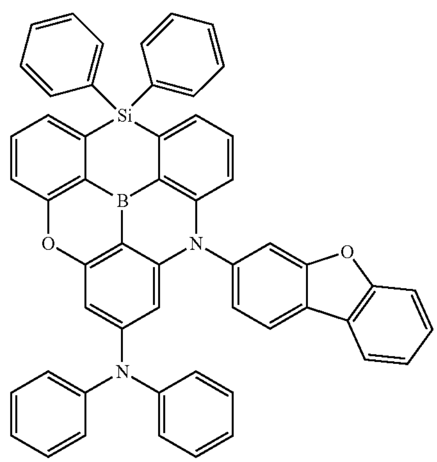
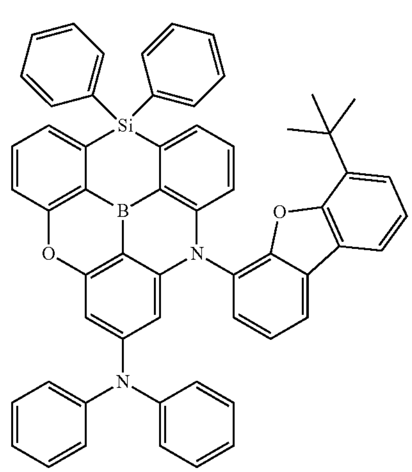

-continued
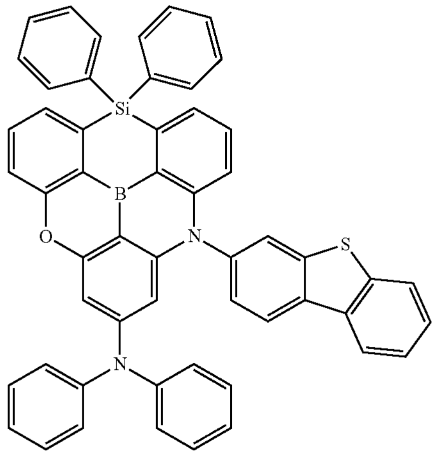
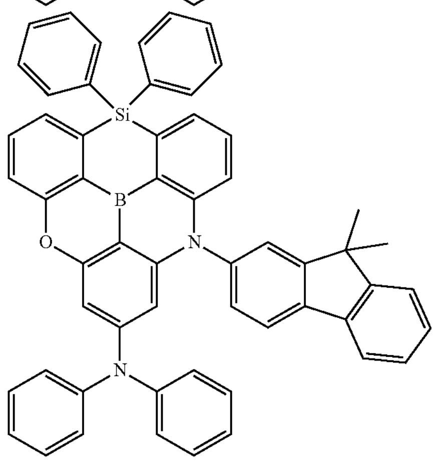
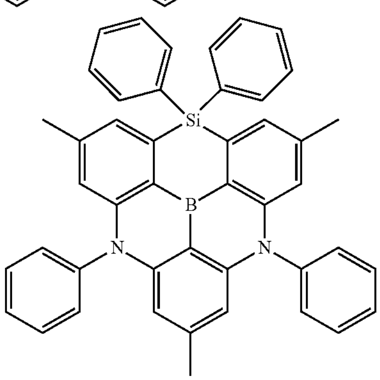
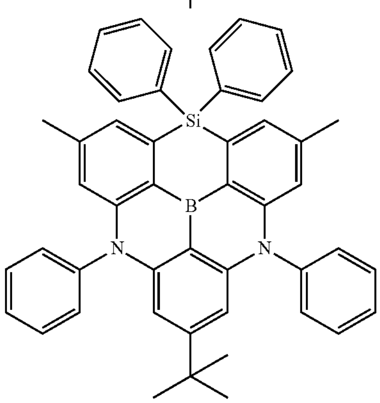
-continued
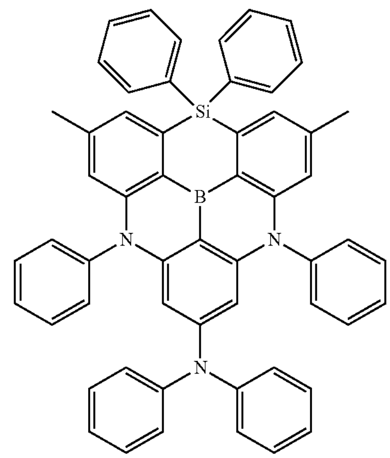
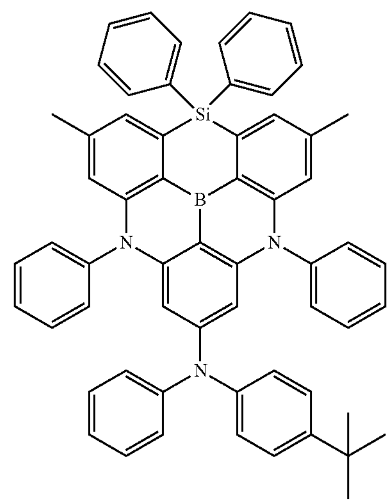
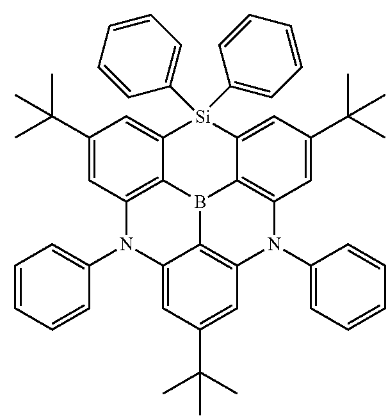

-continued
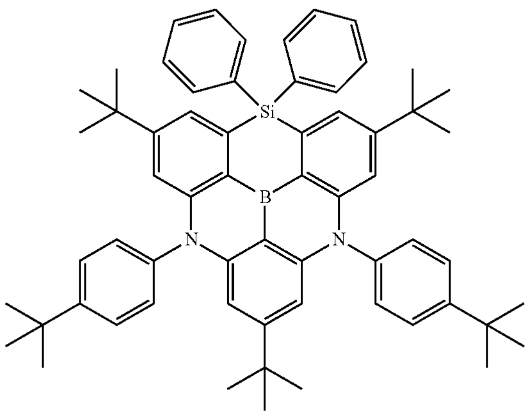
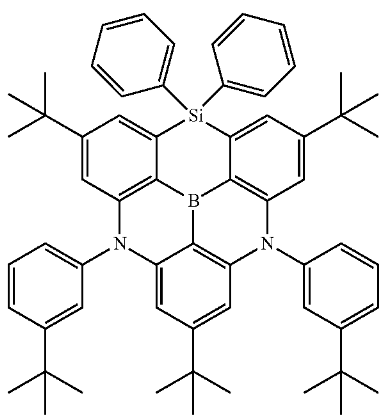
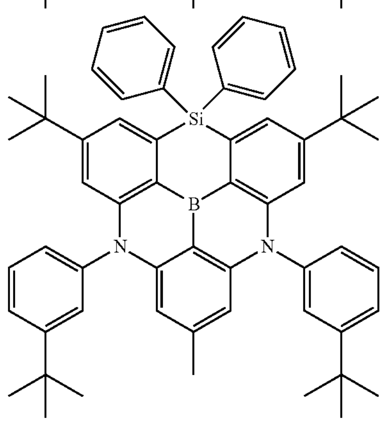
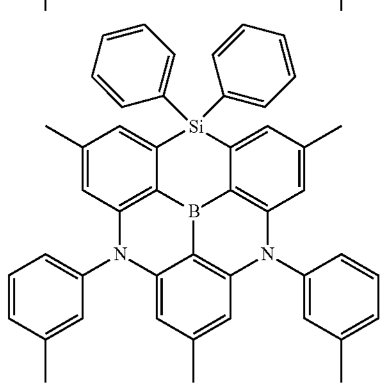
-continued
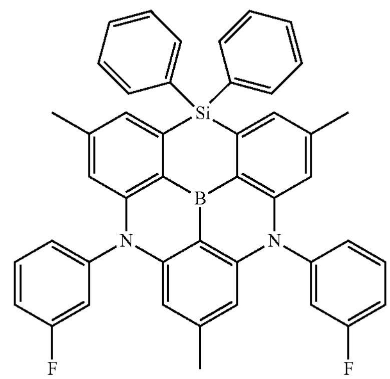
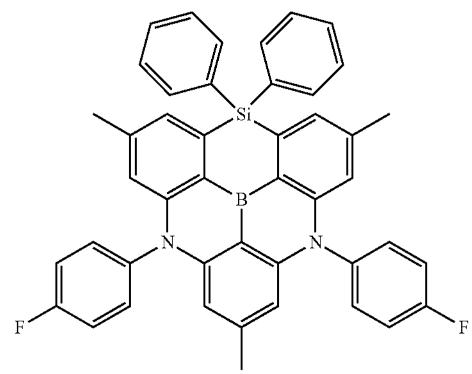
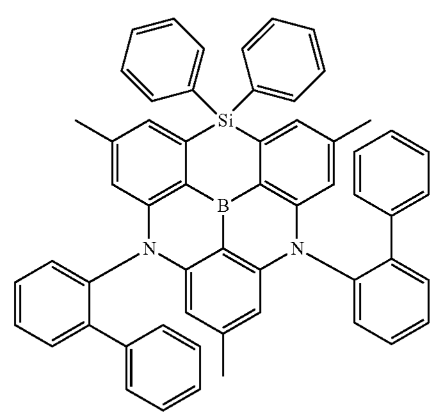
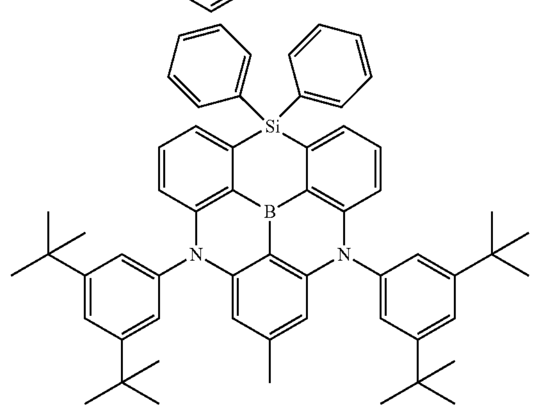

-continued
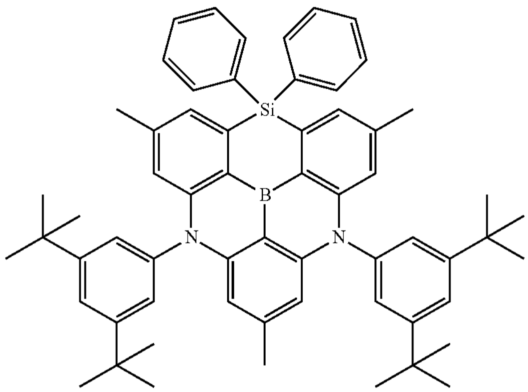
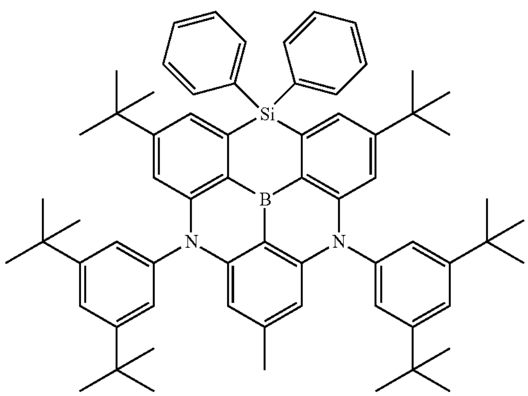
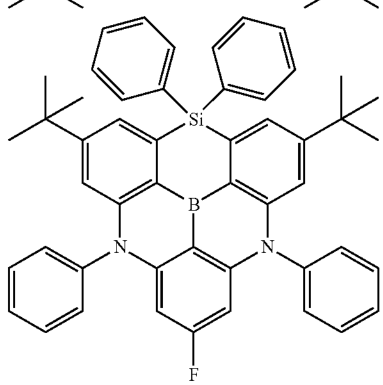
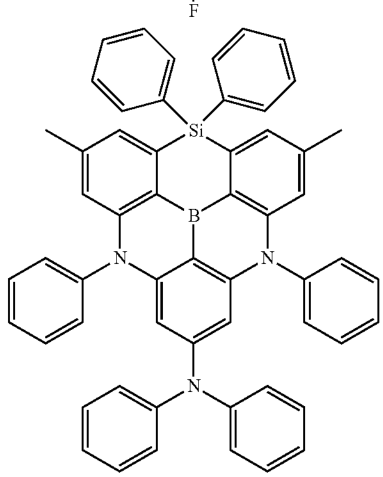
-continued
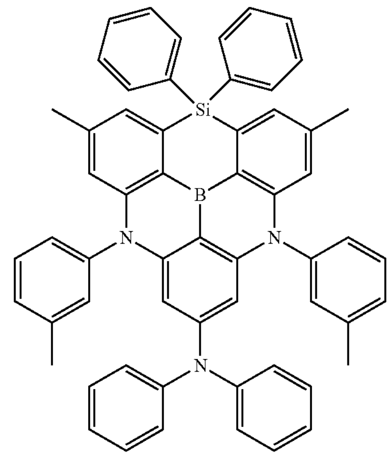
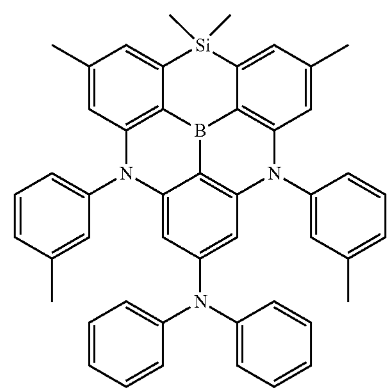
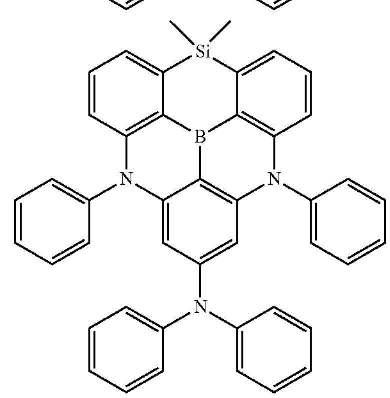
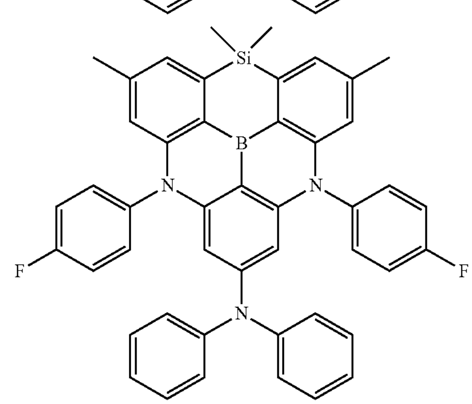

-continued
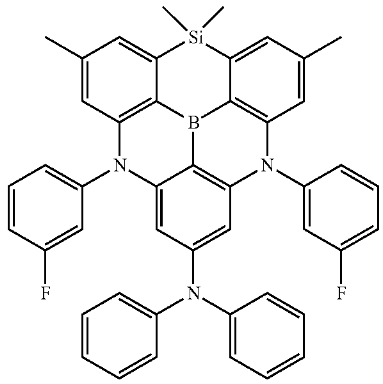
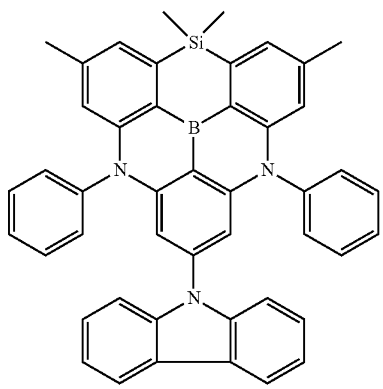
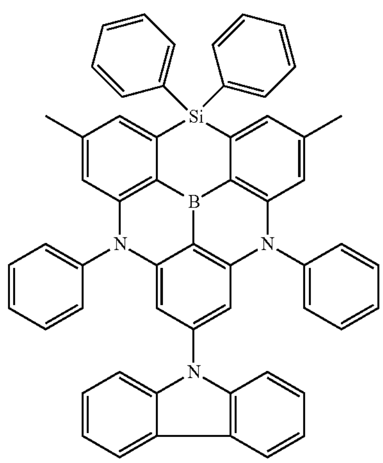
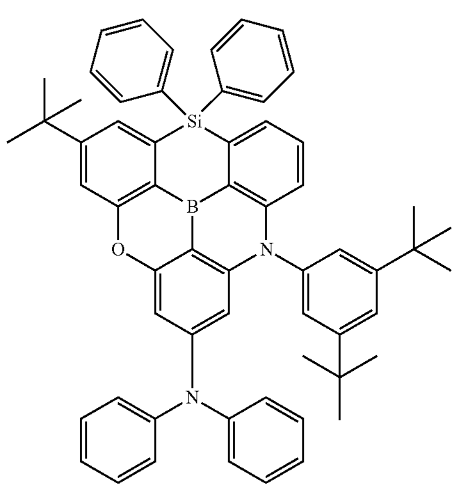
-continued
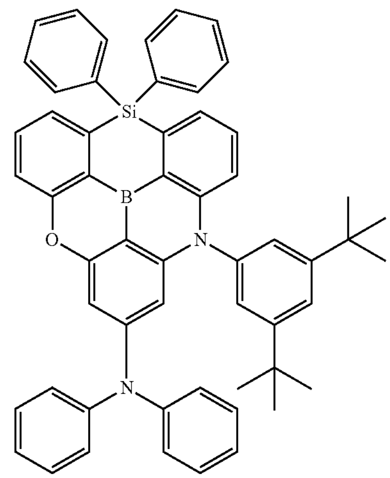
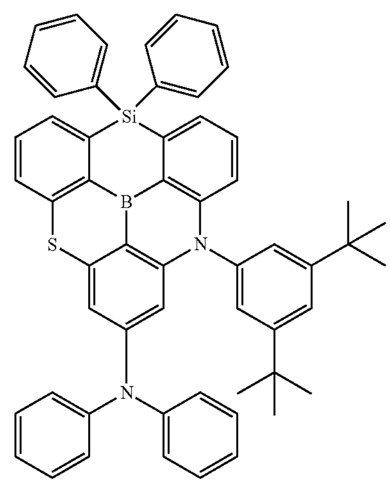
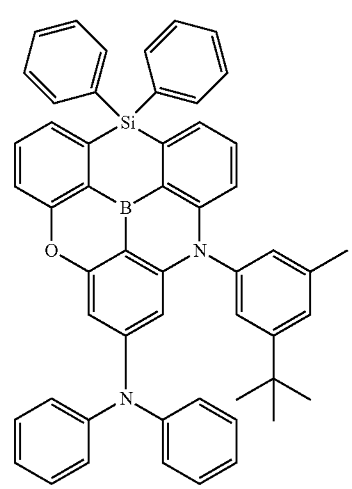

-continued
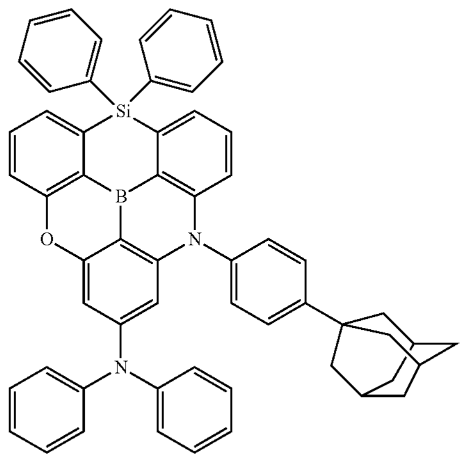
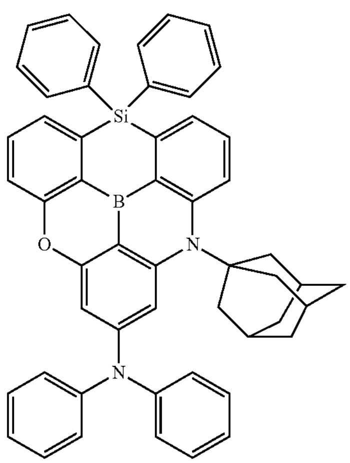
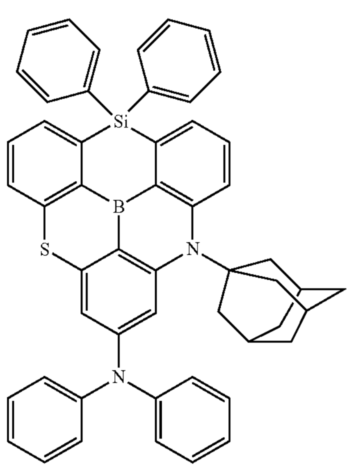
-continued
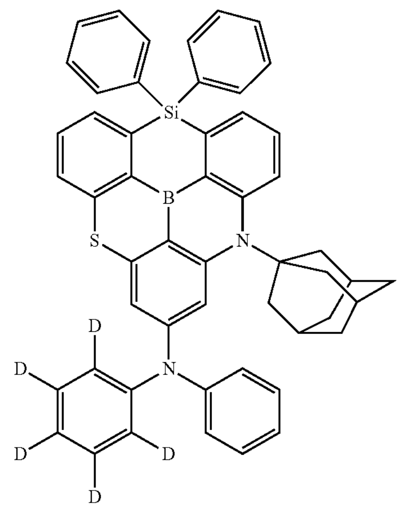
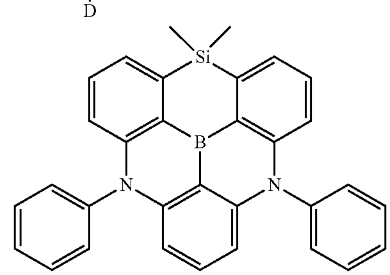
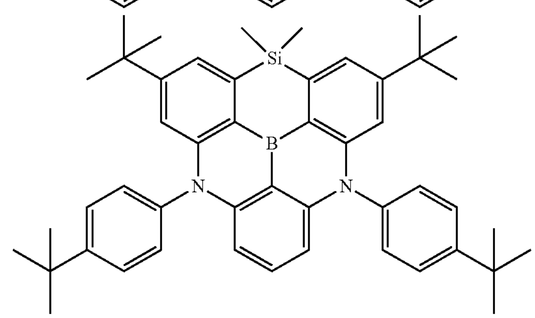
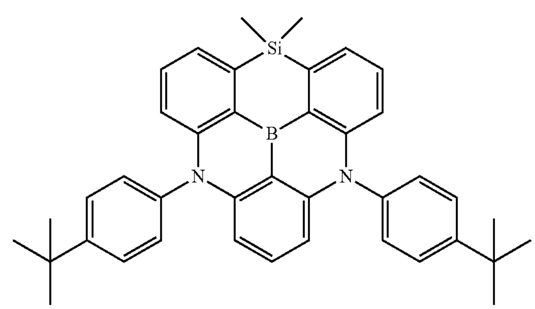
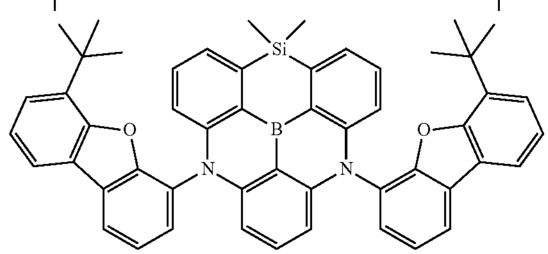

-continued
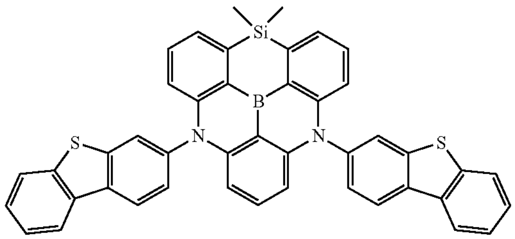
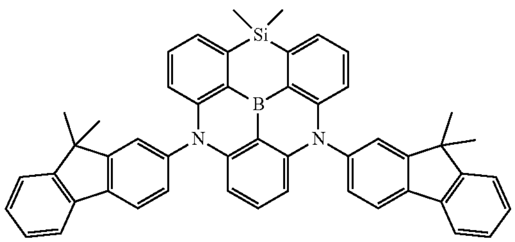
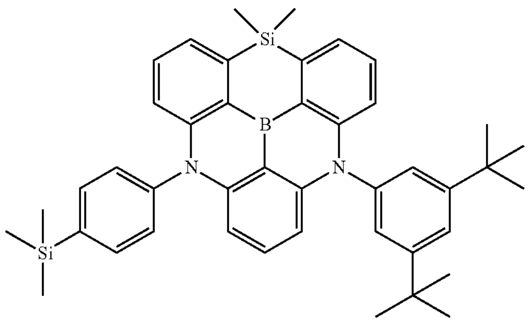
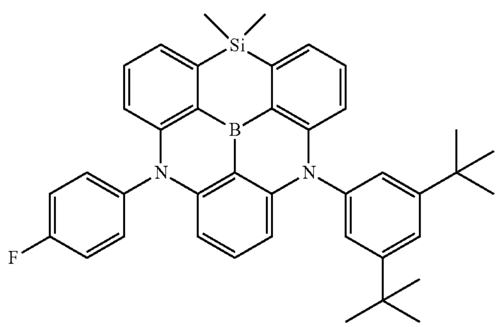
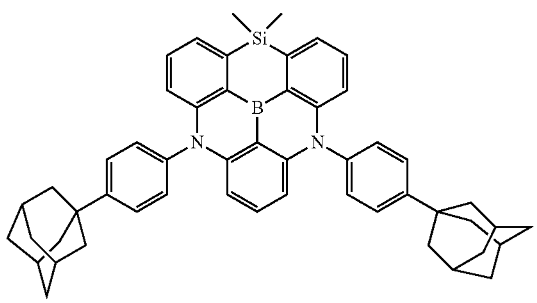
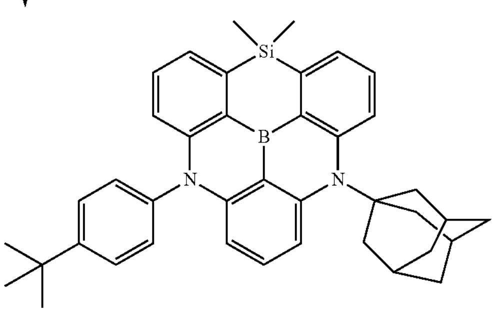
-continued
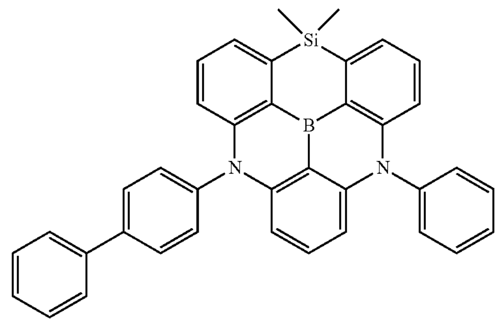
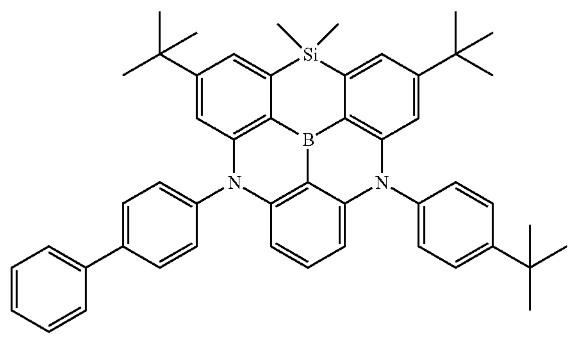
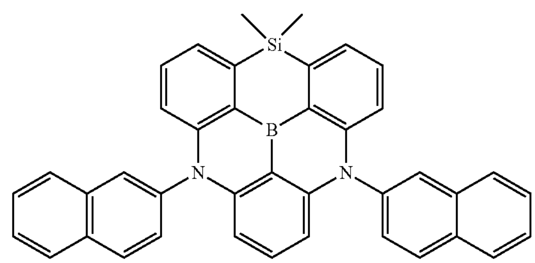
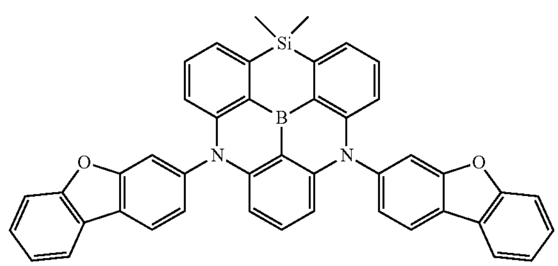
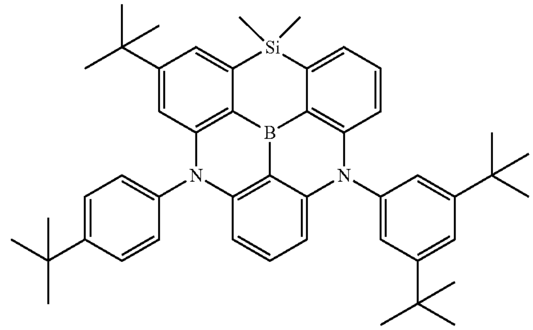

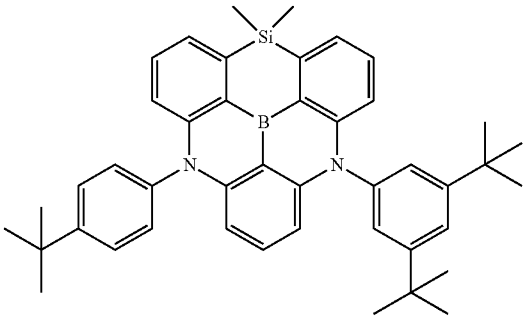
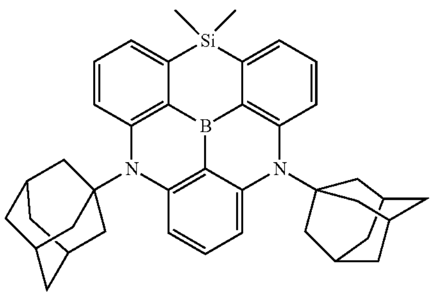
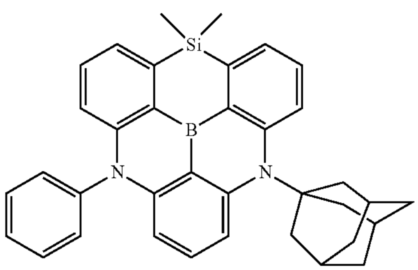
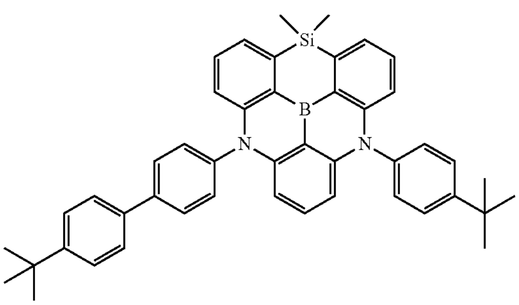
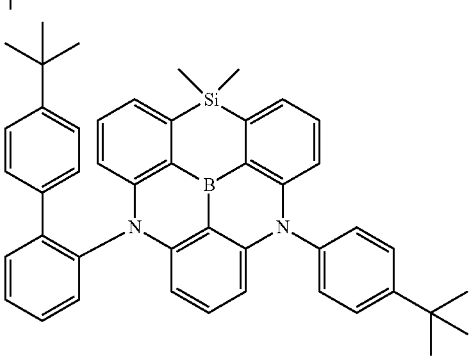
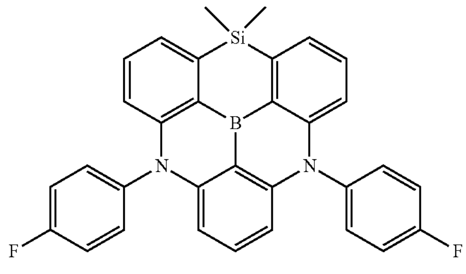
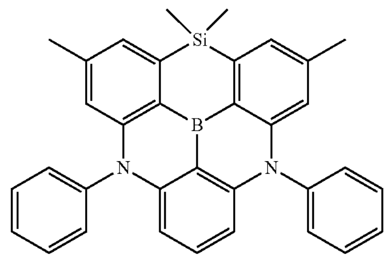
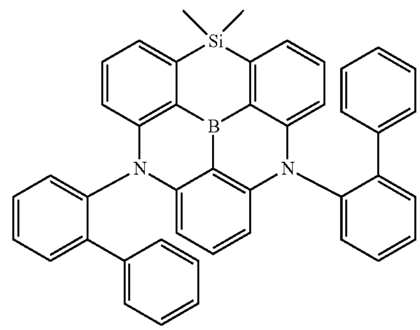
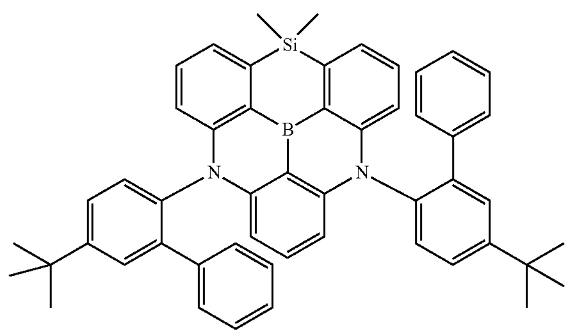
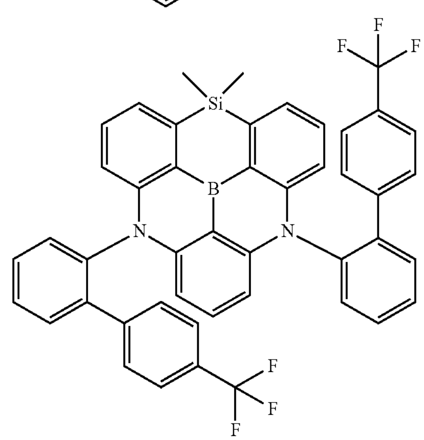

-continued
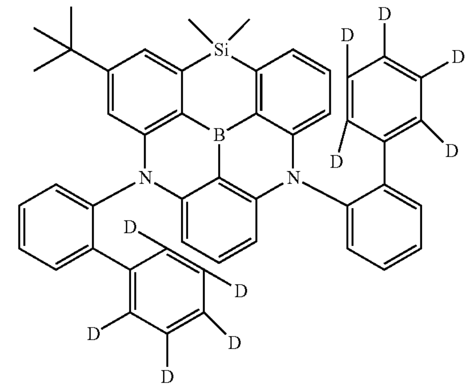
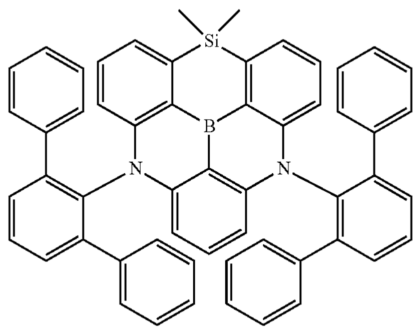
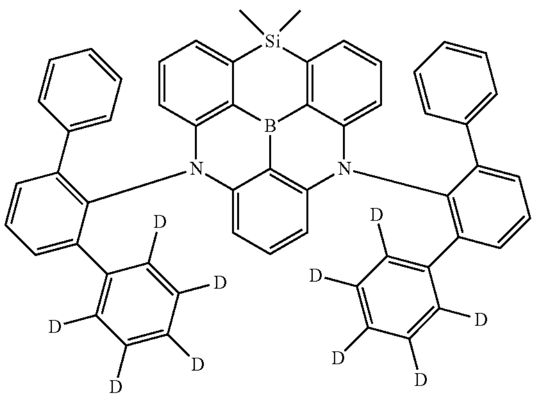
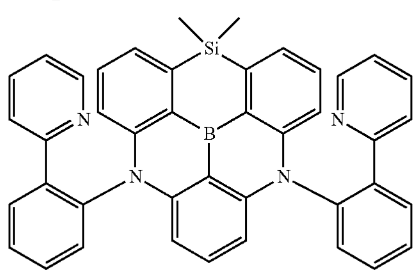
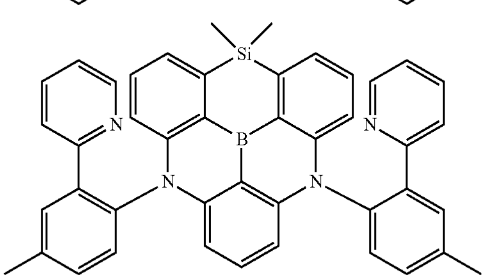
-continued
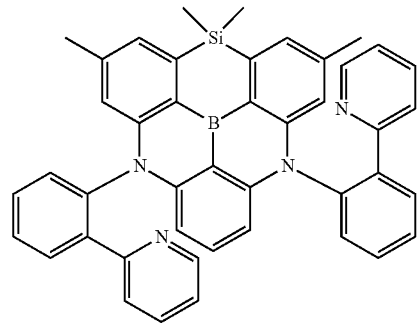
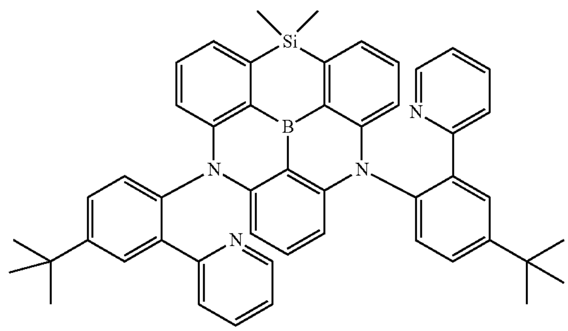
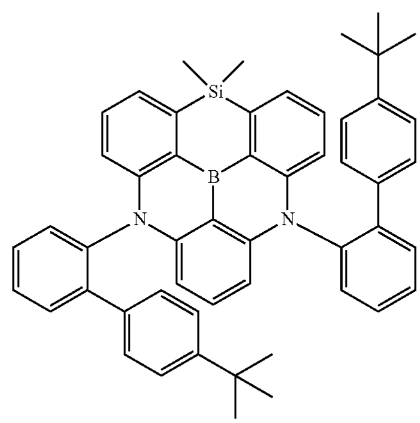
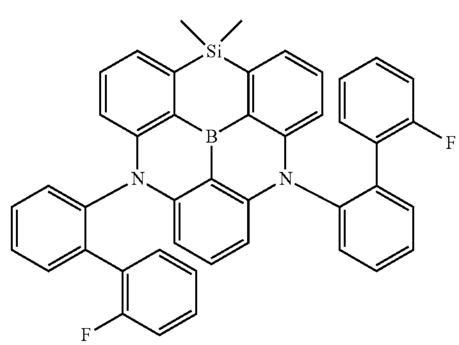

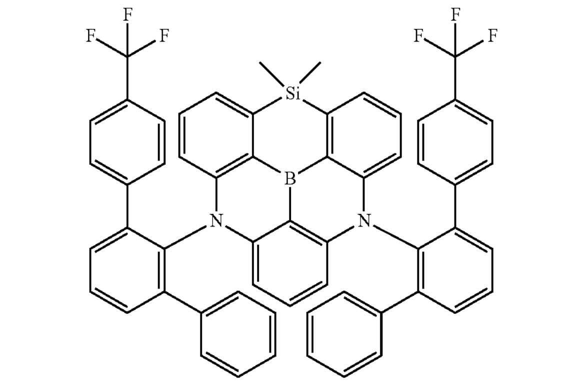
F
F
F
Si
B
N
N
F
F
F
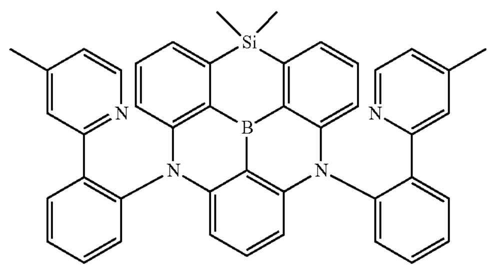
Si
N
B
N
N
N
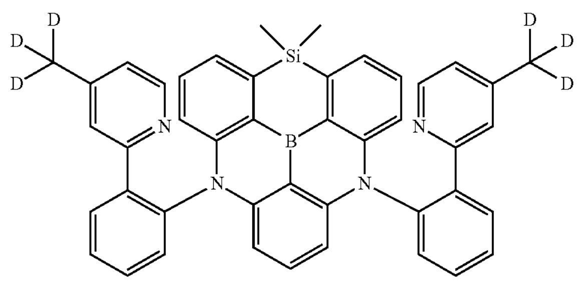
D
D
D
Si
N
B
N
N
N
D
D
D
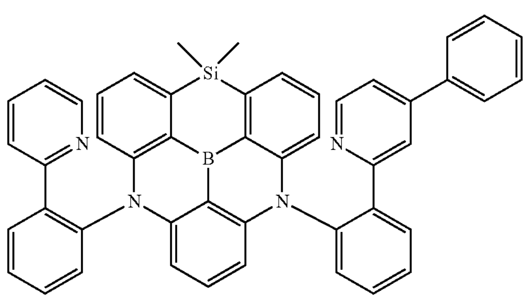
Si
N
B
N
N
N
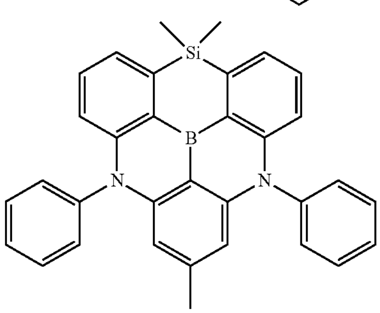
Si
B
N
N
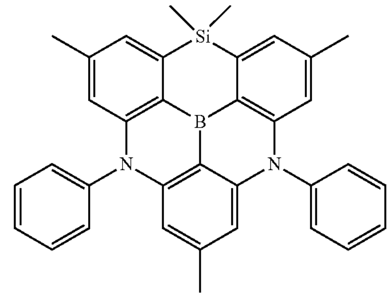
Si
B
N
N
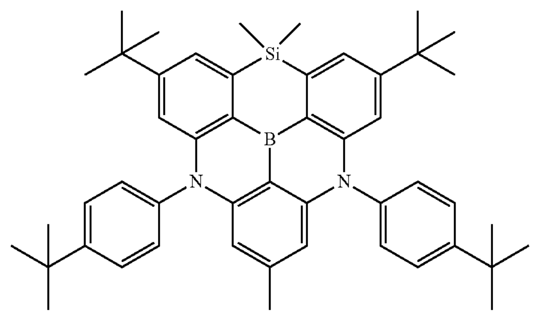
Si
B
N
N
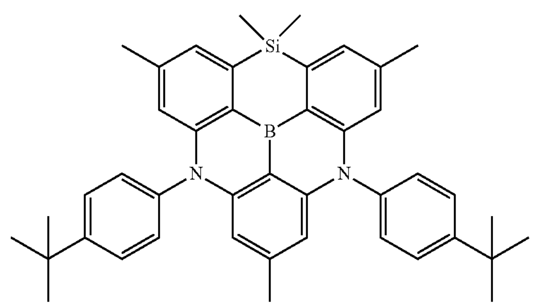
Si
B
N
N
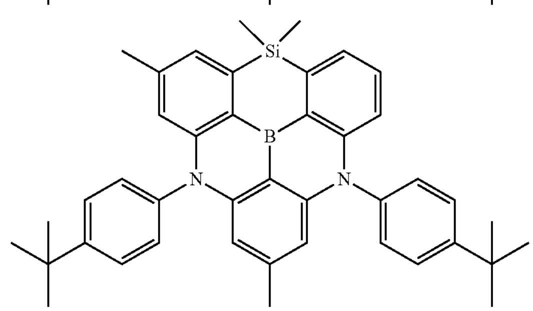
Si
B
N
N
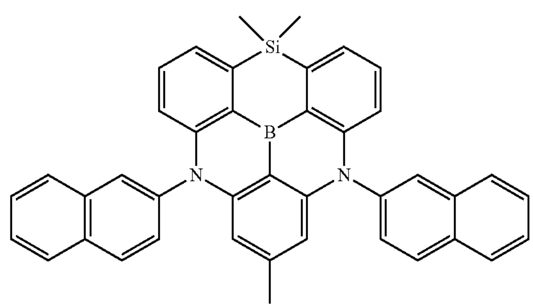
Si
B
N
N -continued
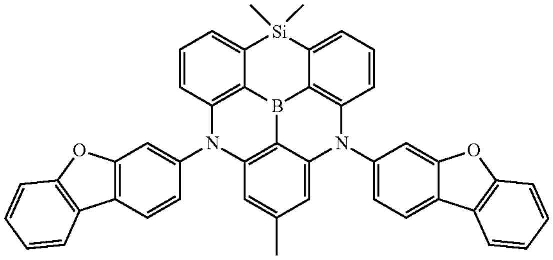
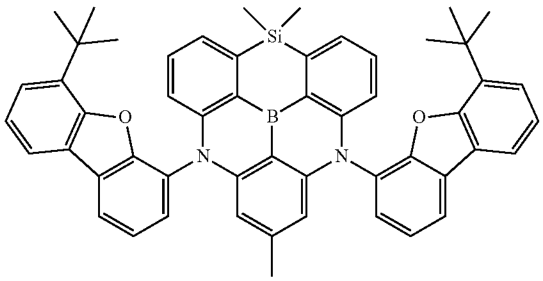
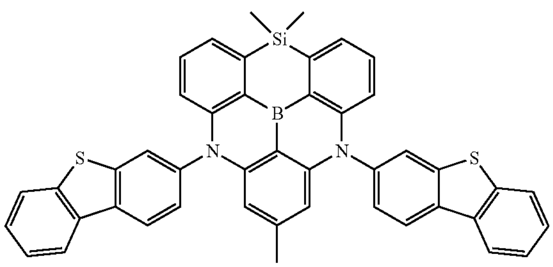
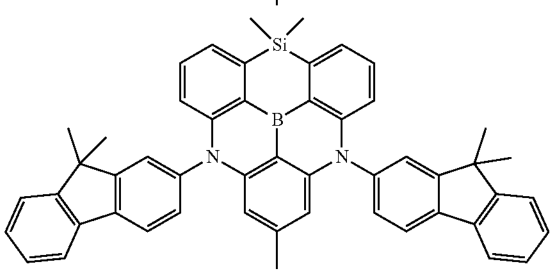
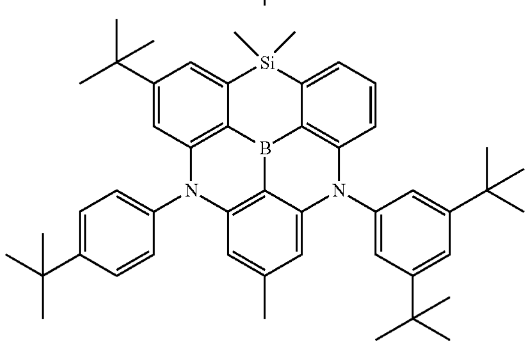
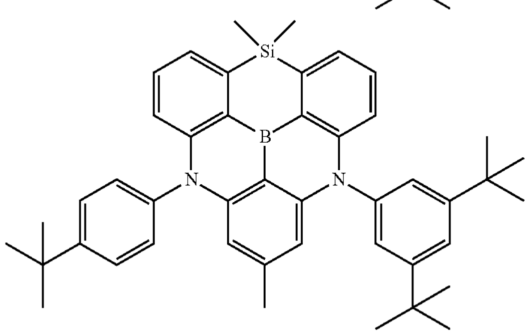
-continued
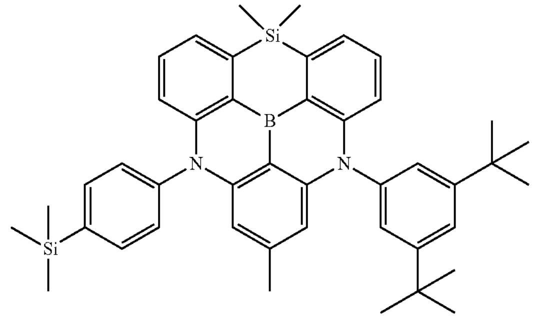
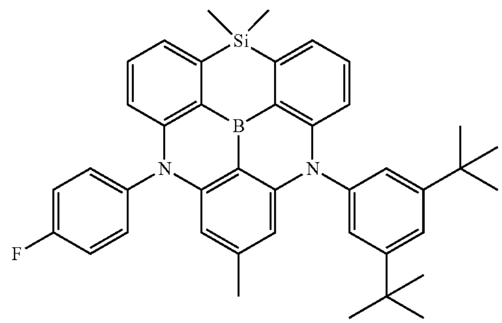
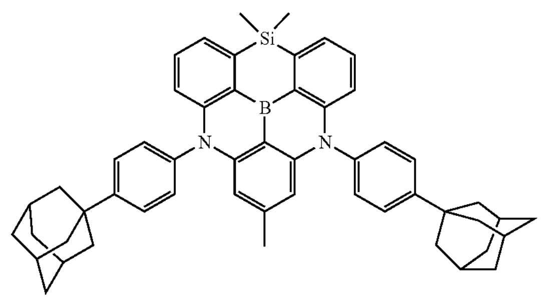
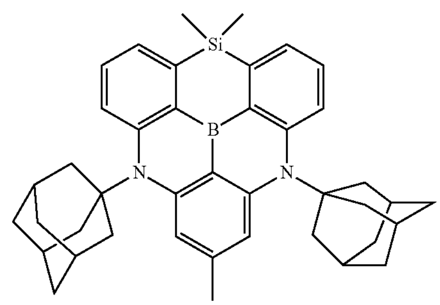
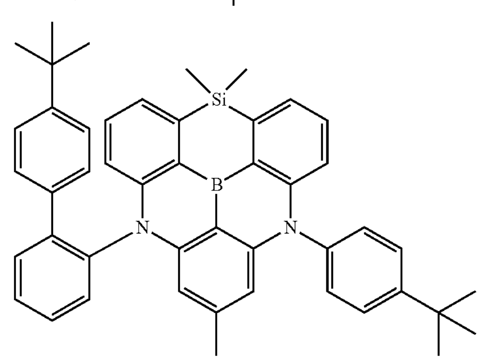

-continued
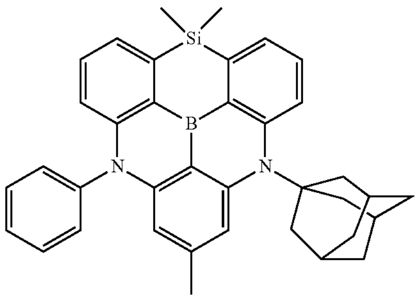
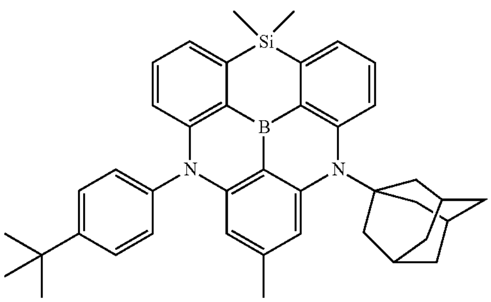
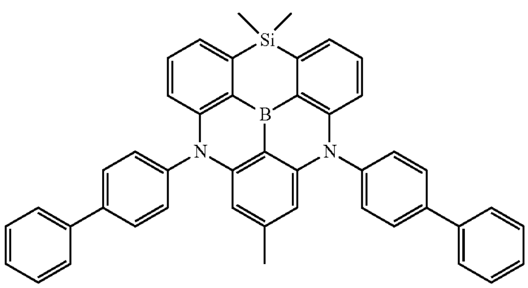
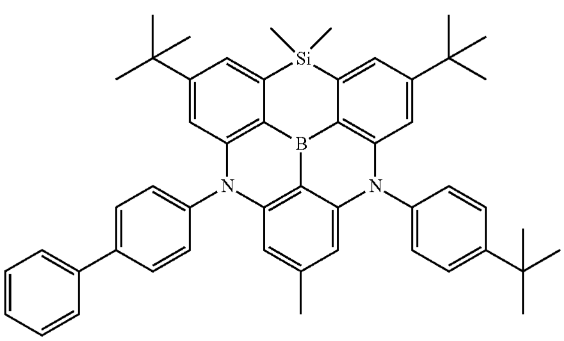
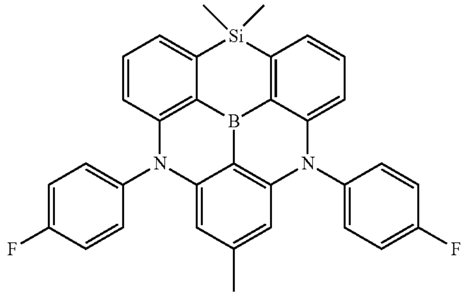
-continued
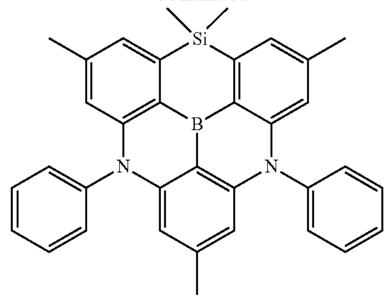
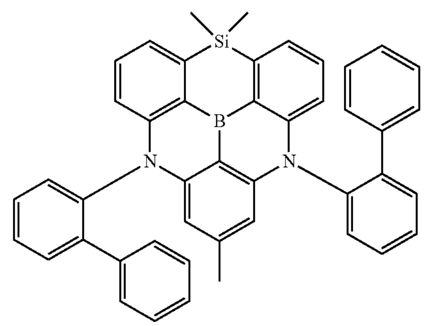
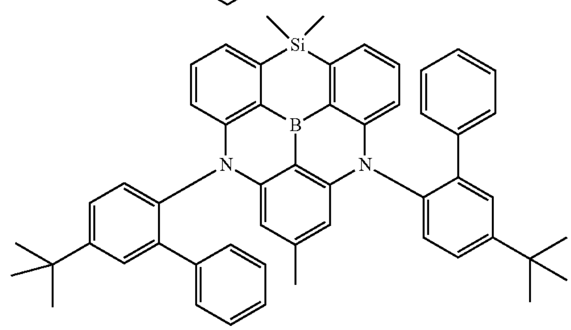
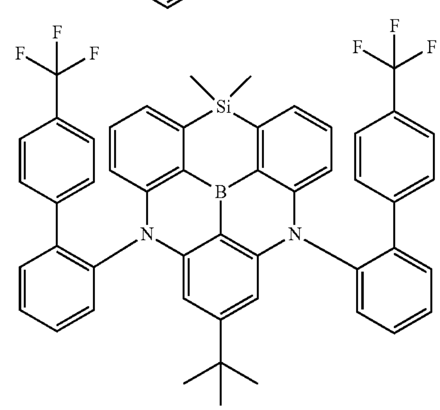
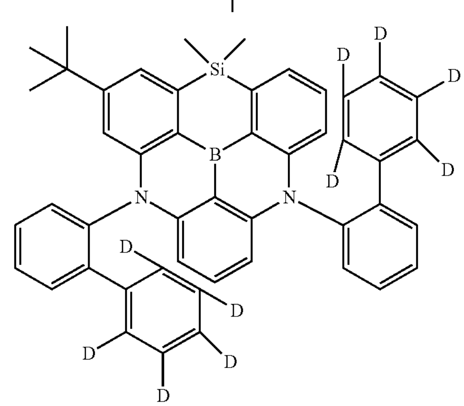

-continued
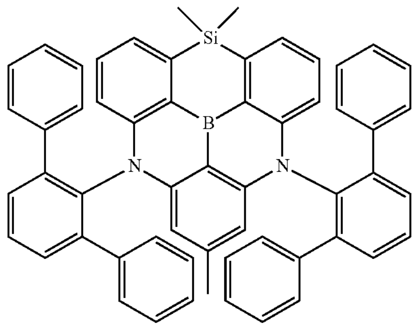
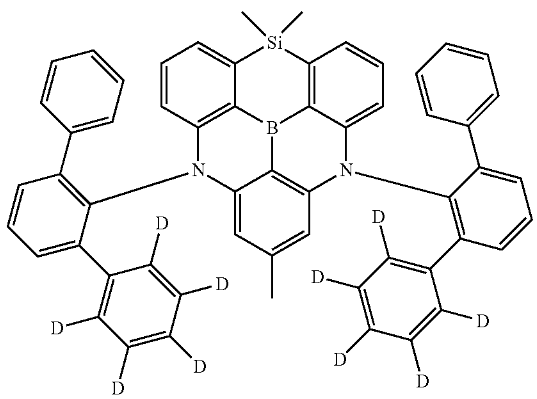
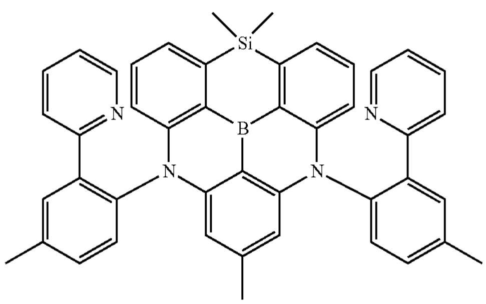
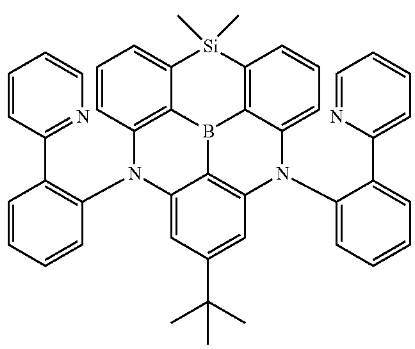
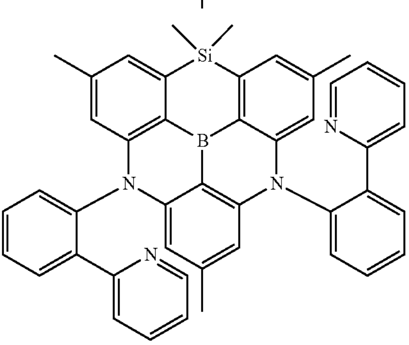
-continued
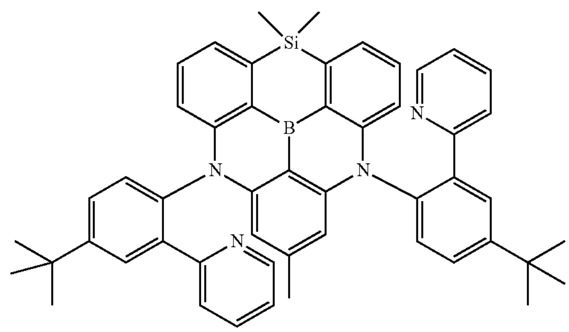
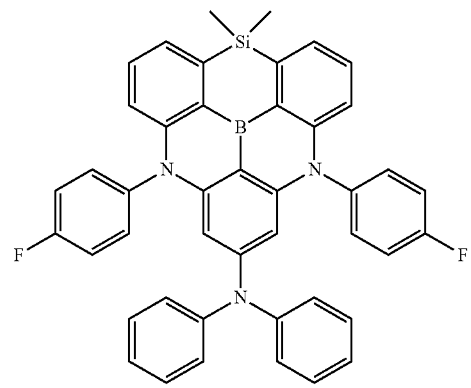
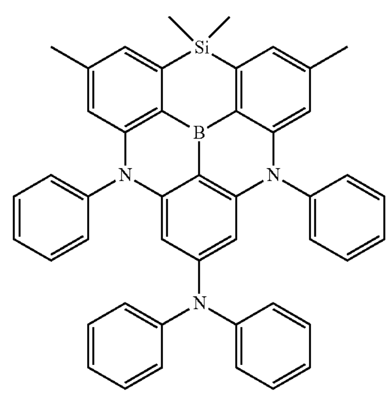
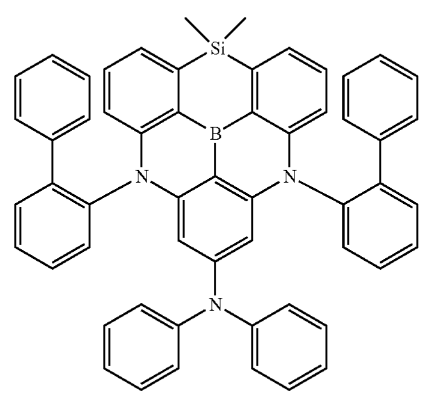

-continued
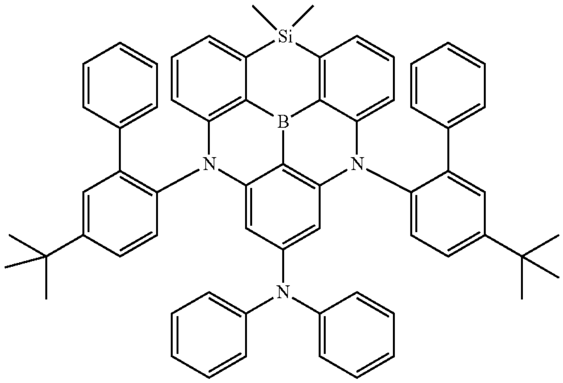
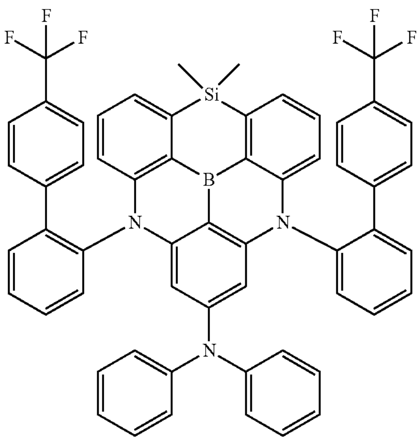
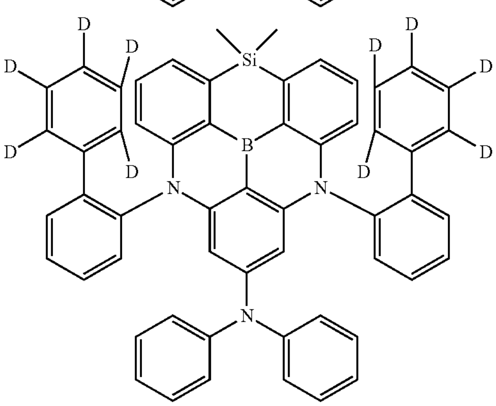
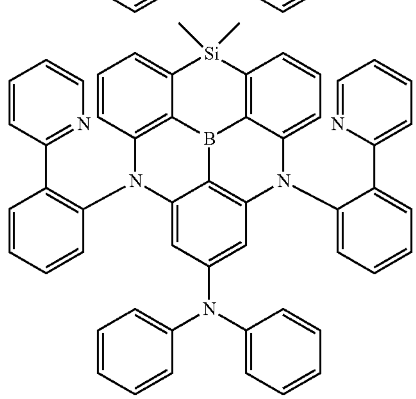
-continued
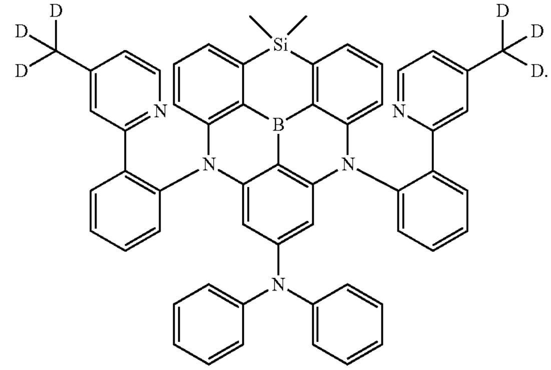
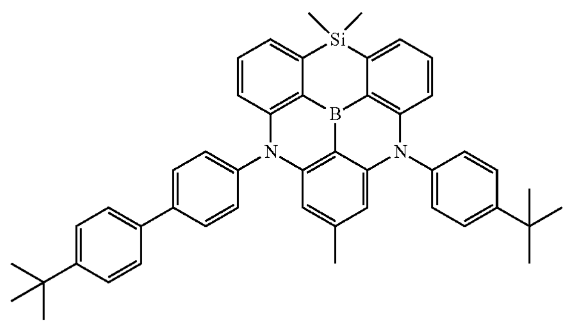
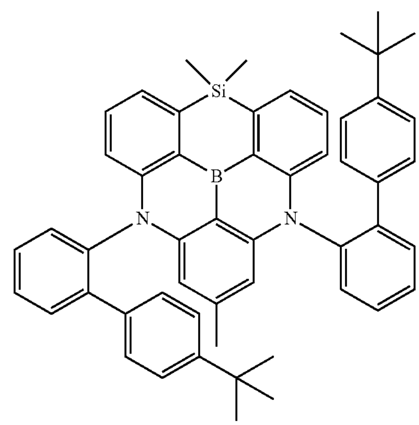
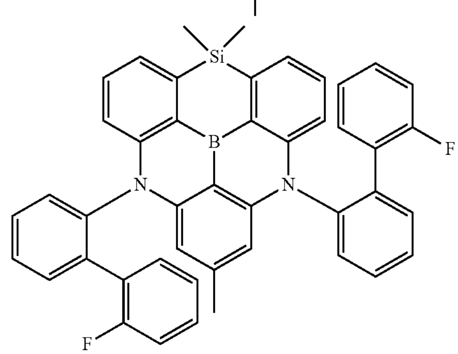

-continued
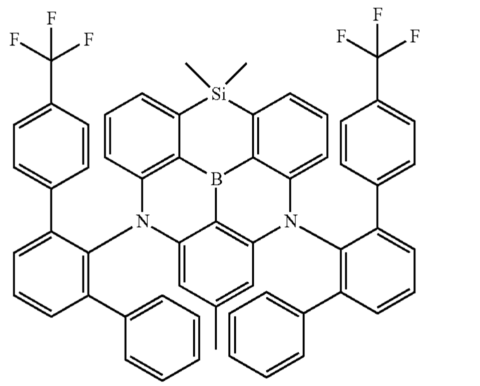
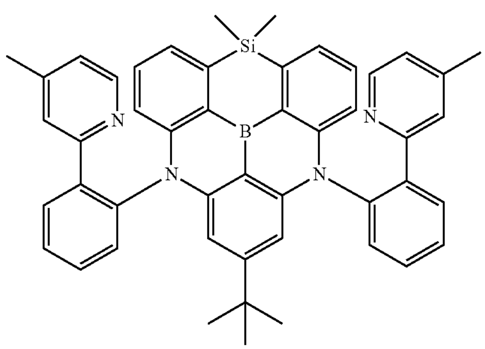
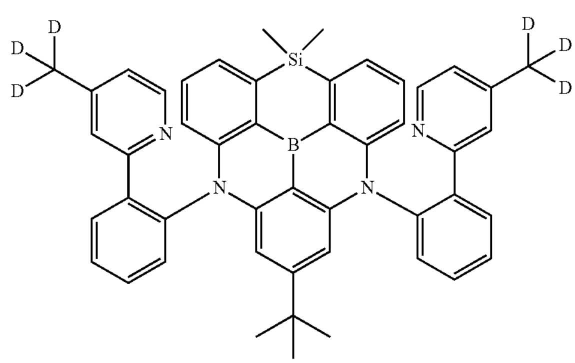
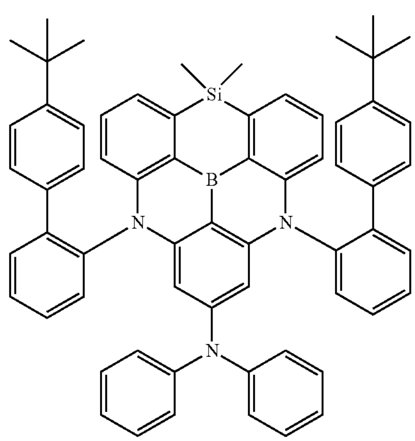
-continued
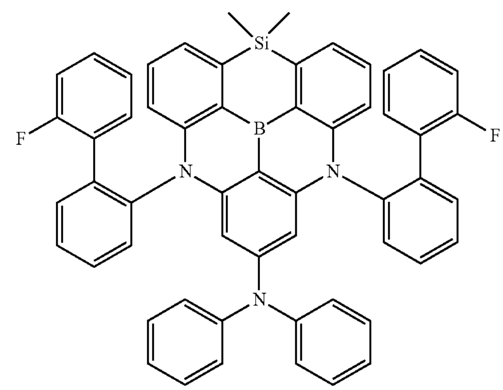
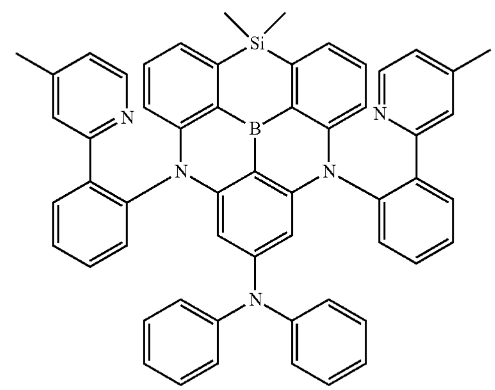
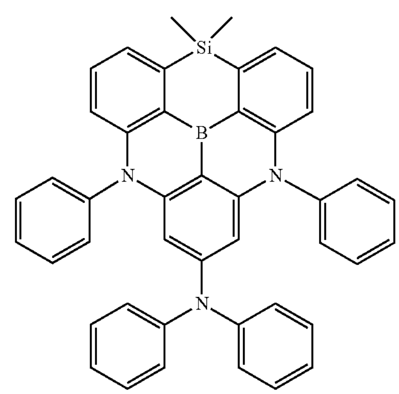
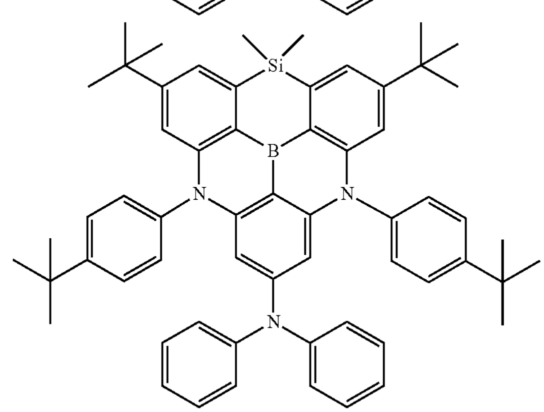

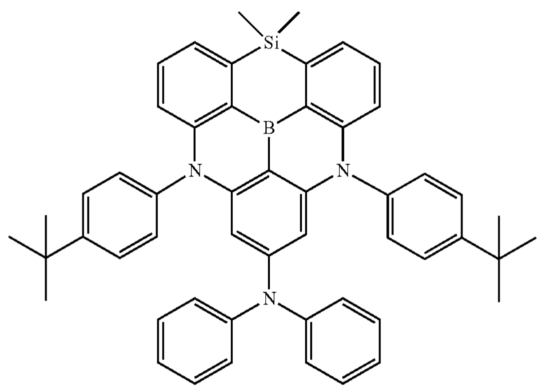
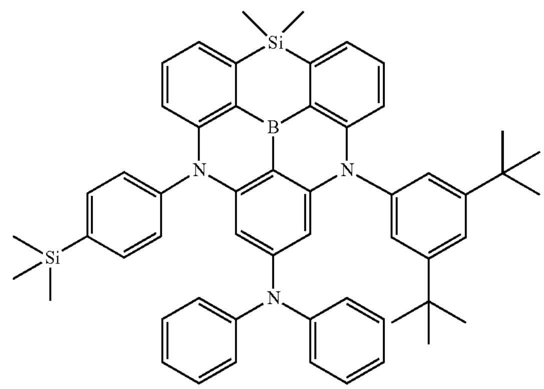
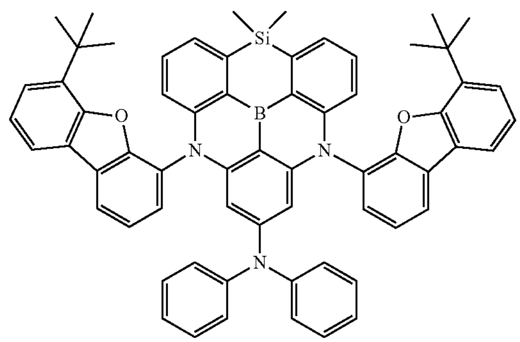
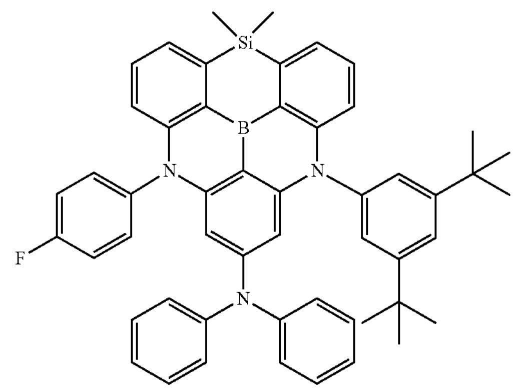
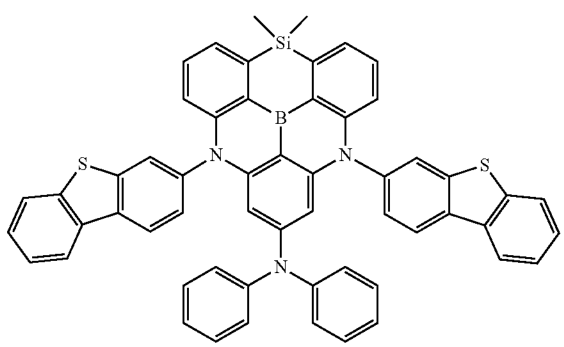
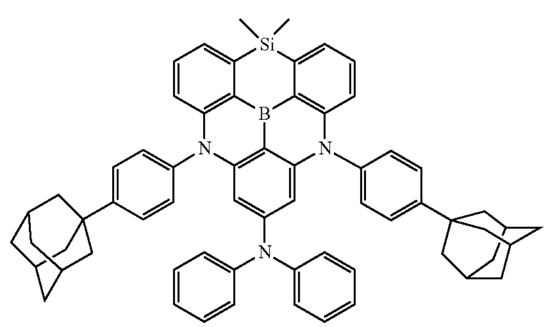
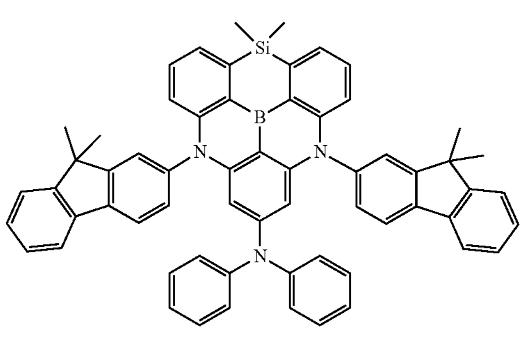
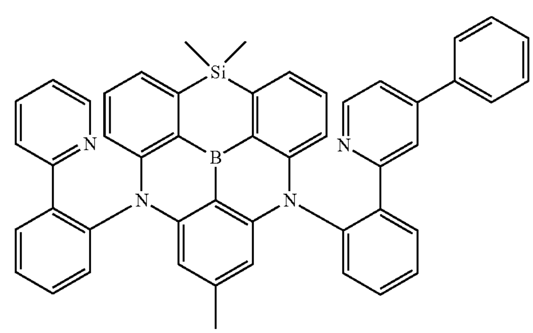

-continued
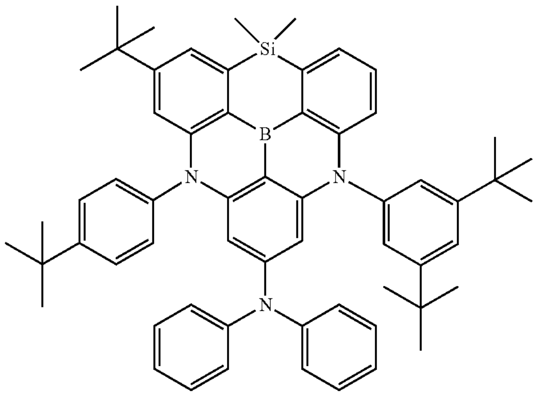
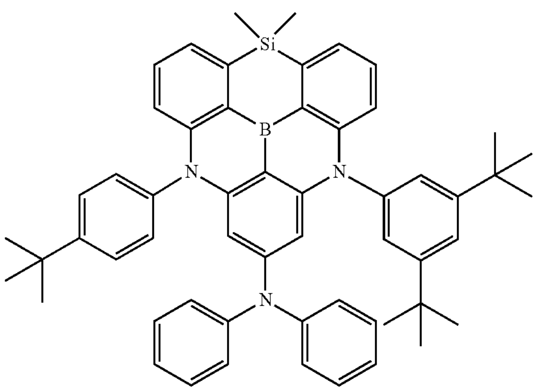
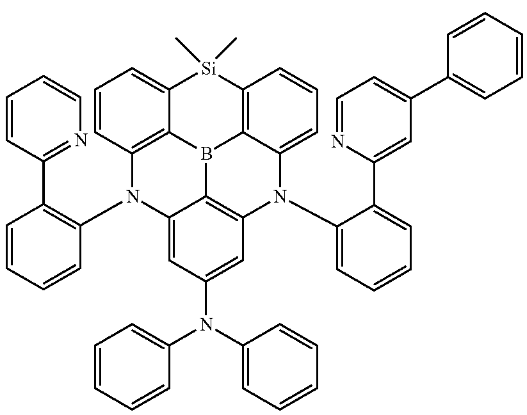
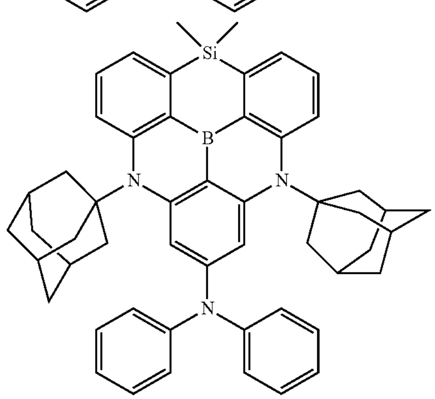
-continued
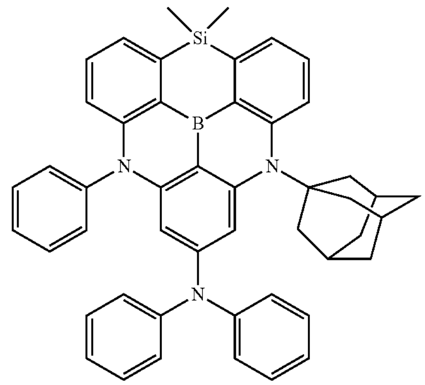
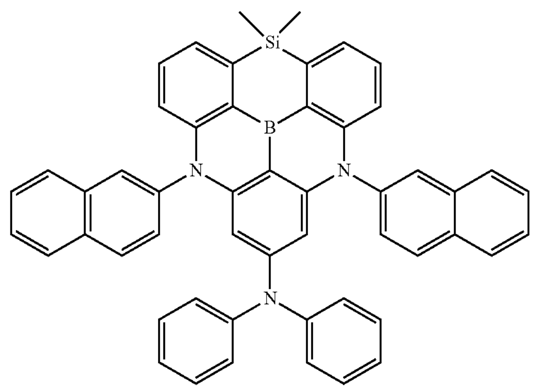
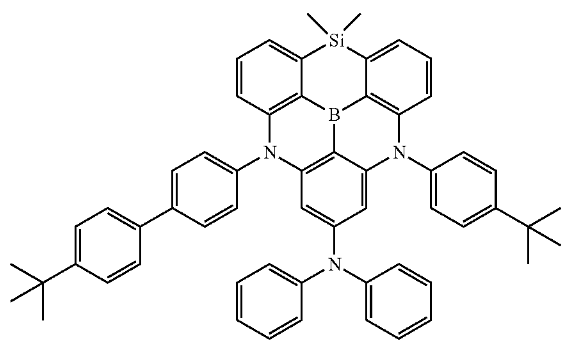
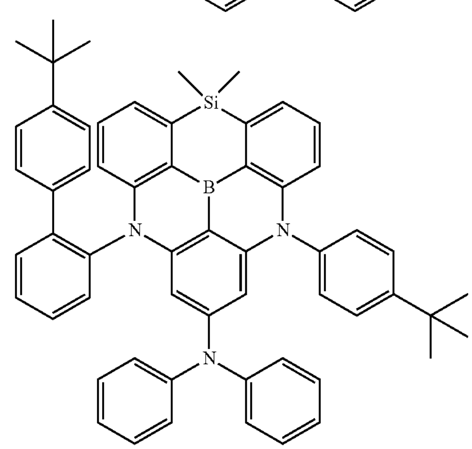

-continued
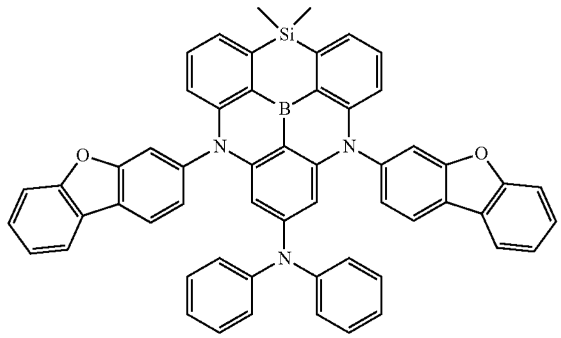
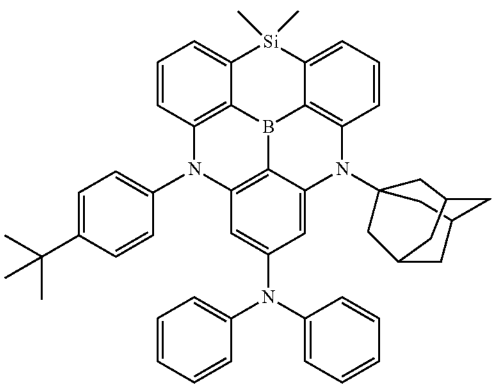
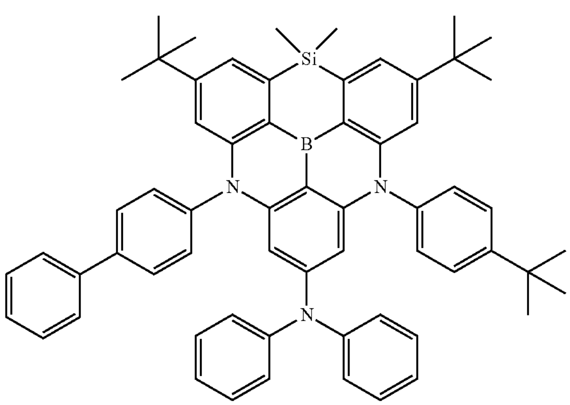
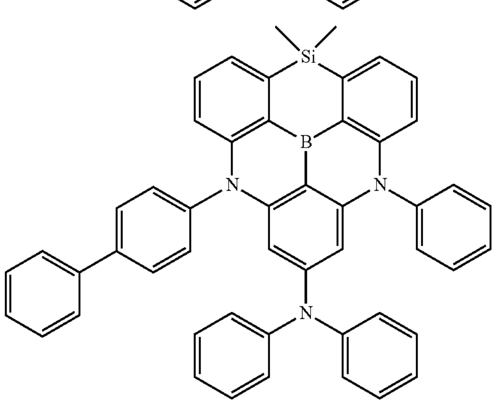
-continued
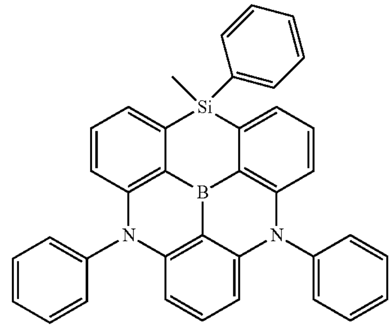
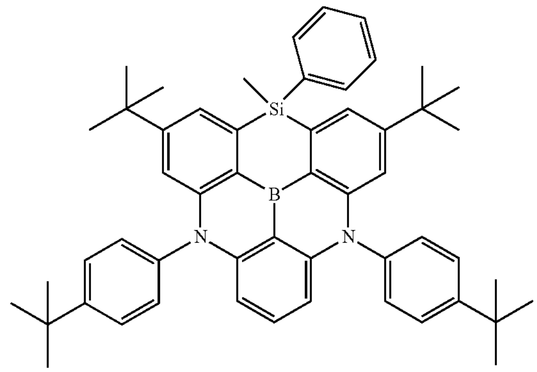
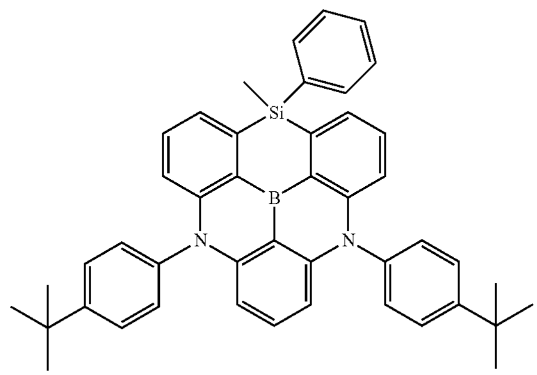
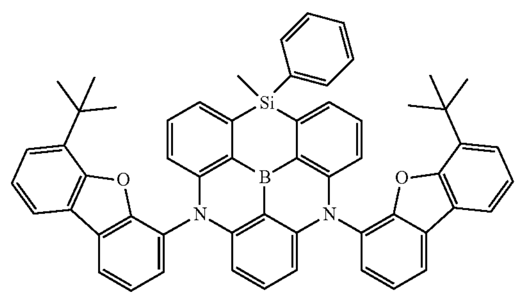
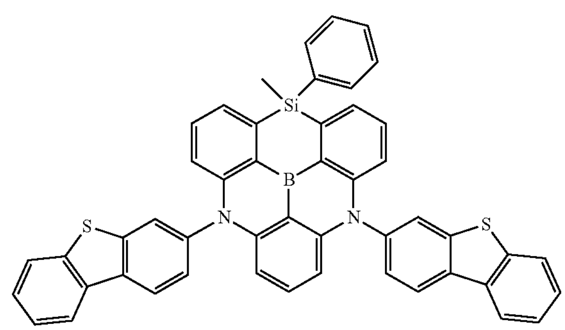

-continued
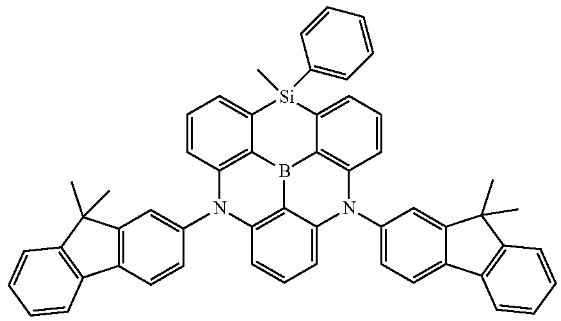
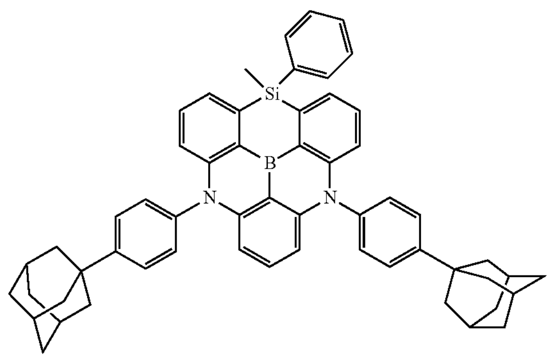
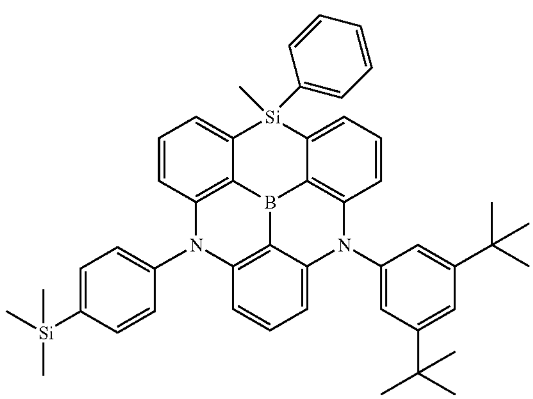
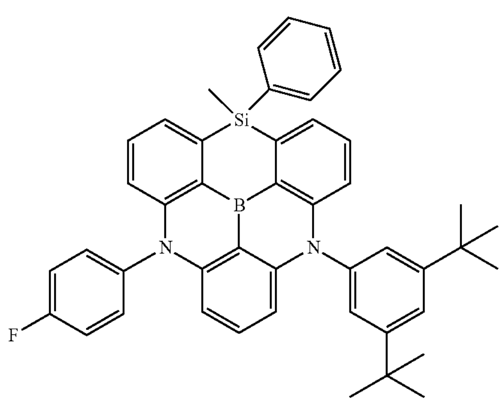
-continued
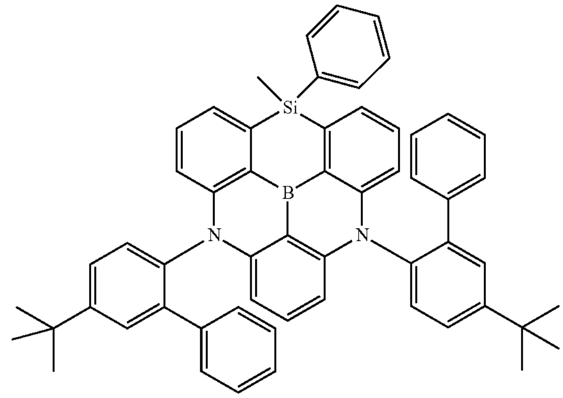
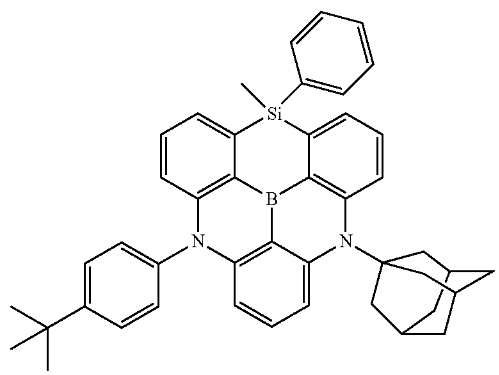
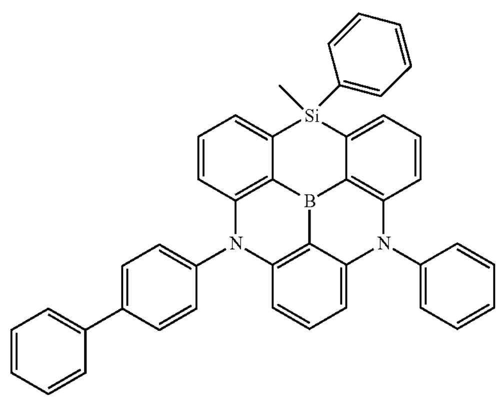
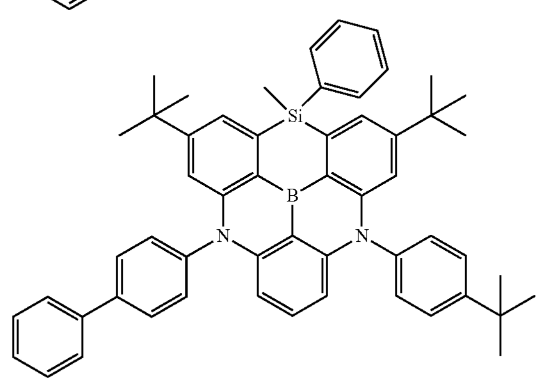

-continued
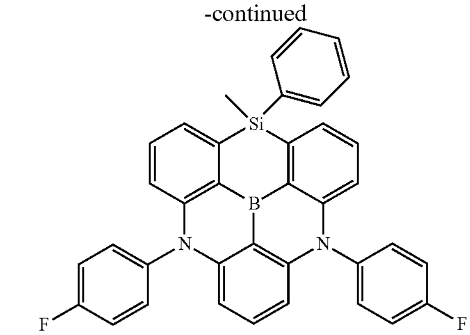
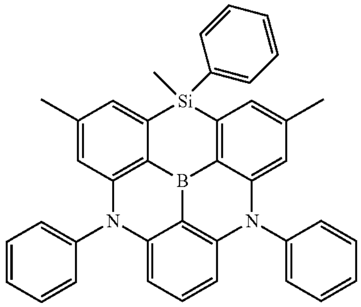
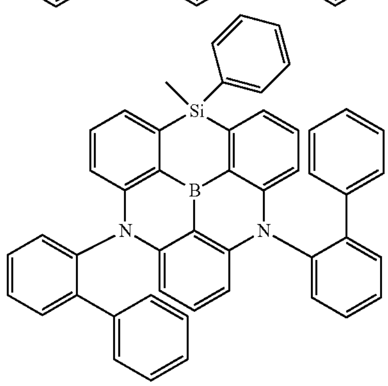
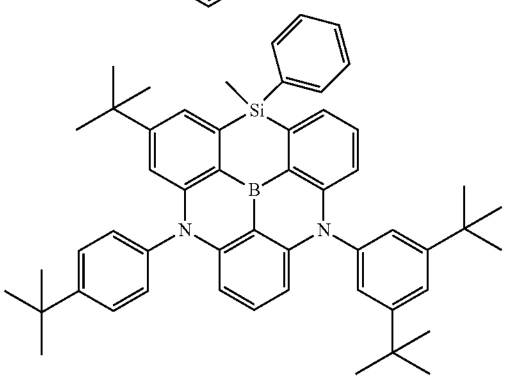
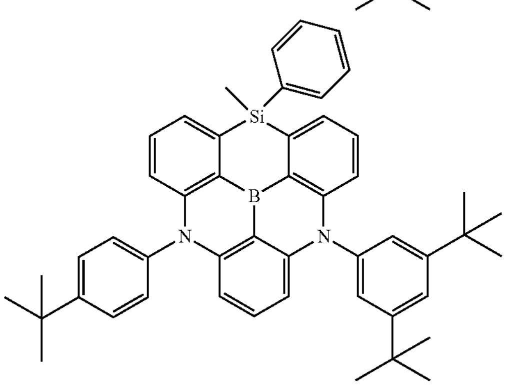
-continued
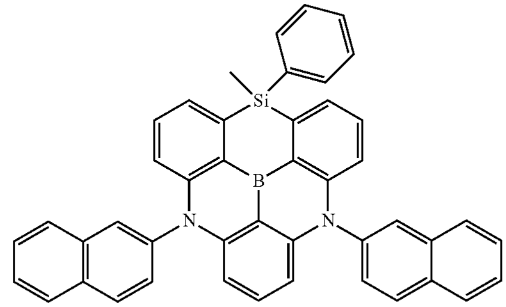
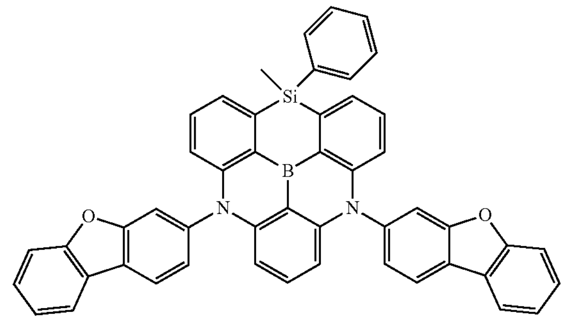
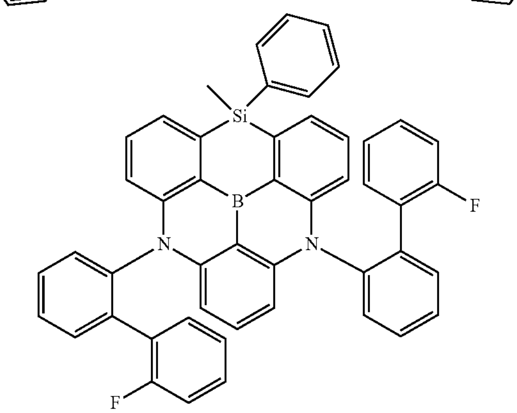
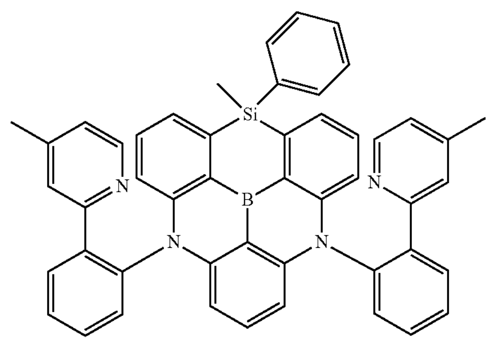
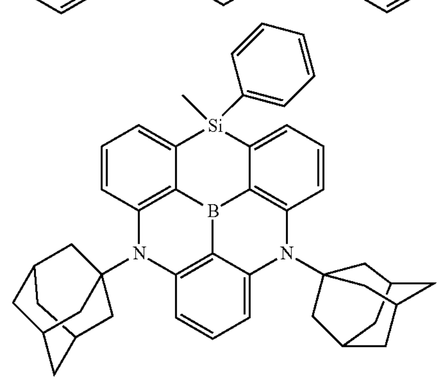

-continued
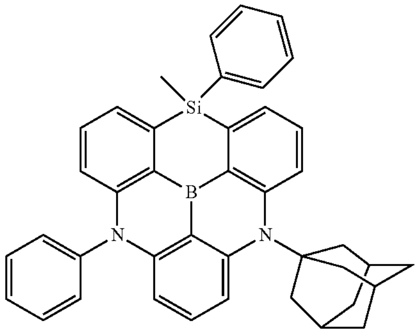
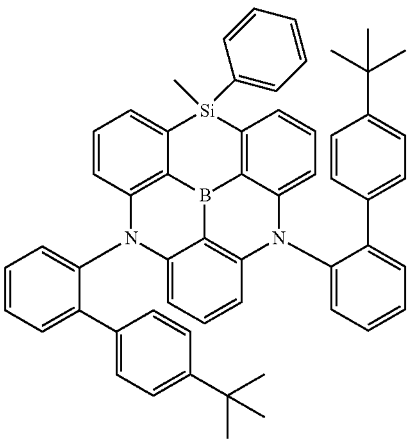
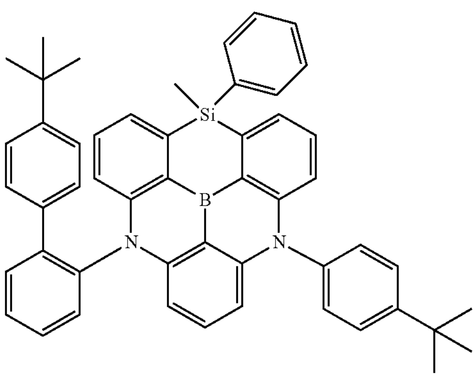
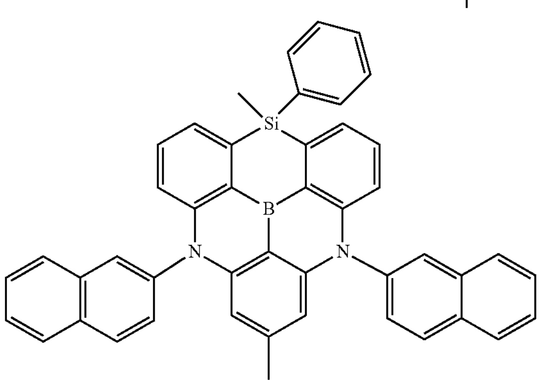
-continued
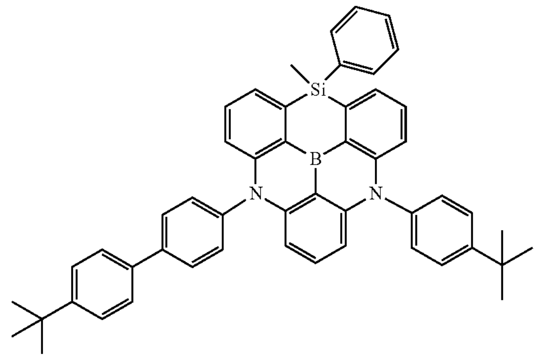
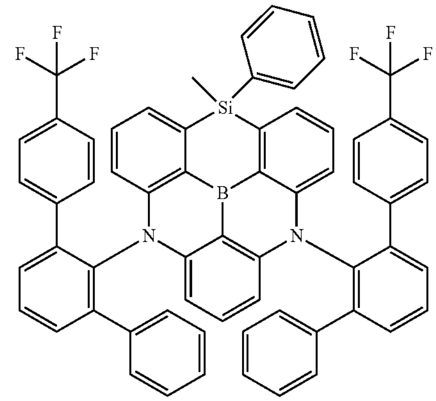
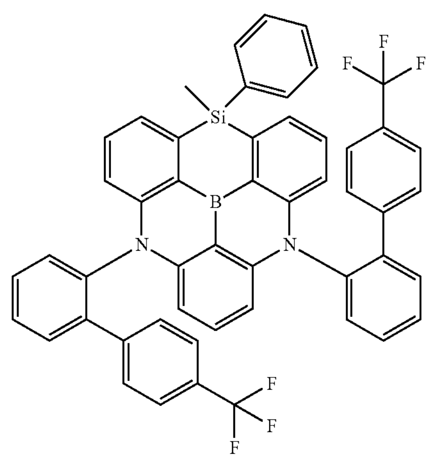
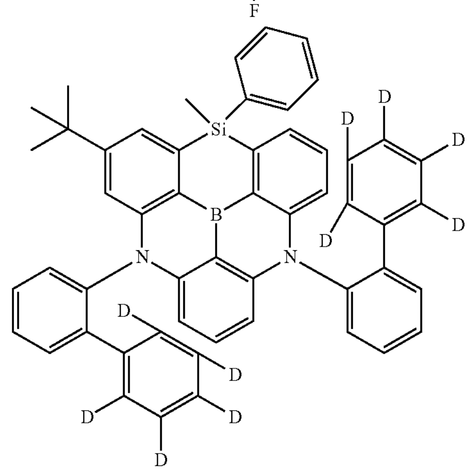

-continued
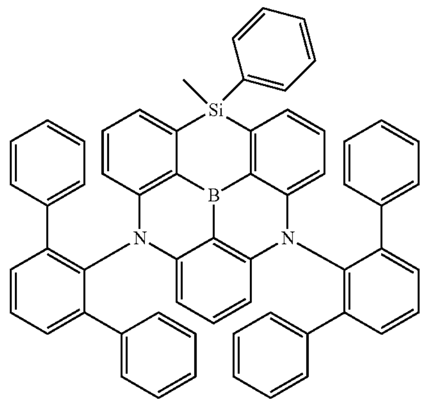
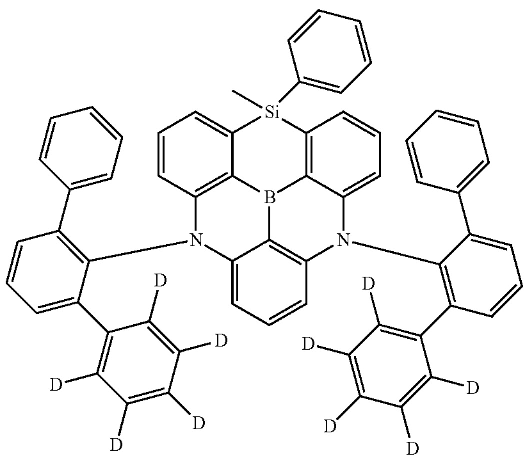
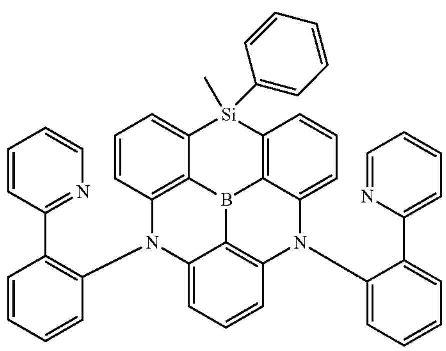
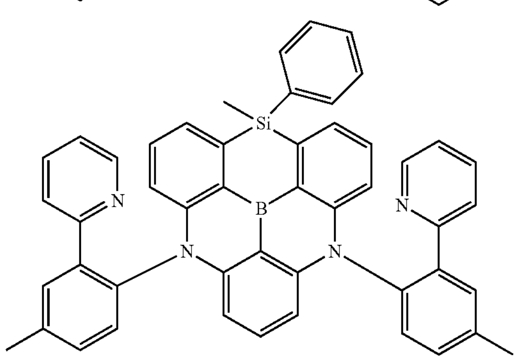
-continued
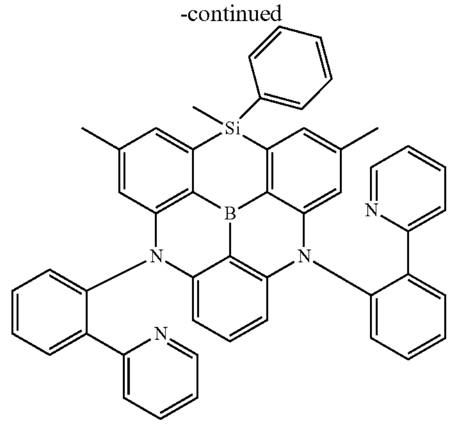
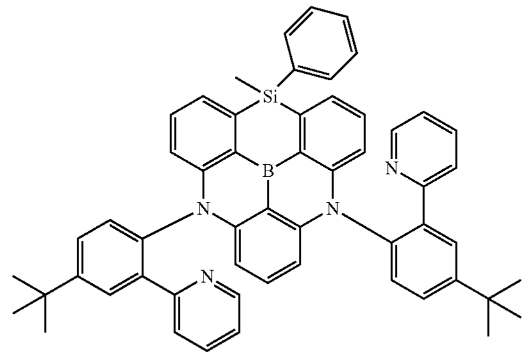
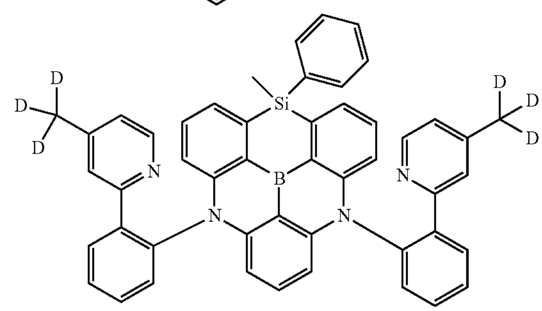
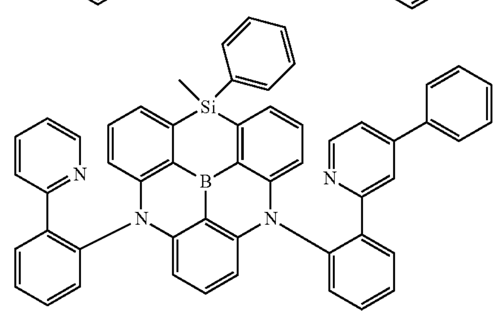
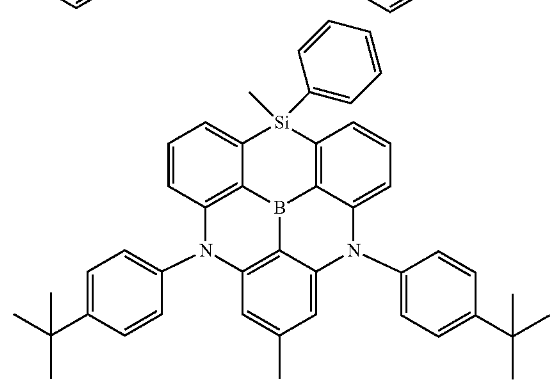

-continued
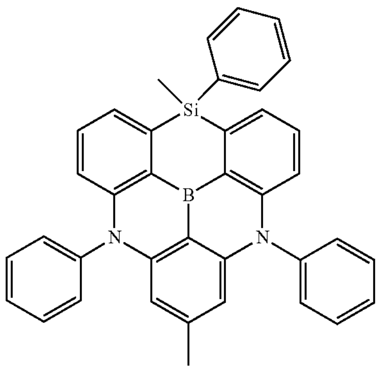
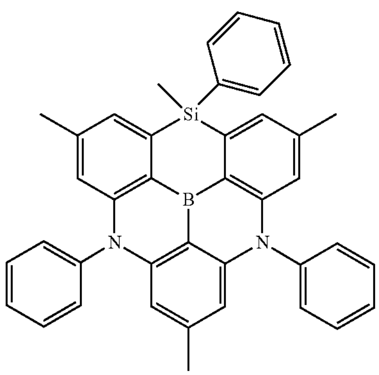
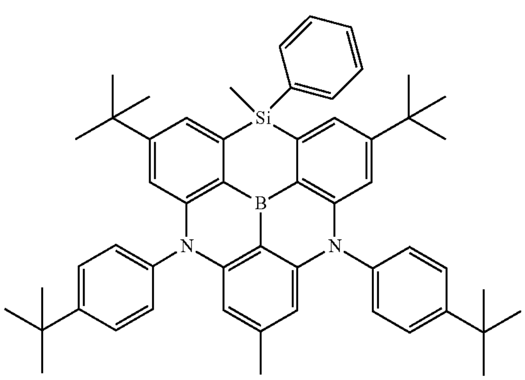
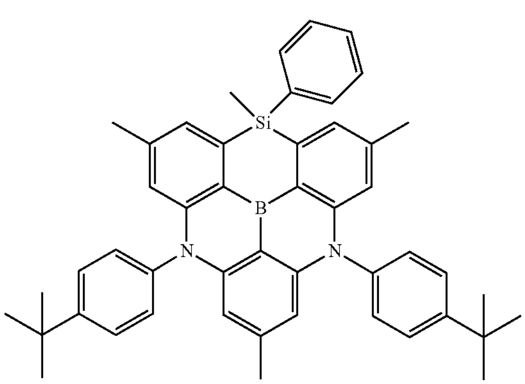
-continued
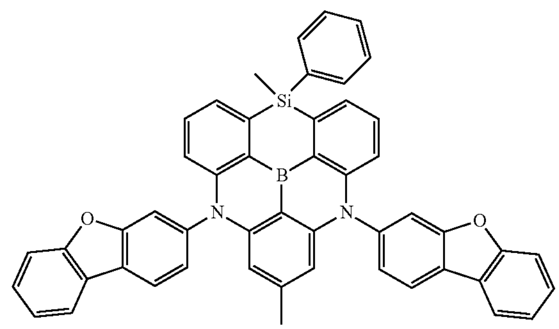
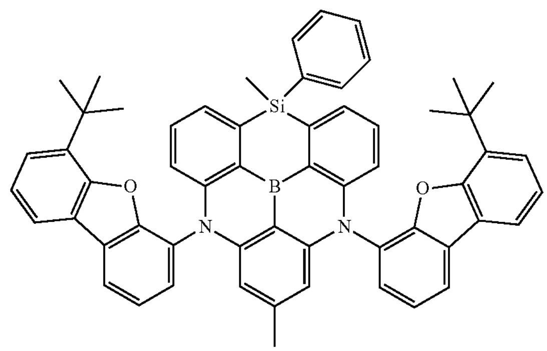
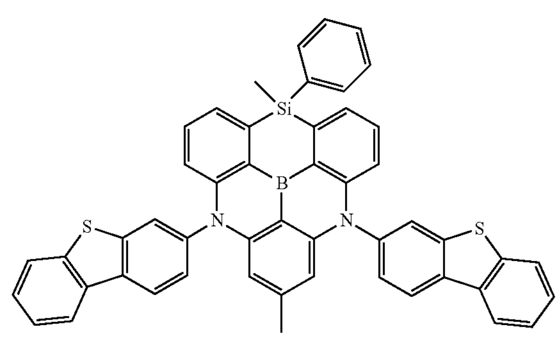
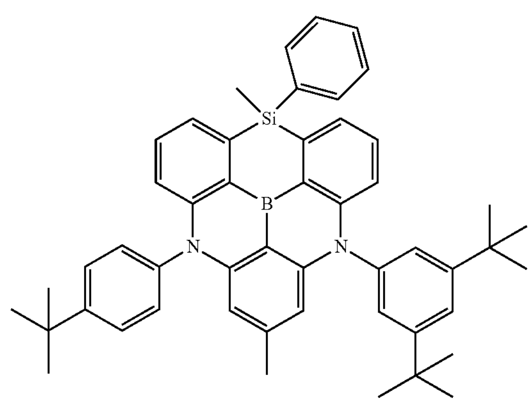

-continued
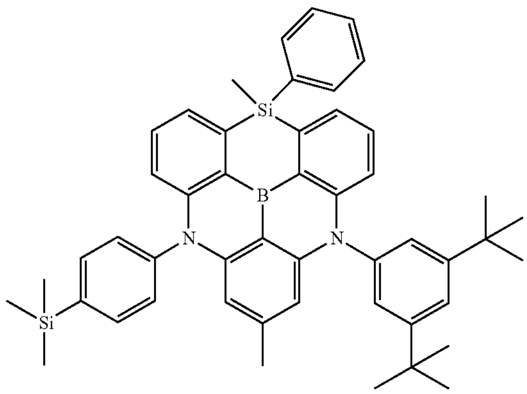
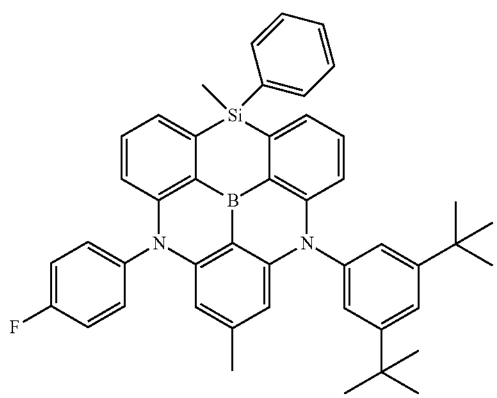
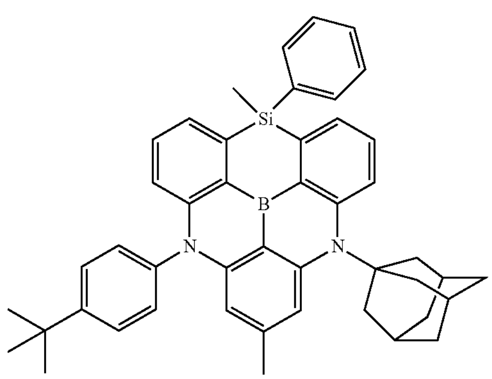
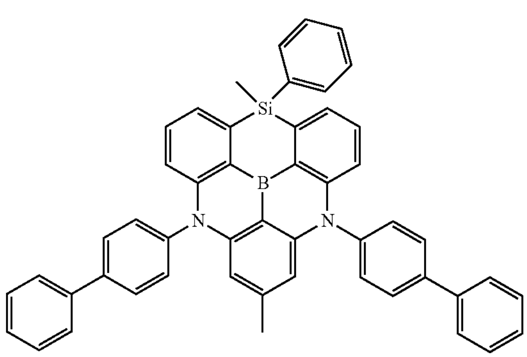
-continued
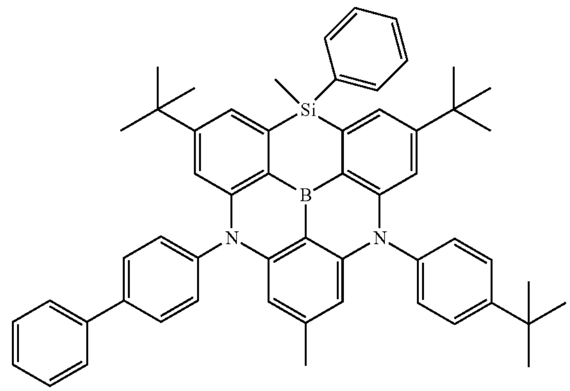
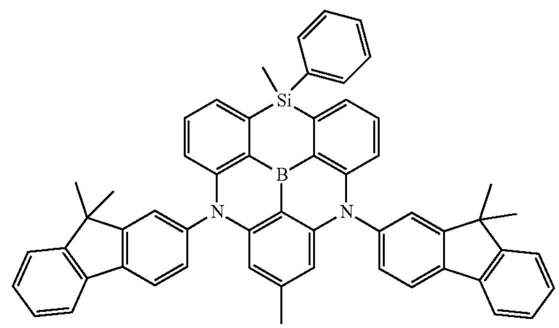
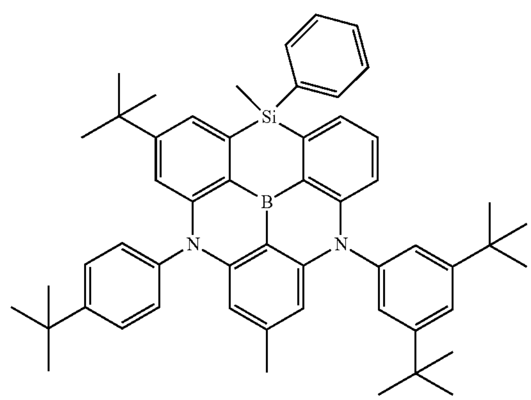
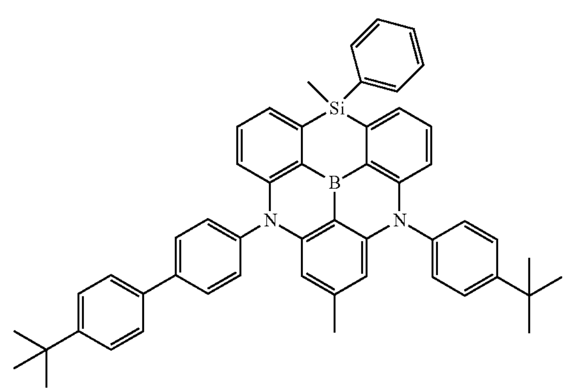

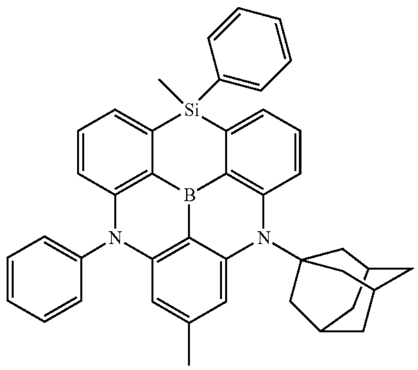
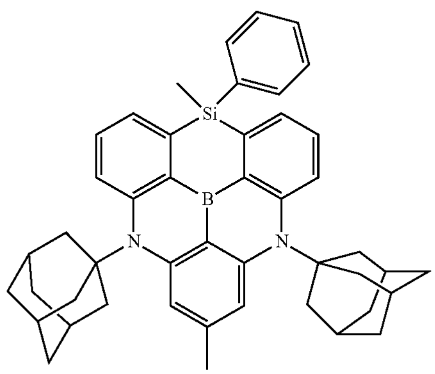
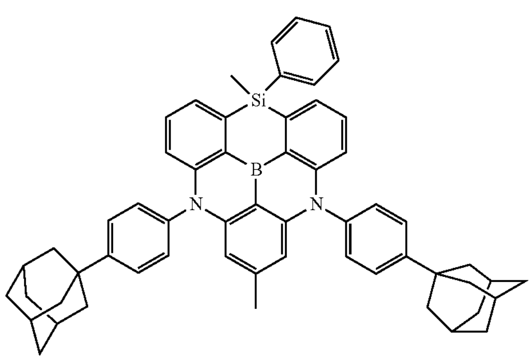
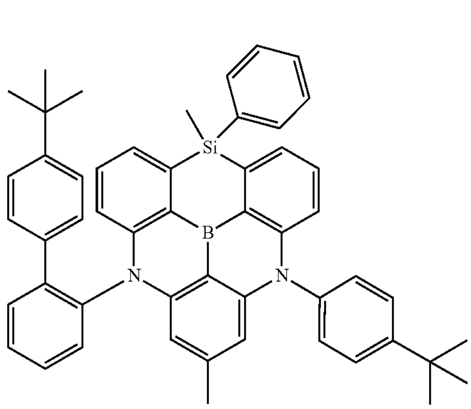
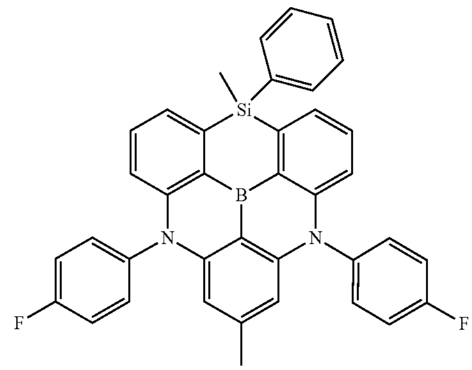
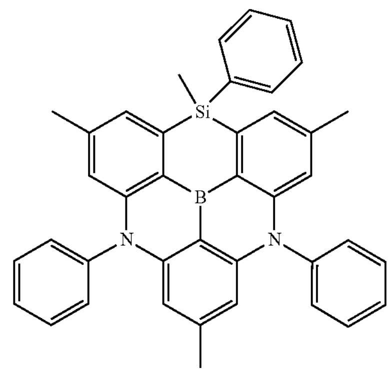
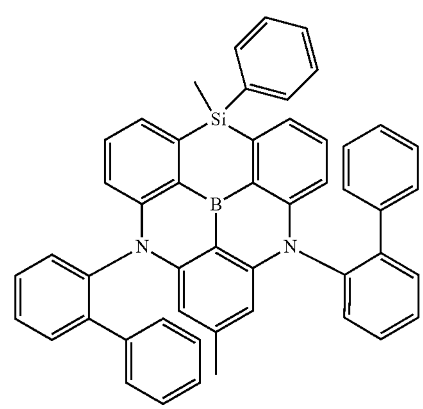
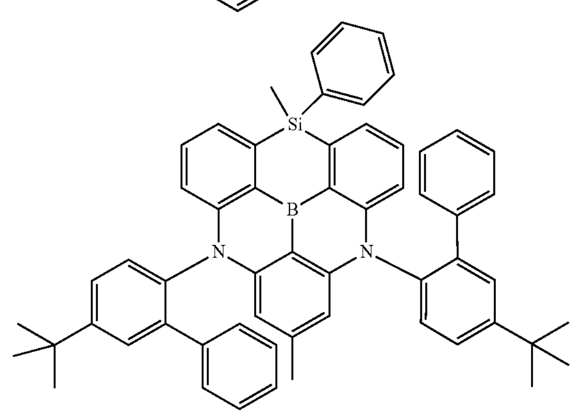

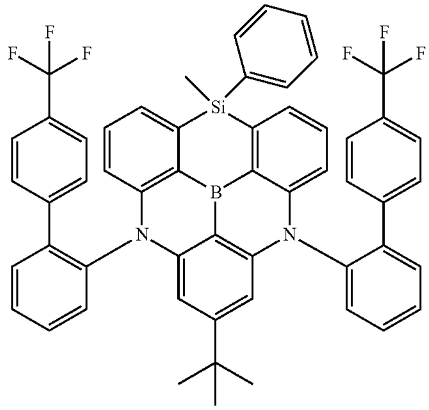
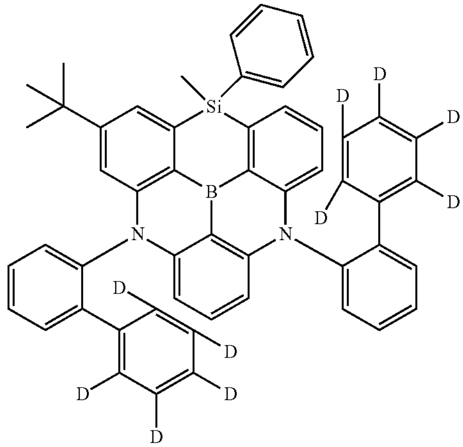
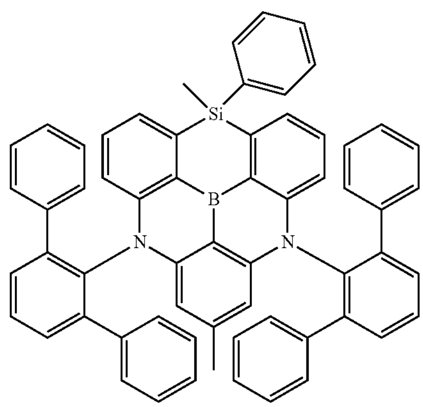
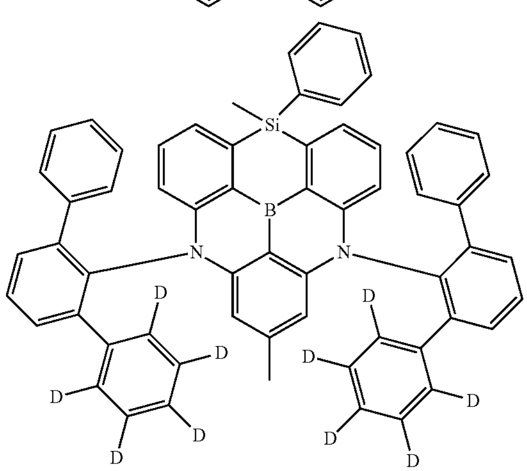
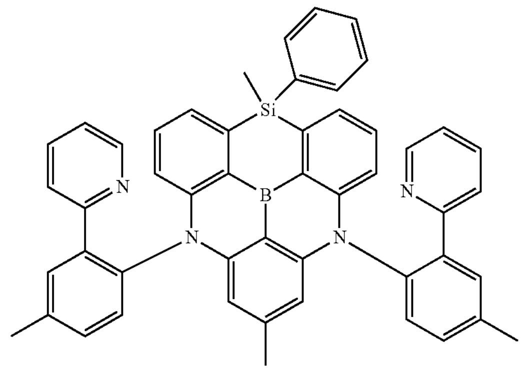
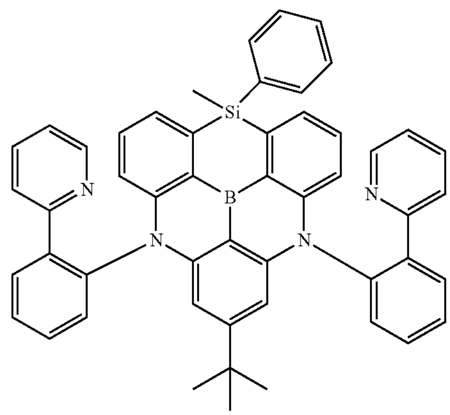
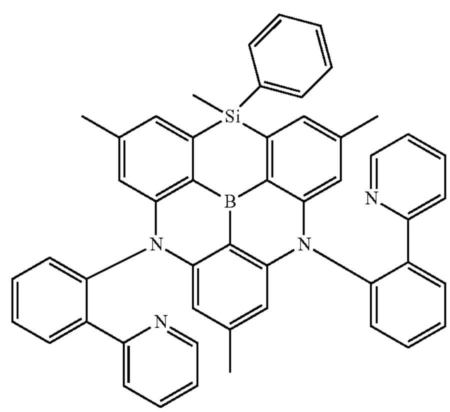
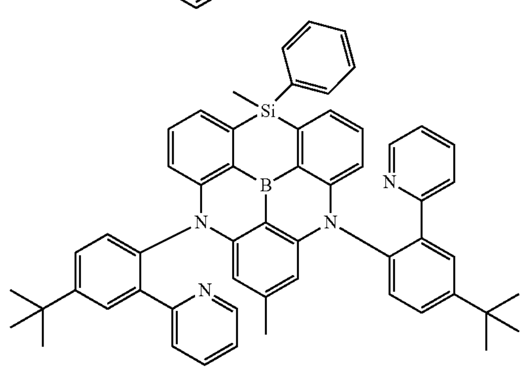

-continued
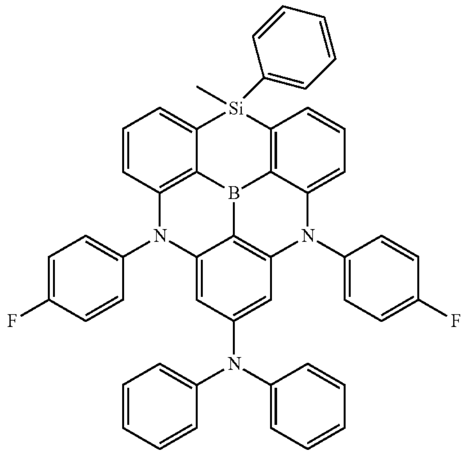
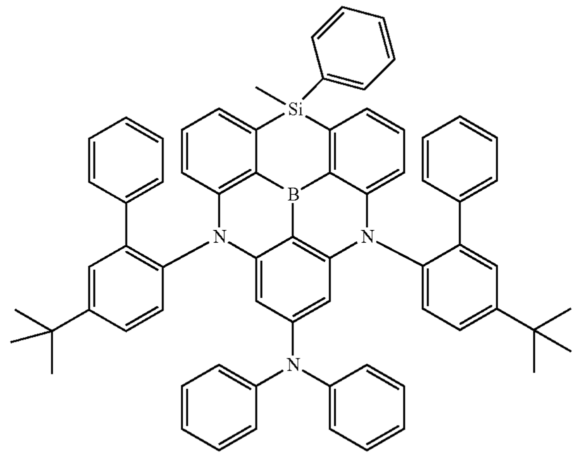
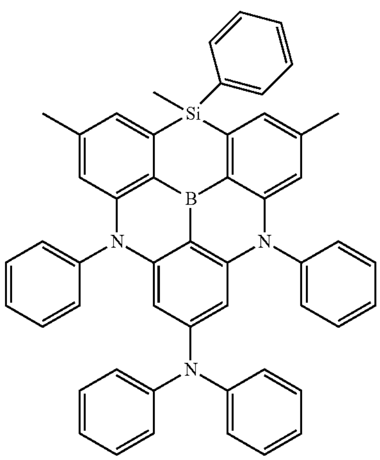
-continued
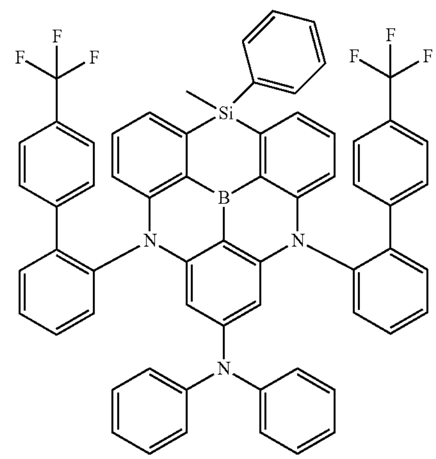
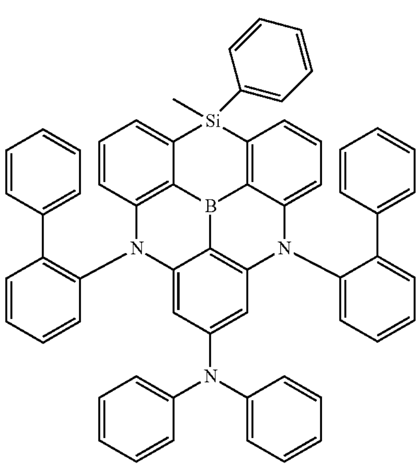
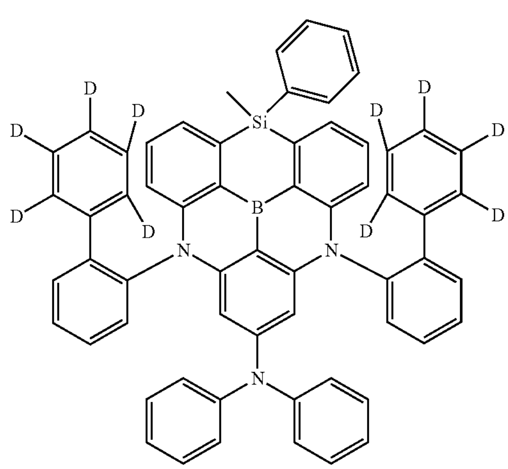

-continued
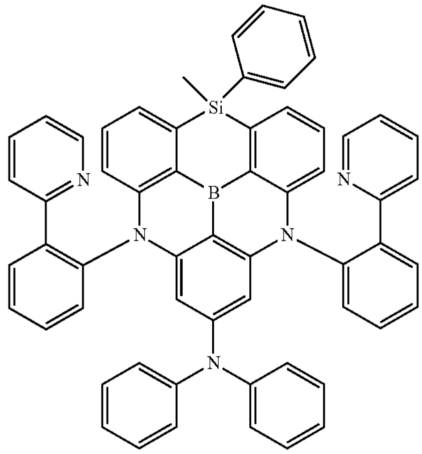
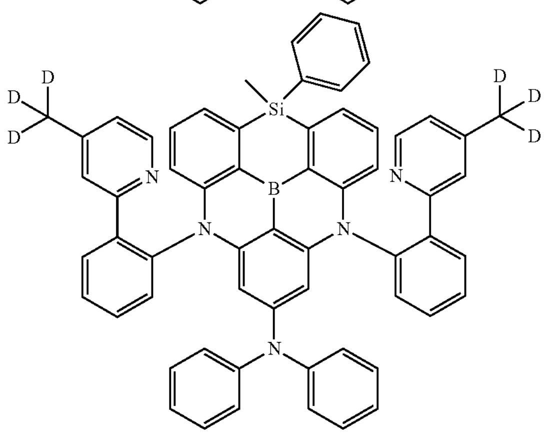
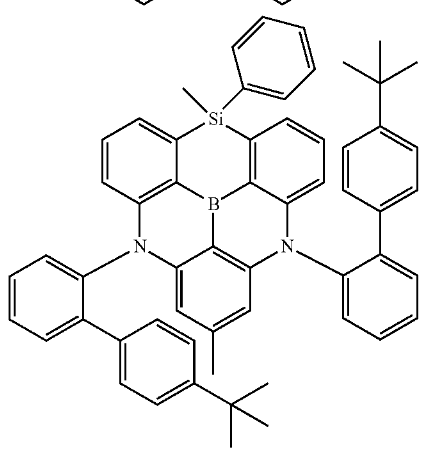
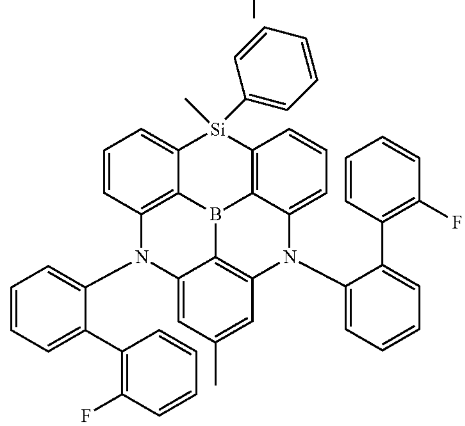
-continued
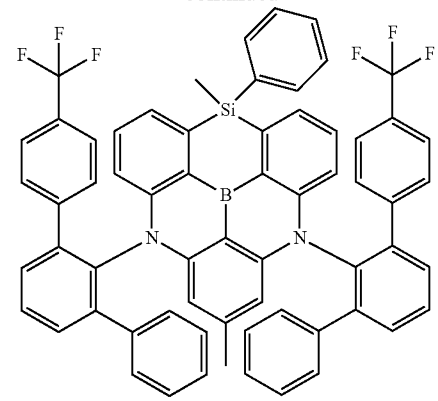
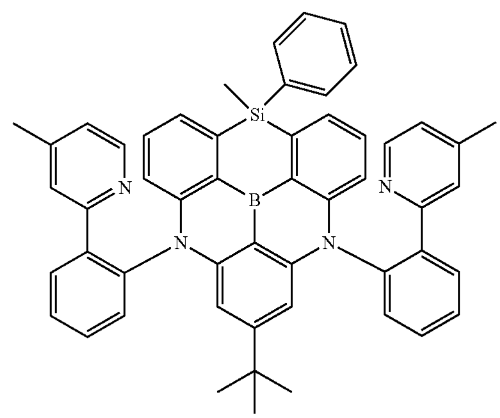
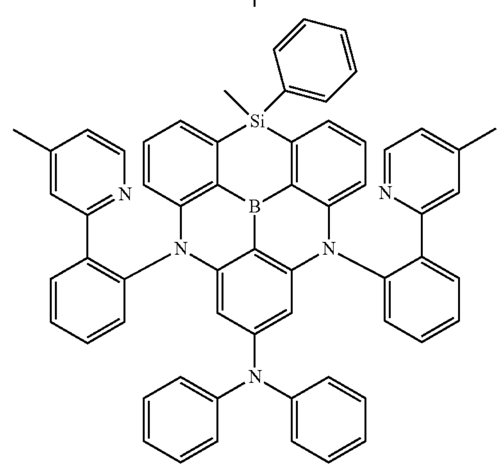
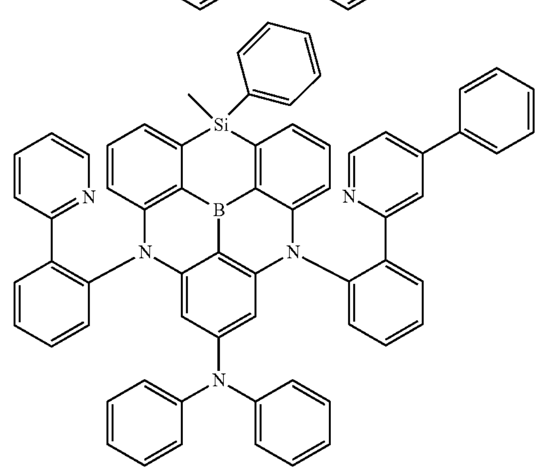

-continued
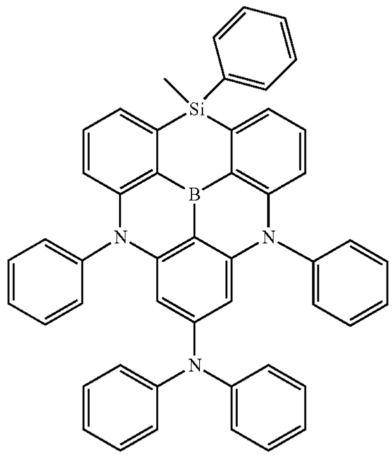
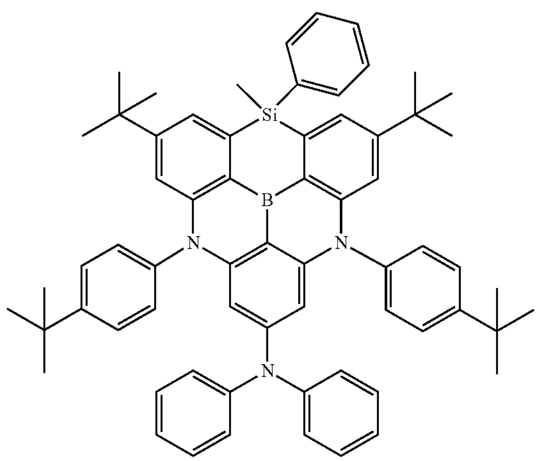
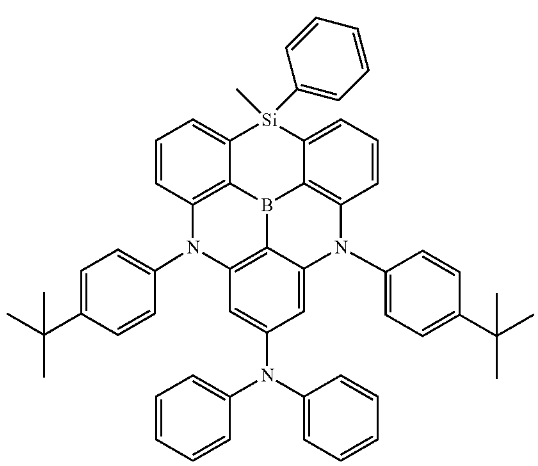
-continued
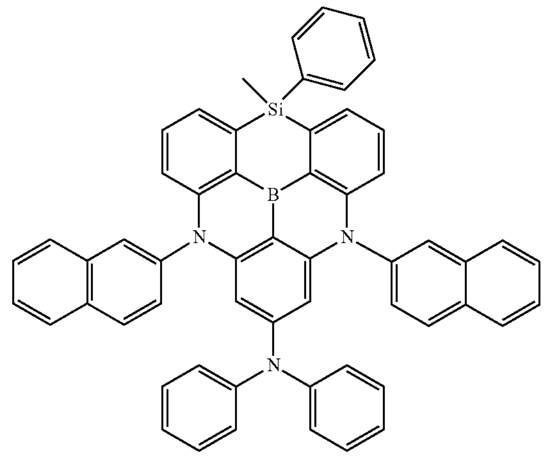 [SMILES: C[Si]1(c2ccccc2)c2cccc3c2B2c4c(cc(N(c5ccccc5)c5ccccc5)cc4N(c4ccc5ccccc5c4)c4cccc1c42)N3c1ccc2ccccc2c1]
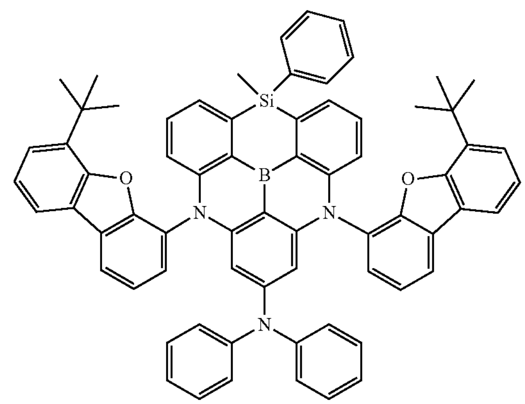
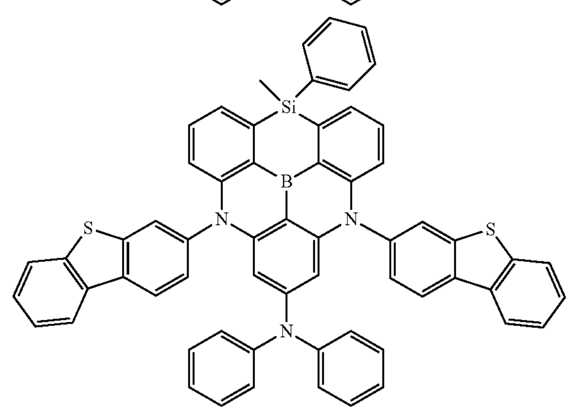
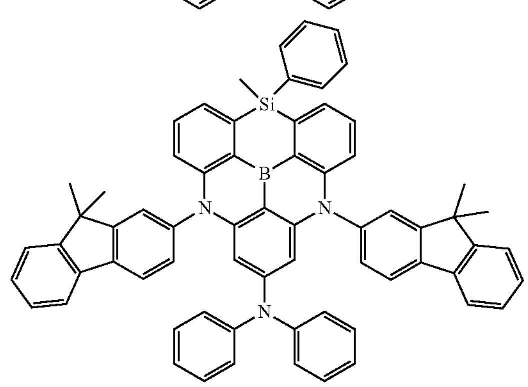

-continued
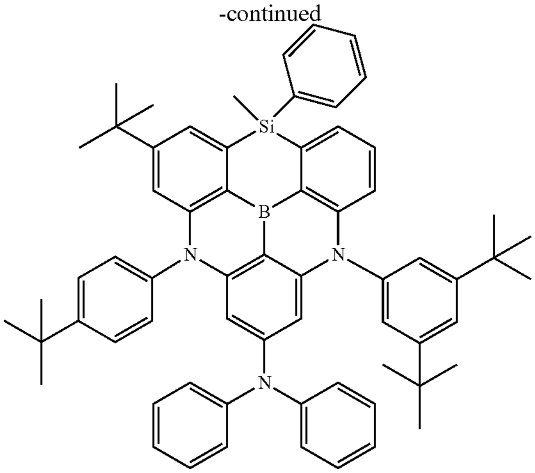
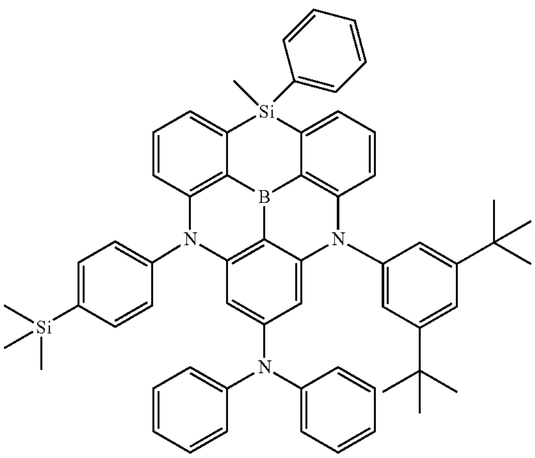
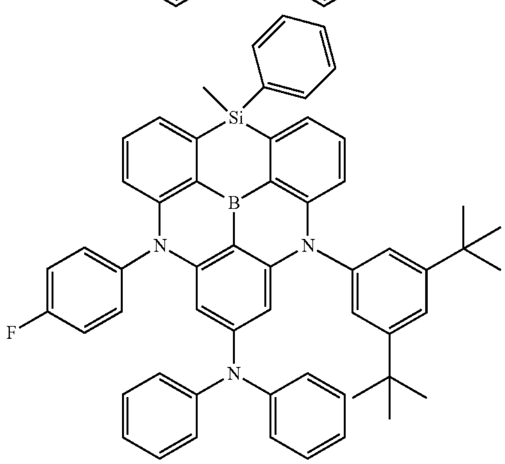
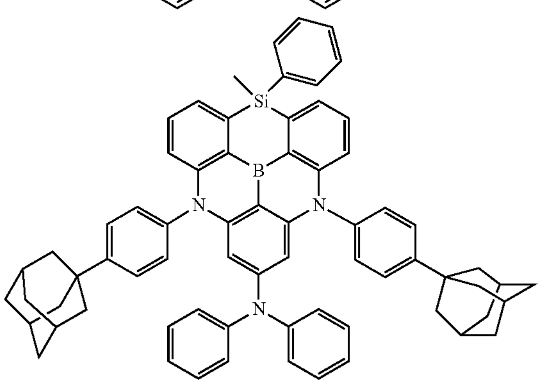
-continued
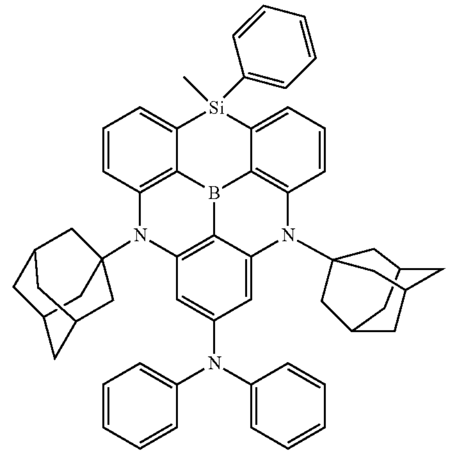
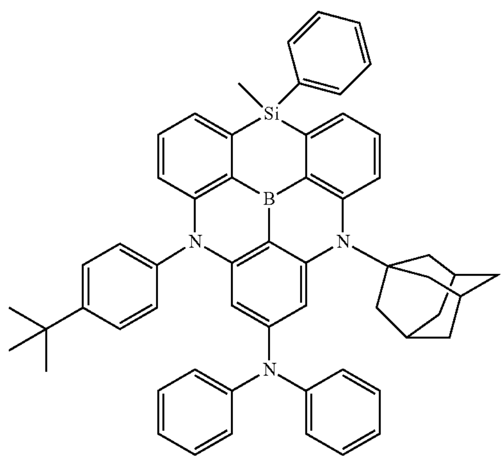
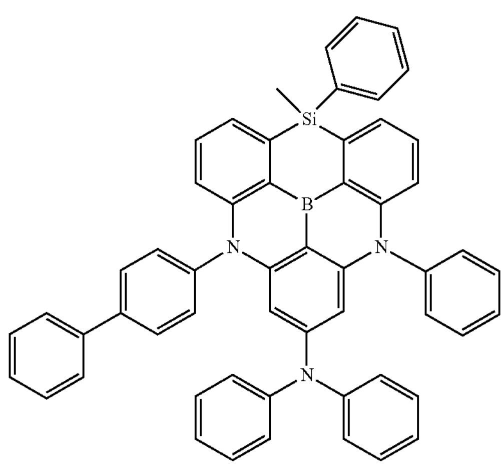

-continued
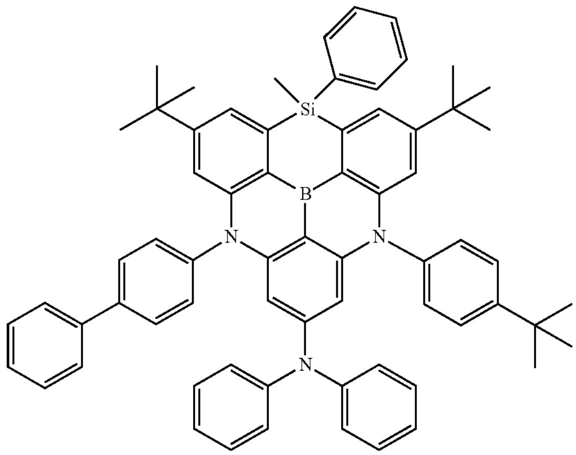
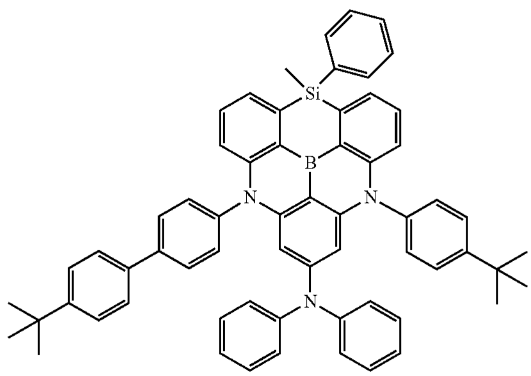
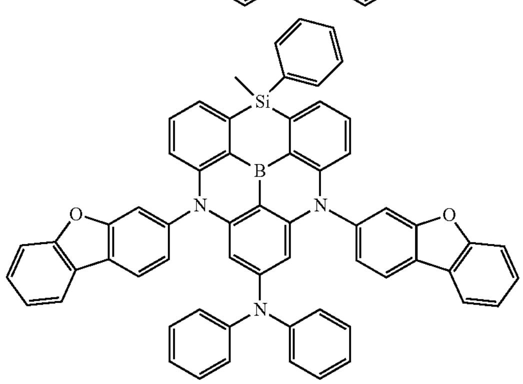
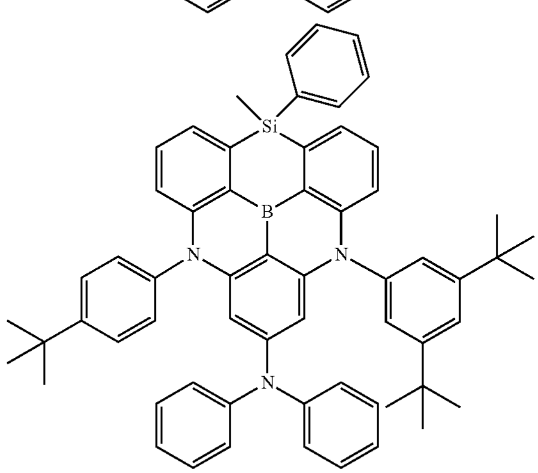
-continued
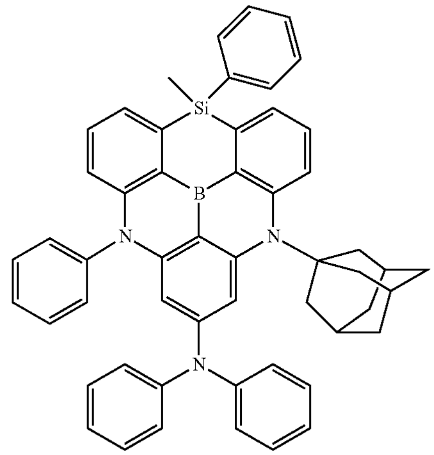
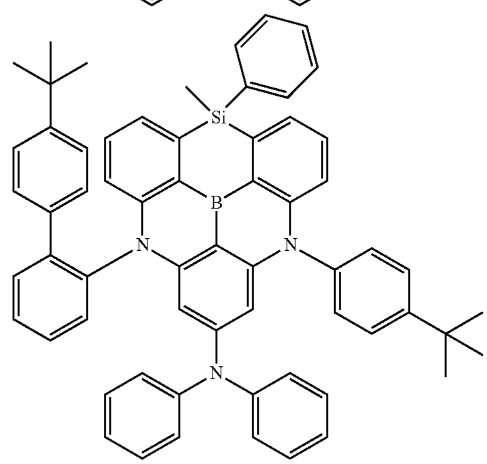
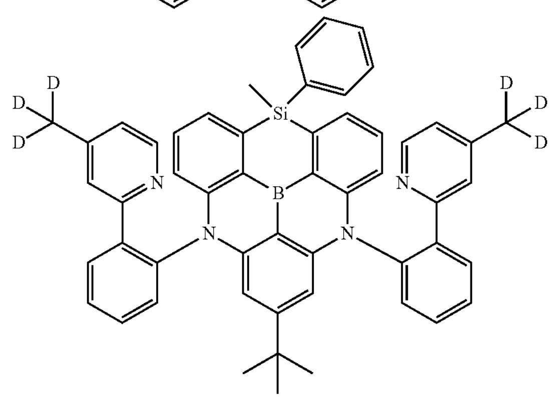
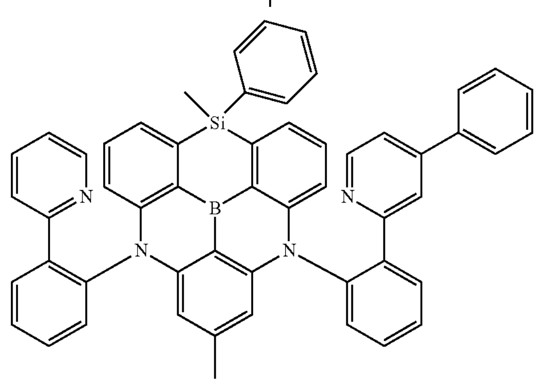

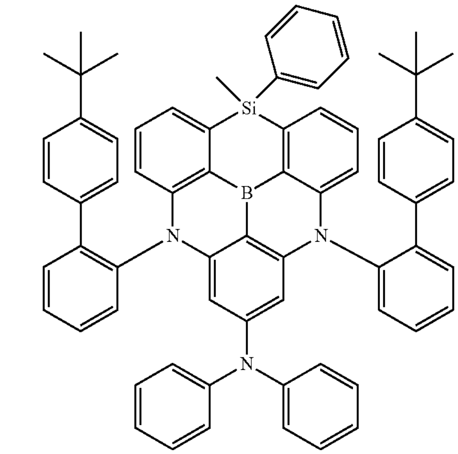
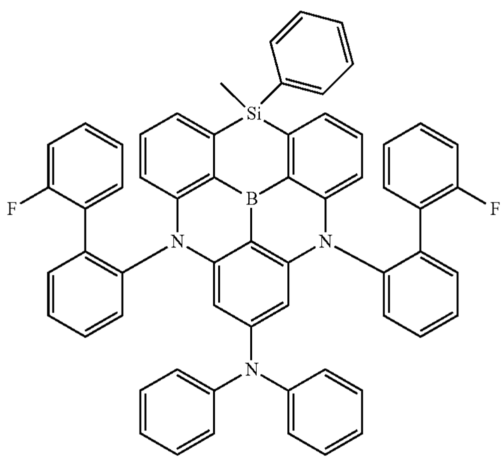
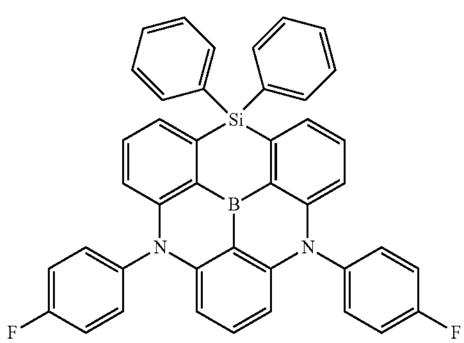
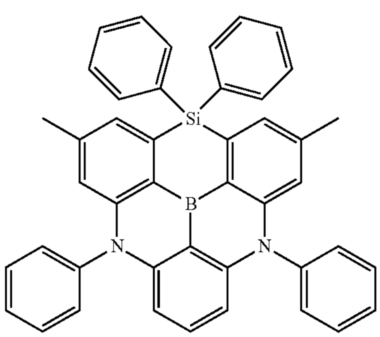
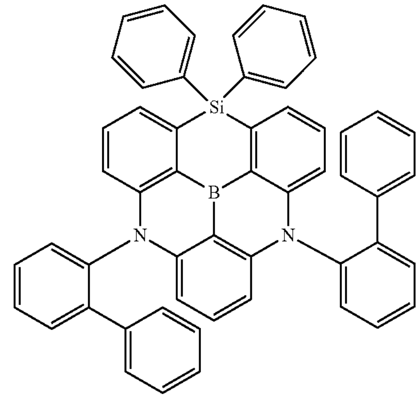
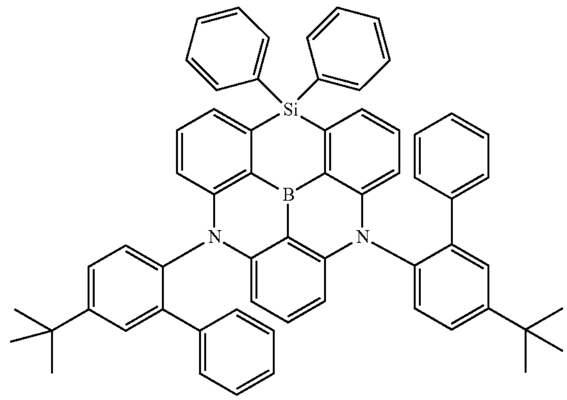
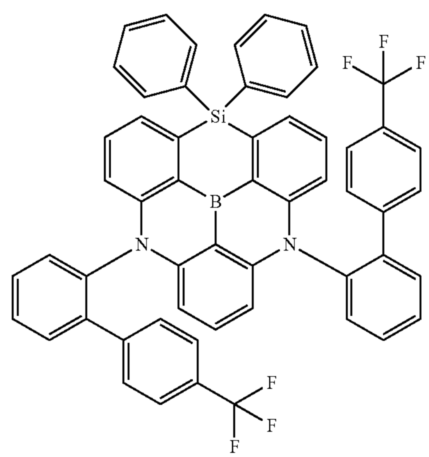
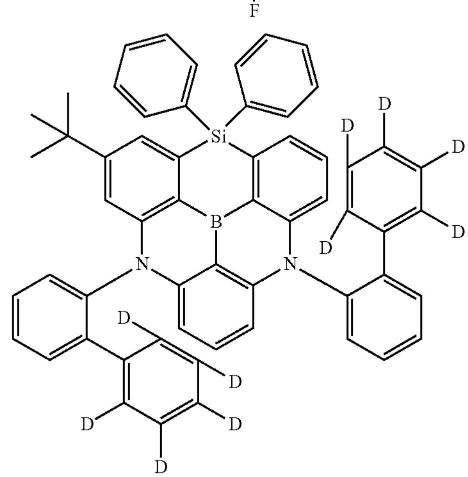

-continued
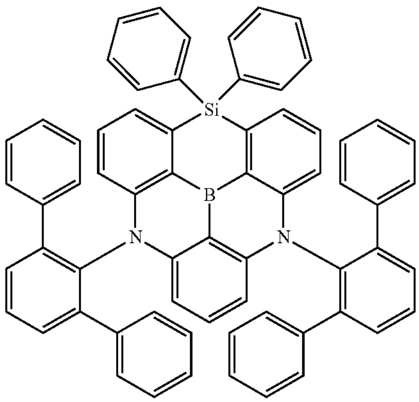
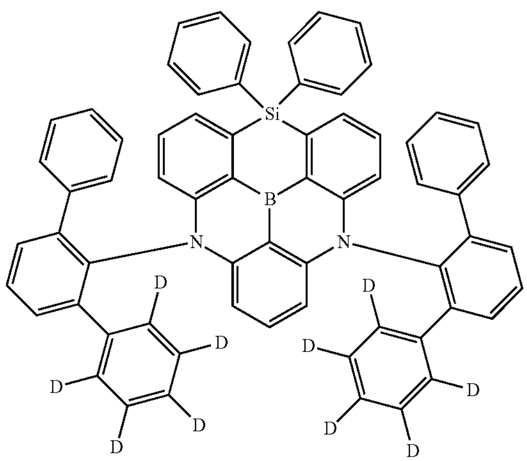
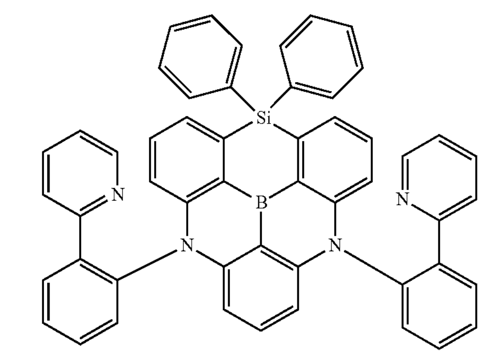
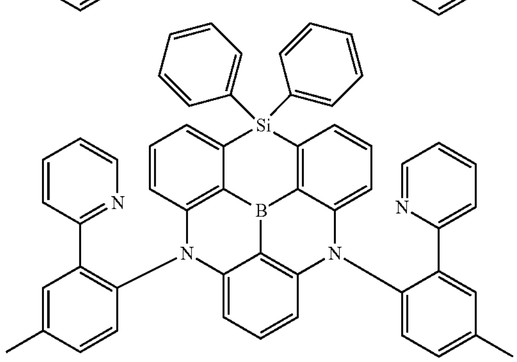
-continued
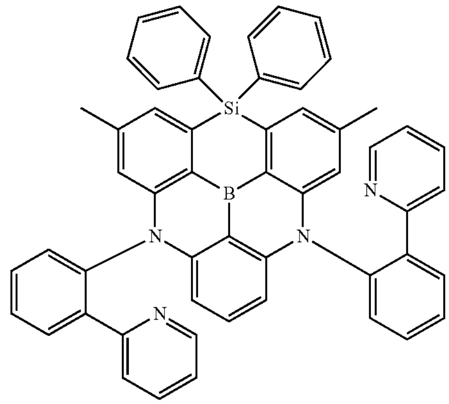
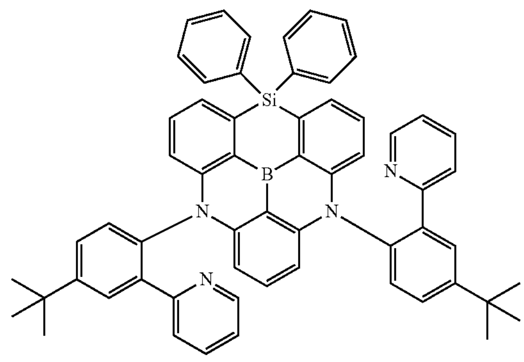
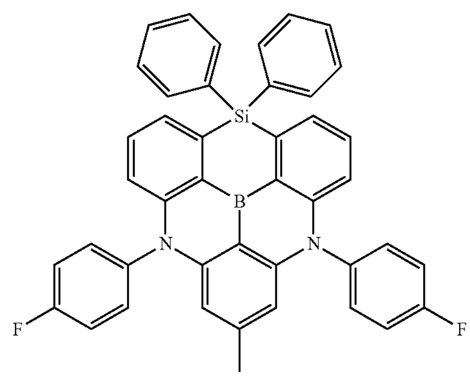
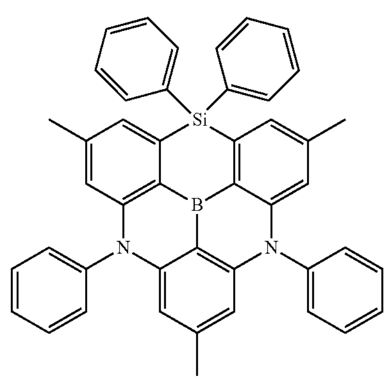

-continued
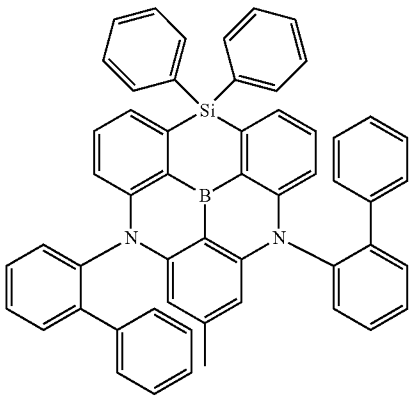
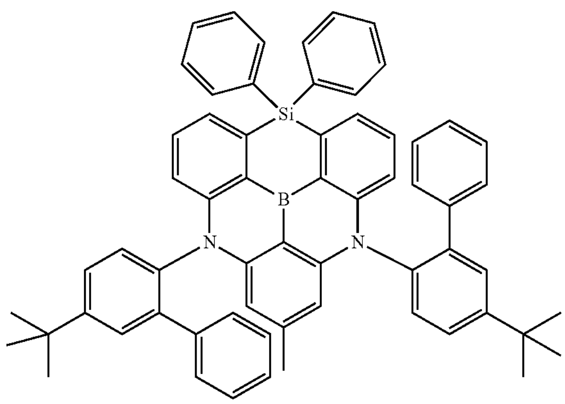
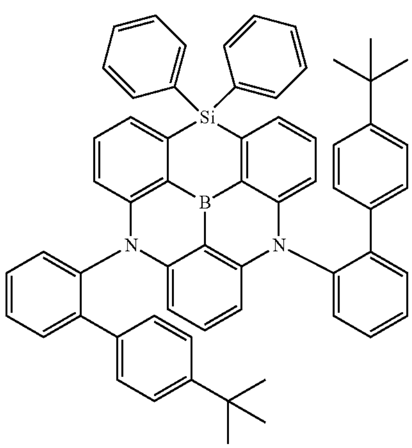
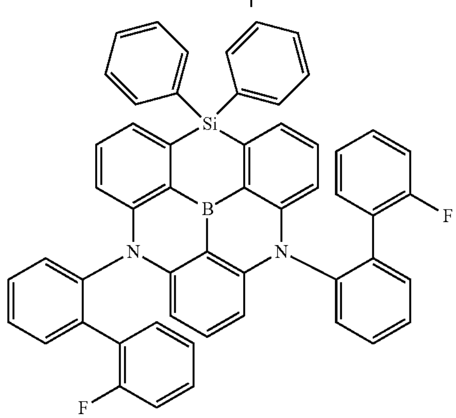
-continued
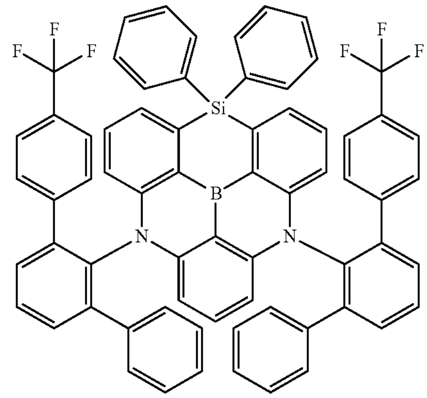
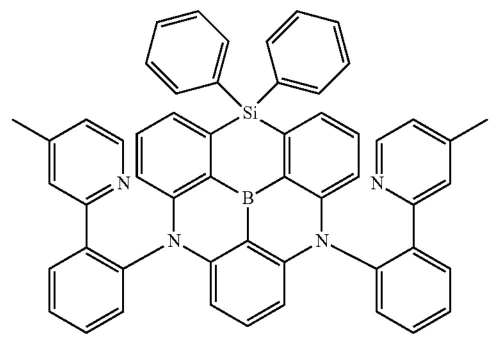
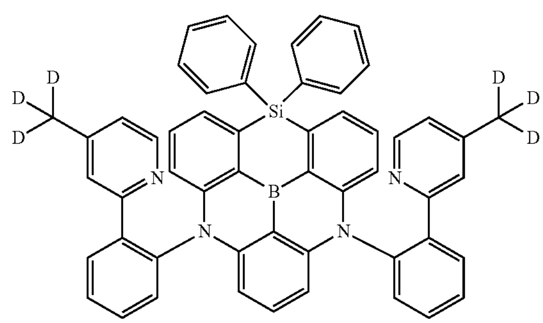
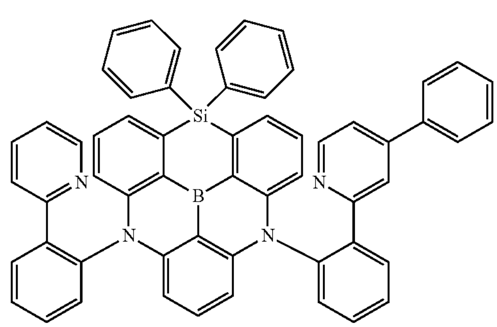

-continued
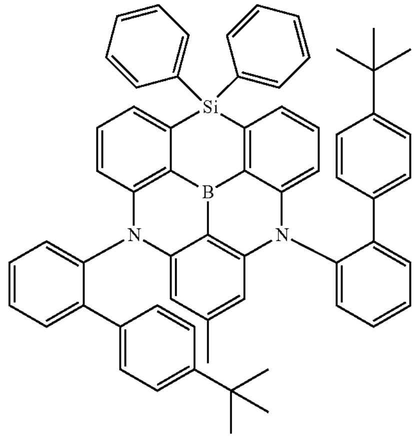
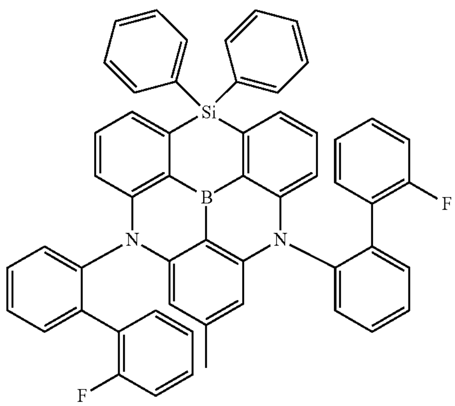
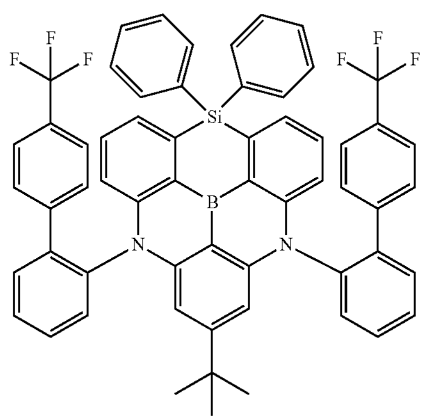
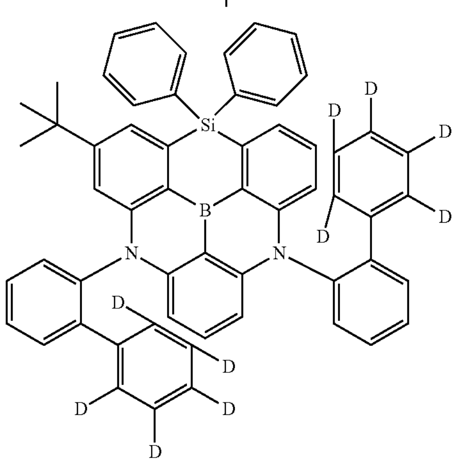
-continued
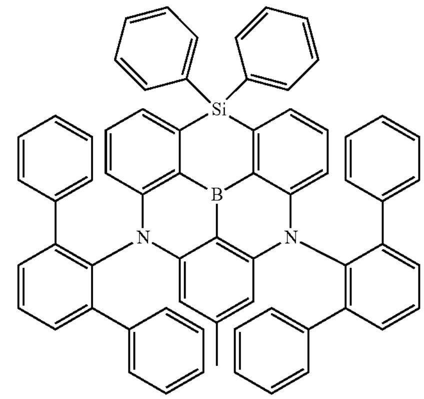
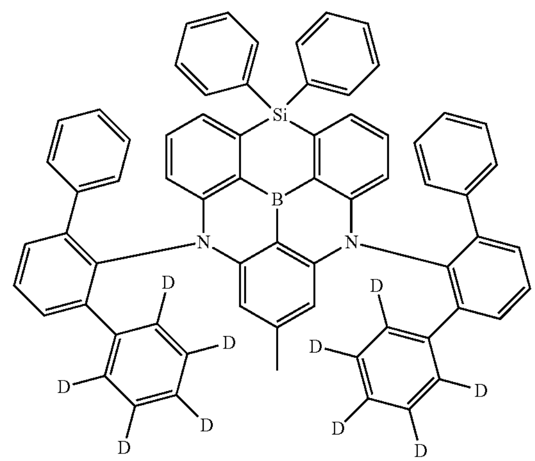
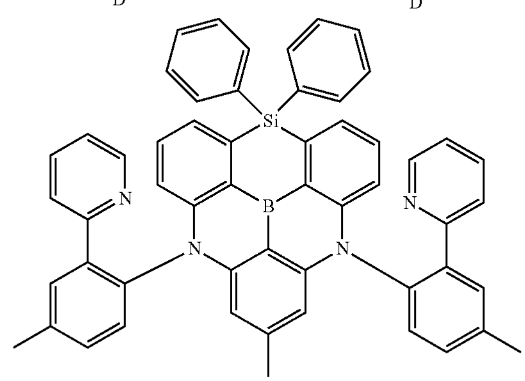
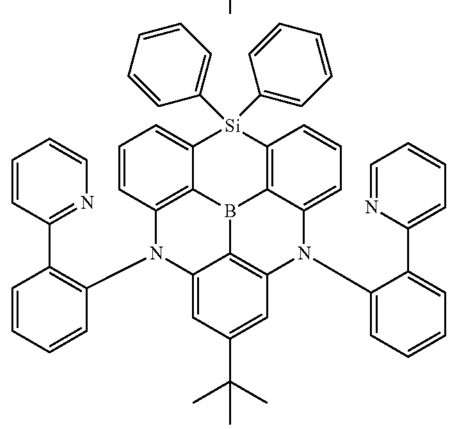

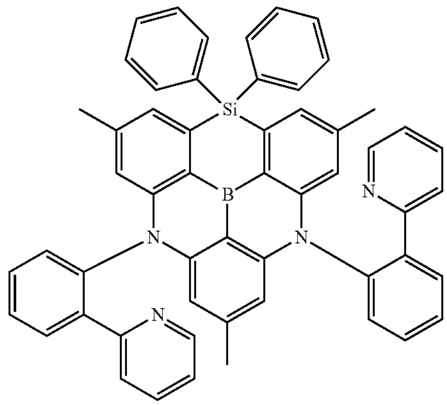
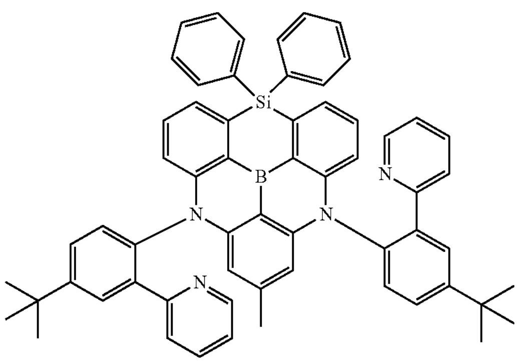
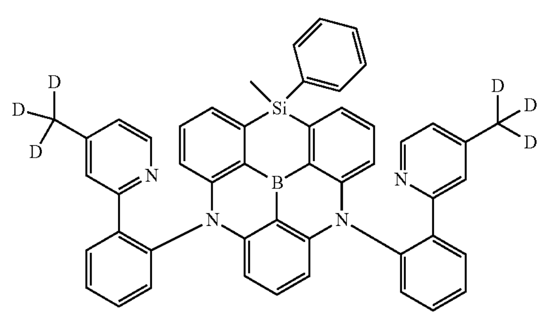
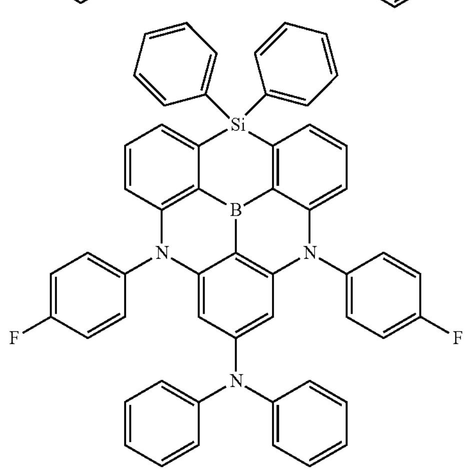
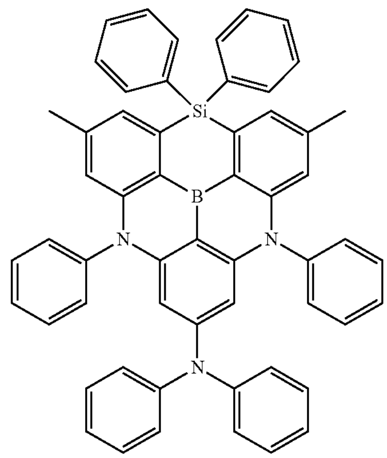
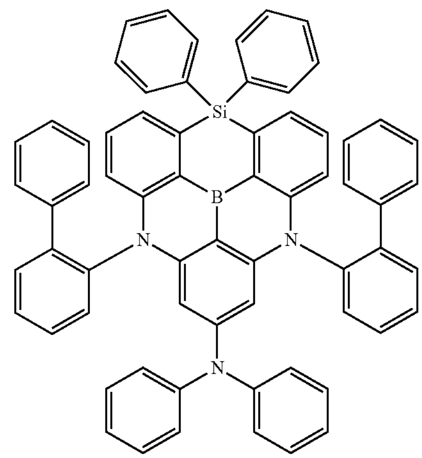
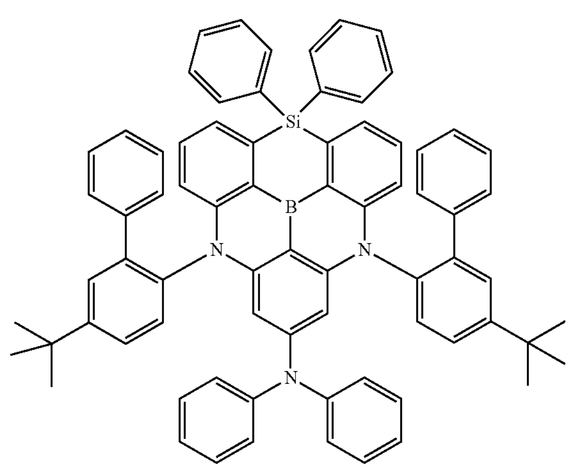

307
-continued
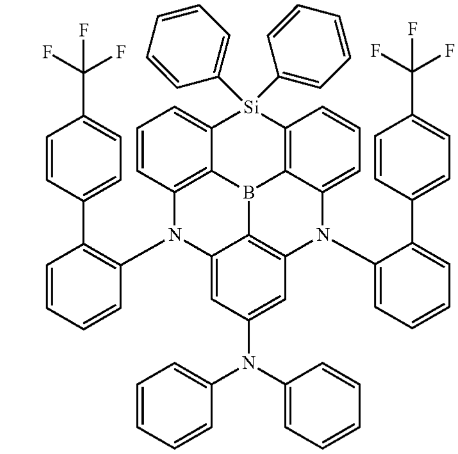
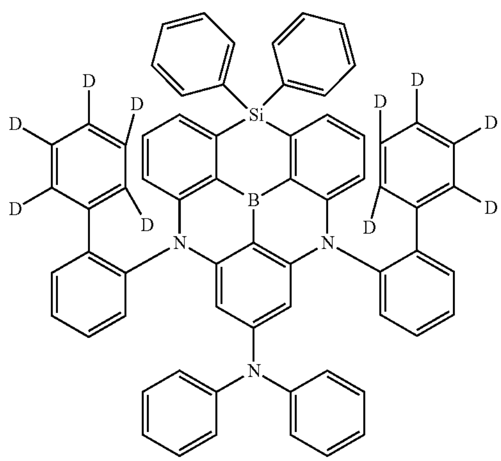
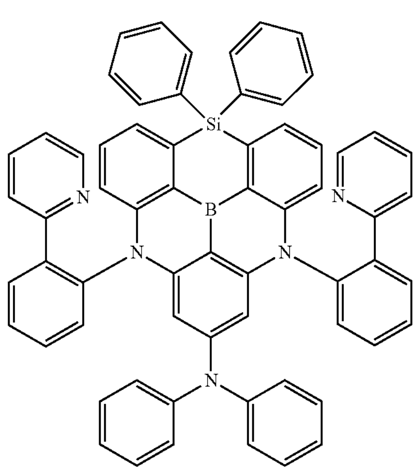
308
-continued
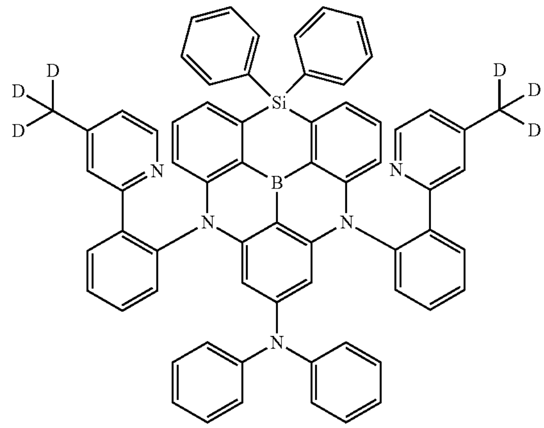
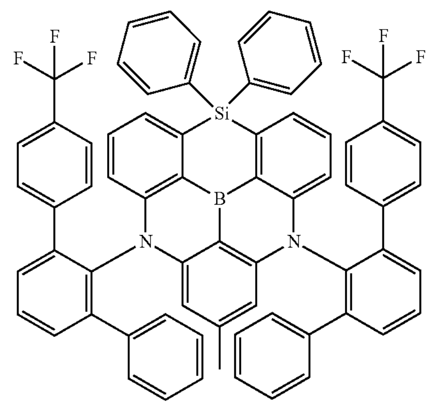
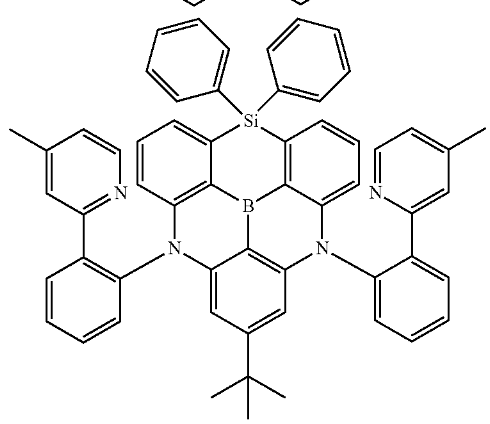
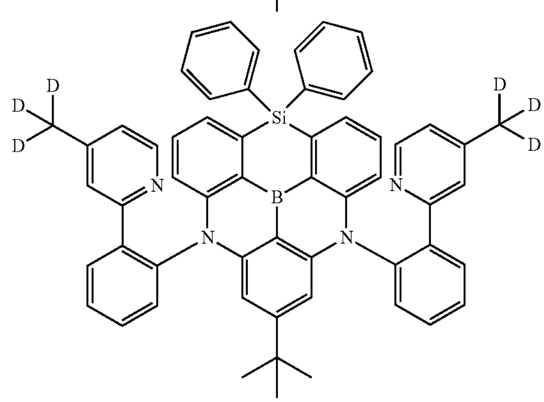

-continued

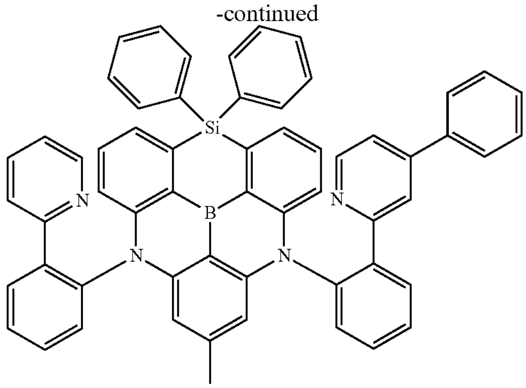

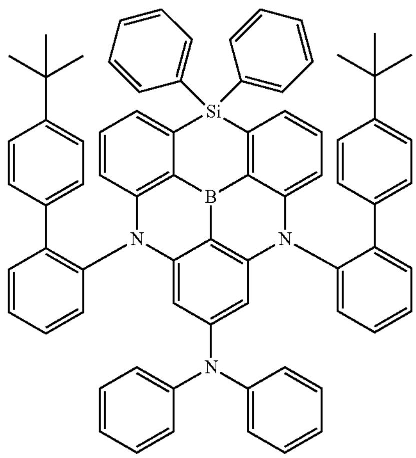

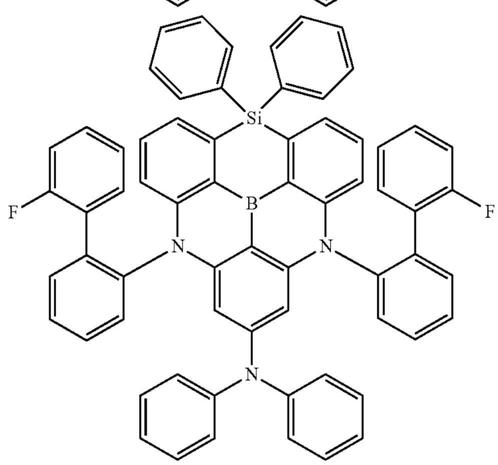

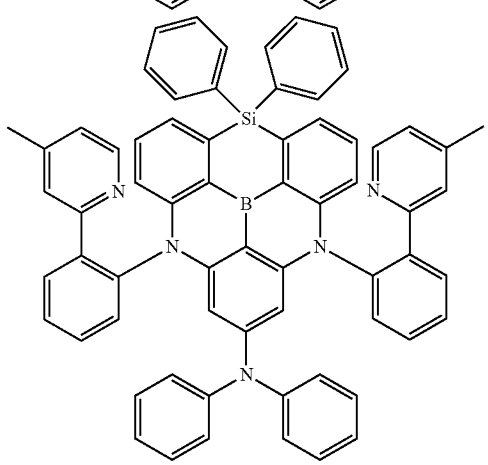

-continued

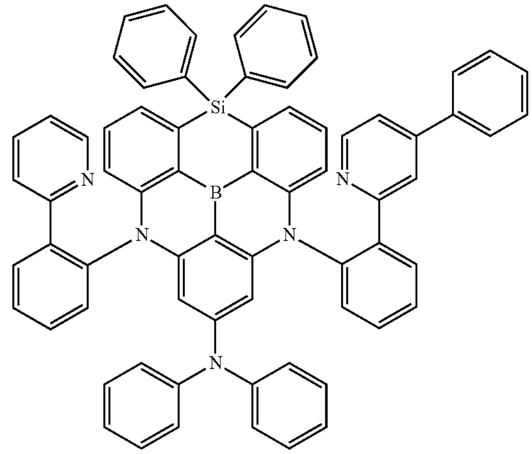

5. An organic light emitting device comprising:

a first electrode;

a second electrode provided opposite to the first electrode; and one or more organic material layers provided between the first electrode and the second electrode, wherein one or more layers of the organic material layers include the compound of Chemical Formula 1 of claim 1.

6. The organic light emitting device of claim 5, wherein the organic material layer includes a hole injection layer or a hole transfer layer, and the hole injection layer or the hole transfer layer includes the compound of Chemical Formula 1.

7. The organic light emitting device of claim 5, wherein the organic material layer includes an electron transfer layer or an electron injection layer, and the electron transfer layer or the electron injection layer includes the compound of Chemical Formula 1.

8. The organic light emitting device of claim 5, wherein the organic material layer includes a light emitting layer, and the light emitting layer includes the compound of Chemical Formula 1.

9. The organic light emitting device of claim 8, wherein the light emitting layer further includes a compound of the following Chemical Formula 1-1:

[Chemical Formula 1-1]

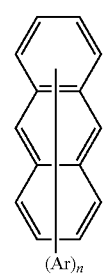

in Chemical Formula 1-1,

Ar is a substituted or unsubstituted aryl group; or a substituted or unsubstituted heteroaryl group; and n is an integer of 1 to 10, and when n is 2 or greater, the two or more Ars are the same as or different from each other.

10. The organic light emitting device of claim 9, wherein Chemical Formula 1-1 is of the following Chemical Formula 1-1-1:

[Chemical Formula 1-1-1]

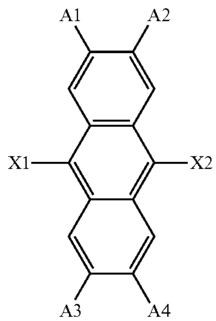

in Chemical Formula 1-1-1,

A1 to A4 are the same as or different from each other, and are each independently hydrogen; a substituted or unsubstituted aryl group; or a substituted or unsubstituted heteroaryl group; and X1 and X2 are the same as or different from each other, and are each independently a substituted or unsubstituted aryl group; or a substituted or unsubstituted heteroaryl group.

11. The organic light emitting device of claim 5, wherein the organic material layer includes a light emitting layer, and the light emitting layer includes the compound of Chemical Formula 1 as a dopant of the light emitting layer.

* * * * *